United States Patent [19]

Nohara et al.

[11] Patent Number: 5,812,673
[45] Date of Patent: Sep. 22, 1998

[54] NOISE SUPPRESSING DEVICE

[75] Inventors: Akira Nohara, Nishinomiya; Joji Kane, Nara, both of Japan

[73] Assignee: Matsushita Electric Industrial Co., Ltd., Osaka, Japan

[21] Appl. No.: 522,496

[22] Filed: Aug. 31, 1995

[30] Foreign Application Priority Data

Sep. 2, 1994 [JP] Japan ..................... 6-210287
Oct. 14, 1994 [JP] Japan ..................... 6-249531

[51] Int. Cl.⁶ ............... H04H 5/00; H04B 1/10
[52] U.S. Cl. ............. 381/13; 455/296; 455/222; 381/94
[58] Field of Search ........... 381/13, 3, 4, 94.1–94.9; 455/296–7, 222–225, 278.1, 226.2–226.3, 317

[56] References Cited

U.S. PATENT DOCUMENTS

| | | | |
|---|---|---|---|
| 5,067,157 | 11/1991 | Ishida et al. | 381/13 |
| 5,201,062 | 4/1993 | Nakamura et al. | 455/296 |
| 5,390,344 | 2/1995 | Nagata | 455/296 |
| 5,410,751 | 4/1995 | Yokoyama | 381/13 |
| 5,428,832 | 6/1995 | Nohara et al. | 455/296 |
| 5,430,894 | 7/1995 | Nohara et al. | 455/296 |
| 5,432,854 | 7/1995 | Honjo et al. | 381/94.2 |

FOREIGN PATENT DOCUMENTS 629054  12/1994  European Pat. Off. ........... 455/296

*Primary Examiner*—Curtis Kuntz
*Assistant Examiner*—Xu Mei
*Attorney, Agent, or Firm*—Ratner & Prestia

[57] ABSTRACT

It is a primary object of the invention to provide a noise suppressing device in which the function to suppress or remove the noise is more improved than the conventional device. The invention comprises a tuner section which detects the radio wave and converts it to the electric signal, an antenna connected to the tuner section, a field/disturbance information-detecting section for detecting the carrier level and the like of the input signal based on the signal from inside of the tuner section, a modulation information-detecting section for detecting the modulation degree and the like based on the signal from inside of the tuner section, a noise suppression control section which suppresses or removes the noise from the noise-containing signal input from the tuner section, a noise cancel section, and a noise data-generating section; and the noise-removed signal is output to an amplifier and amplified and sent to a speaker.

2 Claims, 78 Drawing Sheets

Parameter at the time of strong multipath

Parameter at the time of usual multipath

L/R signal $\begin{cases} L = L_s + N_L \\ R = R_s + N_R \end{cases}$

⇩

Provided that generally
$N_L \approx -N_R$

Separation control $\begin{cases} (1-a)L + aR \\ (1-a)R + aL \end{cases}$

Coefficient "a" $\begin{cases} \text{a is large} \longrightarrow \text{Separation small} \\ \text{a is small} \longrightarrow \text{Separation large} \\ \text{a = 0} \longrightarrow \text{Separation MAX} \end{cases}$

FIG. 14

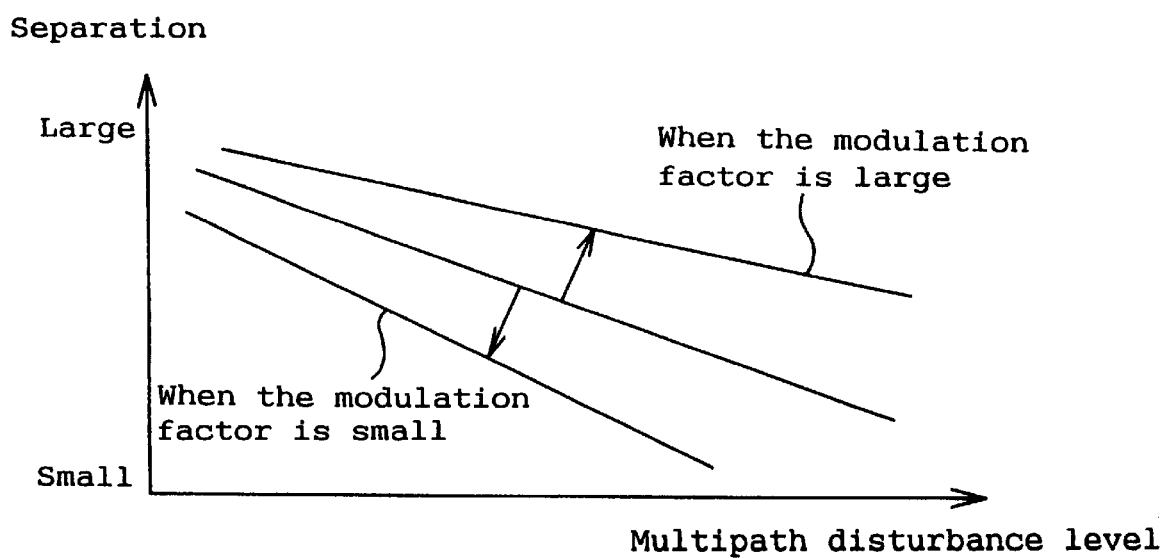

FIG. 15

Example of the structure of the cancel parameter table

| Number of band | α | β |
|---|---|---|
| 20 | 2.0 | 0.7 |
| 60 | 2.0 | 0.3 |
| 48 | 1.0 | 0.5 |

Example where 16 kHz is divided into 128 bands

NOISE SUPPRESSING DEVICE

BACKGROUND OF THE INVENTION

1. Field of the Invention

The present invention relates to a noise suppressing device for suppressing or removing the noise in the signal to be modulated, more particularly, relates to a noise suppressing device in a receiver.

2. Description of the Prior Art

Conventionally, there can be mentioned various devices as a device for suppressing or removing the noise contained in the voice of, for example, FM radio broadcasting and the like.

The structural view of the conventional noise suppressing device in the FM radio receiver is shown in FIG. 80, and the structure and the actions of the conventional device will be described with reference to FIG. 80.

In FIG. 80, reference numeral 1 represents a tuner section which detects the radio wave and converts it to the electric signal, and 2 represents an antenna connected to the tuner section 1. 3 represents a field information detecting means which detects the place where the radio wave to be received exists and the field conditions and the like in the frequency, based on the output from the tuner section 1. This field information detecting means 3 detects the signal of the intermediate frequency (in the case of FM broadcasting, 10.7 MHz, and in the case of AM broadcasting, 450 kHz) from the tuner section 1, and by analyzing the component of this signal, detects the carrier level and the disturbed degree of the signal to be received to transmit it as a field information to the noise data generating means 6 described below.

4 represents a noise suppression control section which suppresses or removes the noise from the noise-containing signal input from the tuner section 1. This noise suppression control section 4 is composed of a noise cancel means 5 and a noise data generating means 6. The noise data generating means 6 utilizes the field information from the field information detecting means 3 to generate the noise data, and by using the noise data, transfers the noise data to the noise cancel means 5 in order to cancel the noise from the noise-containing signal input from the tuner section 1.

Here, the actions to generate the noise data and cancel the noise will be concretely described.

Namely, the noise data generating means 6 obtains the multipath disturbance from the field information detecting means 3 as the one showing the disturbed degree of the signal to be received, and according to the multipath-disturbing level, calculates the multipath-disturbing noise data to transmit it to the noise cancel means 5. The noise cancel means 5 adds the noise data transmitted from the noise data generating means 6 to the noise-containing signal output from the tuner section 1, to cancel the noise.

Furthermore, in the noise data generating means 6, there is the one so constituted that noise data is prepared by calculating the receiver's residual noise having a tendency that the noise level becomes high particularly at a weak field where the field level as the carrier level is weak, instead of the multipath-disturbing.

Thus, the signal in which the noise has been suppressed or removed is output to the amplifier 7 from the noise cancel means 5.

However, in this conventional structure, though the S/N ratio is improved, since the noise is removed evenly, not depending on the vertical difference of the level of the audio signal to be received, there has been a problem in that the noise cannot be removed effectively without affecting the level of the audio signal to be received. Considering these problems of the conventional noise suppressing device, the object of the present invention is to provide a noise suppressing device which can suppress or remove the noise more effectively than the conventional devices.

On the other hand, in this conventional structure, for example, if a high level multipath-disturbing noise comes into the input signal, the level of the signal is weakened by the noise, and the signal falls into the weak field. Therefore, there has been a problem that even if the multipath-disturbing noise is removed, the receiver's residual noise cannot be removed.

Furthermore, in this case, in order to take measures against the receiver's residual noise which has not been removed, other four noise suppression control sections are required, which causes the cost increase.

Considering these problems of the conventional noise suppressing device, the object of the present invention is to provide a noise suppressing device which can suppress or remove the noise more effectively than the conventional devices.

SUMMARY OF THE INVENTION

It is hence a primary object of the invention to provide a noise suppressing device in which the function to suppress or remove the noise is more improved than the conventional device.

A noise suppressing device of the present invention 1 comprises:

a means for inputting the signal to be modulated;

a tuner section for obtaining the signal from said input means, detecting and outputting a given signal;

a field/disturbance information-detecting means for detecting field/disturbance informations relating to the carrier level of said signal to be modulated and/or the disturbed degree of said signal to be modulated from said tuner section, and outputting the field/disturbance informations;

a modulation information-detecting means for detecting the modulation degree of said signal to be modulated and/or the stereo pilot signal level of said signal to be modulated from said tuner section, and outputting said modulation informations;

a noise data-generating means which inputs said field/disturbance informations to be output and said modulation informations to be output, and when calculating the noise data from said field/disturbance informations, adds said modulation informations to perform said calculation, and outputs the resultant noise data;

a noise cancel means for utilizing said noise data with respect to the given signal output from said tuner section to suppress or remove the noise contained in said given signal; and an output means for obtaining and outputting the output signal from said noise cancel means.

A noise suppressing device of the present invention 2 comprises:

a means for inputting a signal to be modulated in a transfer system of a stereo signal;

a tuner section for obtaining the signal from said input means, detecting and outputting a plurality of given signals;

a sum signal-preparing means for summing up said respective signals output from said tuner section and preparing a sum signal;

a difference signal-preparing means for taking the difference between said respective signals output from said tuner section and preparing a difference signal;

a field/disturbance information-detecting means for detecting field/disturbance informations relating to the carrier level of said signal to be modulated and the disturbed degree of said signal to be modulated from said tuner section, and outputting the field/disturbance informations;

a modulation information-detecting means for detecting the modulation degree of said signal to be modulated and/or the stereo pilot signal level of said signal to be modulated from said tuner section, and outputting said modulation informations;

a sum signal noise cancel means for suppressing or removing the noise with respect to said sum signal;

a difference signal noise cancel means for suppressing or removing the noise with respect to said difference signal;

a noise cancel control means for controlling said sum signal noise cancel means and said difference signal noise cancel means, based on the output from said field/disturbance information-detecting means and the output from said modulation information-detecting means; and a signal separation means for separating said plurality of given signals based on the sum signal and the difference signal in which the noise has been suppressed or removed.

A noise suppressing device of the present invention 3 comprises:

a means for inputting a signal to be modulated;

a tuner section for obtaining the signal from said input means, detecting and outputting a plurality of given signals;

a field/disturbance information-detecting means for detecting field/disturbance informations relating to the carrier level of said signal to be modulated and the disturbed degree of said signal to be modulated from said tuner section, and outputting the field/disturbance informations;

a modulation information-detecting means for detecting the modulation degree of said signal to be modulated and/or the stereo pilot signal level of said signal to be modulated from said tuner section, and outputting said modulation informations;

a noise-generating means for outputting a noise data based on the information relating to at lease said field/disturbance informations to be output;

a noise cancel parameter-setting means for setting a noise cancel parameter based on said field/disturbance informations to be output and/or said modulation informations to be output;

a noise cancel means for utilizing said noise data and said set noise cancel parameters to suppress or remove the noise contained in the given signal, with respect to the given signal to be output from said tuner section; and an output means for obtaining and outputting the output signal from said noise cancel means.

A noise suppressing device of the present invention 4 according to said invention 3 further includes:

a noise cancel parameter frequency characteristic-setting means for conducting weighting in response to the frequency of the given signal output from said tuner section with respect to the noise cancel parameter output from the noise cancel parameter-setting means, and outputting the weighted noise cancel parameter to said noise cancel means; and a noise frequency characteristic-setting means for conducting weighting in response to the frequency of the given signal output from said tuner section with respect to the noise data output from the noise-generating means, and outputting the weighted noise data to said noise cancel means.

A noise suppressing device of the present invention 5 according to said invention 3 further includes:

a first detection threshold-setting means which sets the threshold level of said field/disturbance informations used when the noise data is generated, based on said modulation informations to be output; and a second detection threshold-setting means which sets the threshold level of said field/disturbance informations used when said noise cancel parameter is set, based on said modulation informations to be output;

said noise-generating means generating the noise data in response to the field/disturbance informations obtained by making the threshold level set by said first detection threshold-setting means as the reference and the threshold thereof; and said noise cancel parameter-setting means being so as to set the noise cancel parameter in response to the field/disturbance informations obtained by making the threshold level set by said second detection threshold-setting means as the reference and the threshold thereof.

A noise suppressing device of the present invention 6 comprises:

a means for inputting a signal to-be modulated in a transfer system of a stereo signal;

a tuner section for obtaining the signal from said input means, detecting and outputting a plurality of given signals;

a field/disturbance information-detecting means for detecting field/disturbance informations relating to the carrier level of said signal-to be modulated and the disturbed degree of said signal to be modulated from said tuner section;

a modulation information-detecting means for detecting the modulation degree of said signal to be modulated and/or the stereo pilot signal level of said signal to be modulated from said tuner section;

a stereo separation variable means which determines the separation degree to said given signal output from said tuner section by considering said modulation informations to be detected, when the separation degree is determined from said field/disturbance informations to be detected, and suppresses the noise feeling in the audibility by conducting separation/control with respect to said given signal, and an output means for obtaining and outputting the output signal from said stereo separation variable means.

A noise suppressing device of the present invention 7 according to said invention 6 is characterized in that the field/disturbance information is a multipath disturbance signal.

A noise suppressing device of the present invention 8 according to said invention 7 is characterized in that:

the stereo separation variable means has a separation detecting means for detecting the variation of said time-varying separation degree, gives the time constant characteristic to the variation of said separation degree based on the detected results by the separation detecting means, and performs said separation/control based on the separation degree having the time constant characteristic.

A noise suppressing device of the present invention 9 comprises:

a means for inputting a signal to be modulated;

a tuner section for obtaining the signal from said input means, detecting and outputting a plurality of given signals;

a field/disturbance information-detecting means for detecting field/disturbance informations relating to the carrier level of said signal to be modulated and the disturbed degree of said signal to be modulated from said tuner section;

a modulation information-detecting means for detecting the modulation degree of said signal to be modulated and/or the stereo pilot signal level of said signal to be modulated from said tuner section;

a frequency characteristic variable means which determines the reduction degree which reduces the frequency component higher than the given frequency to the same level as or lower level than the original level by considering said modulation informations to be detected, when the reduction degree is determined from said field/disturbance informations to be detected, and reduces the higher frequency component of said given signal output from said tuner section to the same level as or lower level than the original level to suppress the noise feeling in the audibility by utilizing the determined reduction degree; and an output means for obtaining and outputting the output signal from said frequency characteristic variable means.

A noise suppressing device of the present invention 10 according to said invention 9 is characterized in that the field/disturbance information is a multipath disturbance signal.

A noise suppressing device of the present invention 11 comprises:

a means for inputting a signal to be modulated;

a tuner section for obtaining the signal from said input means, detecting and outputting a plurality of given signals;

a field/disturbance information-detecting means for detecting field/disturbance informations relating to the carrier level of said signal to be modulated and the disturbed degree of said signal to be modulated from said tuner section;

a modulation information-detecting means for detecting the modulation informations relating to the modulation factor of said signal to be modulated and/or the stereo pilot signal level of said signal to be modulated from said tuner section, and outputting the modulation informations;

a muting characteristic variable means which determines the muting characteristic of said given signal output from said tuner section by considering said modulation informations to be detected, when the muting characteristic is determined from said field/disturbance informations to be detected, and utilizes the determined muting characteristic to suppress the noise feeling in the audibility with respect to said given signal output from said tuner section; and an output means for obtaining and outputting the output signal from said muting characteristic variable means.

A noise suppressing device of the present invention 12 according to said invention 11 is characterized in that the field/disturbance information is a multipath disturbance signal.

A noise suppressing device of the present invention 13 comprises:

a means for inputting a signal to be modulated in a transfer system of a stereo signal;

a tuner section for obtaining the signal from said input means, detecting and outputting a plurality of given signals;

a sum signal-preparing means for summing up said respective signals output from said tuner section and preparing a sum signal;

a difference signal-preparing means for taking the difference between said respective signals output from said tuner section and preparing a difference signal;

a field/disturbance information-detecting means for detecting field/disturbance informations relating to the carrier level of said signal to be modulated and the disturbed degree of said signal to be modulated from said tuner section, and outputting the field/disturbance informations;

a modulation information-detecting means for detecting the modulation degree of said signal to be modulated and/or the stereo pilot signal level of said signal to be modulated from said tuner section, and outputting said modulation informations;

a field/disturbance information-comparing means which compares said field/disturbance informations output from said field/disturbance information-detecting means with a predetermined value, and a modulation information-comparing means which compares said modulation informations output from said modulation information-detecting means with other predetermined value;

a sum signal noise cancel means for suppressing or removing the noise with respect to said sum signal, with the noise data and the noise muting cancel parameter;

a difference signal noise cancel means for suppressing or removing the noise with respect to said difference signal, with the noise data and the noise muting cancel parameter;

a noise muting cancel control means for setting said noise cancel parameter based on the output from said field/disturbance information-detecting means and the output from said modulation information-detecting means to control said difference signal noise cancel means, and setting the clamp coefficient of said noise muting cancel parameter to any value between 0 and 0.7 based on the output from said field/disturbance information-comparing means and the output from said modulation information-comparing means to control said sum signal noise cancel means; and a signal separation means for separating said plurality of given signals based on the sum signal and the difference signal in which the noise has been suppressed or removed by said noise cancel means.

A noise suppressing device of the present invention 14 according to said invention 13 further includes:

a noise muting cancel parameter frequency characteristic-setting means for conducting weighting in response to the frequency of the signal output from said sum signal-preparing means with respect to the noise muting cancel parameter output from the noise muting cancel control means, and outputting the weighted noise muting cancel parameter to said sum signal noise cancel means.

A noise suppressing device of the present invention 15 comprises:

a means for inputting a signal to be modulated;

a tuner section for obtaining the signal from said input means, detecting and outputting a plurality of given signals;

a field/disturbance information-detecting means for detecting field/disturbance informations relating to the carrier level of said signal to be modulated and the disturbed degree of said signal to be modulated from said tuner section, and outputting the field/disturbance informations;

a modulation information-detecting means for detecting the modulation degree of said signal to be modulated and/or the stereo pilot signal level of said signal to be modulated from said tuner section, and outputting said modulation informations;

a noise generating means for outputting the noise data based on at least said field/dusturbance informations to be output;

a field/disturbance information-comparing means which compares said field/disturbance informations output from said field/disturbance information-detecting means with a predetermined value, and/or a modulation information-comparing means which compares said modulation informations output from said modulation information-detecting means with other predetermined value;

a noise muting cancel parameter-setting means for setting the clamp coefficient of said noise muting cancel parameter to any value between 0 and 0.7 based on the comparison result by said field/disturbance information-comparing means and the comparison result from said modulation information-comparing means;

a noise muting cancel means for utilizing said noise data and said set noise muting cancel parameter with respect to the given signal output from said tuner section to suppress or remove the noise contained in said given signal; and an output means for obtaining and outputting the output signal from said noise muting cancel means.

A noise suppressing device of the present invention 16 according to said invention 15 further includes:

a noise muting cancel parameter frequency characteristic-setting means for conducting weighting in response to the frequency of the given signal output from said tuner section, with respect to the noise muting cancel parameter output from the noise muting cancel parameter-setting means, and outputting the weighted noise muting cancel parameter to said noise muting cancel means.

A noise suppressing device of the present invention 17 according to said invention 2, 3, 4, 5, 13 or 14 is characterized in that a value of A characteristic curve of the weighting curve is added to the parameter input to the noise cancel means in order to suppress or remove the noise contained in the given signal.

A noise suppressing device of the present invention 18 according to said invention 2 is characterized in that the noise cancel control means sets the noise cancel parameter from the output from said field/disturbance information-detecting means and the output from said modulation information-detecting means, and controls said sum signal noise cancel means and said difference signal noise cancel means based on said set noise cancel parameter.

A noise suppressing device of the present invention 19 according to said invention 3, 4, 5, or 18 is characterized in that it is so constituted that when the multipath disturbance signal is larger than the first given value and the value of said modulation information is smaller than the second given value, among the field/disturbance informations, the cancel coefficient is made larger than the third given value and the clamp coefficient is made smaller than the fourth given value among said noise cancel parameters, and when said multipath disturbance signal is smaller than said first given value, and the value of said modulation information is larger than the second given value, the cancel coefficient is made smaller than the third given value and the clamp coefficient is made larger than the fourth given value.

A noise suppressing device of the present invention 20 according to any one of said inventions 1 to 6, 8, 9, 11, and 13 to 19 is characterized in that when detecting the multipath disturbance signal among said field/disturnbace informations, the field/disturbance information-detecting means compares the level of the multipath disturbance signal input within the predetermined time with the predetermined threshold level, and performs said detection based on the peak value of said multipath disturbance signal to be input which exceeds the threshold level.

A noise suppressing device of the present invention 21 according to any one of said inventions 1 to 6, 8, 9, 11, and 13 to 19 is characterized in that when detecting the field intensity-level signal showing the multipath disturbance signal and/or the carrier level among said field/disturnbace informations, the field/disturbance information-detecting means examines the rate of change of the wave form of the multipath disturbance signal and/or said field intensity-level signal input within the predetermined time, compares the rate of change with the predetermined reference, and performs said detection based on said wave form in which the rate of change of the wave form to be compared varies more rapidly than the reference.

A noise suppressing device of the present invention 22 according to any one of said inventions 1 to 6, 8, 9, 11, and 13 to 19 is characterized in that when detecting the field intensity-level signal showing the multipath disturbance signal and/or the carrier level among said field/disturnbace informations, the field/disturbance information-detecting means examines the relative or absolute depth of the wave form of the multipath disturbance signal and/or said field intensity-level signal input within the predetermined time, compares the depth with the predetermined threshold level, and performs said detection based on said wave form in which the depth of the wave form to be compared becomes larger than the threshold level.

A noise suppressing device of the present invention 23 according to any one of said inventions 1 to 6, 8, 9, 11, and 13 to 19 is characterized in that when detecting the field intensity-level signal showing the multipath disturbance signal and/or the carrier level among said field/disturnbace informations, the field/disturbance information-detecting means examines the level of the wave form of the multipath disturbance signal and/or said field intensity-level signal to be input, compares the level with the predetermined reference, and performs said detection based on said wave form in which, as a result, the time when the level of said wave form to be compared continues to satisfy said reference becomes longer than the predetermined time.

A noise suppressing device of the present invention 24 according to any one of said inventions 1 to 6, 8, 9, 11, and 13 to 19 is characterized in that when detecting the field intensity-level signal showing the carrier level among said field/disturnbace informations, the field/disturbance information-detecting means calculates the average value of said field intensity-level signal between the timing when the field intensity-level signal should be used and a point of time going back by the given time from that timing, and detects the calculated result as the field intensity-level signal in said timing.

A noise suppressing device of the present invention 25 according to any one of said inventions 1 to 6, 8, 9, 11, and 13 to 19 is characterized in that when detecting the field intensity-level signal showing the carrier level among said field/disturnbace informations, the field/disturbance information-detecting means detects the instantaneous value of the field intensity-level signal at the timing when the field intensity-level signal should be used as the field intensity-level signal in said timing.

A noise suppressing device of the present invention 26 according to any one of said inventions 1 to 6, 8, 9, 11, and 13 to 19 is characterized in that when detecting the modulation informations, the modulation information-detecting means calculates the average value of said modulation informations between the timing when said modulation informations should be used and a point of time going back by the given time from that timing, and detects the calculated result as the modulation informations in said timing.

A noise suppressing device of the present invention 27 according to any one of said inventions 1 to 6, 8, 9, 11, and 13 to 19 is characterized in that when detecting said modulation informations, the modulation information-detecting means detects the instantaneous value of the modulation informations at the timing when the modulation information should be used as the modulation informations in said timing.

A noise suppressing device of the present invention 28 according to said invention 3, 4, or 5 comprises:
  a power spectrum-analyzing means which analyzes the power spectrum of said given signal output from the tuner section;
  a noise power spectrum memory means which preliminarily stores the pattern of the power spectrum by the frequency analysis of the noise; and
  a spectral pattern-comparing means which compares the output from said power spectrum-analyzing means and the output from said noise power spectrum memory means, and transfers the matching degree of the spectral pattern as the compared result to said noise cancel parameter-setting means;
  said noise cancel parameter-setting means being so constituted to set said noise cancel parameter by considering the matching degree of said spectral pattern.

A noise suppressing device of the present invention 29 according to any one of said inventions 1–5, 13, and 15 is characterized in that when the signal to be modulated is the stereo signal, said modulation information-detecting means utilizes the power calculation value corresponding to the (L+R) component in the stereo composite signal as said modulation informations.

A noise suppressing device of the present invention 30 comprises:
  an antenna to obtain the signal to be modulated;
  a tuner section for obtaining-the signal from said antenna, detecting and outputting a given signal;
  a field/disturbance information-detecting means for detecting field/disturbance informations relating to the carrier level of said signal to be modulated and the disturbed degree of said signal to be modulated from said tuner section, and outputting the field/disturbance informations;
  a modulation information-detecting means for detecting the modulation informations relating to the modulation factor of said signal to be modulated and/or the stereo pilot signal level of said signal to be modulated from said tuner section, and outputting said modulation informations;
  a car speed-detecting means for detecting the moving speed of an automobile loaded with said antenna;
  a noise suppression control means which controls the suppression or removal of the noise contained in said given signal by considering the car speed detected by said car speed-detecting means, when the control is performed with respect to the given signal output from said tuner section, based on said field/disturbance informations to be output and said modulation informations to be output;
  and an output means for obtaining and outputting the output signal from said noise suppression control means.

A noise suppressing device of the present invention 31 comprises:
  an antenna to obtain the signal to be modulated;
  a tuner section for obtaining the signal from said antenna, detecting and outputting a given signal;
  a field/disturbance information-detecting means for detecting field/disturbance informations relating to the carrier level of said signal to be modulated and the disturbed degree of said signal to be modulated from said tuner section, and outputting the field/disturbance informations;
  a modulation information-detecting means for detecting the modulation informations relating to the modulation factor of said signal to be modulated and/or the stereo pilot signal level of said signal to be modulated from said tuner section, and outputting said modulation informations;
  a car speed-detecting means for detecting the moving speed of an automobile loaded with said antenna;
  a muting characteristic variable means which determines the muting characteristic of said given signal output from said tuner section by considering the car speed detected by said car speed-detecting means, when the detection is performed based on said field/disturbance informations to be output and said modulation informations to be output, and utilizes said determined muting characteristic to suppress the noise feeling in the audibility with respect to said given signal output from said tuner section; and
  an output means for obtaining and outputting the output signal from said muting characteristic variable means.

A noise suppressing device of the present invention 32 comprises:
  a means for inputting a signal to be modulated in a transfer system of a stereo signal;
  a tuner section for obtaining the signal from said input means, detecting and outputting a plurality of given signals;

a sum signal-preparing means for summing up said respective signals output from said tuner section and preparing a sum signal;

a difference signal-preparing means for taking the difference between said respective signals output from said tuner section and preparing a difference signal;

a field/disturbance information-detecting means for detecting field/disturbance informations relating to the carrier level of said signal to be modulated and the disturbed degree of said signal to be modulated from said tuner section, and outputting the field/disturbance informations;

a sum signal noise cancel means for suppressing or removing the noise with respect to said sum signal; a difference signal noise cancel means for suppressing or removing the noise with respect to said difference signal; a noise cancel control means for controlling said sum signal noise cancel means and said difference signal noise cancel means, based on said field/disturbance informations from said field/disturbance information-detecting means;

a separation control means forsetting the separation degree of said plurality of given signals based on said field/disturbance information from said field/disturbance information-detecing means; and a signal separation means for separating said plurality of given signals from the sum signal and the difference signal in which the noise has been suppressed or removed by said noise cancel means, based on said separation degree to be set.

A noise suppressing device of the present invention 33 according to said invention 32 further includes a modulation information-detecting means for detecting the modulation informations relating to the modulation degree of said signal to be modulated and/or the stereo pilot signal level of said signal to be modulated from said tuner section, and outputting said modulation informations;

said noise cancel control means controlling said sum signal noise cancel means and said difference signal noise cancel means, based on the output from said modulation information-detecting means; and said separation control means begins so constituted to set the separation degree of said plurality of given signals, based on the output from said modulation information-detecting means.

A noise suppressing device of the present invention 34 comprises:

a means for inputting a signal to be modulated in a transfer system of a stereo signal;

a tuner section for obtaining the signal from said input means, detecting and outputting a plurality of given signals;

a sum signal-preparing means for summing up said respective signals output from said tuner section and preparing a sum signal;

a difference signal-preparing means for taking the difference between said respective signals output from said tuner section and preparing a difference signal;

a field/disturbance information-detecting means for detecting field/disturbance informations relating to the carrier level of said signal to be modulated and the disturbed degree of said signal to be modulated from said tuner section, and outputting the field/disturbance informations;

a sum signal noise cancel means for suppressing or removing the noise with respect to said sum signal; a difference signal noise cancel means for suppressing or removing the noise with respect to said difference signal; a noise cancel control means for controlling said sum signal noise cancel means and said difference signal noise cancel means, based on said field/disturbance informations, and setting the noise cancel parameter based on said field/disturbance informations;

a separation control means for setting the separation degree of said plurality of given signals based on said noise cancel parameter set by said noise cancel control means; and a signal separation means for separating said plurality of given signals from the sum signal and the difference signal in which the noise has been suppressed or removed by said noise cancel means, based on said separation degree to be set.

A noise suppressing device of the present invention 35 according to said invention 34 further includes a modulation information-detecting means for detecting the modulation informations relating to the modulation degree of said signal to be modulated and/or the stereo pilot signal level of said signal to be modulated from said tuner section, and outputting said modulation informations;

said noise cancel control means controlling said sum signal noise cancel means and said difference signal noise cancel means, based on the output from said modulation information-detecting means, and being so constituted to set the noise cancel parameter based on the output from said modulation information-detecting means.

A noise suppressing device of the present invention 36 according to any one of said inventions 32–35 further includes a separation detecting means which detects the time variation of said separation degree output from the separation control means, and gives a time constant characteristic to the time variation of said separation degree by utilizing the detection result;

said signal separation means being so constituted to separate said plurality of given signals based on the separation degree having said time constant characteristic, from the sum signal and the difference signal in which the noise has been suppressed or removed by said noise cancel means.

A noise suppressing device of the present invention 37 according to said invention 15 or 16 is characterized in that said input means of said signal to be modulated is an antenna, and further includes an ignition noise-detecting means for detecting the ignition noise of the automobile loaded with the antenna; and said noise muting cancel parameter-setting means sets the noise muting cancel parameter by considering said detected ignition noise, when setting the noise muting cancel parameter based on the comparison result by said field/disturbance information-comparing means and/or the comparison result by said modulation information-comparing means.

A noise suppressing device of the present invention 38 comprises:

an antenna for obtaining the signal to be modulated;

a front end to obtain the signal from the antenna;

an intermediate frequency-amplifying means for amplifying the signal of the intermediate frequency from the output of said front end;

a field/disturbance information-detecting means for detecting field/disturbance informations relating to the carrier level of said signal to be modulated and the disturbed degree of said signal to be modulated from said intermediate frequency-amplifying means, and outputting the field/disturbance informations;

a modulation information-detecting means for detecting the modulation informations relating to the modulation factor of said signal to be modulated and/or the stereo pilot signal level of said signal to be modulated from said intermediate frequency-amplifying means, and outputting said modulation informations;

a noise-generating means for outputting the noise data based on at lease said field/disturbance informations to be output;

a field/disturbance information-comparing means for comparing said field/disturbance informations output from said field/disturbance information-detecting means with a predetermined value, and/or a modulation information-comparing means for comparing said modulation informations output from said modulation information-detecting means with other predetermined value;

an ignition noise-detecting means for detecting the ignition noise of the automobile loaded with said antenna;

a noise muting cancel parameter-setting means which sets the clamp coefficient of the noise muting cancel parameter by considering said detected ignition noise, when the clamp coefficient is set to any value between 0 and 0.7 based on the comparison result by said field/disturbance information-comparing means and the comparison result from said modulation information-comparing means;

a noise muting cancel means which utilizes said noise data and said set noise muting cancel parameter to suppress or remove the noise contained in said given signal, with respect to the given signal output from said intermediate frequency-amplifying means; and a detection means for inputting and detecting the output signal from said noise muting cancel means.

A modulation degree-detecting device of the present invention 39 comprises:

a means for inputting the signal to be modulated;

a tuner section for obtaining the signal from said input means, detecting and outputting a given signal;

a power calculating means for calculating the power of the signal after said signal to be modulated has been detected;

a received information-detecting means for detecting a multipath signal; and an averaging means which averages said power when said multipath signal does not exist, and outputs it as the modulation degree signal.

A modulation degree-detecting device of the present invention 40 according to said invention 39 is characterized in that the signal to be modulated is the stereo signal, and said power-calculating means calculates the power value based on the sum signal (L+R) separated after the detection, and said received information-detecting means detects the multipath signal from said tuner section.

A modulation degree-detecting device of the present invention 41 comprises:

a means for inputting the signal to be modulated;

a tuner section for obtaining the signal from said input means, detecting and outputting a given signal;

a received information-detecting means for detecting the received information from said tuner section;

a noise generating means for outputting the corresponding noise based on the detected received information;

a power spectrum-analyzing means for analyzing the power spectrum of the given signal output from said tuner section;

a noise-subtracting means for subtracting said noise output from the analyzed power spectrum; and a modulation degree-detecting means for detecting the modulation degree of the given signal output from said tuner section, based on the subtraction result of the noise-subtracting means.

A noise suppressing device of the present invention 42 comprises:

a means for inputting the signal to be modulated;

a tuner section for obtaining the signal from said input means, detecting and outputting a given signal;

a received information-detecting means for detecting the received information from said tuner section;

a noise generating means for outputting the corresponding noise based on the detected received information;

a power spectrum-analyzing means for analyzing the power spectrum of the given signal output from said tuner section;

a noise-subtracting means for subtracting said noise output from the analyzed power spectrum; and a modulation degree-detecting means for detecting the modulation degree of the given signal output from said tuner section, based on the subtraction result of the noise-subtracting means;

a noise cancel parameter-setting means for setting the noise cancel parameter, based on the detected modulation factor;

a demodulation section for demodulating the output from said tuner section;

a noise cancel means which utilizes said set noise cancel parameter and the noise information from said noise generating means to suppress or remove the noise contained in said demodulated signal, with respect to the signal demodulated by said demodulation section; and an output means for outputting the output signal from the noise cancel means.

In the first invention, the input means obtains a signal to be modulated; the tuner section obtains the signal from the input means, detects and outputs a given signal; the field/disturbance information-detecting means detects the field/disturbance informations relating to the carrier level and/or the disturbed degree of said signal to be modulated from the tuner section and outputs the field/disturbance informations; the modulation information-detecting means detects the modulation informations relating to the modulation degree of the signal to be modulated and/or the stereo pilot signal level of said-signal to be modulated from said tuner section and outputs the modulation informations; the noise data generating means inputs said field/disturbance informations to be output and said modulation informations to be output, and when calculating the noise data from said field/disturbance informations, adds said modulation informations to perform said calculation, and outputs the resultant noise data; the noise cancel means utilizes said noise data with respect to the given signal output from said tuner section to suppress or remove the noise contained in said given signal; and the output means obtains and outputs the output signal from said noise cancel means.

Thereby, when the noise data is calculated, the modulation information-detecting section calculates the modulapower from the signal after the detection at the tuner section to determine the modulation degree, and outputs it to the noise data generating means as the modulation informations, and by considering this modulation information, the noise can be suppressed or removed more efficiently than the case where the modulation information is not added.

In the second invention, the input means obtains the signal to be modulated in a transfer system of a stereo signal; the tuner section obtains the signal from said input means, detects and outputs a plurality of given signals; the sum signal-preparing means sums up said respective signals output from said tuner section and prepares a sum signal; the difference signal-preparing means takes the difference between said respective signals output from said tuner section and prepares a difference signal; the field/disturbance information-detecting means detects field/disturbance informations relating to the carrier level of said signal to be modulated and/or the disturbed degree of said signal to be modulated from said tuner section, and outputs the field/disturbance informations; the modulation information-detecting means detects and outputs the modulation informations relating to the modulation degree of said signal to be modulated and/or the stereo pilot signal level from said tuner section; the sum signal noise cancel means suppresses or removes the noise with respect to said sum signal; the difference signal noise cancel means suppresses or removes the noise with respect to said difference signal; the noise cancel control means controls said sum signal noise cancel means and said difference signal noise cancel means, based on the output from said field/disturbance information-detecting means and the output from said modulation information-detecting means; and the signal separation means separates said plurality of given signals based on the sum signal and the difference signal in which the noise has been suppressed or removed.

Thereby, when the noise cancel control means controls the difference signal noise cancel means and the sum signal noise cancel means, for example, it determines the modulation degree by calculating the modulation power from the signal after the detection at the tuner section, and transfers it as the modulation information to the noise cancel control means, therefore, by considering this modulation information, the noise can be suppressed or removed more efficiently than the case where the modulation information is not added.

In the third invention, the input means obtains a signal to be modulated; the tuner section obtains the signal from said input means, detects and outputs a plurality of given signals; the field/disturbance information-detecting means detects field/disturbance informations relating to the carrier level and the disturbed degree of said signal to be modulated from said tuner section, and outputs the field/disturbance informations; the modulation information-detecting means detects the modulation degree of said signal to be modulated and/or the stereo pilot signal level from said tuner section, and outputs said modulation informations; the noise-generating means outputs a noise data based on at least said field/disturbance informations to be output; the noise cancel parameter-setting means sets a noise cancel parameter based on said field/disturbance informations to be output and/or said modulation informations to be output; the noise cancel means utilizes said noise data and said set noise cancel parameters to suppress or remove the noise contained in the given signal, with respect to the given signal output from said tuner section; and the output means obtains and outputs the output signal from said noise cancel means.

Thereby, for example, when the noise cancel parameter is set, since the modulation information can be utilized, the magnification of the noise cancel parameter can be controlled according to the modulation information, and the noise can be suppressed or removed more efficiently.

In the sixth invention, the input means obtains a signal to be modulated in a transfer system of a stereo signal; the tuner section obtains the signal from said input means, detects and outputs a plurality of given signals; the field/disturbance information-detecting means detects field/disturbance informations relating to the carrier level and/or the disturbed degree of said signal to be modulated from said tuner section; the modulation information-detecting means detects the modulation informations relating to the modulation degree of said signal to be modulated and/or the stereo pilot signal level from said tuner section; the stereo separation variable means determines the separation degree to said given signal output from said tuner section by considering said modulation informations to be detected, when the separation degree is determined from said field/disturbance informations to be detected, and suppresses the noise feeling in the audibility by conducting separation/control with respect to said given signal, and the output means obtains and outputs the output signal from said stereo separation variable means.

Thereby, for example, when the modulation information-detecting means detects that the modulation degree of the modulation signal is small, it is so controlled to make the separation to the given signal small, and the noise can be suppressed or removed more efficiently.

In the 9th invention, the input means obtains a signal to be modulated; the tuner section obtains the signal from said input means, detects and outputs a plurality of given signals; the field/disturbance information-detecting means detects field/disturbance informations relating to the carrier level and the disturbed degree of said signal to be modulated from said tuner section; the modulation information-detecting means detects the modulation informations relating to the modulation degree of said signal to be modulated and/or the stereo pilot signal level from said tuner section and outputs the modulation informations;

the frequency characteristic variable means determines the reduction degree which reduces the frequency component higher than the given frequency to the same level as or lower level than the original level by considering said modulation informations to be detected, when the reduction degree is determined from said field/disturbance informations to be detected, and reduces the higher frequency component of said given signal output from said tuner section to the same level as or lower level than the original level to suppress the noise feeling in the audibility by utilizing the determined reduction degree; and the output means obtains and outputs the output signal from said frequency characteristic variable means.

Thereby, for example, when the modulation information-detecting means detects that the modulation degree of the modulation signal is small, it is so controlled to make said reduction degree large with respect to the given signal, thereby the noise suppression or removal can be made more efficiently.

In the 11th invention, the input means obtains a signal to be modulated; the tuner section obtains the signal from said input means, detects and outputs a plurality of given signals;

the field/disturbance information-detecting means detects field/disturbance informations relating to the carrier level and the disturbed degree of said signal to be modulated from said tuner section; the modulation information-detecting means detects the modulation informations relating to the modulation degree of said signal to be modulated and/or the stereo pilot signal level from said tuner section and outputs the modulation informations; the muting characteristic variable means determines the muting characteristic of said given signal output from said tuner section by considering said modulation informations to be detected, when the muting characteristic is determined from said field/disturbance informations to be detected, and utilizes the determined muting characteristic to suppress the noise feeling in the audibility with respect to said given signal output from said tuner section; and the output means obtains and outputs the output signal from said frequency characteristic variable means.

Thereby, for example, when the modulation information-detecting means detects that the modulation degree of the modulation signal is small, it is so controlled to make said muting characteristic large with respect to the given signal, to suppress the level of the noise-containing signal itself, whereby the noise suppression or removal can be made more efficiently.

In the 13th invention, the input means obtains a signal to be modulated in a transfer system of a stereo signal; the tuner section obtains the signal from said input means, detects and outputs a plurality of given signals; the sum signal-preparing means sums up said respective signals output from said tuner section and prepares a sum signal; the difference signal-preparing means takes the difference between said respective signals output from said tuner section and prepares a difference signal; the field/disturbance information-detecting means detects field/disturbance informations relating to the carrier level and the disturbed degree of said signal to be modulated from said tuner section; the modulation information-detecting means detects the modulation degree of said signal to be modulated and/or the stereo pilot signal level from said tuner section;

the field/disturbance information-comparing means compares said field/disturbance informations output from said field/disturbance information-detecting means with a predetermined value, and/or the modulation information-comparing means compares said modulation informations output from said modulation information-detecting means with other predetermined value;

the sum signal noise cancel means suppresses or removes the noise with respect to said sum signal, with the noise data and the noise muting cancel parameter; the difference signal noise cancel means suppresses or removes the noise with respect to said difference signal, with the noise data and the noise muting cancel parameter; the noise muting cancel control means sets said noise cancel parameter based on the output from said field/disturbance information-detecting means and the output from said modulation information-detecting means to control said difference signal noise cancel means, and sets the clamp coefficient of said noise muting cancel parameter to any value between 0 and 0.7 based on the output from said field/disturbance information-comparing means and the output from said modulation information-comparing means to control said sum signal noise cancel means; and the signal separation means separates said plurality of given signals based on the sum signal and the difference signal in which the noise has been suppressed or removed by said noise cancel means.

Thereby, for example, when the modulation information-detecting means detects that the modulation degree of the modulation signal is small, it is so controlled that the clamp coefficient of the noise muting cancel parameter is set to any value between 0 to 0.7 to control said sum signal noise cancel means, and to exert substantially the muting characteristic and suppress the level of the noise-containing signal itself, whereby the noise suppression or removal can be made more efficiently.

In the 15th invention, the input means obtains a signal to be modulated; the tuner section obtains the signal from said input means, detects and outputs a plurality of given signals;

the field/disturbance information-detecting means detects field/disturbance informations relating to the carrier level and the disturbed degree of said signal to be modulated from said tuner section; the modulation information-detecting means detects the modulation degree of said signal to be modulated and/or the stereo pilot signal level from said tuner section, and outputs said modulation informations; the noise generating means outputs the noise data based on at least said field/dusturbance informations to be output;

the field/disturbance information-comparing means compares said field/disturbance informations output from said field/disturbance information-detecting means with a predetermined value, and/or the modulation information-comparing means compares said modulation informations output from said modulation information-detecting means with other predetermined value; the noise muting cancel parameter-setting means sets the clamp coefficient of said noise muting cancel parameter to any value between 0 and 0.7 based on the comparison result by said field/disturbance information-comparing means and the comparison result from said modulation information-comparing means;

the noise muting cancel means utilizes said noise data and said set noise muting cancel parameter with respect to the given signal output from said tuner section to suppress or remove the noise contained in said given signal; and the output means obtains and-outputs the output signal from said noise muting cancel means.

Thereby, for example, when the modulation information-detecting means detects that the modulation degree of the modulation signal is small, it is so controlled that the clamp coefficient of the noise muting cancel parameter is set to any value between 0 to 0.7 to be output to said noise muting cancel means, and to exert substantially the muting characteristic and suppress the level of the noise-containing signal itself, whereby the noise suppression or removal can be made more efficiently.

In the 30th invention, the antenna obtains the signal to be modulated; the tuner section obtains the signal from said antenna, detects and outputs a given signal; the field/disturbance information-detecting means detects field/disturbance informations relating to the carrier level and the disturbed degree of said signal to be modulated from said tuner section, and outputs the field/disturbance informations; the modulation information-detecting means detects the modulation informations relating to the modulation degree of said signal to be modulated and/or the stereo pilot signal level from said tuner section, and outputs said modulation informations; the car speed-detecting means detects the moving speed of an automobile loaded with said antenna; the noise suppression control means controls the suppression or-removal of the noise contained in said given signal by considering the car speed detected by said car speed-detecting means, when the control is performed with respect to the given signal output from said tuner section, based on said field/disturbance informations to be output and said modulation informations to be output; and the output means obtains and outputs the output signal from said noise suppression control means.

Thereby, for example, when it is detected that the car speed is faster than the predetermined value, it is so controlled that the suppression or removal of the noise contained in the given signal is more emphasized than the case where the car speed is slower than the predetermined value, whereby the noise suppression or removal can be made more efficiently.

In the 31st invention, the antenna obtains the signal to be modulated; the tuner section obtains the signal from said antenna, detects and outputs a given signal; the field/disturbance information-detecting means for detecting field/disturbance informations relating to the carrier level and the disturbed degree of said signal to be modulated from said tuner section; the modulation information-detecting means detects the modulation informations relating to the modulation degree of said signal to be modulated and/or the stereo pilot signal level from said tuner section, and outputs said modulation informations; the car speed-detecting means detects the moving speed of an automobile loaded with said antenna; the muting characteristic variable means determines the muting characteristic of said given signal output from said tuner section by considering the car speed detected by said car speed-detecting means, when the detection is performed based on said field/disturbance informations to be output and said modulation informations to be output, and utilizes said determined muting characteristic to suppress the noise feeling in the audibility with respect to said given signal output from said tuner section; and the output means obtains and outputs the output signal from said muting characteristic variable means.

Thereby, for example, when it is detected that the car speed is faster than the predetermined value, it is so controlled that the suppression of the level itself of the noise-containing signal is more emphasized than the case where the car speed-is slower than the predetermined value, whereby the noise suppression or removal can be made more efficiently.

In the 32nd invention, the input means obtains a signal to be modulated in a transfer system of a stereo signal; the tuner section obtains the signal from said input means, detects and outputs a plurality of given signals;

the sum signal-preparing means sums up said respective signals output from said tuner section and prepares a sum signal; the difference signal-preparing means takes the difference between said respective signals output from said tuner section and prepares a difference signal; the field/disturbance information-detecting means detects field/disturbance informations relating to the carrier level and the disturbed degree of said signal to be modulated from said tuner section; the sum signal noise cancel means suppresses or removes the noise with respect to said sum signal;

the difference signal noise cancel means suppresses or removes the noise with respect to said difference signal; the noise cancel control means controls said sum signal noise cancel means and said difference signal noise cancel means, based on said field/disturbance informations from said field/disturbance information-detecting means; the separation control means sets the separation degree of said plurality of given signals based on said field/disturbance information from said field/disturbance information-detecting means; and the signal separation means separates said plurality of given signals from the sum signal and the difference signal in which the noise has been suppressed or removed by said noise cancel means, based on said separation degree to be set.

Thereby, for example, when the separation control means sets the separation degree, said separation degree is set based on the field/disturbance informations, whereby the noise suppression or removal can be made more efficiently compared to the case where the field/disturbance informations are not considered.

In the 34th invention, the input means obtains a signal to be modulated in a transfer system of a stereo signal; the tuner section obtains the signal from said input means, detects and outputs a plurality of given signals; the sum signal-preparing means sums up said respective signals output from said tuner section and prepares a sum signal; the difference signal-preparing means takes the difference between said respective signals output from said tuner section and prepares a difference signal; the field/disturbance information-detecting means detects field/disturbance informations relating to the carrier level and the disturbed degree of said signal to be modulated from said tuner section; the sum signal noise cancel means suppresses or removes the noise with respect to said sum signal;

the difference signal noise cancel means suppresses or removes the noise with respect to said difference signal; the noise cancel control means controls said sum signal noise cancel means and said difference signal noise cancel means, based on said field/disturbance informations, and sets the noise cancel parameter based on said field/disturbance informations; the separation control means sets the separation degree of said plurality of given signals based on said noise cancel parameter set by said noise cancel control means; and the signal separation means separates said plurality of given signals from the sum signal and the difference signal in which the noise has been suppressed or removed by said noise cancel means, based on said separation degree to be set.

Thereby, for example, since said separation degree is set based on the noise cancel parameter set by considering the field/disturbance informations, the noise suppression or removal can be made more efficiently compared to the case where the separation degree is not set based on such noise cancel parameter.

In the 38th invention, the antenna obtains the signal to be modulated; the front end obtains the signal from the antenna; the intermediate frequency-amplifying means amplifies the signal of the intermediate frequency from the output of said front end; the field/disturbance information-detecting means detects field/disturbance informations relating to the carrier level and the disturbed degree of said signal to be modulated from said intermediate frequency-amplifying means, and outputs the field/disturbance informations; the modulation information-detecting means detects the modulation informations relating to the modulation degree of said signal to be modulated and/or the stereo pilot signal level from said intermediate frequency-amplifying means, and outputs said modulation informations; the noise-generating means outputs the noise data based on at lease said field/disturbance informations to be output;

the field/disturbance information-comparing means compares said field/disturbance informations output from said field/disturbance information-detecting means with a predetermined value, and/or a modulation information-comparing means compares said modulation informations output from said modulation information-detecting means with other predetermined value;

the ignition noise-detecting means detects the ignition noise of the automobile loaded with said antenna; the noise muting cancel parameter-setting means sets the noise muting cancel parameter by considering said detected ignition noise, when the noise muting cancel parameter is set based on the comparison result by said field/disturbance information-comparing means and the comparison result from said modulation information-comparing means; the noise muting cancel means utilizes said noise data and said set noise muting cancel parameter to suppress or remove the noise contained in said given signal, with respect to the given signal output from said intermediate frequency-amplifying means; and the detection means inputs and detects the output signal from said noise muting cancel means.

Thereby, for example, the noise muting cancel parameter is set by considering said ignition noise, therefore the noise suppression or removal can be made more efficiently.

In the 39th invention, the input means obtains the signal to be modulated; the tuner section obtains the signal from said input means, detects and outputs a given signal; the power calculating means calculates the power of the signal after said signal to be modulated has been detected; the received information-detecting means detects a multipath signal; and the averaging means averages said power when said multipath signal does not exist, and outputs it as the modulation degree signal.

In the 41st invention, the input means obtains the signal to be modulated; the tuner section obtains the signal from said input means, detects and outputs a given signal; the received information-detecting means detects the received information from said tuner section; the noise generating means outputs the corresponding noise based on the detected received information; the power spectrum-analyzing means analyzes the power spectrum of the given signal output from said tuner section; the noise-subtracting means subtracts said noise output from the analyzed power spectrum; and the modulation degree-detecting means detects the modulation degree of the given signal output from said tuner section, based on the subtraction result of the noise-subtracting means.

Thereby, for example, since the modulation degree is calculated based on the result that the noise is subtracted from the power spectrum, the noise cancel parameter is set more accurately, and the noise suppression or removal can be made more efficiently.

In the 42nd invention, the input means obtains the signal to be modulated; the tuner section obtains the signal from said input means, detects and outputs a given signal; the received information-detecting means detects the received information from said tuner section; the noise generating means outputs the corresponding noise based on the detected received information; the power spectrum-analyzing means analyzes the power spectrum of the given signal output from said tuner section; the noise-subtracting means subtracts said noise output from the analyzed power spectrum; the modulation degree-detecting means detects the modulation degree of the given signal output from said tuner section, based on the subtraction result of the noise-subtracting means; the noise cancel parameter-setting means sets the noise cancel parameter, based on the detected modulation degree; the demodulation section demodulates the output from said tuner section; the noise cancel means utilizes said set noise cancel parameter and the noise information from said noise generating means to suppress or remove the noise contained in said demodulated signal, with respect to the signal demodulated by said demodulation section; and the output means outputs the output signal from the noise cancel means.

A noise suppressing device of the present invention 43 comprises:

a means for inputting the signal to be modulated;

a tuner section for obtaining the signal from said input means, detecting and outputting a given signal;

a field/disturbance information-detecting means for detecting a field/disturbance informations relating to the carrier level of said signal to be modulated and the disturbed degree of said signal to be modulated from said tuner section, and outputting the field/disturbance informations;

a receiver's noise-generating means for generating and outputting a receiver's residual noise data based on the information relating to said carrier level among said field/disturbance informations to be output;

a multipath-disturbing noise-generating means for generating and outputting a multipath-disturbing noise data based on the information relating to said disturbed degree among said field/disturbance informations to be output;

a noise mixer for utilizing said receiver's residual noise data to be output and said multipath-disturbing noise data to be output, mixing these noise data and outputting the mixed noise data;

a noise cancel means for utilizing said mixed noise data with respect to the given signal output from said tuner section and suppressing or removing the noise contained in said given signal; and an output means for obtaining and outputting the output signal from said noise cancel means.

A noise suppressing device of the present invention 44 according to said invention 43 is characterized in that mixing is to add said receiver's residual noise data to be output and said multipath-disturbing noise data to be output.

A noise suppressing device of the present invention 45 according to said invention 43 is characterized in that mixing is to select a noise data with larger noise level among said receiver's residual noise data to be output and said multipath-disturbing noise data to be output.

A noise suppressing device of the present invention 46 comprises:

a means for inputting a signal to be modulated in a transfer system of a stereo signal;

a tuner section for obtaining the signal from said input means, detecting and outputting a plurality of given signals;

a sum signal-preparing means for summing up said respective signals output from said tuner section and preparing a sum signal;

a difference signal-preparing means for taking the difference between said respective signals output from said tuner section and preparing a difference signal;

a field/disturbance information-detecting means for detecting a field/disturbance informations relating to the carrier level of said signal to be modulated and the disturbed degree of said signal to be modulated from said tuner section, and outputting the field/disturbance informations;

a receiver's sum signal noise-generating means for generating and outputting a receiver's residual sum signal noise data based on the information relating to said carrier level among said field/disturbance informations to be output;

a multipath-disturbing sum signal noise-generating means for generating and outputting a multipath-disturbing sum signal noise data based on the information relating to said disturbed degree among said field/disturbance informations to be output;

a sum signal noise mixer for utilizing said receiver's residual sum signal noise data to be output and said multipath-disturbing sum signal noise data to be output, mixing these noise data and outputting the mixed noise data;

a receiver's difference signal noise-generating means for generating and outputting a receiver's residual difference signal noise data based on the information relating to said carrier level among said field/disturbance informations to be output;

a multipath-disturbing difference signal noise-generating means for generating and outputting a multipath-disturbing difference signal noise data based on the information relating to said disturbed degree among said field/disturbance informations to be output;

a difference signal noise mixer for utilizing said receiver's residual difference signal noise data to be output and said multipath-disturbing difference signal noise data to be output, mixing these noise-data and outputting the mixed noise data, a sum signal noise cancel means for utilizing said noise data output from said sum signal noise mixer and suppressing or removing the noise contained in said sum signal;

a difference signal noise cancel means for utilizing said noise data output from said difference signal noise mixer and suppressing or removing the noise contained in said difference signal; and a signal separation means for separating said plurality of given signals based on the sum signal and the difference signal in which the noise is suppressed or removed.

A noise suppressing device of the present invention 47 comprises:

a means for inputting a signal to be modulated in a transfer system of a stereo signal;

a tuner section for obtaining the signal from said input means, detecting and outputting a plurality of given signals;

a sum signal-preparing means for summing up said respective signals output from said tuner section and preparing a sum signal;

a difference signal-preparing means for taking the difference between said respective signals output from said tuner section and preparing a difference signal;

a field/disturbance information-detecting means for detecting a field/disturbance informations relating to the carrier level of said signal to be modulated and the disturbed degree of said signal to be modulated from said tuner section, and outputting the field/disturbance informations;

a receiver's sum signal noise-generating means for generating and outputting a receiver's residual sum signal noise data based on the information relating to said carrier level among said field/disturbance informations to be output;

a multipath-disturbing sum signal noise-generating means for generating and outputting a multipath-disturbing sum signal noise data based on the information relating to said disturbed degree among said field/disturbance informations to be output;

a sum signal noise mixer for utilizing said receiver's residual sum signal noise data to be output and said multipath-disturbing sum signal noise data to be output, mixing these noise data and outputting the mixed noise data;

a sum signal noise cancel parameter-setting means for setting a sum signal noise cancel parameter based on said field/disturbance informations to be output;

a receiver's difference signal noise-generating means for generating and outputting a receiver's residual difference signal noise data based on the information relating to said carrier level among said field/disturbance informations to be output;

a multipath-disturbing difference signal noise-generating means for generating and outputting a multipath-disturbing difference signal noise data based on the information relating to said disturbed degree among said field/disturbance informations to be output;

a difference signal noise mixer for utilizing said receiver's residual difference signal noise data to be output and said multipath-disturbing difference signal noise data to be output, mixing these noise data and outputting the mixed noise data;

a difference signal noise cancel parameter-setting means for setting a difference signal noise cancel parameter based on said field/disturbance informations to be output;

a sum signal noise cancel means for suppressing or removing the noise contained in the sum signal with respect to said sum signal based on said set sum signal noise cancel parameter and the noise data output from said sum signal noise mixer;

a difference signal noise cancel means for suppressing or removing the noise contained in the difference signal with respect to said difference signal, based on said set difference signal noise cancel parameter and the noise data output from said difference signal noise mixer; and a signal separation means for separating said plurality of given signals based on the sum signal and the difference signal in which the noise is suppressed or removed.

A noise suppressing device of the present invention 48 according to said invention 46 or 47, is characterized in that mixing is to add said receiver's residual sum signal noise data to be output and said multipath-disturbing sum signal noise data to be output, with regard to said sum signal noise mixer, and is to add said receiver's residual difference signal noise data to be output and said multipath-disturbing difference signal noise data to be output, with regard to said sufferance signal noise mixer.

A noise suppressing device of the present invention 49 according to said invention 46 or 47, is characterized in that mixing is to select a noise data with larger noise level among said receiver's residual sum signal noise data to be output and said multipath-disturbing sum signal noise data to be output with regard to said sum signal noise mixer, and to select a noise data with larger noise level among said receiver's residual difference signal noise data to be output and said multipath-disturbing difference signal noise data to be output with regard to said difference signal noise mixer.

A noise suppressing device of the present invention 50 comprises:

a means for inputting a signal to be modulated;

a tuner section for obtaining the signal from said input means, detecting and outputting a given signal;

a field/disturbance information-detecting means for detecting a field/disturbance informations relating to the carrier level of said signal to be modulated and the disturbed degree of said signal to be modulated from said tuner section, and outputting the field/disturbance informations;

a receiver's noise-generating means for generating and outputting a receiver's residual noise data based on the information relating to said carrier level among said field/disturbance informations to be output;

a multipath-disturbing noise-generating means for generating and outputting a multipath-disturbing noise data based on the information relating to said disturbed degree among said field/disturbance informations to be output;

a noise mixer for mixing these noise data and outputting the mixed noise data, based on receiver's residual noise data to be output and said multipath-disturbing noise data to be output;

a mixing control means for controlling the way of mixing of said noise mixer based on said field/disturbance informations to be output;

a noise cancel means for utilizing said mixed noise data with respect to the given signal output from said tuner section to suppress or remove the noise contained in said given signal; and an output means for obtaining and outputting the output signal from said noise cancel means.

A noise suppressing device of the present invention 51 according to said invention 50 is characterized in that to control the way of mixing is to set a mixing coefficient as weighting to respective data of said receiver's residual noise data to be output and said multipath-disturbing noise data to be output, and control the value of the mixing coefficient.

A noise suppressing device of the present invention 52 comprises:

a means for inputting a signal to be modulated in a transfer system of a stereo signal;

a tuner section for obtaining the signal from said input means, detecting and outputting a plurality of given signals;

a sum signal-preparing means for summing up said respective signals output from said tuner section and preparing a sum signal;

a difference signal-preparing means for taking the difference between said respective signals output from said tuner section and preparing a difference signal;

a field/disturbance information-detecting means for detecting a field/disturbance informations relating to the carrier level of said signal to be modulated and the disturbed degree of said signal to be modulated from said tuner section, and outputting the field/disturbance informations;

a receiver's sum signal noise-generating means for generating and outputting a receiver's residual sum signal noise data based on the information relating to said carrier level among said field/disturbance informations to be output;

a multipath-disturbing sum signal noise-generating means for generating and outputting a multipath-disturbing sum signal noise data based on the information relating to said disturbed degree among said field/disturbance informations to be output;

a sum signal noise mixer for utilizing said receiver's residual sum signal noise data to be output and said multipath-disturbing sum signal noise data to be output, mixing these noise data and outputting the mixed noise data;

a sum signal mixing control means for controlling the way of mixing of said sum signal noise mixer based on said field/disturbance informations to be output;

a receiver's difference signal noise-generating means for generating and outputting a receiver's residual difference signal noise data based on the information relating to said carrier level among said field/disturbance informations to be output;

a multipath-disturbing difference signal noise-generating means for generating and outputting a multipath-disturbing difference signal noise data based on the information relating to said disturbed degree among said field/disturbance informations to be output;

a difference signal noise mixer for utilizing said receiver's residual difference signal noise data to be output and said multipath-disturbing difference signal noise data to be output, mixing these noise data and outputting the mixed noise data;

a difference signal mixing control means for controlling the way of mixing of said difference signal noise mixer based on said field/disturbance informations to be output;

a sum signal noise cancel means for suppressing or removing the noise contained in the sum signal with respect to said sum signal by utilizing the noise data output from said sum signal noise mixer;

a difference signal noise cancel means for suppressing or removing the noise contained in the difference signal with respect to said difference signal, by utilizing the noise data output from said difference signal noise mixer; and a signal separation means for separating said plurality of given signals based on the sum signal and the difference signal in which the noise is suppressed or removed.

A noise suppressing device of the present invention 53 comprises:

a means for inputting a signal to be modulated in a transfer system of a stereo signal;

a tuner section for obtaining the signal from said input means, detecting and outputting a plurality of given signals;

a sum signal-preparing means for summing up said respective signals output from said tuner section and preparing a sum signal;

a difference signal-preparing means for taking the difference between said respective signals output from said tuner section and preparing a difference signal;

a field/disturbance information-detecting means for detecting a field/disturbance informations relating to the carrier level of said signal to be modulated and the disturbed degree of said signal to be modulated from said tuner section, and outputting the field/disturbance informations;

a receiver's sum signal noise-generating means for generating and outputting a receiver's residual sum signal noise data based on the information relating to said carrier level among said field/disturbance informations to be output;

a multipath-disturbing sum signal noise-generating means for generating and outputting a multipath-disturbing sum signal noise data based on the information relating to said disturbed degree among said field/disturbance informations to be output;

a sum signal noise mixer for utilizing said receiver's residual sum signal noise data to be output and said multipath-disturbing sum signal noise data to be output, mixing these noise data and outputting the mixed noise data;

a sum signal mixing control means for controlling the way of mixing of said sum signal noise mixer based on said field/disturbance informations to be output;

a sum signal noise cancel parameter-setting means for setting a sum signal noise cancel parameter based on said field/disturbance informations to be output;

a receiver's difference signal noise-generating means for generating and outputting a receiver's residual difference signal noise data based on the information relating to said carrier level among said field/disturbance informations to be output;

a multipath-disturbing difference signal noise-generating means for generating and outputting a multipath-disturbing difference signal noise data based on the information relating to said disturbed degree among said field/disturbance informations to be output;

a difference signal noise mixer for utilizing said receiver's residual difference signal noise data to be output and said multipath-disturbing difference signal noise data to be output, mixing these noise data and outputting the mixed noise data;

a difference signal mixing control means for controlling the way of mixing of said difference signal noise mixer based on said field/disturbance informations to be output;

a difference signal noise cancel parameter-setting means for setting a difference signal noise cancel parameter based on said field/disturbance informations to be output;

a sum signal noise cancel means for suppressing or removing the noise contained in the sum signal with respect to said sum signal based on said set sum signal noise cancel parameter and the noise data output from said sum signal noise mixer;

a difference signal noise cancel means for suppressing or removing the noise contained in the difference signal with respect to said difference signal, based on said set difference signal noise cancel parameter and the noise data output from said difference signal noise mixer; and a signal separation means for separating said plurality of given signals based on the sum signal and the difference signal in which the noise is suppressed or removed.

A noise suppressing device of the present invention 54 according to said invention 50, 52 or 53, comprises a modulated information-detecting means for detecting the modulated information relating to the modulation degree of said signal to be modulated and/or the stereo pilot signal level of said signal to be modulated from said tuner section, and outputting the modulated information;

wherein said sum signal mixing control means and said difference signal mixing control means utilize said modulated information to be output to perform said control, respectively.

A noise suppressing device of the present invention 55 according to said invention 53 or 54, is characterized in that said sum signal noise cancel parameter-setting means alsoutilizes the output from said sum signal mixing control means to set said sum signal noise cancel parameter, and said difference signal noise cancel parameter-setting means also utilizes the output from said difference signal mixing control means to set said difference signal noise cancel parameter.

A noise suppressing device of the present invention 56 according to any one of said inventions 52 to 54, is characterized in that to control the way of mixing is to adjust a mixing coefficient as weighting to respective data of said receiver's sum signal noise data to be output and said multipath-disturbing sum signal noise data to be output with regard to said sum signal noise mixer, and to adjust a mixing coefficient as weighting to respective data of said receiver's difference signal noise data to be output and said multipath-disturbing difference signal noise data to be output with regard to said difference signal noise mixer.

A noise suppressing device of the present invention 57 comprises:

a means for inputting a signal to be modulated;

a tuner section for obtaining the signal from said input means, detecting and outputting a given signal;

a field/disturbance information-detecting means for detecting at least a field/disturbance informations relating to the disturbed degree of said signal to be modulated from said tuner section, and outputting the field/disturbance informations;

a multipath-disturbing noise-generating means for generating and outputting a multipath-disturbing noise data based on the information relating to said disturbed degree to be output;

a multipath-disturbing noise cancel parameter-generating means for generating a multipath-disturbing noise cancel parameter based on the information relating to said disturbed degree;

a noise cancel means for utilizing said generated multipath-disturbing noise data and said generated multipath-disturbing noise cancel parameter with respect to the given signal output from said tuner section to suppress or remove the noise contained in said given signal; and an output means for obtaining and outputting the output signal from said noise cancel means.

A noise suppressing device of the present invention 58 comprises:

a means for inputting a signal to be modulated;

a tuner section for obtaining the signal from said input means, detecting and outputting a given signal;

a field/disturbance information-detecting means for detecting at least a field/disturbance information relating to the carrier level of said signal to be modulated from said tuner section, and outputting the field/disturbance informations;

a receiver's noise-generating means for generating and outputting a receiver's residual noise data based on the information relating to said carrier level to be output; a receiver's noise cancel parameter-generating means for generating a receiver's noise cancel parameter based on the information relating to said carrier level;

a noise cancel means for utilizing said generated receiver's residual noise data and said generated receiver's noise cancel parameter with respect to the given signal output from said tuner section to suppress or remove the noise contained in said given signal; and an output means for obtaining and outputting the output signal from said noise cancel means.

A noise suppressing device of the present invention 59 comprises:

a means for inputting a signal to be modulated;

a tuner section for obtaining the signal from said input means, detecting and outputting a given signal;

a field/disturbance information-detecting means for detecting the field information relating to the carrier level and the disturbance information relating to the disturbed degree of said signal to be modulated from said tuner section, and outputting these informations;

a multipath-disturbing noise-generating means for generating and outputting a multipath-disturbing noise data based on said disturbance information;

a multipath-disturbing noise cancel parameter-generating means for generating a multipath-disturbing noise cancel parameter based on said disturbance information;

a receiver's noise-generating means for generating and outputting a receiver's residual noise data based on said field information;

a receiver's noise cancel parameter-generating means for generating a receiver's noise cancel parameter based on said field information;

a noise mixer for utilizing said multipath-disturbing noise data to be output and said receiver's residual noise data to be output, mixing these noise data and outputting the mixed noise data;

a noise parameter mixer for utilizing said multipath-disturbing noise cancel parameter to be output and said receiver's residual noise cancel parameter to be output, mixing these cancel parameters and outputting the mixed cancel parameters;

a noise cancel means for utilizing said mixed noise data and said mixed cancel parameter with respect to the given signal output from said tuner section and suppressing or removing the noise contained in said given signal; and an output means for obtaining and outputting the output signal from said noise cancel means.

A noise suppressing device of the present invention 60 according to said invention 47 is characterized in that the sum signal noise cancel parameter-setting means has a multipath-disturbing sum signal noise cancel parameter-generating means for generating a multipath-disturbing sum signal noise cancel parameter based on the disturbance information relating to said disturbed degree among said field/disturbance informations; and a receiver's sum signal noise cancel parameter-generating means for generating a receiver's sum signal noise cancel parameter based on the field information relating to said carrier level among said field/disturbance informations;

said difference signal noise cancel parameter-setting means has a multipath-disturbing difference signal noise cancel parameter-generating means for generating a multipath-disturbing difference signal noise cancel parameter based on said disturbance information; and a receiver's difference signal noise cancel parameter-generating means for generating a receiver's difference signal noise cancel parameter based on said field information; and the noise suppressing means includes a sum signal noise parameter mixer for utilizing said receiver's sum signal noise cancel parameter to be output and said multipath-disturbing sum signal noise cancel parameter to be output, mixing these cancel parameters and outputting the mixed cancel parameters; and a difference signal noise parameter mixer for utilizing said receiver's difference signal noise cancel parameter to be output and said multipath-disturbing difference signal noise cancel parameter to be output, mixing these cancel parameters and outputting the mixed cancel parameters;

said sum signal noise cancel means being to input the mixed cancel parameter output from said sum signal noise parameter mixer, and said difference signal noise cancel means being to input the mixed cancel parameter output from said difference signal noise parameter mixer, to suppress or remove said noise.

A noise suppressing device of the present invention 61 according to any one of said inventions 57, 58 or 59, is characterized in that the frequency band of the signal detected by said tuner section is preliminarily divided on a given basis, and the multipath-disturbing noise cancel parameter or said receiver's noise cancel parameter are set to the given values for every divided band.

A noise suppressing device of the present invention 62 according to said invention 60 is characterized in that the receiver's sum signal noise cancel parameter-generating means has a receiver's sum signal noise cancel parameter table for preliminarily storing said generated cancel parameter, the frequency band of the signal detected by said tuner section being preliminarily divided on a given basis, and the stored cancel parameter being set to the given value for every divided band;

the receiver's difference signal noise cancel parameter-generating means has a receiver's difference signal noise cancel parameter table for preliminarily storing said generated cancel parameter, the frequency band of the signal detected by said tuner section being divided on the same or different basis with said given basis, and the stored cancel parameter being set to the same or different value with said given value for every divided band;

the multipath-disturbing sum signal noise cancel parameter-generating means has a multipath-disturbing sum signal noise cancel parameter table for preliminarily storing said generated cancel parameter, the frequency band of the signal detected by said tuner section being divided on the other given basis, and the stored cancel parameter being set to the other given value for every divided band;

the multipath-disturbing difference signal noise cancel parameter-generating means has a multipath-disturbing difference signal noise cancel parameter table for preliminarily housing said generated cancel parameter, the frequency band of the signal detected by said tuner section being divided on the same or different basis with said other given basis, and the stored cancel parameter being set to the same or different value with said other given value for every divided band.

A noise suppressing device of the present invention 63 according to said invention 59 is characterized in that mixing of the noise data is to select the noise data with larger noise level among said multipath-disturbing noise data to be output and said receiver's residual noise data to be output; and mixing of said cancel parameter is to select a smaller cancel parameter in the case of the clamp coefficient, and to select a larger cancel parameter in the case of the cancel coefficient, among said multipath-disturbing noise cancel parameter to be output and said receiver's residual noise cancel parameter to be output.

A noise suppressing device of the present invention 64 comprises:

a low gain antenna for obtaining a signal to be modulated;

a tuner section for obtaining the signal from said low gain antenna to detect and output a given signal;

a field/disturbance information-detecting means for detecting the field/disturbance informations relating to the carrier level of said signal to be modulated and/or the disturbed degree of said signal to be modulated from said tuner section, and outputting the field/disturbance informations;

a noise data-generating means for inputting said field/disturbance informations to be output, generating a noise data based on the field/disturbance informations, and outputting the generated noise data;

a noise cancel means for utilizing said noise data with respect to the given signal output from said tuner section to suppress or remove the noise contained in said given signal; and an output means for obtaining and outputting the output signal from said noise cancel means.

A noise suppressing device of the present invention 65 comprises:

a means for inputting a signal to be modulated;

a tuner section for obtaining the signal from said input means, detecting and outputting a given signal;

a field/disturbance information-detecting means for detecting the field/disturbance informations relating to the carrier level of said signal to be modulated and/or the disturbed degree of said signal to be modulated from said tuner section, and outputting the field/disturbance informations;

a noise data-generating means for utilizing the noise data stored in the given noise table based on the field/disturbance informations to generate the noise data and outputting the generated noise data;

a noise data shift control means for performing the adjustment of the given volume with respect to the noise data, when said noise data-generating means utilizes the noise data in said noise table;

a noise cancel means for utilizing the noise data output from said noise data-generating means with respect to the given signal output from said tuner section to suppress or remove the noise contained in said given signal;

a noise detecting means for detecting the noise level of the noise existing in the output signal of the noise cancel means; and a shift volume-determining means for determining said given volume so that said detected noise level becomes smaller, according to the noise level detected by the noise detecting means, and transmitting the determined given volume to said noise data shift control means.

A noise suppressing device of the present invention 66 comprises:

a means for inputting a signal to be modulated;

a tuner section for obtaining the signal from said input means, detecting and outputting a given signal;

a field/disturbance information-detecting means for detecting the field/disturbance informations relating to the carrier level of said signal to be modulated and/or the disturbed degree of said signal to be modulated from said tuner section, and outputting the field/disturbance information;

a noise data-generating means for utilizing the noise data stored in the given noise table based on the field/disturbance information to generate the noise data and outputting the generated noise data;

a noise data shift control means for performing the adjustment of the given amount with respect to the noise data, when said noise data-generating means utilizes the noise data in said noise table;

a noise cancel means for utilizing the noise data output from said noise data-generating means with respect to the given signal output from said tuner section to suppress or remove the noise contained in said given signal;

a S/N ratio-detecting means for detecting the S/N ratio from the output signal of said noise cancel means; and a shift volume-determining means for determining said given amount so that said detected S/N ratio becomes larger, according to the S/N ratio detected by said S/N ratio-detecting means, and transmitting the determined given amount to said noise data shift control means.

A noise suppressing device of the present invention 67 comprises:

a means for inputting a signal to be modulated;

a tuner section for obtaining the signal from said input means, amplifying and outputting a signal of an intermediate frequency;

a field/disturbance information-detecting means for detecting the field/disturbance informations relating to the carrier level of said signal to be modulated and/or the disturbed degree of said signal to be modulated from said tuner section, and outputting the field/disturbance information;

a detection means for inputting the signal from said tuner section and detecting a given signal;

a detection output noise data-generating means for generating and outputting a detection output noise data based on said field/disturbance informations;

a noise cancel means for utilizing said detection output noise data to be output to suppress or remove the noise contained in said detected given signal, and outputting a signal in which the noise has been suppressed or removed; and a demodulating means for demodulating the signal output from said noise cancel means.

A noise suppressing device of the present invention 68 comprises:

a memory for storing the program to execute at least noise suppressing control and/or acoustic field control;

a processing means for sampling and outputting a program in said memory according to the noise characteristic contained in the input signal; and a digital signal processor for inputting said output program and executing said noise suppressing control and/or acoustic field control to said input signal, based on said input program.

A noise suppressing device of the present invention 69 according to said invention 68 includes a muting means for muting in order to suppress or remove the shock noise generated due to the input of said program, inside of said digital signal processor and/or at the lower stage than the output section of the digital signal processor, when said program is input to the digital signal processor.

A noise suppressing device of the present invention 70 comprises:

a means for inputting a signal to be modulated;

a detection means for inputting the signal from said input means and detecting a given signal;

a noise generating means for generating and outputting a noise data so adjusted that the higher becomes the frequency of said given signal, the larger becomes the noise level of the noise data corresponding to the frequency;

a noise cancel means for utilizing said noise data to be output to suppress or remove the noise contained in said detected given signal, and outputting the signal in which the noise has been suppressed or removed; and a demodulating means for demodulating the signal output from said noise cancel means.

A noise suppressing device of the present invention 71 comprises:

a means for inputting a signal to be modulated;

a detection means for inputting the signal from said input means and detecting a given signal;

a signal separation means for separating said detected given signal based on the predetermined standard;

a plurality of noise cancel means for suppressing or removing the noise contained in the signal based on the separation signal separated by said signal separation means, and outputting a signal in which the noise has been suppressed or removed; and a demodulating means for demodulating based on the signal output from said noise cancel means.

A noise suppressing device of the present invention 72 according to said invention 71 is characterized in that the signal to be modulated is a signal to be modulated in the transmitting system of a stereo signal;

said signal separation means separates the output signal from said detecting means into the sum signal, the difference signal and the pilot signal;

said plurality of noise cancel means have a sum signal noise cancel means for inputting said separated sum signal, a difference signal noise cancel means for inputting said separated difference signal, and a pilot signal noise cancel means for inputting said separated pilot signal; and the noise suppressing means includes a signal mixing means for mixing respective signals output from said plurality of noise cancel means;

said demodulating means inputting the mixed signal output from said signal mixing means to perform said demodulation.

A noise suppressing device of the present invention 73 according to said invention 72 comprises:

a front end for obtaining the signal from the input means;

an intermediate frequency amplifying means for amplifying the signal of the intermediate frequency from the output of said front end and outputting it to said detecting means; and a received information-detecting means for detecting the field/disturbance informations relating to the carrier level of said signal to be modulated and/or the disturbed degree of said signal to be modulated from said intermediate frequency amplifying-means, and detecting the modulation information relating to the modulation degree of said signal to be modulated and/or the stereo pilot signal level of said signal to be modulated from said intermediate frequency amplifying means or said detecting means, and outputting these informations; wherein said noise cancel means suppresses or removes the noise based on said informations output from said received information-detecting means, respectively.

A noise suppressing device of the present invention 74 according to said invention 72 comprises:

a front end for obtaining the signal from the input means;

an intermediate frequency amplifying means for amplifying the signal of the intermediate frequency from the output of said front end and outputting it to said detecting means; and a received information-detecting means for detecting the field/disturbance informations relating to the carrier level of said signal to be modulated and/or the disturbed degree of said signal to be modulated from said intermediate frequency amplifying means, and detecting the modulation information relating to the modulation degree of said signal to be modulated and/or the stereo pilot signal level of said signal to be modulated from said intermediate frequency amplifying means;

a receiver's sum signal noise-generating means for generating and outputting a receiver's residual sum signal noise data based on the information relating to said carrier level, among the field/disturbance informations output from said receiver's information-detecting means;

a multipath-disturbing sum signal noise-generating means for generating and outputting a multipath-disturbing sum signal noise data based on the information output from said receiver's information-detecting means;

a sum signal noise mixer for utilizing the receiver's residual sum signal noise data to be output and said multipath-disturbing sum signal noise data to be output, mixing these noise data and outputting the mixed noise data;

a receiver's difference signal noise-generating means for generating and outputting a receiver's residual difference signal noise data based on the information relating to said carrier level, among the field/disturbance informations output from said receiver's information-detecting means;

a multipath-disturbing difference signal noise-generating means for generating and outputting a multipath-disturbing difference signal noise data based on the information output from said receiver's information-detecting means;

a difference signal noise mixer for utilizing the receiver's residual difference signal noise data to be output and said multipath-disturbing difference signal noise data to be output, mixing these noise data and outputting the mixed noise data; and a pilot signal noise mixer for utilizing the output from said sum signal noise-mixer and the output from said difference signal noise mixer, mixing these noise data and outputting the mixed noise data; wherein said sum signal noise cancel means utilizes the output from said sum signal noise mixer, and said difference signal noise cancel means utilizes the output from said difference signal noise mixer, and said pilot signal noise cancel means utilizes the output from said pilot signal noise mixer, to suppress or remove said noises, respectively.

A noise suppressing device of the present invention 75 according to said invention 72 comprises:

a front end for obtaining the signal from the input means;

an intermediate frequency amplifying means for amplifying the signal of the intermediate frequency from the output of said front end and outputting it to said detecting means; and a received information-detecting means for detecting the field/disturbance informations relating to the carrier level of said signal to be modulated and/or the disturbed degree of said signal to be modulated from said intermediate frequency amplifying means, and detecting the modulation information relating to the modulation degree of said signal to be modulated and/or the stereo pilot signal level of said signal to be modulated from said intermediate-frequency amplifying means;

a receiver's sum signal noise-generating means for generating and outputting a receiver's residual sum signal noise data based on the information relating to said carrier level, among the field/disturbance informations output from said receiver's information-detecting means;

a multipath-disturbing sum signal noise-generating means for generating and outputting a multipath-disturbing sum signal noise data based on the information output from said receiver's information-detecting means;

a sum signal noise mixer for utilizing the receiver's residual sum signal noise data to be output and said multipath-disturbing sum signal noise data to be output, mixing these noise data and outputting the mixed noise data;

a sum signal noise cancel parameter-setting means for setting a sum signal noise cancel parameter based on the information output from said received information-detecting means;

a receiver's difference signal noise-generating means for generating and outputting a receiver's residual difference signal noise data based on the information relating to said carrier level, among the field/disturbance informations output from said receiver's information-detecting means;

a multipath-disturbing difference signal noise-generating means for generating and outputting a multipath-disturbing difference signal noise data based on the information output from said receiver's information-detecting means;

a difference signal noise mixer for utilizing the receiver's residual difference signal noise data to be output and said multipath-disturbing difference signal noise data to be output, mixing these noise data and outputting the mixed noise data; and a difference signal noise cancel parameter-setting means for setting a difference signal noise cancel parameter based on the information output from said received information-detecting means;

a pilot signal noise mixer for utilizing the output from said sum signal noise mixer and the output from said difference signal noise mixer, mixing these noise data and outputting the mixed noise data; and a pilot signal noise cancel parameter-setting means for setting the pilot signal noise cancel parameter based on the information output from said received information-detecting means; wherein said sum signal noise cancel means utilizes said set sum signal noise cancel parameter and the output from said sum signal noise mixer, said difference signal noise cancel means utilizes said set difference signal noise cancel parameter and the output from said difference signal noise mixer, and said pilot signal noise cancel means utilizes said set pilot signal noise cancel parameter and the output from said pilot signal noise mixer, to suppress or remove said noise, respectively.

A noise suppressing device of the present invention 76 comprises:

a means for inputting a signal to be modulated;

a frequency converting means which is provided on the poststage of said input means, and uses the input signal to be input as a reference based on the output signal from said input means to convert the signal so that the band width of the input signal and the value of the absolute frequency becomes smaller;

a noise cancel means for suppressing or removing the noise contained in the signal output from said frequency converting means and outputting the signal in which the noise has been suppressed or removed; and a frequency inversely converting means for substantially returning the signal data output from said noise cancel means to the state before the conversion and outputting it.

A noise suppressing device of the present invention 77 comprises:

a means for inputting a signal to be modulated;

a front end for obtaining the signal from said input means;

an intermediate frequency-amplifying means which is provided at the poststage of said front end, and amplifies and outputs the signal of the intermediate frequency;

a detecting means which is provided at the poststage of said intermediate frequency-amplifying means, and detects and outputs the given signal;

a frequency converting means for inputting said output signal from said front end, or said intermediate frequency-amplifying means, or said detecting means, and using the input signal as a reference to convert the signal so that the band width of the signal and the value of the absolute frequency becomes smaller;

a noise cancel means for suppressing or removing the noise contained in the signal output from said frequency converting means and outputting the signal in which the noise has been suppressed or removed;

a frequency inversely converting means for substantially returning the signal output from said noise cancel means to the state before the conversion and outputting it;

a noise generating means for generating and outputting the receiver's residual noise or the received radio wave-disturbing noise data;

a received information-detecting means for detecting the field/disturbance informations relating to the carrier level of said signal to be modulated and/or the disturbed degree of said signal to be modulated from said intermediate frequency-amplifying means, and detecting the modulation information relating to the modulation degree of said signal to be modulated and/or the stereo pilot signal level of said signal to be modulated from said intermediate frequency-amplifying means; and a noise cancel control means for controlling so that said noise data can be used based on the informations from said received information-detecting means, when said noise cancel means suppresses or removes said noise; wherein the output signal from said frequency inversely converting means is transmitted to said intermediate frequency-amplifying means when said frequency converting means inputs the signal output from said front end, and to said detecting means when said frequency converting means inputs the signal output from said intermediate frequency-amplifying means.

A noise suppressing device of the present invention 78 comprises:

a means for inputting a signal to be modulated;

a signal compressing means which is provided at the poststage of said input means, and using the input signal to be input based on the output signal from the input means to compress the data of the input signal;

a noise cancel means for suppressing or removing the noise contained in the signal output from said signal compressing means and outputting the signal in which the noise has been suppressed or removed; and a signal extending means for substantially returning the data of the signal output from said noise cancel means to the state before the compression and outputting it.

A noise suppressing device of the present invention 79 comprises:

a means for inputting a signal to be modulated;

a front end for obtaining the signal from said input means;

an intermediate frequency-amplifying means which is provided at the poststage of said front end, and amplifies and outputs the signal of the intermediate frequency;

a detecting means which is provided at the poststage of said intermediate frequency-amplifying means, and detects and outputs the given signal;

a signal compressing means for inputting said output signal from said front end, or said intermediate frequency-amplifying means, or said detecting means, and using the input signal as a reference to convert the signal so that the band width of the signal and the value of the absolute frequency becomes smaller;

a noise cancel means for suppressing or removing the noise contained in the signal output from said frequency converting means and outputting the signal in which the noise has been suppressed or removed;

a signal extending means for substantially returning the signal output from said noise cancel means to the state before the conversion and outputting it;

a noise generating means for generating and outputting the receiver's residual noise or the received radio wave-disturbing noise data;

a received information-detecting means for detecting the field/disturbance informations relating to the carrier level of said signal to be modulated and/or the disturbed degree of said signal to be modulated from said intermediate frequency-amplifying means, and detecting the modulation information relating to the modulation degree of said signal to be modulated and/or the stereo pilot signal level of said signal to be modulated from said intermediate frequency-amplifying means; and a noise cancel control means for controlling so that said noise data can be used based on the informations from said received information detecting means, when said noise cancel means suppresses or removes said noise; wherein the output signal from said signal extending means is transmitted to said intermediate frequency-amplifying means when said signal compressing means inputs the signal output from said front end, and to said detecting means when said signal compressing means inputs the signal output from said intermediate frequency-amplifying means.

A recording or reproducing device of the present invention 80 which compresses and records a signal, or reproduces and extends the compressed signal, wherein after the compression, the noise contained in the compressed data is suppressed or removed before being recorded, or after the reproduction, the noise contained in the reproduced compressed data is suppressed or removed before being extended.

A noise suppressing device of the present invention 81 comprises:

a plurality of tuner sections for obtaining the signal from the input section, and detecting and outputting the given signal;

an input switching means for obtaining the instruction which signal is to be selected among signals from said plurality of tuner sections, and outputting said signal to be selected based on the instruction;

a noise cancel means for suppressing or removing the noise contained in the signal output from said input switching means;

a plurality of noise generating means for generating and outputting the noise data corresponding to said respective tuner section;

a noise switching means for performing switching control so that the noise data to be selected is output among the noise data set by said plurality of noise generating means corresponding to said instruction;

a plurality of noise cancel parameter-setting means for setting the noise cancel parameter corresponding to said respective tuner sections; and a parameter switching means for performing switching control so that the noise cancel parameter to be selected is output among the noise cancel parameters set by said plurality of noise cancel parameter-setting means, corresponding to said instruction;

wherein said noise cancel means is so constituted to suppress or remove said noise, based on said noise data to be output and said noise cancel parameter to be output.

In the invention 43, the input means obtains a signal to be modulated, the tuner section obtains the signal from the input means, detects and outputs a given signal, the field/disturbance information-detecting means detects the field/disturbance informations relating to the carrier level and/or the disturbed degree of said signal to be modulated from the tuner section and outputs the field/disturbance informations, the receiver's noise generating means generates and outputs the receiver's residual noise data based on the information relating to said carrier level, among said field/disturbance informations to be output, the multipath-disturbing noise-generating means generates and outputs the multipath-disturbing noise data based on the information relating to said disturbed degree, among said field/disturbance informations to be output, the noise mixer utilizes said receiver's residual noise data to be output and said multipath-disturbing noise data to be output to mix these noise data and outputs the mixed noise data, the noise cancel means utilizes said mixed noise data with respect to the given signal output from said tuner section to suppress or remove the noise contained in said given signal, and the output means obtains and outputs the output signal from said noise cancel means.

In the invention 46, the input means obtains a signal to be modulated in a transfer system of a stereo signal, the tuner section obtains the signal from said input means, and detects and outputs a plurality of given signals, the sum signal-preparing means takes the sum of said respective signals output from said tuner section and prepares the sum signal, the difference signal-preparing means takes the difference between said respective signals output from said tuner section and prepares a difference signal, the field/disturbance information-detecting means detects and outputs the field/disturbance informations relating to the carrier level of said signal to be modulated and the disturbed degree of said signal to be modulated from said tuner section, the receiver's sum signal noise-generating means generates and outputs the receiver's residual sum signal noise data based on the information relating to said carrier level among said field/disturbance informations to be output, the multipath-disturbing sum signal noise-generating means generates and outputs the multipath-disturbing sum signal noise data based on the information relating to said disturbed degree among said field/disturbance informations to be output, the sum signal noise mixer utilizes said receiver's residual sum signal noise data to be output and said multipath-disturbing sum signal noise data to be output to mix these noise data and outputs the mixed noise data, the receiver's difference signal noise-generating means generates and outputs the receiver's residual difference signal noise data based on the information relating to said carrier level among said field/disturbance informations to be output, the multipath-disturbing difference signal noise-generating means generates and outputs the multipath-disturbing difference signal noise data based on the information relating to said disturbed degree among said field/disturbance informations to be output, the difference signal noise mixer utilizes said receiver's residual difference signal noise data to be output and said multipath-disturbing difference signal noise data to be output to mix these noise data and outputs the mixed noise data, the sum signal noise cancel means utilizes said noise data output from said sum signal noise mixer to suppress or remove the noise contained in said sum signal, the difference signal noise cancel means utilizes said noise data output from said difference signal noise mixer to suppress or remove the noise contained in said difference signal, and the signal separation means separates said plurality of given signals based on the sum signal and the difference signal in which the noise is suppressed or removed.

In the invention 50, the input means obtains a signal to be modulated; the tuner section obtains the signal from said input means, detects and outputs a given signal; the field/disturbance information-detecting means detects the field/disturbance informations relating to the carrier level and the disturbed degree of said signal to be modulated from said tuner section, and outputs the field/disturbance informations; the receiver's noise-generating means generates and outputs the receiver's residual noise data based on the information relating to said carrier level among said field/disturbance informations to be output; the multipath-disturbing noise-generating means generates and outputs the multipath-disturbing noise data based on the information relating to said disturbed degree among said field/disturbance informations to be output; the noise mixer mixes these noise data and outputs the mixed noise data, based on receiver's residual noise data to be output and said multipath-disturbing noise data to be output; the mixing control means controls the way of mixing of said noise mixer based on said field/disturbance informations to be output; the noise cancel means utilizes said mixed noise data with respect to the given signal output from said tuner section to suppress or remove the noise contained in said given signal; and the output means obtains and outputs the output signal from said noise cancel means.

In the invention 57, the input means obtains a signal to be modulated; the tuner section obtains the signal from said input means, detects and outputs a given signal; the field/disturbance information-detecting means detects at least a field/disturbance information relating to the disturbed degree of said signal to be modulated from said tuner section, and outputs the field/disturbance information; the multipath-disturbing noise-generating means generates and outputs the multipath-disturbing noise data based on the information relating to said disturbed degree to be output; the multipath-disturbing noise cancel parameter-generating means generates the multipath-disturbing noise cancel parameter based on the information relating to said disturbed degree; the noise cancel means utilizes said generated multipath-disturbing noise data and said generated multipath-disturbing noise cancel parameter with respect to the given signal output from said tuner section to suppress or remove the noise contained in said given signal; and the output means obtains and outputs the output signal from said noise cancel means.

In the invention 58, the input means obtains a signal to be modulated; the tuner section obtains the signal from said input means, detects and outputs a given signal; the field/disturbance information-detecting means detects at least a field/disturbance information relating to the carrier level of said signal to be modulated from said tuner section, and outputs the field/disturbance information; the receiver's noise-generating means generates and outputs the receiver's residual noise, data based on the information relating to said carrier level to be output; the receiver's noise cancel parameter-generating means generates the receiver's noise cancel parameter based on the information relating to said carrier level; the noise cancel means utilizes said generated receiver's residual noise data and said generated receiver's noise cancel parameter with respect to the given signal output from said tuner section to suppress or remove the noise contained in said given signal; and the output means obtains and outputs the output signal from said noise cancel means.

In the invention 64, the low gain antenna obtains a signal to be modulated; the tuner section obtains the signal from said low gain antenna to detect and output a given signal; the field/disturbance information-detecting means detects the field/disturbance informations relating to the carrier level and/or the disturbed degree of said signal to be modulated from said tuner section, and outputs the field/disturbance informations; the noise data-generating means inputs said field/disturbance informations to be output, generates the noise data based on the field/disturbance informations, and outputs the generated noise data; the noise cancel means utilizes said noise data with respect to the given signal output from said tuner section to suppress or remove the noise contained in said given signal; and the output means obtains and outputs the output signal from said noise cancel means.

In the invention 65, the input means obtains a signal to be modulated; the tuner section obtains the signal from said input means, detects and outputs a given signal; the field/disturbance information-detecting means detects the field/disturbance informations relating to the carrier level and/or the disturbed degree of said signal to be modulated from said tuner section, and outputs the field/disturbance informations; the noise data-generating means inputs said field/ disturbance informations to be output, and utilizes the noise data stored in the given noise table based on the field/disturbance informations to generate the noise data and outputs the generated noise data; the noise data shift control means performs the adjustment of the given volume with respect to the noise data, when said noise data-generating means utilizes the noise data in said noise table; the noise cancel means utilizes the noise data output from said noise data-generating means with respect to the given signal output from said tuner section to suppress or remove the noise contained in said given signal; the noise detecting means detects the noise level of the noise existing in the output signal of the noise cancel means; and the shift volume-determining means determines said given volume so that said detected noise level becomes smaller, according to the noise level detected by the noise detecting means, and transmits the determined given volume to said noise data shift control means.

In the invention 67, the input means obtains a signal to be modulated; the tuner section obtains the signal from said input means, amplifies and outputs a signal of an intermediate frequency; the field/disturbance information-detecting means for detecting the field/disturbance informations relating to the carrier level and/or the disturbed degree of said signal to be modulated from said tuner section, and outputs the field/disturbance informations; the detection means inputs the signal from said tuner section and detects a given signal; the detection output noise data-generating means generates and outputs a detection output noise data based on said field/disturbance informations; the noise cancel means utilizes said detection output noise data to be output to suppress or remove the noise contained in said detected given signal, and outputs a signal in which the noise has been suppressed or removed; and the demodulating means demodulates the signal output from said noise cancel means.

In the invention 68, the memory stores the program to execute at least noise suppressing control and/or acoustic field control; the processing means samples and outputs a program in said memory according to the noise characteristic contained in the input signal; and the digital signal processor inputs said output program and executes said noise suppressing control and/or acoustic field control to said input signal, based on said input program.

In the invention 70, the input means obtains a signal to be modulated; the detection means inputs the signal from said input means and detects a given signal; the noise generating means generates and outputs a noise data so adjusted that the higher becomes the frequency of said given signal, the larger becomes the noise level of the noise data corresponding to the frequency; the noise cancel means utilizes said noise data to be output to suppress or remove the noise contained in said detected given signal, and outputs the signal in which the noise has been suppressed or removed; and the demodulating means demodulates the signal output from said noise cancel means.

In the invention 71, the input means obtains a signal to be modulated; the detection means inputs the signal from said input means and detects a given signal; the signal separation means separates said detected given signal based on the predetermined standard; a plurality of noise cancel means suppress or remove the noise contained in the signal based on the separation signal separated by said signal separation means, and outputs a signal in which the noise has been suppressed or removed; and the demodulating means demodulates based on the signal output from said noise cancel means.

In the invention 76, the input means obtains a signal to be modulated; the frequency converting means is provided on the poststage of said input means, and uses the input signal to be input as a reference based on the output signal from said input means to convert the signal so that the band width of the input signal and the value of the absolute frequency becomes smaller; the noise cancel means suppresses or removes the noise contained in the signal output from said frequency converting means and outputs the signal in which the noise has been suppressed or removed; and the frequency inversely converting means substantially returns the signal data output from said noise cancel means to the state before the conversion and outputs it.

In the invention 78, the input means obtains a signal to be modulated; the signal compressing means is provided at the poststage of said input means, and uses the input signal to be input based on the output signal from the input means to compress the data of the input signal; the noise cancel means suppresses or removes the noise contained in the signal output from said signal compressing means and outputs the signal in which the noise has been suppressed or removed; and the signal extending means substantially returns the data of the signal output from said noise cancel means to the state before the compression and outputs it.

BRIEF DESCRIPTION OF THE DRAWING

FIG. 14 is a view illustrating the conventional stereo separation control.

FIG. 15 is a graph showing the relation among the separation degree and the multipath disturbance level and the modulation degree, when the modulation degree is also considered to determine the coefficient "a", in other embodiment according to the present invention.

DESCRIPTION OF THE REFERENCE NUMERAL

10 represents a tuner section,

20 represents an antenna,

30 represents a field/disturbance information-detecting means,

40 represents a receiver's noise-generating means,

50 represents a receiver's noise memory,

60 represents a multipath-disturbing noise-generating means,

70 represents a multipath noise memory,

80 represents a modulation information-detecting means,

90 represents a mixing control means, 100 represents a noise mixer,

110 represents a noise cancel means,

120 represents an amplifier,
130 represents a speaker.

DESCRIPTION OF THE PREFERRED EMBODIMENTS

The embodiments of the present invention will now be described with reference to the accompanied drawings.

Figure 1:
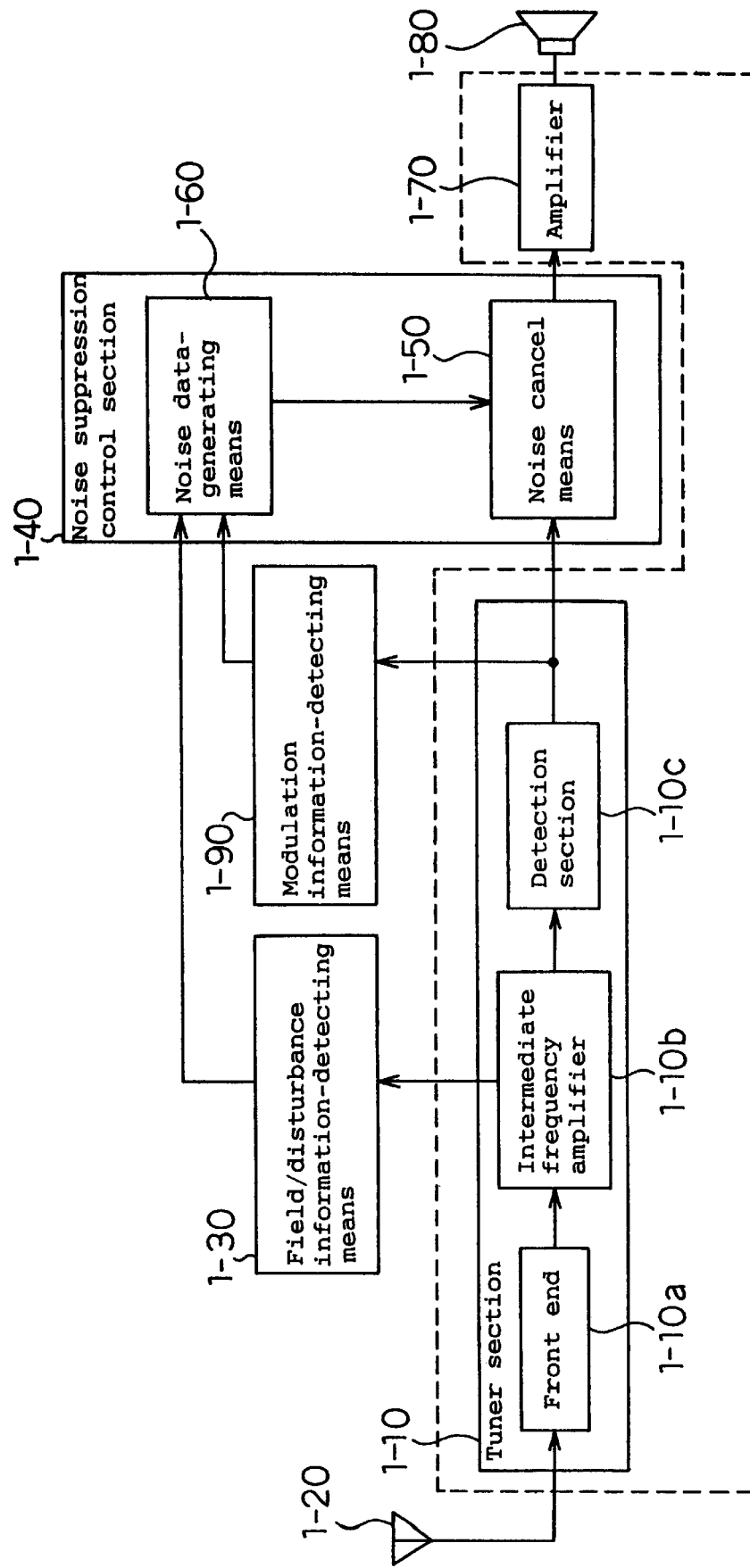
FIG. 1 is a structural view of the noise suppressing device of one embodiment according to the present invention.

FIG. 1 is a structural view of the noise suppressing means of one embodiment according to the present invention, and the structure and the action of the present embodiment will be described with reference to FIG. 1.

Namely, in FIG. 1, reference numeral 1-10 represents a tuner section which detects the radio wave and converts it to the electric signal, and 1-20 represents an antenna as the input means of the present invention connected to the tuner section 1-10. Tuner section 1-10 is further composed of a front end 1-10a, from the input side, an intermediate frequency amplifier 1-10b on the poststage, and a detection section 1-10c on the poststage thereof.

1-30 represents a field/disturbance information-detecting means which detects the carrier level of the input signal and the disturbed degree of the input signal as the field/disturbance informations of the present invention, based on the signal from the inside of the tuner section 1-10. Namely, the field/disturbance information-detecting means 1-30 detects the signal of the intermediate frequency which is the output of the intermediate frequency amplifier inside of the tuner section 1-10, and by analyzing the component of this signal, detects said field/disturbance informations, and sends the information to the noise data-generating means 1-60 described below. As the level of the disturbed degree of the input signal, the multipath disturbance and the ghost disturbance and the like are utilized.

1-90 is a modulation information-detecting means which detects the modulation degree and the stereo pilot signal level as the modulation information of the present invention, based on the signal from inside of the tuner section 1-10. Namely, the modulation information-detecting means 1-90 is so constituted to be able to detect the output of the detection section 1-10c within the tuner section 1-10 to determine the modulation degree by calculating the modulation power from the signal after the detection, or to detect the stereo pilot signal level from the input signal, when the input signal is the FM stereo signal.

1-40 is a noise suppression control section which suppresses or removes the noise from the noise-containing signal input from the tuner section 1-10. The noise suppression control section 1-40 is composed of a noise cancel means 1-50 and a noise data-generating means 1-60. When the noise data-generating means 1-60 inputs said field/disturbance informations and said modulation informations, and calculates the noise data from the field/disturbance informations, it performs the calculation by considering the input modulation informations and sends the obtained resultant noise data to the noise cancel means 1-50.

Here, the action to generate the noise data will be explained more concretely.

The noise data-generating means 1-60 obtains the multipath disturbance as the one showing said disturbed degree of the input signal from the field/disturbance information-detecting means 1-30, and according to the multipath disturbance level, takes said modulation degree and the stereo pilot signal level into consideration, when calculating the receiver's noise or the receiver's residual noise.

Figure 2:
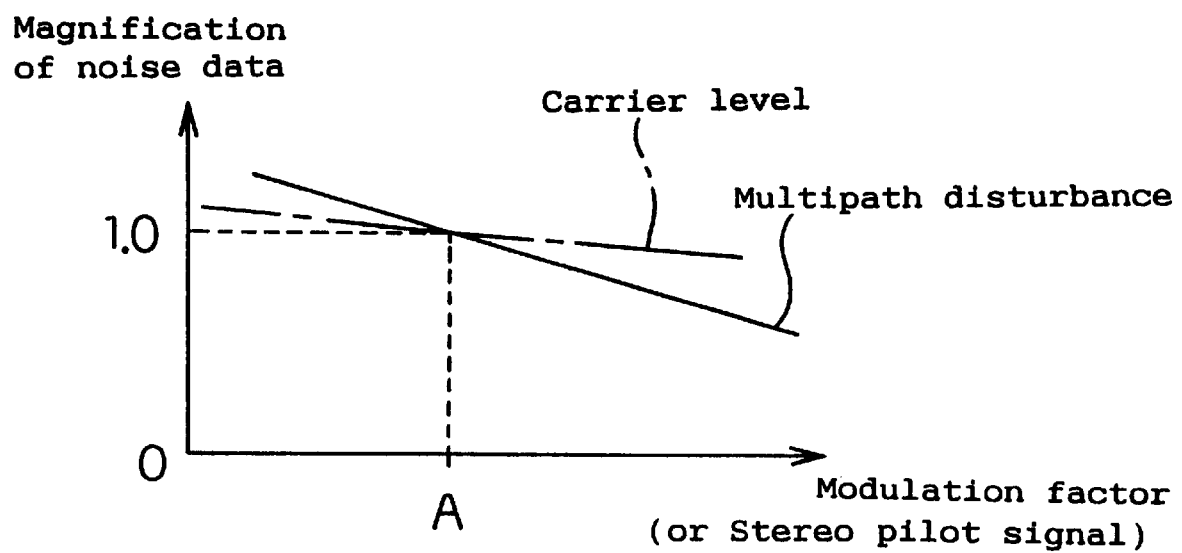
FIG. 2 is a graph showing the relation between the modulation degree and the noise data magnification of one embodiment according to the present invention, when the multipath disturbance is detected.

Namely, as shown in FIG. 2, when the multipath disturbance is detected, the noise data-generating means 1-60 makes the magnification of the noise data smaller than 1.0 as the modulation degree is larger than the predetermined value A, and makes the magnification of the noise data larger than 1.0 as the modulation degree is smaller than the predetermined value A. In addition, when the stereo pilot signal level is used, said magnification is similarly controlled, by changing the lateral axis in FIG. 2 from the modulation degree to the stereo pilot signal level.

Furthermore, when the noise data-generating means 1-60 obtains the carrier level from the field/disturbance information-detecting means 1-30, and calculates the receiver's noise or the receiver's residual noise according to the level, the modulation degree and the stereo pilot signal level are considered similarly as described. In FIG. 2, the carrier level is expressed by an one-dot chain line, and the multipath disturbance is expressed by a solid line.

Thus prepared noise data is subtracted from the noise-containing signal output from the tuner section 1-10 by the noise cancel means 1-50, and as a result, the signal in which the noise has been removed is output to the amplifier 1-70, amplified and sent to the speaker 1-80.

Thus, by controlling the magnification of the noise data, considering the modulation informations, the noise removal can be made more effectively and more efficiently compared to the case where the value of the noise data is utilized evenly.

Figure 3:
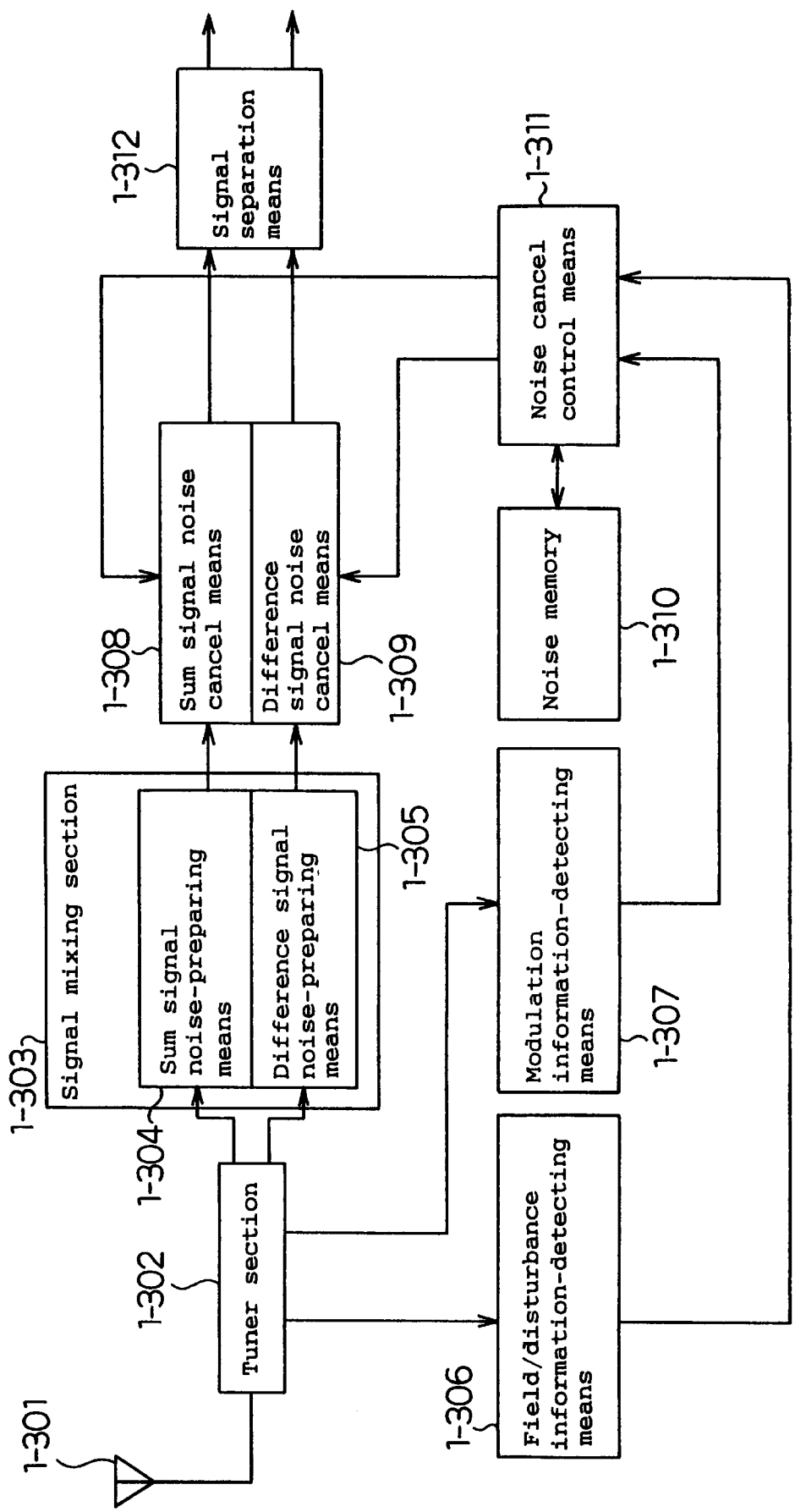
FIG. 3 is a structural view of the noise suppressing device of other embodiment according to the present invention.

FIG. 3 is a structural view of the noise suppressing device of other embodiment according to the present invention, and the structure and the action of the present embodiment will be described with reference to FIG. 3.

In FIG. 3, 1-301 is an antenna as the input means of the signal to be modulated in the transfer system of the stereo signal, and 1-302 is a tuner section which obtains the signal from the antenna 1-301 and detects and outputs R-signal and L-signal. 1-303 is a signal mixing section, and is composed of a sum signal-preparing means 1-304 which prepares the sum signal by summing up L-signal and R-signal output from the tuner section 1-302 and a difference signal-preparing means 1-305 which prepares the difference signal by taking the difference of L-signal and R-signal.

1-306 is a field/disturbance detecting means which detects and outputs the field/disturbance informations relating to the carrier level of said signal to be modulated and the disturbed degree of said signal to be modulated from the tuner section 1-302, and 1-307 is a modulation information-detecting means which detects and outputs the modulation informations relating to the modulation degree of said signal to be modulated and the stereo pilot signal level of said signal to be modulated from the tuner section 1-302.

1-308 is a sum signal noise cancel means to suppress or remove the noise with respect to said sum signal, and 1-309 is a difference signal noise cancel means to suppress or remove the noise with respect to said difference signal.

1-310 is a noise memory which preliminarily stores plural kinds of noise patterns, and 1-311 is a noise cancel control means which samples the noise pattern suitable for respective ones from the noise patterns within the noise memory 1-310, as the noise data used for suppressing or removing the noise contained in the sum signal, and the noise data used for suppressing or removing the noise contained in the difference signal, based on the output from the field/disturbance information-detecting means 1-306 and the output from the modulation information-detecting means 1-307, and control the sum signal noise cancel means 1-308 and the difference signal noise cancel means 1-309 by utilizing the cancel coefficient and the clamp coefficient as the noise cancel parameter.

Here, when the noise cancel parameter is set, if the modulation informations are considered, the noise removal can be made more effectively and more efficiently.

1-312 is a signal separation means to separate signals into L-signal and R-signal, based on the sum signal and the difference signal in which the noise has been suppressed or removed by these noise cancel means 1-308 and 1-309.

Thus separated L-signal and R-signal are sent to the speaker (not shown) via an amplifier (not shown) and the like.

According to the present embodiment, when the noise cancel control means control the difference signal noise cancel means and the sum signal noise cancel means, since the modulation degree is determined by calculating the modulation power from the signal after the detection at the tuner section and transferred to the noise cancel control means as the modulation information, by considering this information for setting the noise cancel parameter, the noise suppression or removal can be made more efficiently.

Figure 4:
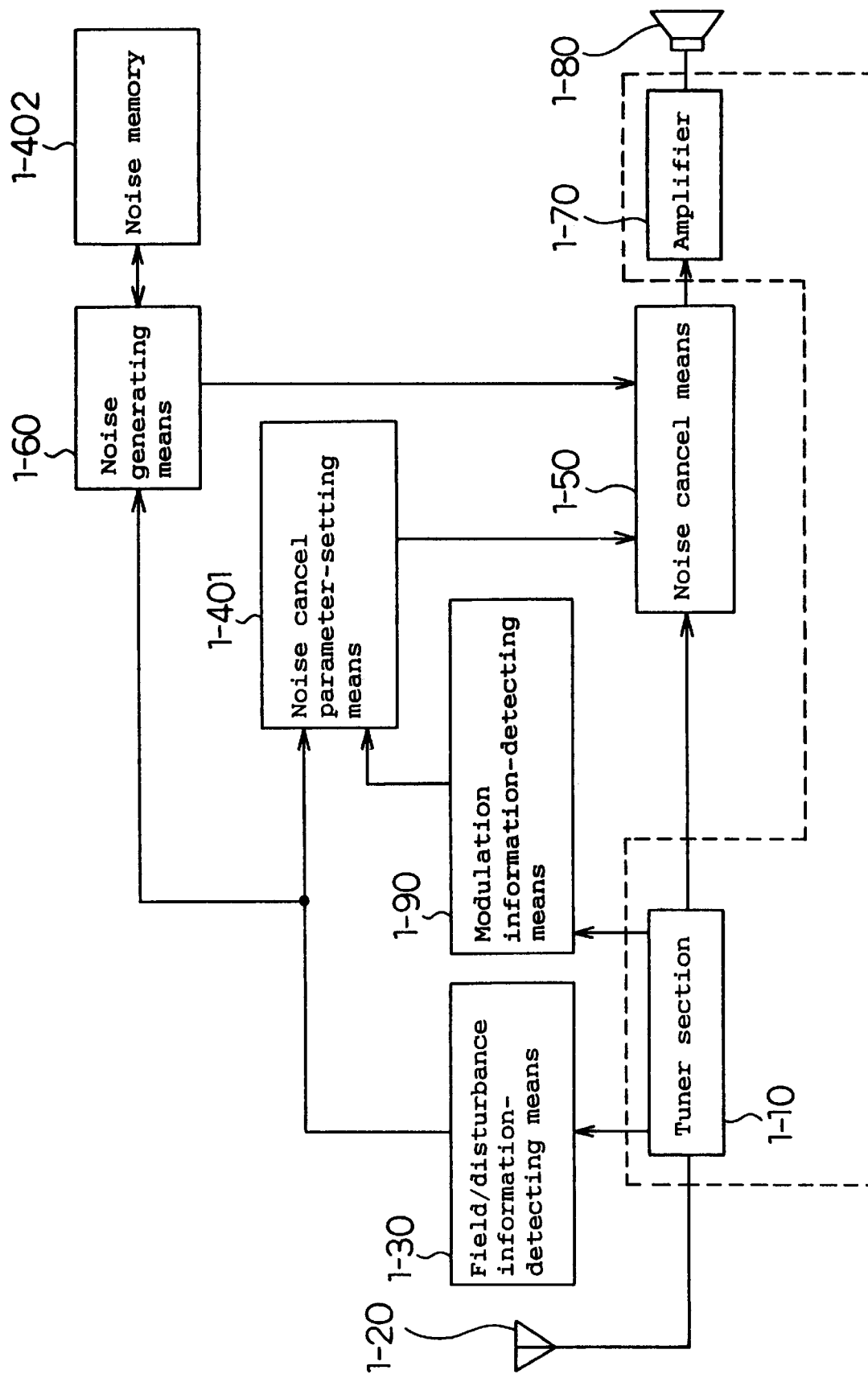
FIG. 4 is a structural view of the noise suppressing device of other embodiment according to the present invention.

FIG. 4 is a structural view of the noise suppressing device of the other embodiment according to the present invention, and the structure and the action of the present embodiment will be described with reference to FIG. 4.

The main structural difference between this embodiment and the above embodiment shown in FIG. 1 is that a noise cancel parameter-setting means 1-401 and a noise momory 1-402 are added.

In the present embodiment, as in the above embodiment, it is characterized in that when the noise cancel parameter is set, the magnification of the noise data is not controlled, but the modulation information is considered. Incidentally, the same reference numeral is given to the substantially similar parts as in FIG. 1, and the description thereof will be omitted.

Namely, in FIG. 4, 1-401 is a noise cancel parameter-setting means to set the cancel coefficient and the clamp coefficient as the noise cancel parameter, based on said field/disturbance informations from the field/disturbance information-detecting means 1-30 and the modulation informations from the modulation information-detecting means 1-90, and 1-402 is a noise momory to store plural kinds of noise patterns in advance.

Figure 5:
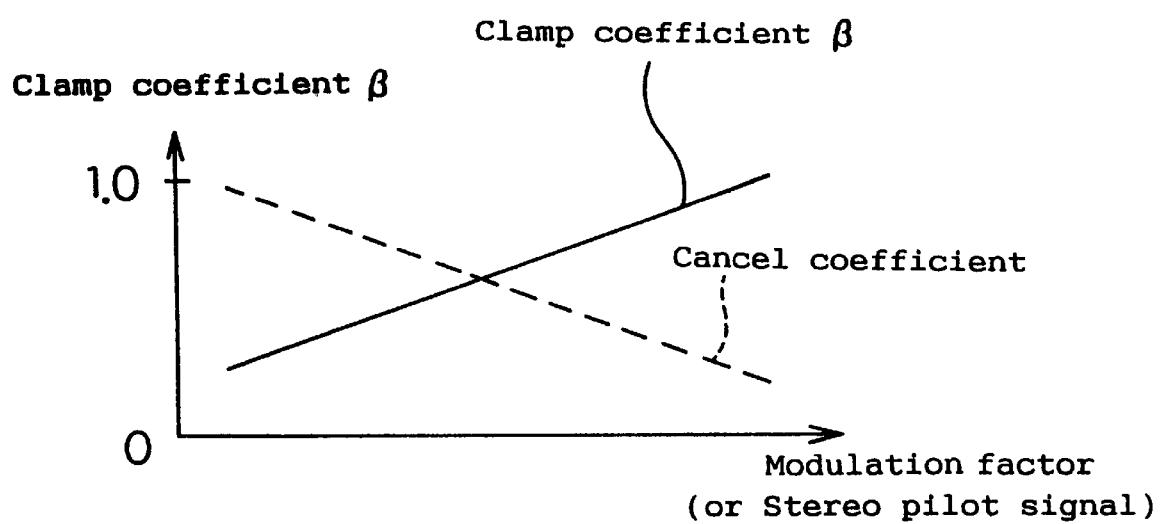
FIG. 5 is a graph showing the relation between the cancel coefficient and the clamp coefficient, when their magnification are controlled by utilizing the modulation degree of other embodiment according to the present invention.

Here, FIG. 5 shows the case where the noise cancel parameter-setting means 1-401 determines the cancel coefficient and the clamp coefficient from the field/disturbance informations, and controls the magnification of each coefficient by utilizing the modulation degree as the modulation information. That is, as the modulation degree is smaller, the magnification of the cancel coefficient becomes nearer to 1.0, and the magnification of the clamp coefficient becomes smaller than 1.0.

In addition, the lateral axis shown in FIG. 5 may be the stereo pilot signal level.

Figure 6:
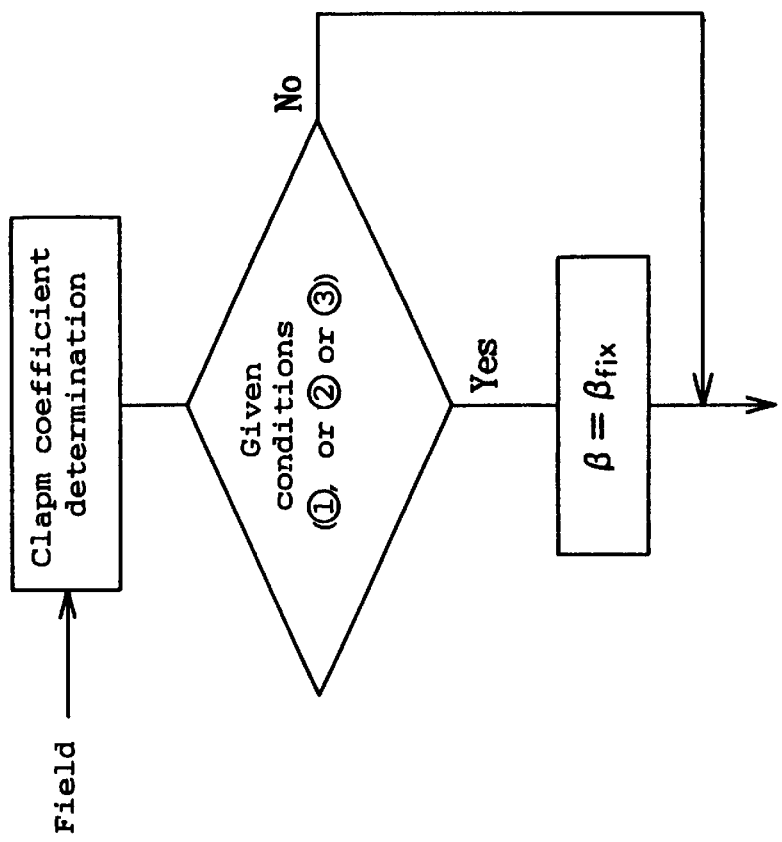
FIG. 6 is a view illustrating the given conditions when the clamp coefficient is determined, in other embodiment according to the present invention.

Furthermore, as the determination method of the clamp coefficient, it may be determined as a fixed value when the given conditions are satisfied, or may be determined so as to be in proportion to the modulation degree as shown in FIG. 5, when the given conditions are not satisfied. Here, as the given conditions, there are three types of conditions, respectively indipendent, as shown in FIG. 6.

According to the present embodiment, since the modulation informations can be utilized when the noise cancel parameter is set, the magnification of the noise cancel parameter can be controlled according to the modulation informations, and the noise can be removed more effectively.

Figure 7:
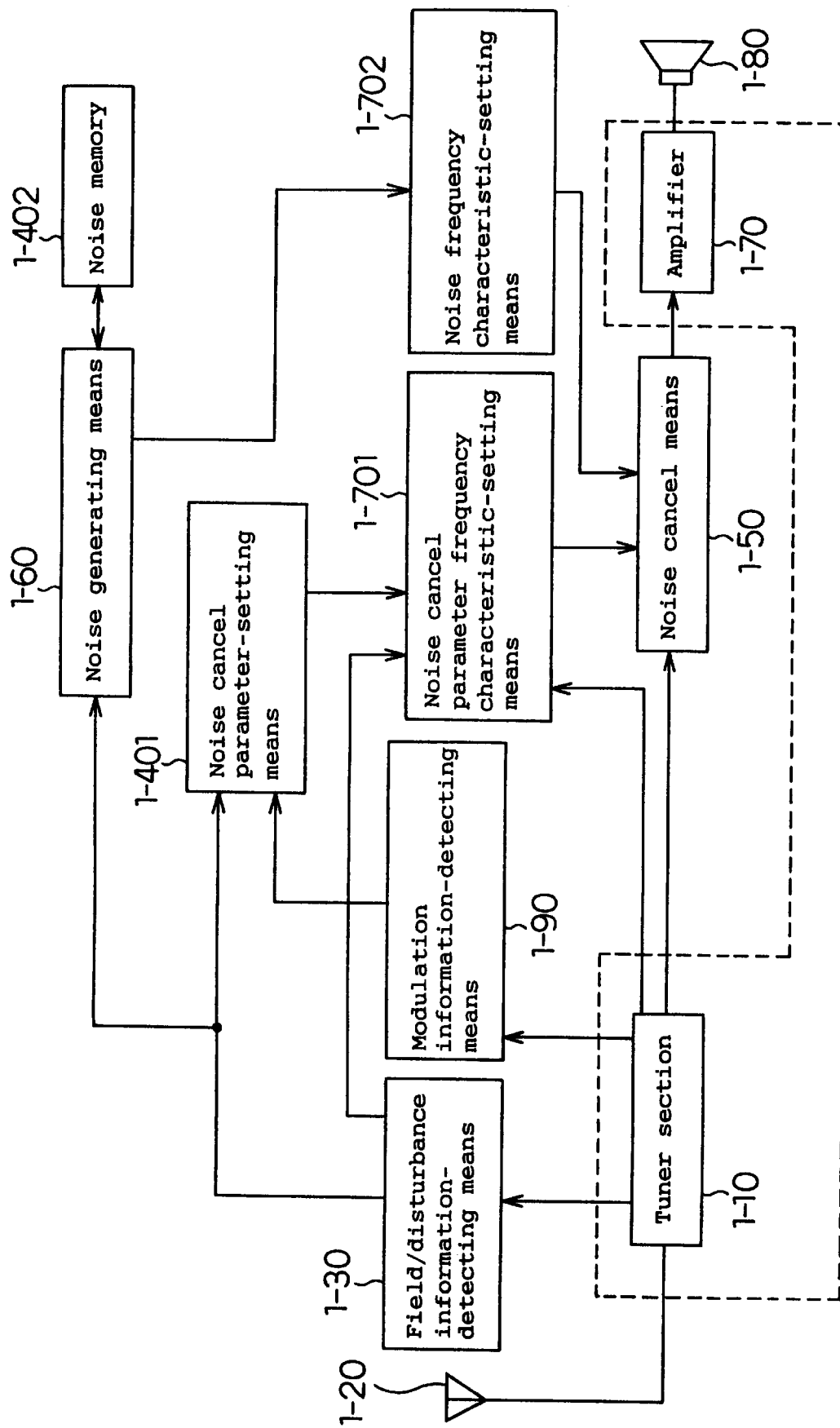
FIG. 7 is a structural view of the noise suppressing device of other embodiment according to the present invention.

FIG. 7 is a structural view of the noise suppressing device of the other embodiment according to the present invention, and the structure and the action of the present embodiment will be described with reference to FIG. 7.

The main structural difference between this embodiment and the above embodiment shown in FIG. 4 is that a noise cancel parameter frequency characteristic-setting means 1-701 and a noise frequency characteristic-setting means 1-702 are added.

In the present embodiment, a predetermined weighting is given according to the frequency of the input signal, and delicate control is made with respect to the variation of the frequency, which is the different point with the above embodiment. Incidentally, the same reference numeral is given to the substantially similar parts as in FIG. 4, and the description thereof will be omitted.

Figure 8A:
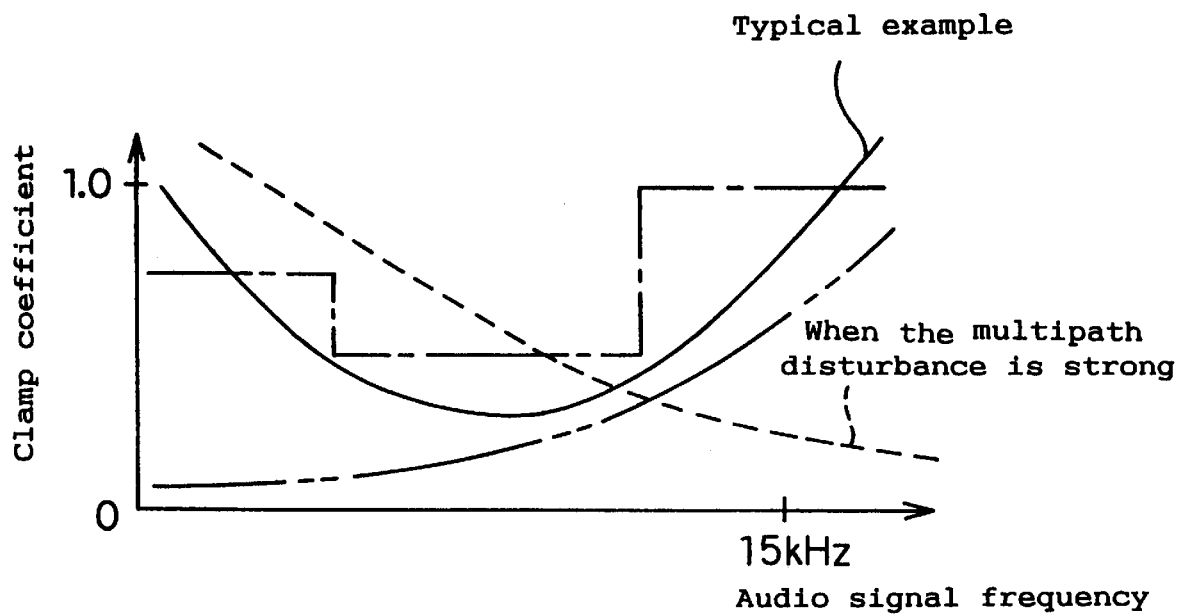
FIG. 8A is graphs showing the frequency characteristics of the clamp coefficient.
Figure 8B:
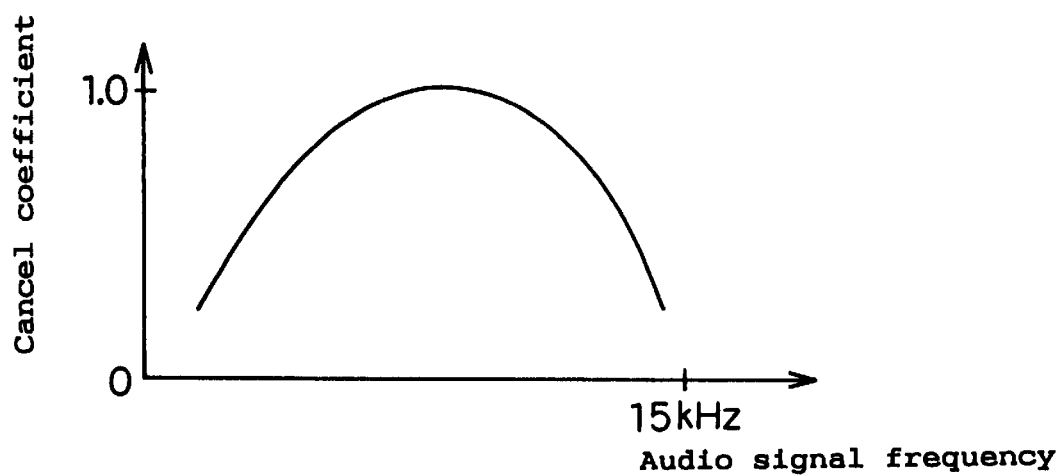
FIG. 8B is graphs showing the frequency characteristics of the cancel coefficient.

In FIG. 8A and FIG. 8B, the frequency characteristics of the cancel coefficient and the clamp coefficient are shown.

In these figures, a typical embodiment is shown in a solid line and the one in which the multipath disturbance is strong is shown in a dotted line.

Figure 9A:
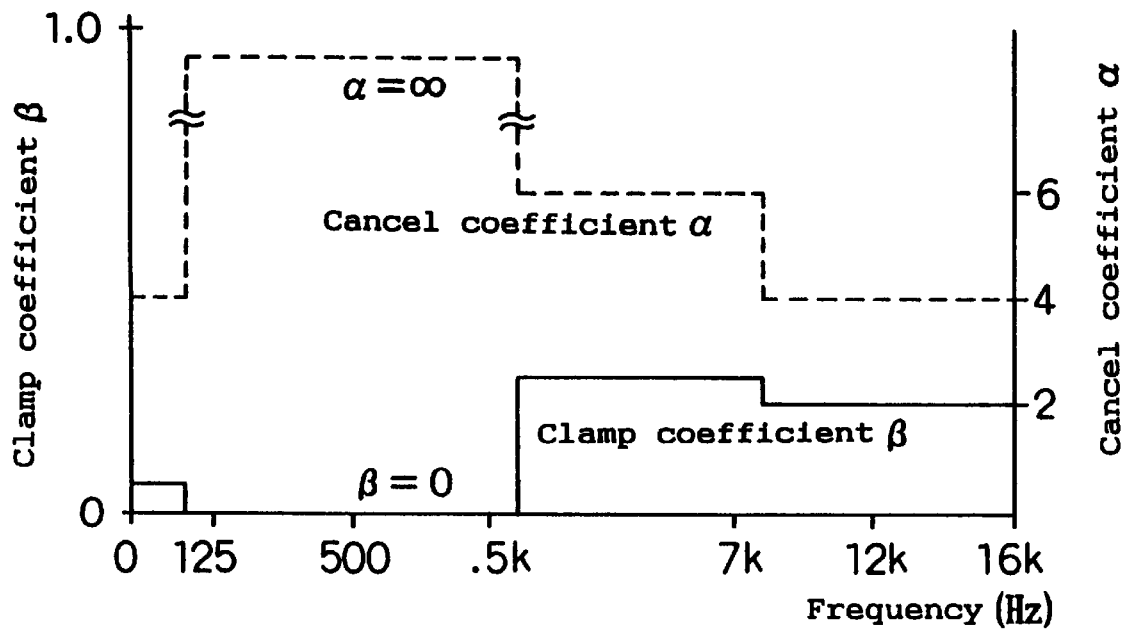
FIG. 9A is graphs showing the frequency characteristics of the cancel coefficient and the clamp coefficient, when the multipath disturbance information is also considered, in other embodiment according to the present invention.
Figure 9B:
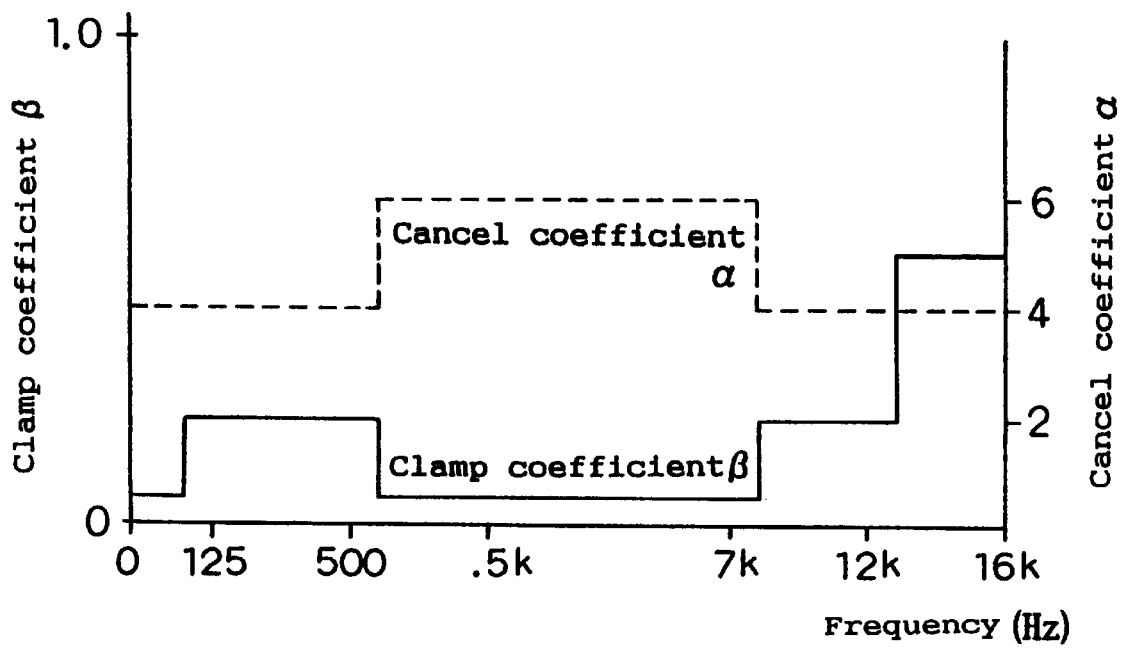
FIG. 9B is graphs showing the frequency characteristics of the cancel coefficient and the clamp coefficient, when the multipath disturbance information is also considered, in other embodiment according to the present invention.

In addition, the embodiment in which the multipath disturbance is considered is shown in FIG. 9A and FIG. 9B.

Figure 10:
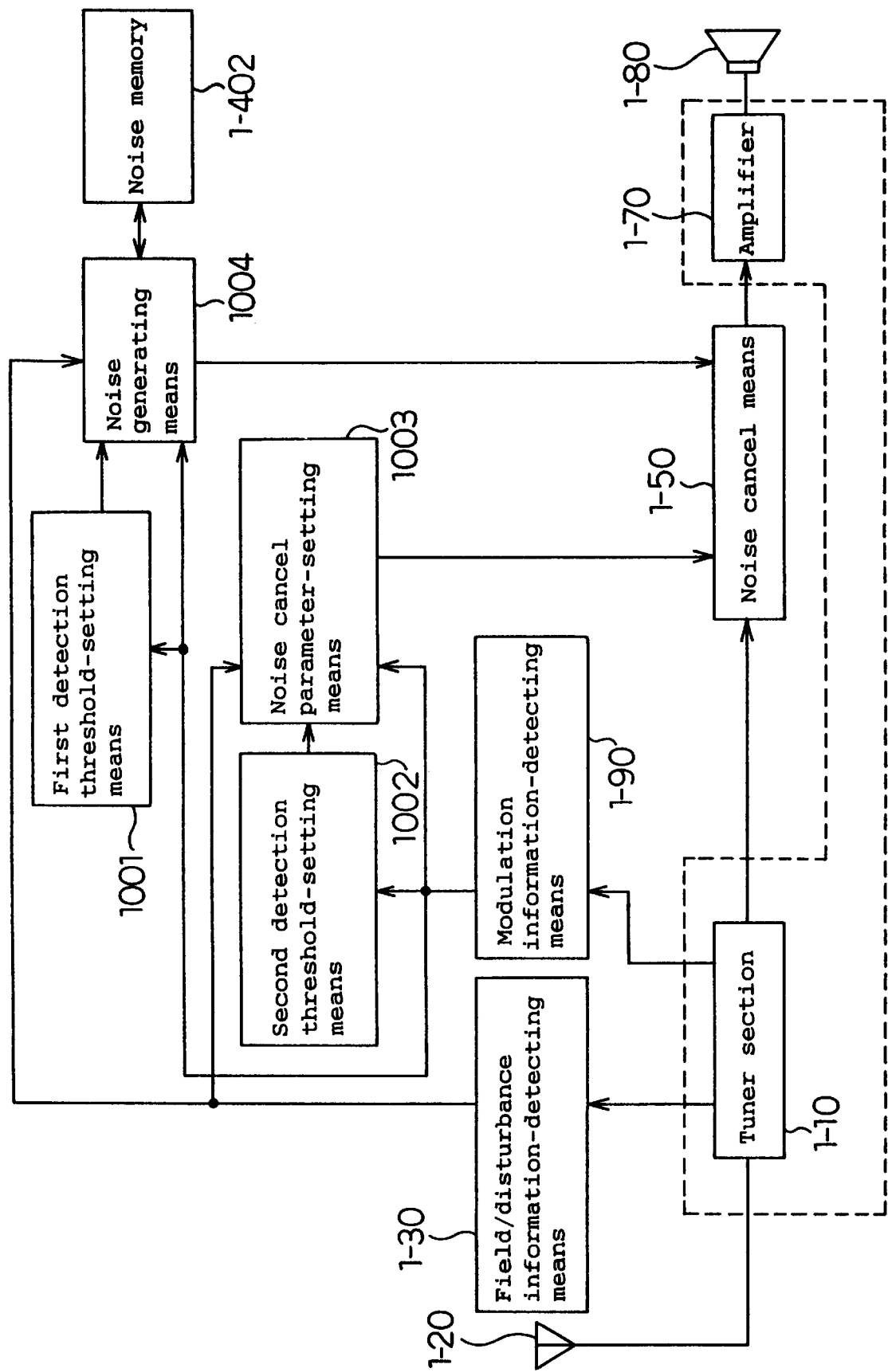
FIG. 10 is a structural view of the noise suppressing device of other embodiment according to the present invention.

FIG. 10 is a structural view of the noise suppressing device of the other embodiment according to the present invention, and the structure and the action of the present embodiment will be described with reference to FIG. 10.

Here, the main structural difference between this embodiment and the above embodiment shown in FIG. 4 is that a first detection threshold-setting means 1001 which sets the threshold level of said field/disturbance informations used when the noise data is generated, based on said modulation informations to be output; and a second detection threshold-setting means 1002 which sets the threshold level of said field/disturbance informations used when said noise cancel parameter is set, based on said modulation informations to be output are added.

In the above embodiment, the noise data is generated according to the existence of the multipath disturbance detected based on the one reference value determined in advance, on the other hand, in the present embodiment, the threshold level is set based on the modulation informations from the modulation information-detecting means 1-90 (in FIG. 12, three kinds of threshold levels of S1, S2 and S3 are expressed), and various data are generated according to the various informations obtained by using these threshold levels as the reference and the threshold level used at that time, as described below.

Figure 11:
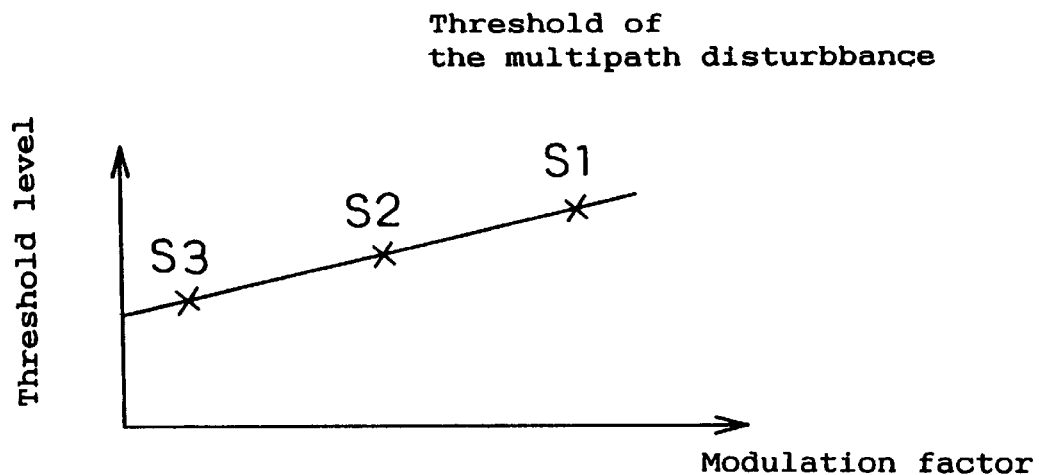
FIG. 11 is a graph showing the relation between the threshold level used in the multipath disturbance detection and the modulation degree, in the other embodiment according to the present invention.
Figure 12:
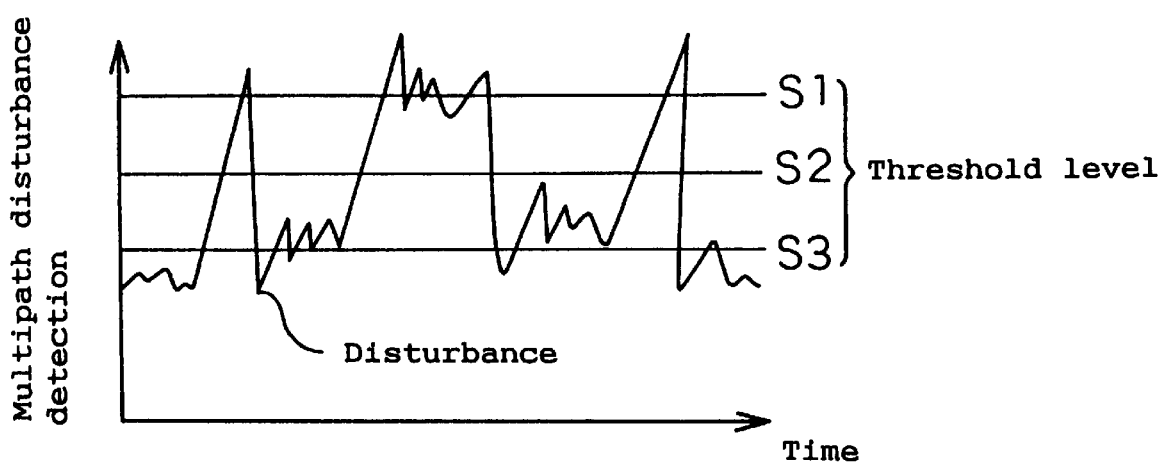
FIG. 12 is a graph showing the relation between each threshold level and the multipath disturbance detection in other embodiment according to the present invention.

Namely, the threshold level used for the detection of the multipath disturbance is set to larger value by, for example, the first detection threshold-setting means 1001 (see FIG. 11), as the modulation degree of the input signal is larger. Here, there is a relation of S1>S2>S3. Therefore, the detection of the multipath disturbance is made based on the threshold level having different set value according to the modulation degree, as shown in FIG. 12, and for example, when the threshold level S1 is set by the first detection threshold-setting means 1001, the noise generating means 1004 generates the noise data, by making the magnification larger than the case where other threshold level is set, with respect to the noise data determined by the multipath disturbance detected by S1.

Furthermore, the relation between the second detection threshold-setting means 1002 and the noise cancel parameter-setting means 1003 is similar as described above, and when the threshold level is high, the clamp coefficient is set large.

By such constitution, the noise suppression or removal can be made more efficiently.

Figure 13:
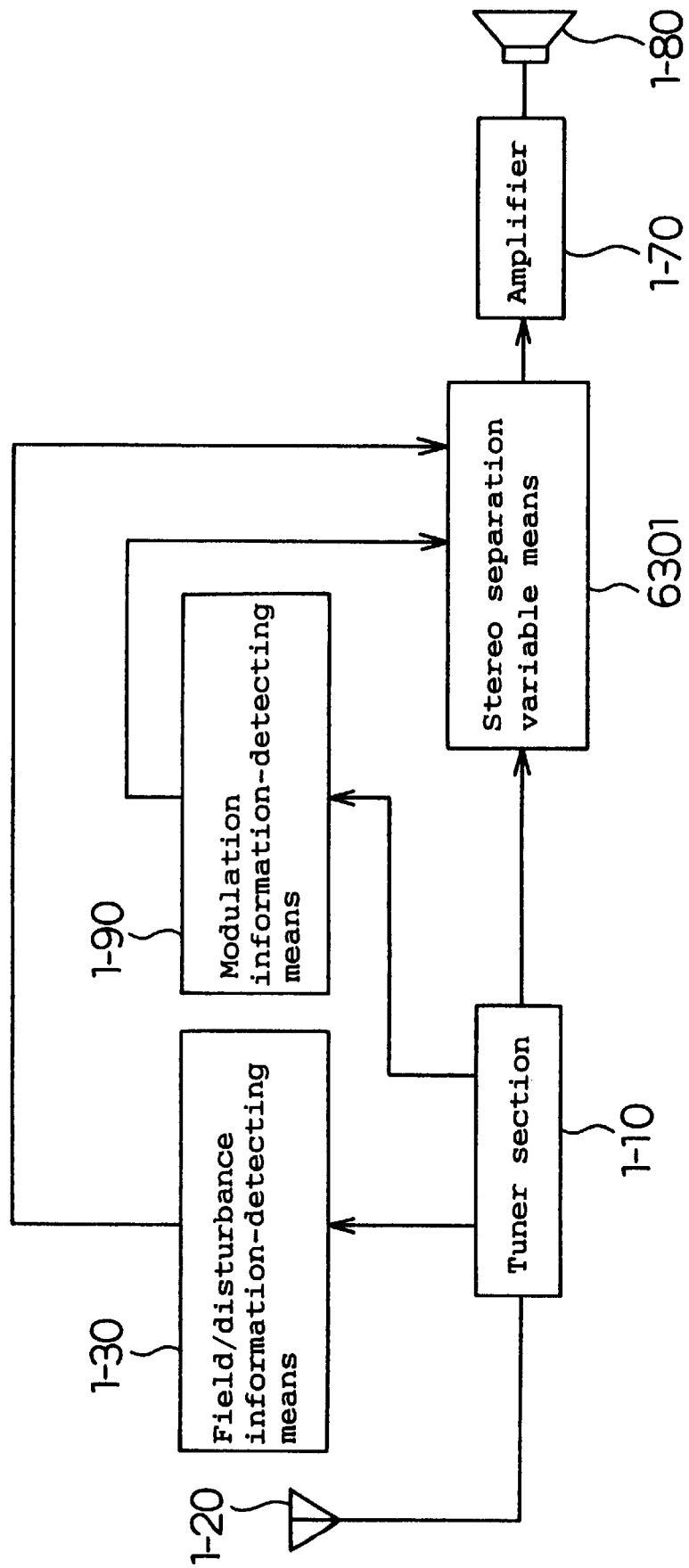
FIG. 13 is a structural view of the noise suppressing device of other embodiment according to the present invention.

FIG. 13 is a structural view of the noise suppressing device of the other embodiment according to the present invention, and the structure and the action of the present embodiment will be described with reference to FIG. 13. In FIG. 13, the structure is the same as the above embodiment except for the stereo separation variable means 6301.

The stereo separation variable means 6301 determines the separation degree to the given signal output from the tuner section 1-10 by also considering the modulation informations detected by the modulation information-detecting means 1-90, when the separation degree is determined from the field/disturbance informations detected by the field/disturbance information-detecting means 1-30, and performs separation/control to said given signal to suppress the noise feeling in the audibility, based on thus determined separation degree.

The case where the noise is detected by using the multipath disturbance as the field/disturbance informations will now be described more concretely.

Namely, in the case of the stereo signal receiver, it has a characteristic that the larger is the separation degree of the R/L channel, the larger becomes the noise feeling in the audibility. There is a known art that by utilizing this characteristic, when the noise detected from the multipath disturbance is large, said separation degree is made small (see FIG. 14).

In the present embodiment, when the coefficient "a" shown in FIG. 14 is determined, differing from the conventional case where the separation degree is made small evenly when the multipath disturbance is large, by further considering the modulation degree, it is so determined that the separation degree becomes larger when the modulation degree is larger than the given value, compared to the case where the modulation degree is smaller than the given value (see FIG. 15).

Figure 16A:
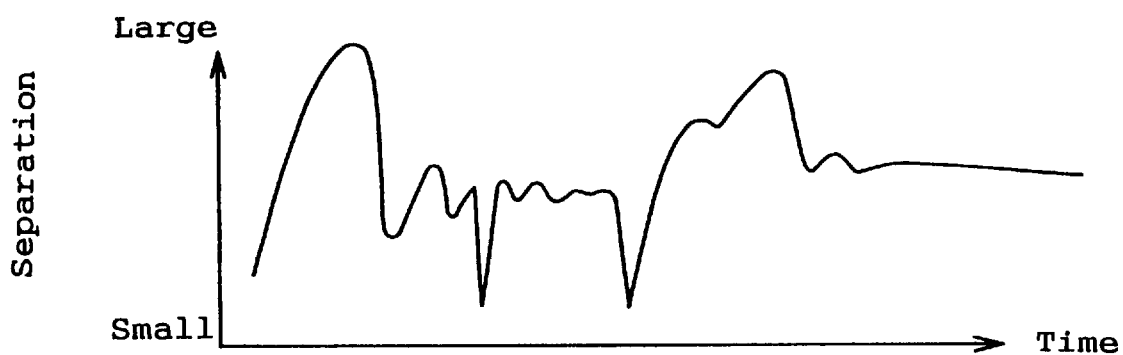
FIG. 16A is graphs when the time constant characteristic is given to the separation degree change, in other embodiment according to the present invention.
Figure 16B:
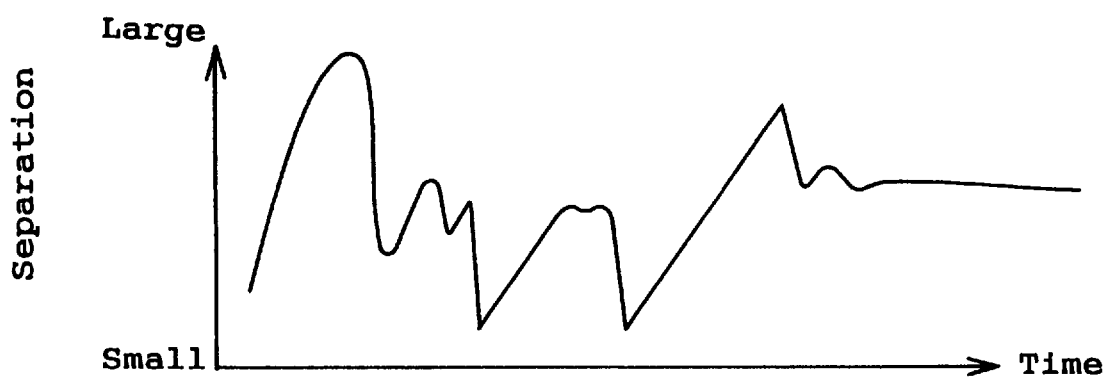
FIG. 16B is graphs when the time constant characteristic is given to the separation degree change, in other embodiment according to the present invention.

In addition, it may be so constituted that the stereo separation variable means 6301 has a separation detecting means (not shown) which detects the time-varying separation degree change, and based on the detection result of the separation detecting means, a time constant characteristic is given to said separation degree change (see FIG. 16A,FIG. 16B), and based on the separation degree having the time constant characteristic, the separation/control of L/R signals are carried out. Here, FIG. 16A shows the separation degree change in the state that the time constant characteristic is not given, and FIG. 16B shows the separation degree change in the state that the time constant characteristic is given. In FIG. 16B, there is shown a case where a short time constant is given for good followability with respect to the change in the direction that the separation degree becomes small, and a long time constant is given for poor followability with respect to the change in the direction that the separation degree becomes large.

According to such constitution, the noise can be suppressed or removed more efficiently.

Figure 17:
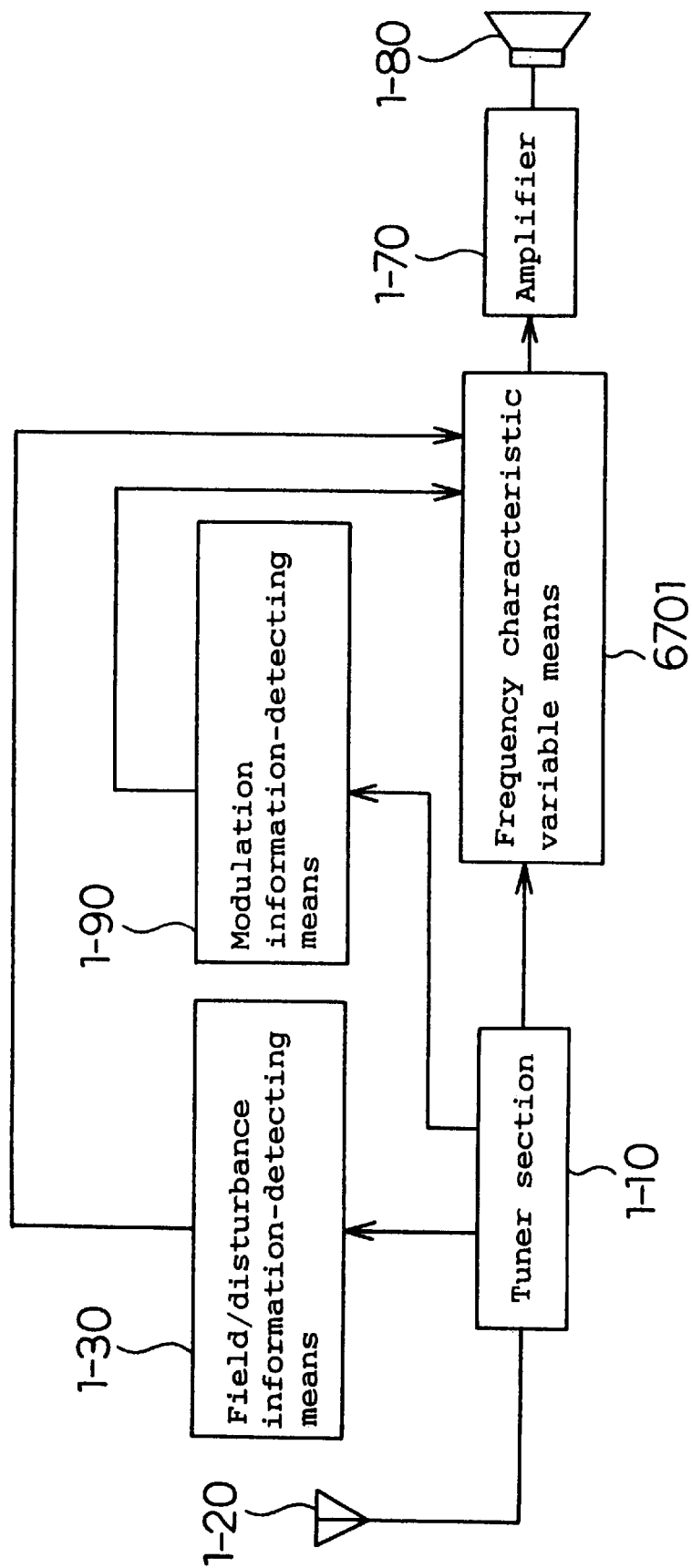
FIG. 17 is a structural view of the noise suppressing device of other embodiment according to the present invention.

FIG. 17 is a structural view of the noise suppressing device of the other embodiment according to the present invention, and the structure and the action of the present embodiment will be described with reference to FIG. 17.

The main structural difference with the embodiment shown in FIG. 13 is that a frequency characteristic variable means 6701 is provided instead of the stereo separation variable means 6301, and other structure is the same as the above embodiment.

The frequency characteristic variable means 6701 determines the reduction degree which reduces the frequency component higher than the given frequency to the same level as or lower level than the original level by considering said modulation informations detected by the modulation information-detecting means 1-90, when the reduction degree is determined from said field/disturbance informations detected by the field/disturbance information-detecting means 1-30, and reduces the higher frequency component of said given signal output from said tuner section 1-10 to the same level as or lower level than the original level to suppress the noise feeling in the audibility by utilizing the determined reduction degree.

Figure 18:
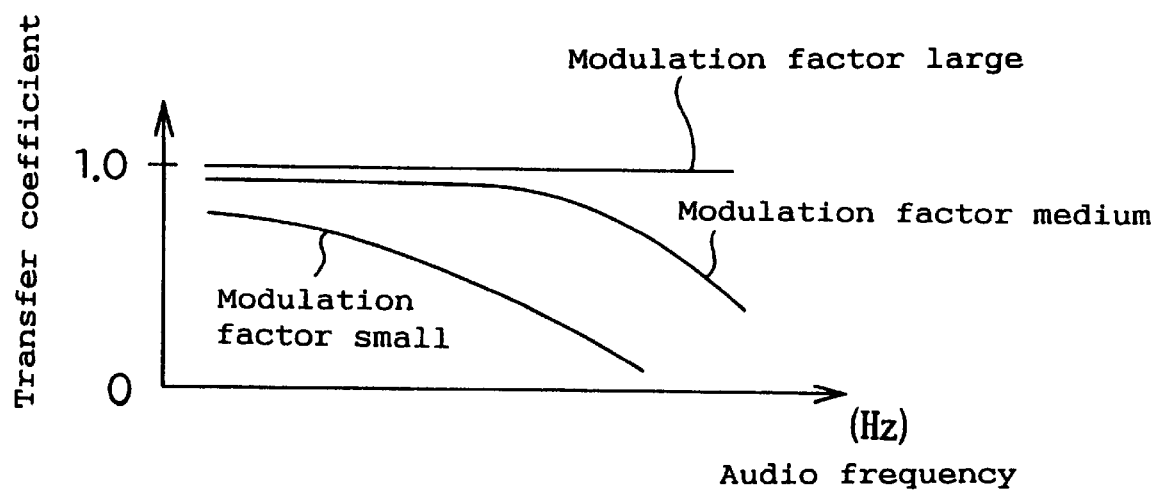
FIG. 18 is a graph showing the manner how the transfer coefficient of the high frequency portion of the frequency of the audio signal changes according to the difference of the modulation degree, in other embodiment according to the present invention.

Here, FIG. 18 shows the manner how the tansfer coefficient of the high frquency portion of the frequency of the audio signal varies due to the difference of the moduation factor. That is, when the modulation degree is large, the transfer coefficient is 1.0 as it is, and as the modulation degree becomes smaller, the transfer coefficient of the high frequency portion is made smaller, and the reduction degree of the high frequency portion is made large, thereby the noise can be suppressed or removed more efficiently.

Figure 19:
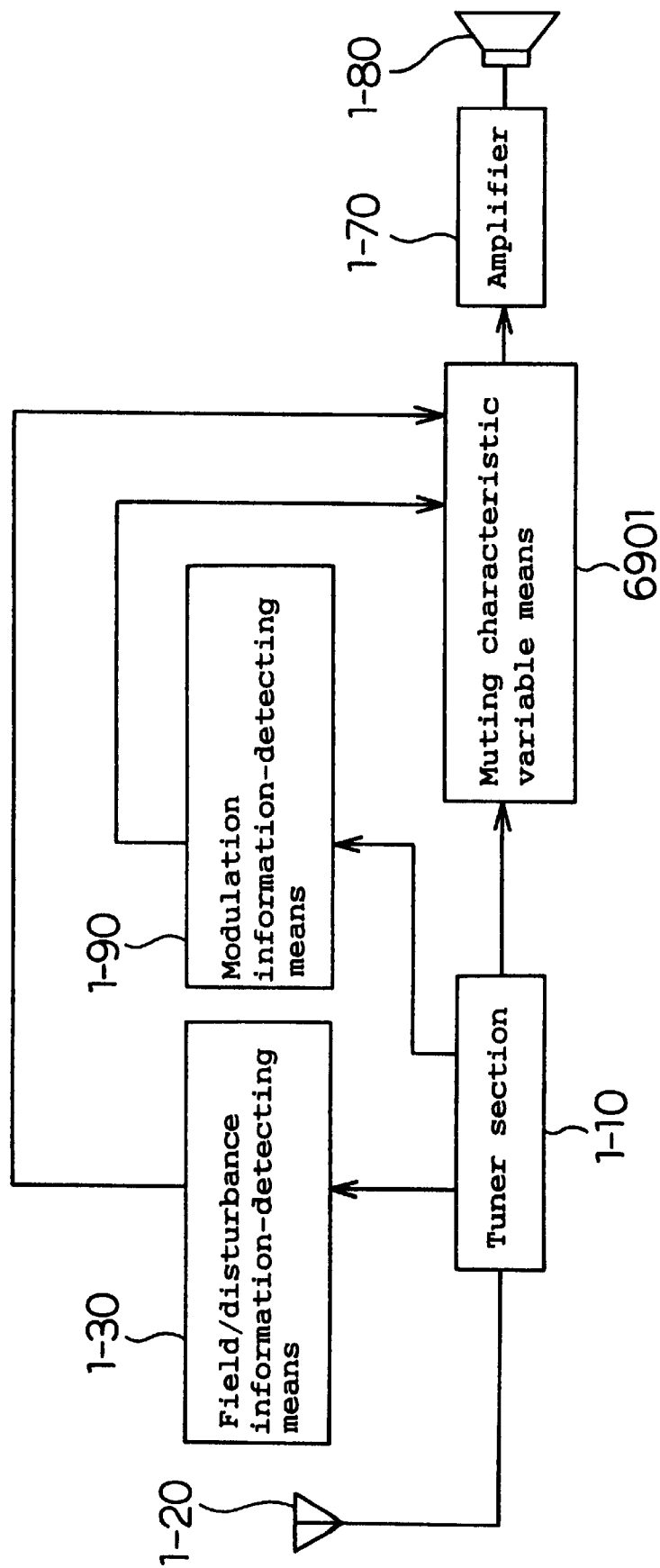
FIG. 19 is a structural view of the noise suppressing device of other embodiment according to the present invention.

FIG. 19 is a structural view of the noise suppressing device of the other embodiment according to the present invention, and the structure and the action of the present embodiment will be described with reference to FIG. 19.

The main structural difference with the embodiment shown in FIG. 13 is that a muting characteristic variable means 6901 is provided instead of the stereo separation variable means 6301, and other structure is the same as the above embodiment.

The muting characteristic variable means 6901 determines the muting characteristic of said given signal output from said tuner section by considering said modulation informations detected by the modulation information-detecting means 1-90, when the muting characteristic is determined from said field/disturbance informations of the field/disturbance information-detecting means 1-30, and utilizes the thus determined muting characteristic to suppress the noise feeling in the audibility with respect to said given signal output from said tuner section 1-10.

In the above embodiment, the level of the signal to be received is constituted not to be changed, but in the present embodiment, such a control is performed to suppress the level itself of the signal containing the noise by the muting characteristic variable means 6901, thereby the noise can be suppressed or removed more efficiently.

Figure 20A:
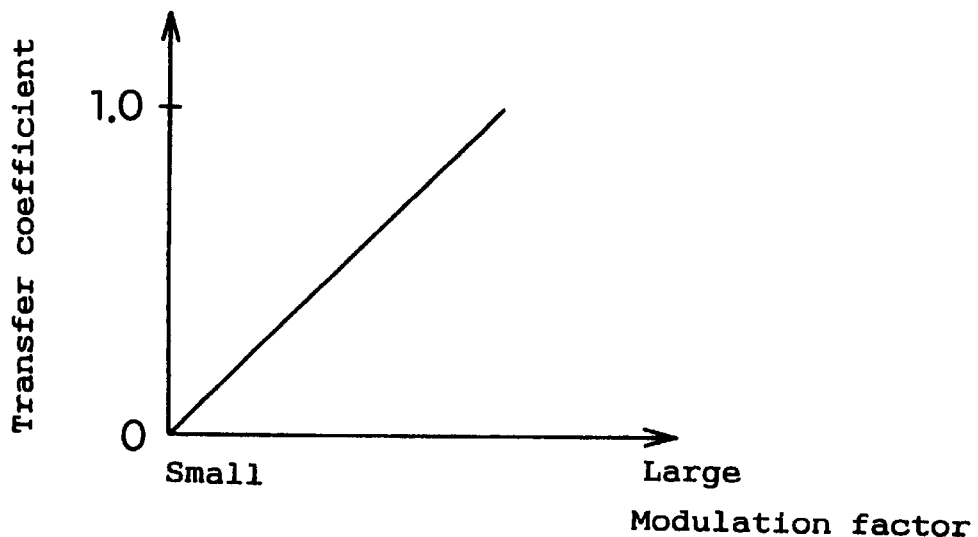
FIG. 20A is a graph showing the relation between the transfer coefficient of the audio signal level for exerting the muting function and the modulation degree, in other embodiment according to the present invention.
Figure 20B:
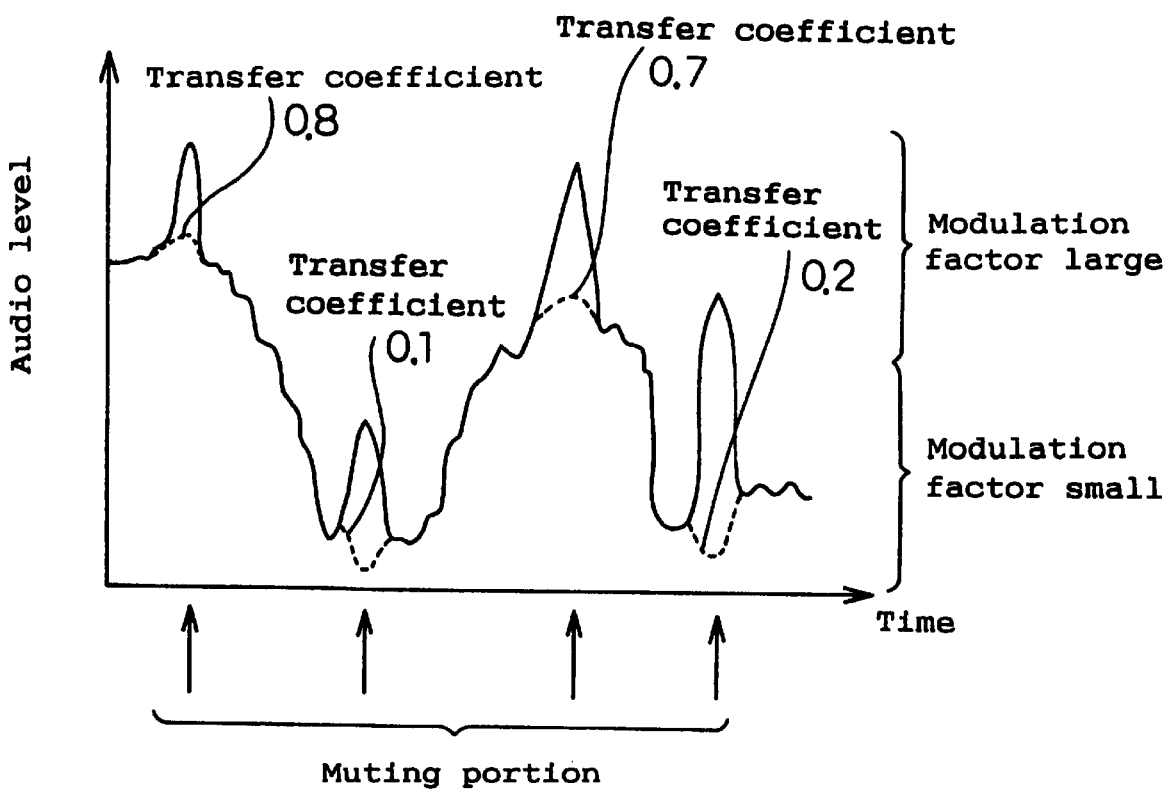
FIG. 20B is a graph showing the relation among the modulation degree, the transfer coefficient and the audio level of said embodiment.

FIG. 20A shows the manner how the tansfer coefficient of the audio signal level to exert the muting function is determined by the moduation factor. And FIG. 20B shows the audio level (shown in a dotted line in the figure) as a result that when the modulation degree is large, the muting characteristic is controlled to be made small, setting the transfer coefficient to be 0.8 and 0.7, and when the modulation degree is small, the muting characteristic is controlled to be large, setting the transfer coefficient to be 0.1 and 0.2.

According to the constitution of the present embodiment, since the control to suppress the level itself of the noise-containing signal is more delicately performed, it is quite effective when the identification of the content is regarded as important than the tone quality, as in the portable telephone and the like.

Figure 21:
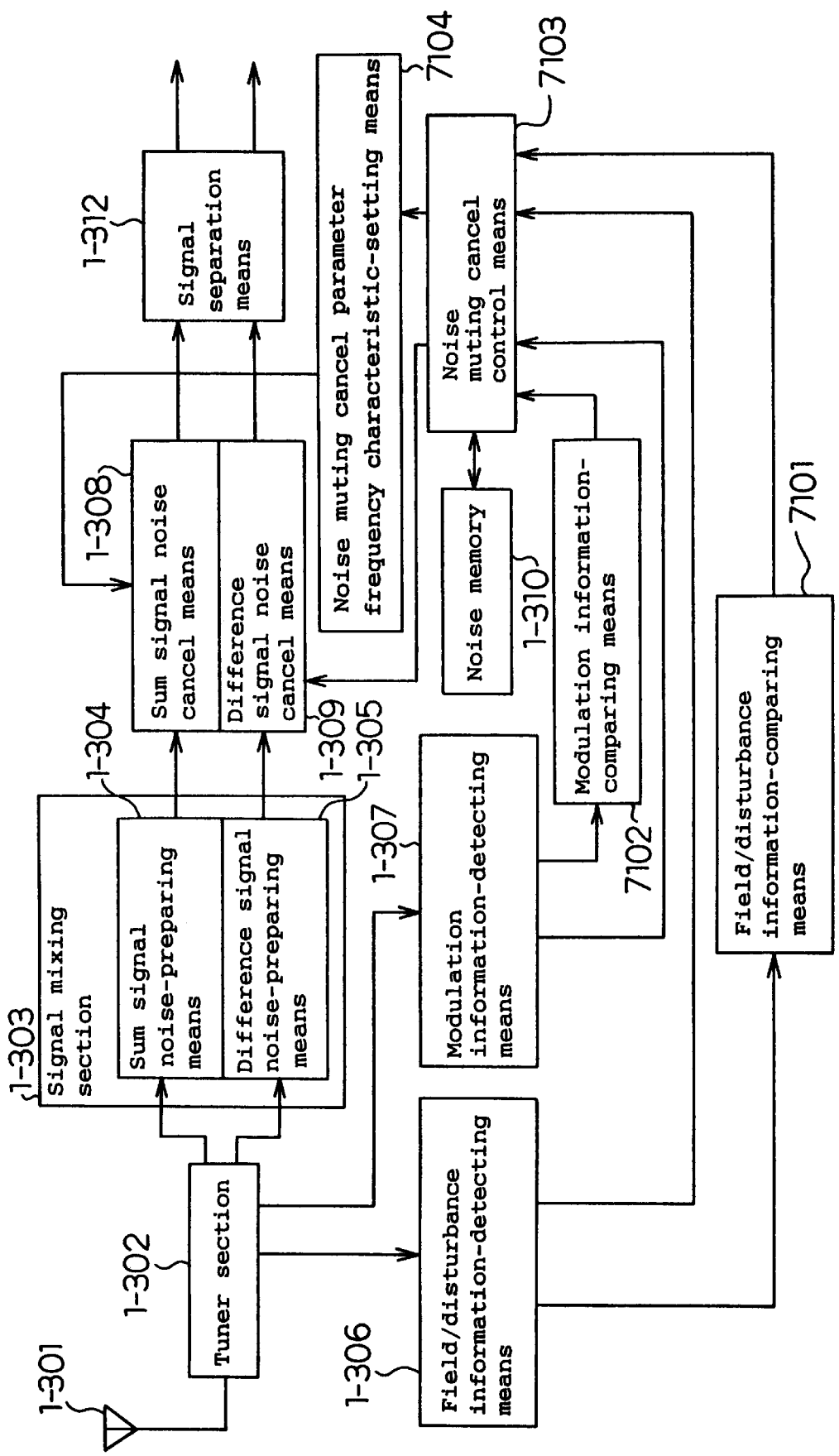
FIG. 21 is a structural view of the noise suppressing device of other embodiment according to the present invention.

FIG. 21 is a structural view of the noise suppressing device of the other embodiment according to the present invention, and the structure and the action of the present embodiment will be described with reference to FIG. 21.

Here, the main structural difference with the embodiment shown in FIG. 3 is that a field/disturbance information-comparing means 7101 which compares the field/disturbance informations output from the field/disturbance information-detecting means 1-306 with a predetermined value, a modulation information-comparing means 7102 which compares the modulation informations output from the modulation information-detecting means 1-307 with the other predetermined value, and a noise muting cancel parameter frequency characteristic-setting means 7104 are added, and a noise muting cancel control means 7103 is provided instead of the noise cancel control means 1-311. Others are substantially the same as the above embodiment.

The noise muting cancel control means 7103 sets the noise cancel parameter based on the field/disturbance informations and the modulation informations to control the difference signal noise cancel means 1-309, and sets the clamp coefficient of the noise muting cancel parameter to any value between 0 to 0.7 based on the field/disturbance informations and the modulation informations to control the sum signal noise cancel means 1-308.

In the embodiment shown in FIG. 3, it is so controlled that the setting-range of the clamp coefficient is generally 0.5 or higher, assuming that any change, that is, muting is not given to the signal to be received. On the contrary, in the present embodiment, when the modulation degree and the like are below the predetermined values, the value of the clamp coefficient is set according to the values of the modulation degree and the like, restricting the setting range of the clamp coefficient to be from 0 to 0.7. Furthermore, in the present embodiment, it is socontrolled that the similar frequency characteristic as in the noise cancel parameter frequency characteristic-setting means 1-701 shown in FIG. 7 is given to the noise cancel parameter of the clamp coefficient and the like.

Thus, according to the present embodiment, the control to suppress the level itself of the noise-containing signal is more delicately done, thereby the noise can be suppressed or removed more efficiently. In addition, the comparing means 7101 and 7102 may be only one of them, or the noise muting cancel parameter frequency characteristic-setting means 7104 may not be provided.

Figure 22:
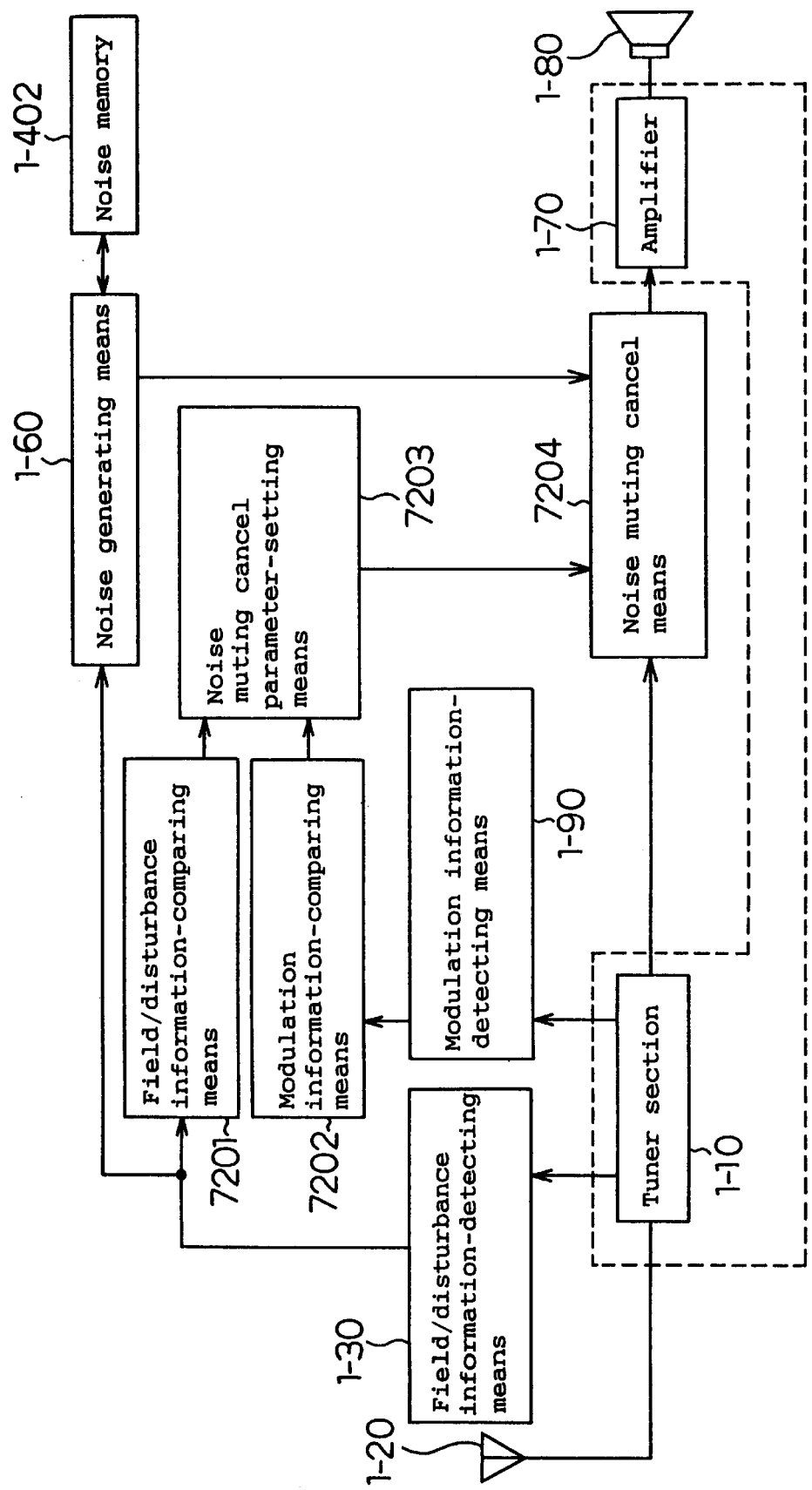
FIG. 22 is a structural view of the noise suppressing device of other embodiment according to the present invention.

FIG. 22 is a structural view of the noise suppressing device of the other embodiment according to the present invention, and the structure and the action of the present embodiment will be described with reference to FIG. 22.

Here, the main structural difference with the embodiment shown in FIG. 4 is that a field/disturbance information-comparing means 7201 and a modulation information-comparing means 7202 having the similar function as described in FIG. 21 are added, and a noise muting cancel parameter-setting means 7203 is provided instead of the noise cancel parameter-setting means 1-401, and a noise muting cancel means 7204 is provided instead of the noise cancel means 1-50.

The noise muting cancel parameter-setting means 7203 sets the clamp coefficient of the noise muting cancel parameter to any value between 0 to 0.7 based on the comparison result by the field/disturbance information-comparing means 7201 and the comparison result by the modulation information-comparing means 7202, and the noise muting cancel means 7204 utilizes the noise data and said set noise muting cancel parameter to suppress or remove the noise contained in said given signal, with respect to the given signal output from the tuner section 1-10.

Thus, according to the present embodiment, the control to suppress the level itself of the noise-containing signal is more delicately done, thereby the noise can be suppressed or removed more efficiently. In addition, the comparing means 7201 and 7202 may be only one of them.

Furthermore, in additon to the above structure, a noise muting cancel parameter frequency characteristic-setting means may be provided which weights the noise muting cancel parameter output from the noise muting cancel parameter-setting means 7203 according to the frequency of the given signal output from tuner section 1-10, and outputs the weighted noise muting cancel parameter to the noise muting cancel means 7204.

Figure 23:
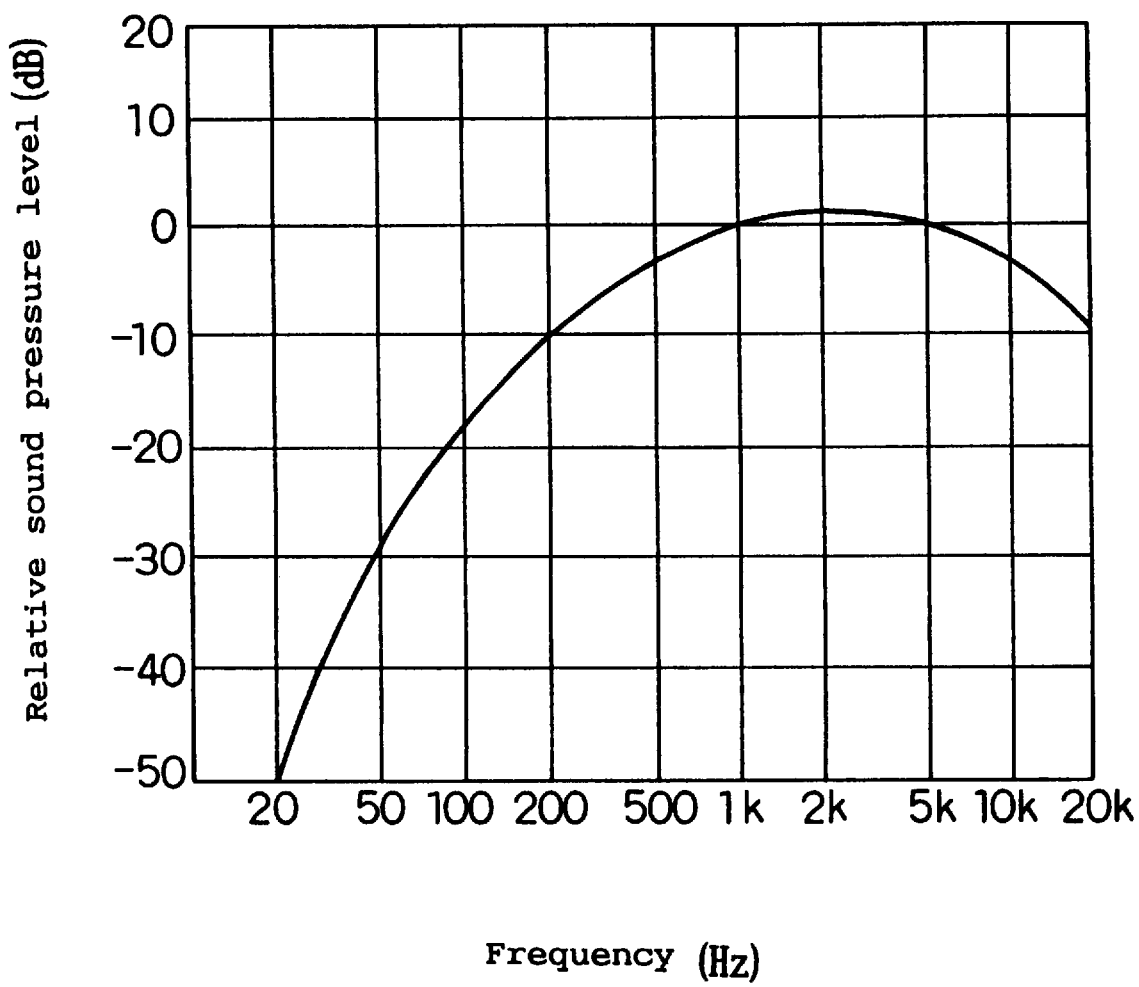
FIG. 23 is a graph showing the A characteristic curve of the weighting curve used in the noise suppressing device of other embodiment according to the present invention.

FIG. 23 is a view showing the A characteristic curve of the weighting curve used in the noise suppressing device of other embodiment according to the present invention.

In the above embodiment, it is so constituted that the value of the A characteristic curve of the weighting curve shown in FIG. 23 is added to the parameter input to the noise cancel means in order to suppress or remove the noise contained in the given signal, thereby the correction which gives importance to the frequency of the signal in the vicinity of 1 to 2 kHz having high audibility is made possible at the time of setting the parameter, and the noise suppression or removal can be made more effectively.

Figure 24:
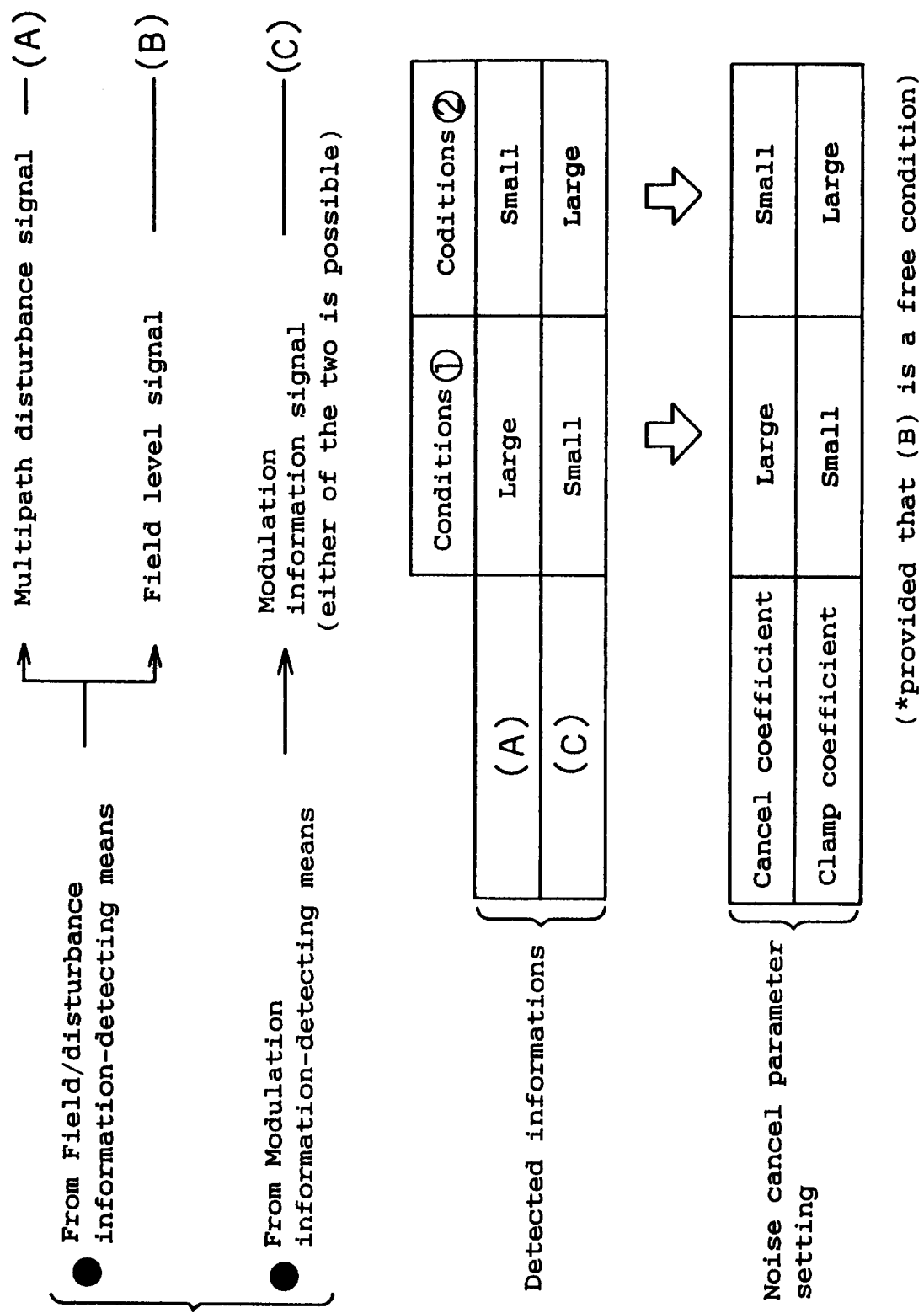
FIG. 24 is a view showing the relative relation between the setting values of the noise cancel parameter, according to various detected informations used in the noise suppressing device of other embodiment according to the present invention.

FIG. 24 is a view showing the relative relation of the setting values of the noise cancel parameter according to various detected informations, used in the noise suppressing device of other embodiment according to the present invention.

Namely, referring to the present embodiment, it is so constitued in the above embodiment, that when the multipath disturbance signal is larger than the first given value and the value of said modulation information is smaller than the second given value, among the field/disturbance informations (corresponding to the condition (1) in the figure), the cancel coefficient is made larger than the third given value and the clamp coefficient is made smaller than the fourth given value among said noise cancel parameters, and when said multipath disturbance signal is smaller than said first given value, and the value of said modulation information is larger than the second given value (corresponding to the condition (2) in the figure), the cancel coefficient is made smaller than the third given value and the clamp coefficient is made larger than the fourth given value.

In addition, as the noise suppressing device of other embodiment according to the present invention, it may be so constituted that when the multipath disturbance signal is detected among said field/disturnbace informations, the field/disturbance information-detecting means compares the level of the multipath disturbance signal input within the predetermined time with the predetermined threshold level, and performs said detection based on the peak value of said multipath disturbance signal to be input which exceeds the threshold level.

Furthermore, as the noise suppressing device of other embodiment according to the present invention, it may be so constituted that when the field intensity-level signal showing the multipath disturbance signal and/or the carrier level is detected among said field/disturnbace informations, the field/disturbance information-detecting means examines the rate of change of the wave form of the multipath disturbance signal and/or said field intensity-level signal input within the predetermined time, compares the rate of change with the predetermined reference, and performs said detection based on said wave form in which the rate of change of the wave form to be compared varies more rapidly than the reference.

Figure 25:
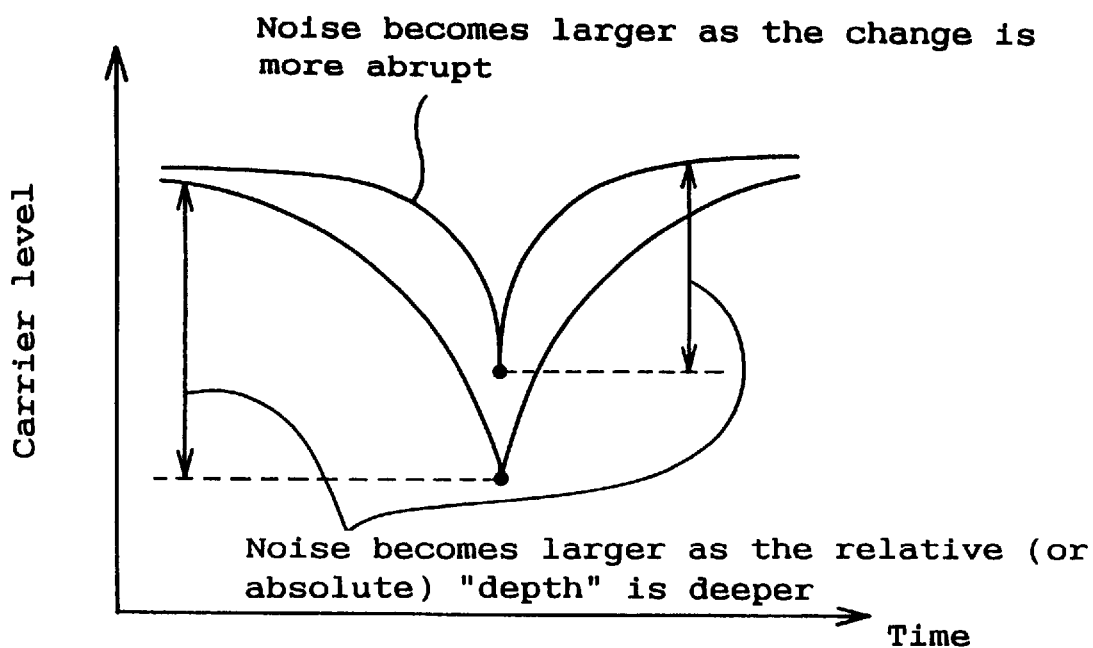
FIG. 25 is a graph showing the depth of the wave form of the carrier level, in other embodiment according to the present invention.

Furthermore, as the noise suppressing device of other embodiment according to the present invention, it may be so constituted that when the field intensity-level signal showing the multipath disturbance signal and/or the carrier level is detected among said field/disturnbace informations, the field/disturbance information-detecting means, in the above embodiment, examines the relative or absolute depth of the wave form of the multipath disturbance signal and/or said field intensity-level signal input within the predetermined time, compares the depth with the predetermined threshold level, and performs said detection based on said wave form in which the depth of the wave form to be compared becomes larger than the threshold level (see FIG. 25). Here, FIG. 25 is a view showing the depth and the like of the wave form of the carrier level.

Figure 26A:
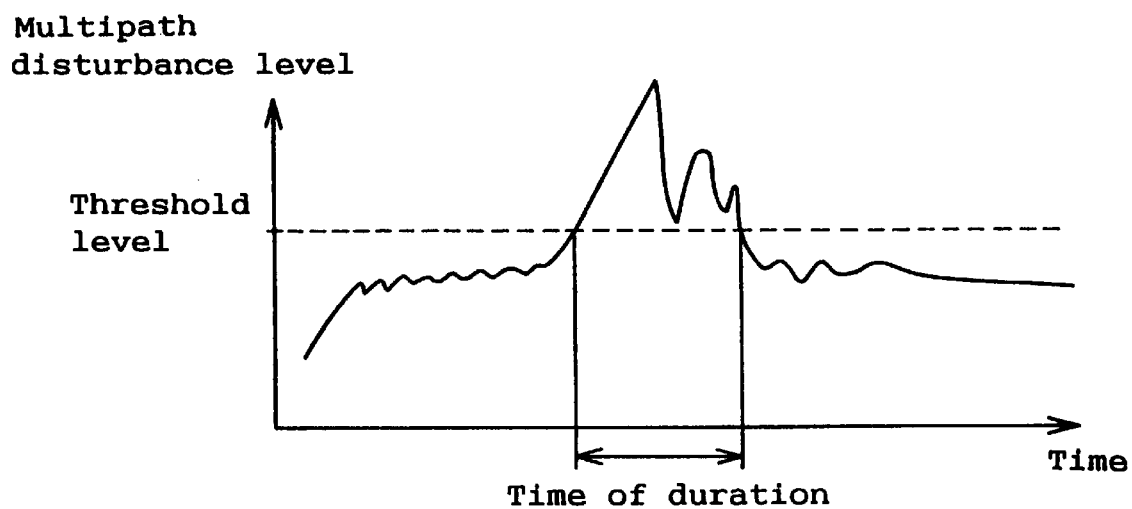
FIG. 26A is a graph relating to the multipath disturbance level, the threshold level and the time of duration of other embodiment according to the present invention.
Figure 26B:
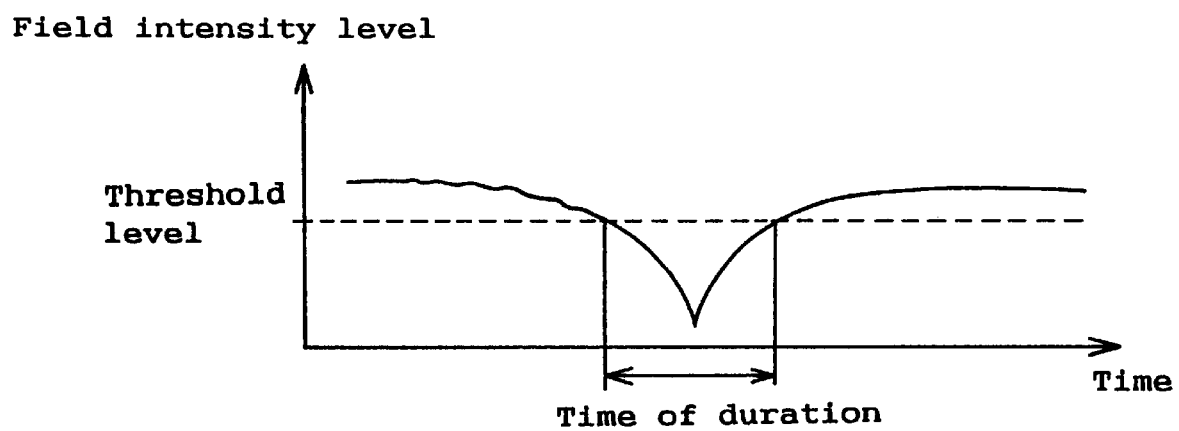
FIG. 26B is a graph relating to the field intensity level, the threshold level and the time of duration of said embodiment.

Furthermore, as the noise suppressing device of other embodiment according to the present invention, it may be so constituted that when the field intensity-level signal showing the multipath disturbance signal and/or the carrier level is detected among said field/disturnbace informations, the field/disturbance information-detecting means, in the above embodiment, examines the level of the wave form of the multipath disturbance signal and/or said field intensity-level signal to be input, compares the level with the predetermined reference, and performs said detection based on said wave form in which, as a result, the time when the level of said wave form to be compared continues to satisfy said reference becomes longer than the predetermined time (see FIG. 26). Here, FIG. 26A is a view relating to the multipath disturbance level and the threshold level and the time of duration, and FIG. 26B is a view relating to the field intensity level and the threshold level and the time of duration.

Figure 27:
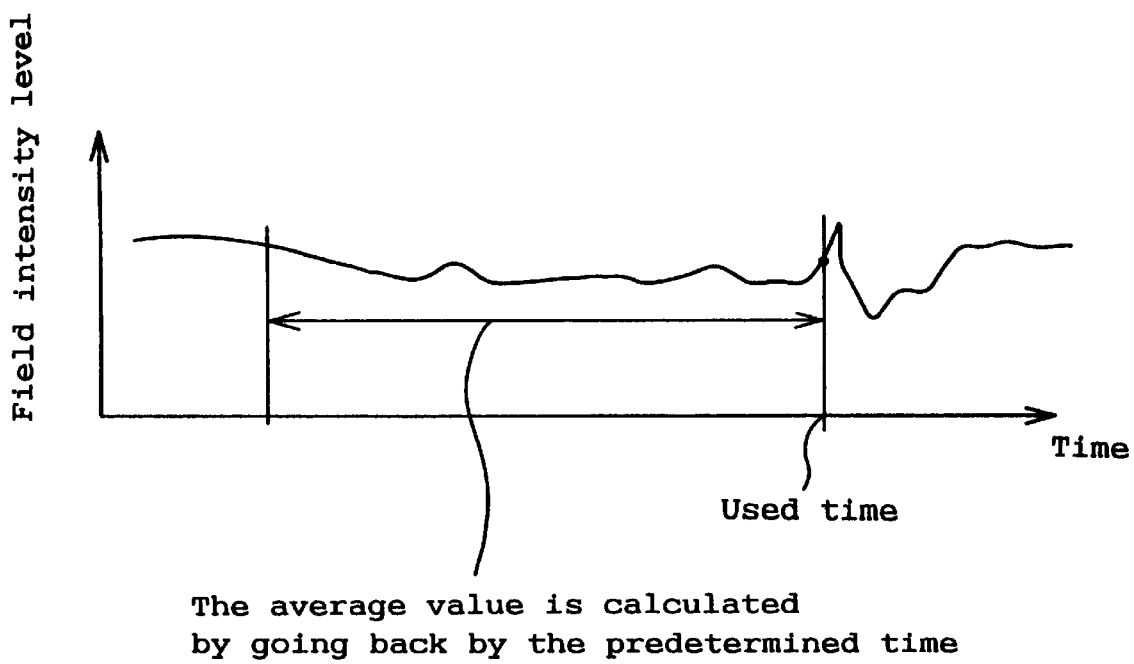
FIG. 27 is a view illustrating the case where the average value of the field intensity level signal is calculated, of other embodiment according to the present invention.

Furthermore, as the noise suppressing device of other embodiment according to the present invention, it may be so constituted that when the field intensity-level signal showing the carrier level is detected among said field/disturnbace informations, the field/disturbance information-detecting means, in the above embodiment, calculates the average value of said field intensity-level signal between the timing when the field intensity-level signal should be used and a point of time going back by the given time from that timing, and detects the calculated result as the field intensity-level signal in said timing (see FIG. 27). FIG. 27 is a view showing the case where the average value of the field intensity-level signal is calculated.

Furthermore, as the noise suppressing device of other embodiment according to the present invention, it may be so constituted that when the field intensity-level signal showing the carrier level is detected among said field/disturnbace informations, the field/disturbance information-detecting means, in the above embodiment, detects the instantaneous value of the field intensity-level signal at the timing when the field intensity-level signal should be used as the field intensity-level signal in said timing (corresponding to the value at the time to be used in FIG. 27).

Figure 28:
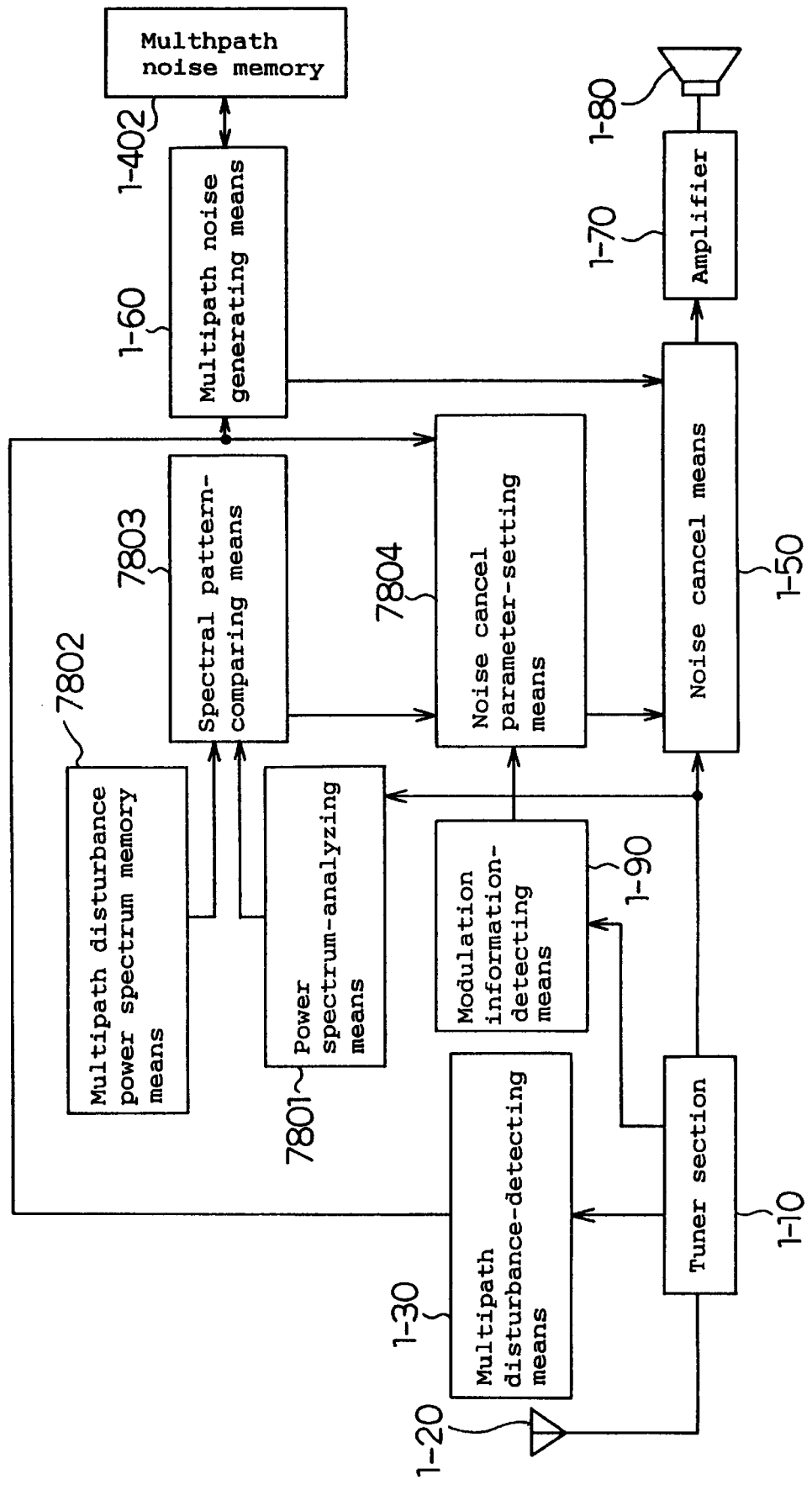
FIG. 28 is a structural view of the noise suppressing device of other embodiment according to the present invention.

FIG. 28 is a structural view of the noise suppressing device of the other embodiment according to the present invention, and the structure and the action of the present embodiment will be described with reference to FIG. 28.

Here, the main structural difference with the embodiment shown in FIG. 4 is that a power spectrum-analyzing means 7801, a multipath disturbance power spectrum memory means 7802 and a spectral pattern-comparing means 7803 are added.

Here, the power spectrum-analyzing means 7801 is a means to analyze the power spectrum of the given signal output from the tuner section 1-10, and the multipath disturbance power spectrum memory means 7802 as the noise power spectrum memory means of the present invention is a means to store preliminarily the power spectral pattern by the frequency analysis of the noise.

The spectral pattern-comparing means 7803 is a means to compare the output from said power spectrum-analyzing means 7801 and the output from said noise power spectrum memory means 7802, and transfer the matching degree of the spectral pattern as the compared result to the noise cancel parameter-setting means 7804.

The noise cancel parameter-setting means 7804 is so constituted to set the noise cancel parameter by considering the matching degree of said spectral pattern, thereby the noise can be suppressed or removed more efficiently.

In addition, as the noise suppressing device of other embodiment according to the present invention, it may be so constituted that in the above embodiment, when the signal to be modulated is the stereo signal, said modulation information-detecting means utilizes the power calculation value corresponding to the (L+R) component in the stereo composite signal as said modulation informations.

Figure 29:
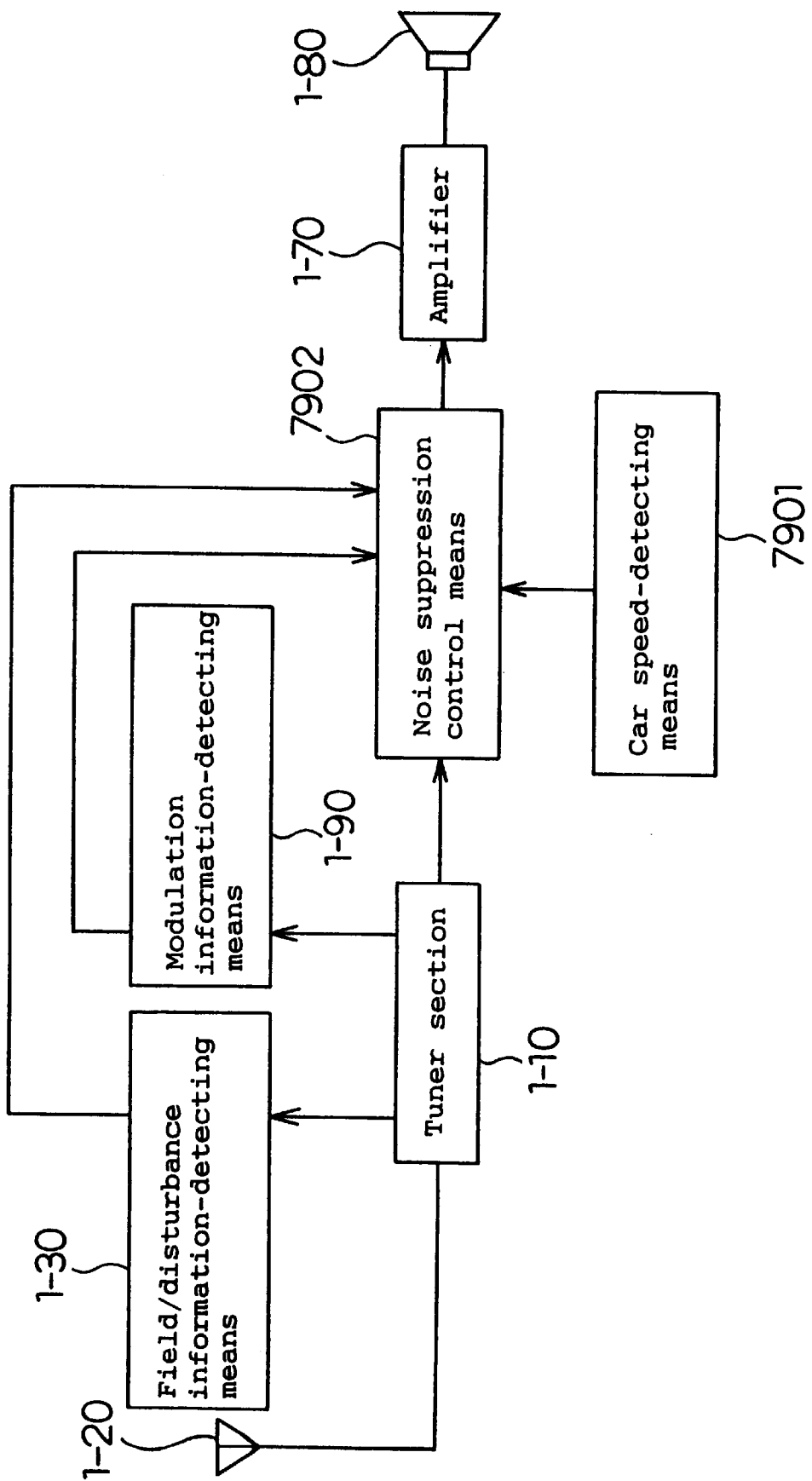
FIG. 29 is a structural view of the noise suppressing device of other embodiment according to the present invention.

FIG. 29 is a structural view of the noise suppressing device of the other embodiment according to the present invention, and the structure and the action of the present embodiment will be described with reference to FIG. 29. Here, the main structural difference with the embodiment shown in FIG. 1 is that a car speed-detecting means 7901 which detects the moving speed of the automobile loaded with an antenna is added and the like.

Thereby, the noise suppression control means 7902 controls the suppression or removal of the noise contained in said given signal by considering the car speed detected by said car speed-detecting means 7901, when the control is performed with respect to the given signal output from said tuner section, based on said field/disturbance informations to be output and said modulation informations to be output.

According to the present embodiment, when it is detected that the car speed is faster than the predetermined value, it is so controlled that the suppression or removal of the noise contained in the given signal is more emphasized than the case where the car speed is slower than the predetermined value, whereby the noise suppression or removal can be made more efficiently.

In addition, as the noise suppressing device of other embodiment according to the present invention, it may be so constituted that in the above embodiment, said noise cancel parameter-setting means considers the car speed detected by the car speed-detecting means 7901, whereby the similar effect can be obtained.

Furthermore, as the noise suppressing device of other embodiment according to the present invention, it may be so constituted that the muting characteristic variable means 6901 described with reference to FIG. 19 is used instead of the noise suppression control means 7902 in the embodiment described with reference to FIG. 29.

Figure 30:
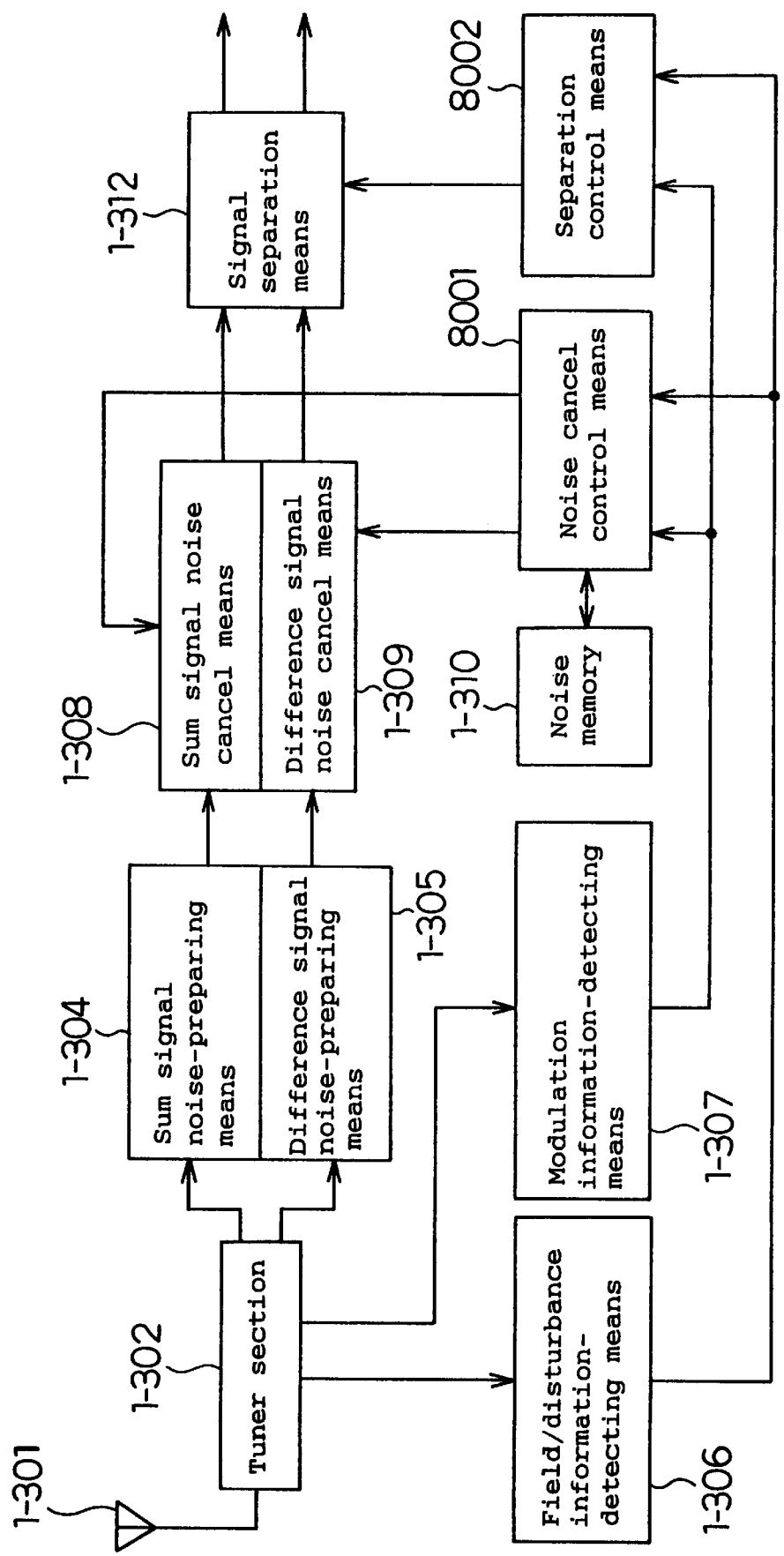
FIG. 30 is a structural view of the noise suppressing device of other embodiment according to the present invention.

FIG. 30 is a structural view of the noise suppressing device of the other embodiment according to the present invention, and the structure and the action of the present embodiment will be described with reference to FIG. 30. Here, the main structural difference with the embodiment shown in FIG. 1 is that, in the present embodiment, the noise cancel control means 8001 is a means to control said sum signal noise cancel means 1-308 and said difference signal noise cancel means 1-309, based on said field/disturbance informations from said field/disturbance information-detecting means 1-306, and the modulation informations from the modulation information-detecting means 1-307, and a separation control means 8002 which sets the separation degree of said plurality of given signals based on said field/disturbance information and said modulation information is added, whereby the noise can be suppressed or removed more efficiently.

In addition, as the noise suppressing device of the other embodiment according to the present invention, it is of course that the modulation information-detecting means 1-307 of the embodiment mentioned above with reference to FIG. 30 may not be provided.

Furthermore, as the noise suppressing device of the other embodiment according to the present invention, it may be so constituted that a new noise cancel control means which controls the sum signal noise cancel means 1-308 and the difference signal noise cancel means 1-309, based on the field/disturbance informations and the modulation informations and sets the noise cancel parameter based on the field/disturbance informations and the modulation informations is used, instead of the noise cancel control means 8001 of the embodiment described with reference to FIG. 30, and a new separation control means which sets the separation degree of said plurality of given signals based on the noise cancel parameter set by said new noise cancel control means is provided instead of the separation control means 8002, whereby the similar effect can be obtained. Furthermore, in this case, the modulation information-detecting means 1-307 may not be provided.

Figure 31:
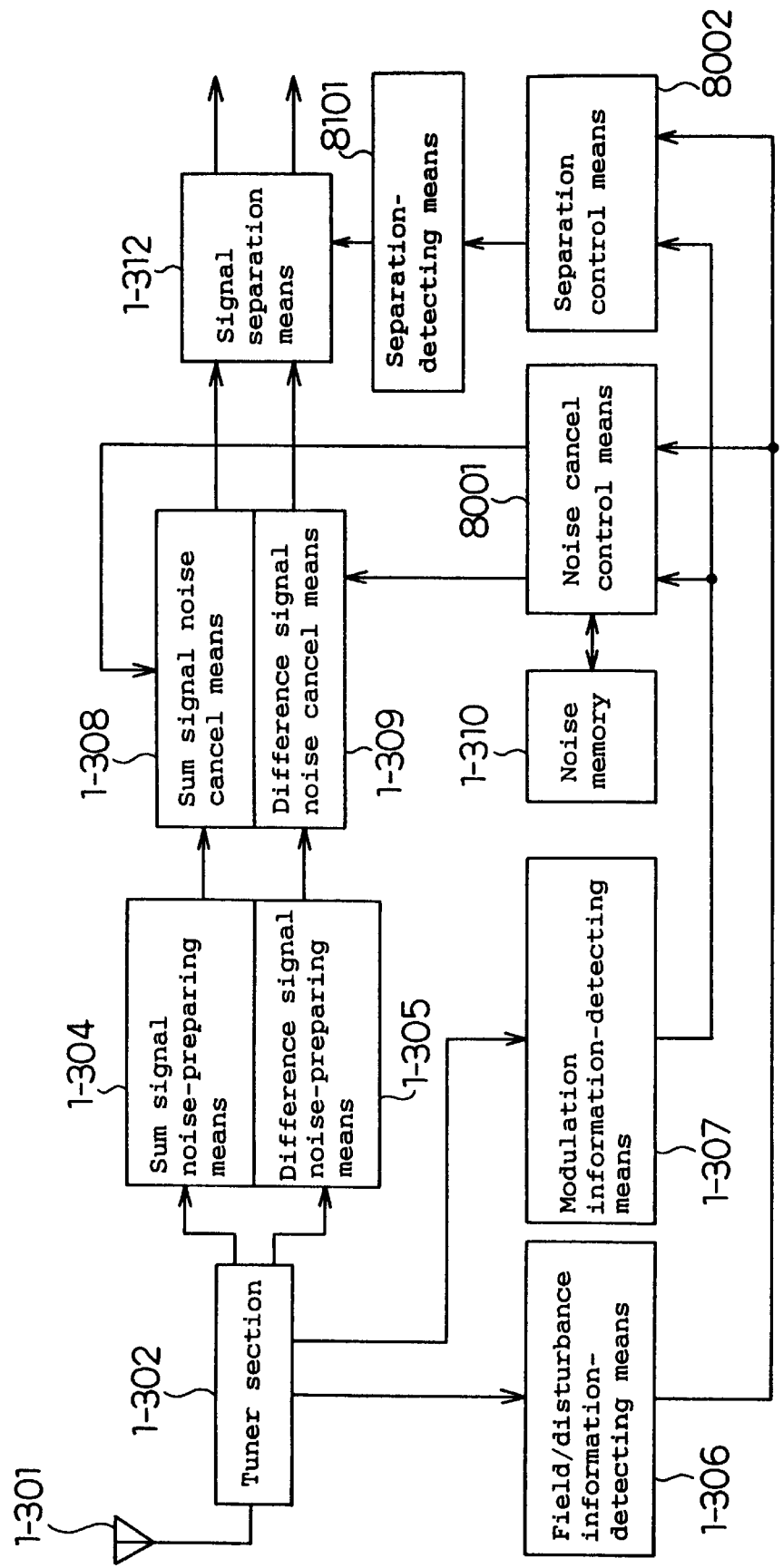
FIG. 31 is a structural view of the noise suppressing device of other embodiment according to the present invention.

Furthermore, as the noise suppressing device of the other embodiment according to the present invention, as shown in FIG. 31, it may be so constituted that, in the above embodiment, a separation detecting means 8101 is provided which detects the time-varying change of said separation degree output from the separation control means and gives the time constant characteristic to the time-varying change of said separation degree by utilizing the detection result, and said signal separation means separates said plurality of given signals from the sum signal and the difference signal in which the noise has been suppressed or removed by said noise cancel means, based on the separation degree having said time constant characteristic.

Figure 32:
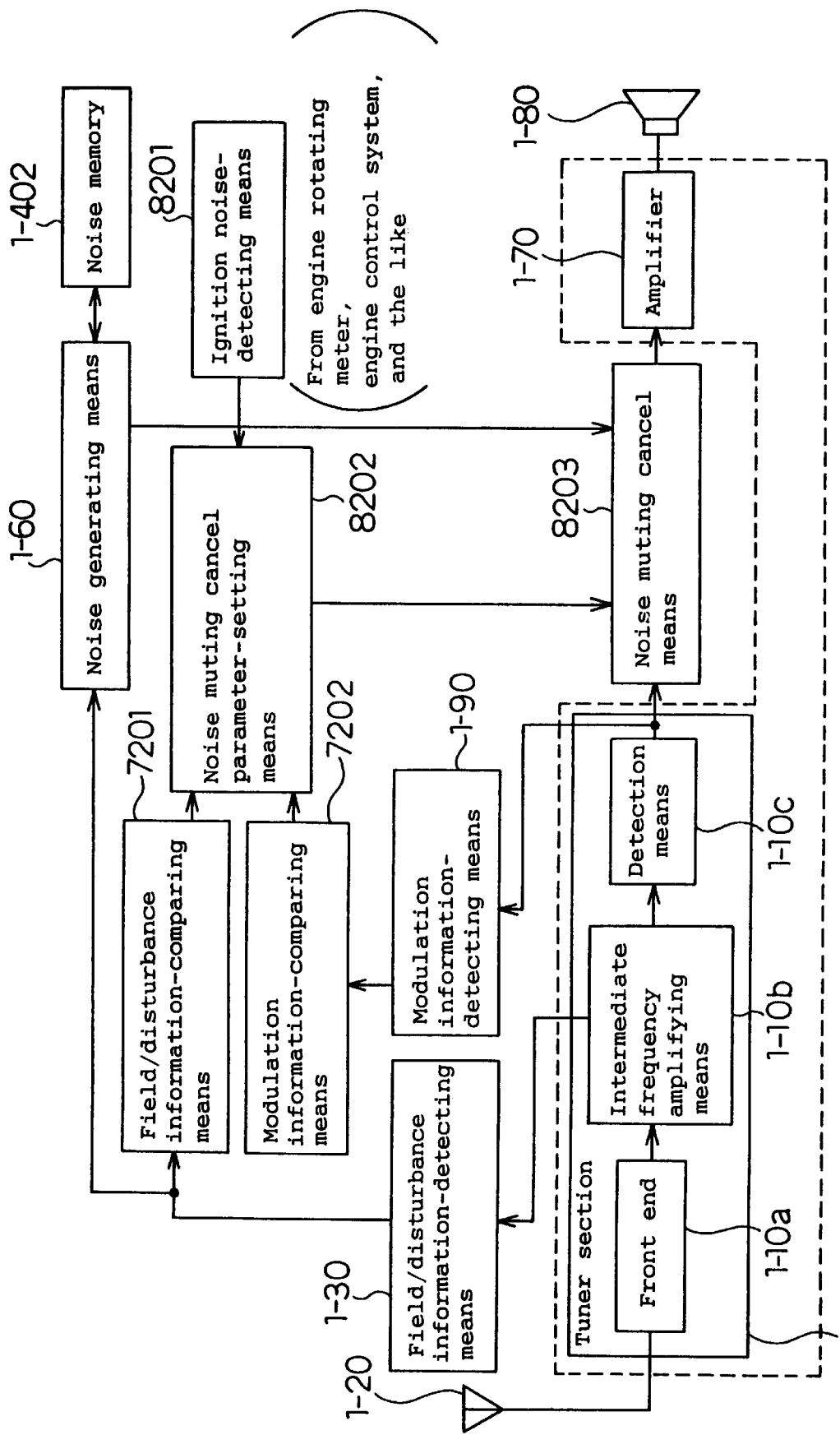
FIG. 32 is a structural view of the noise suppressing device of other embodiment according to the present invention.

FIG. 32 is a structural view of the noise suppressing device of the other embodiment according to the present invention, and the structure and the action of the present embodiment will be described with reference to FIG. 32.

Here, the main structural difference with the embodiment shown in FIG. 22 is that the ignition noise-detecting means 8201 which detects the ignition noise of the automobile loaded with the antenna 1-20 is added, and the noise muting cancel parameter-setting means 8202 sets the noise muting cancel parameter by considering said detected ignition noise, when the noise muting cancel parameter is set based on the comparison result by said field/disturbance information-comparing means 7201 and the comparison result from said modulation information-comparing means 7202. Thereby, the noise can be suppressed or removed more efficiently even in the moving automobile.

Incidentally, the noise muting cancel means 8203 of the embodiment described with reference to FIG. 32 was explained as being provided on the poststage of the detection section 1-10c, but, for exmaple, it may be provided between the intermediate frequency amplifier 1-10b and the detection section 1-10c, as the noise suppressing device of other embodiment according to the present invention, thereby the noise can be suppressed or removed more efficiently and more effectively.

Figure 33:
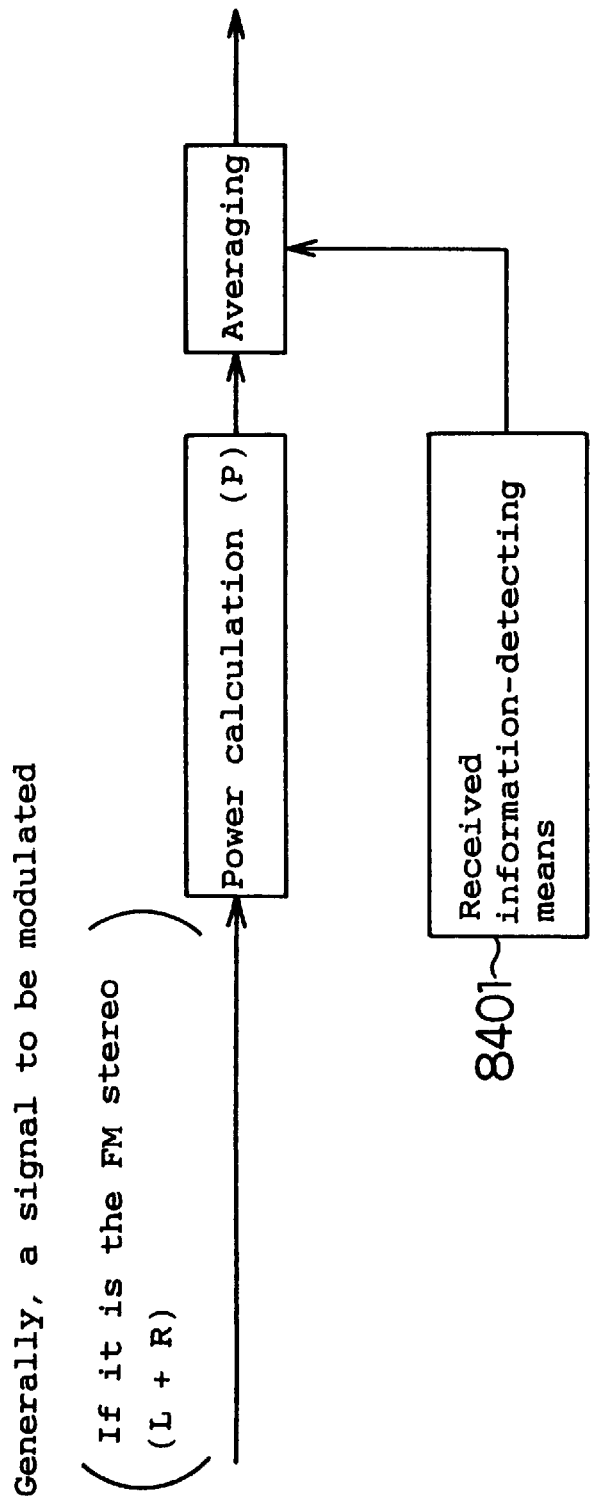
FIG. 33 is a block diagram showing the concept of the case where the modulation degree in the modulation degree-detecting device is determined from the power calculation, in other embodiment according to the present invention.
Figure 34:
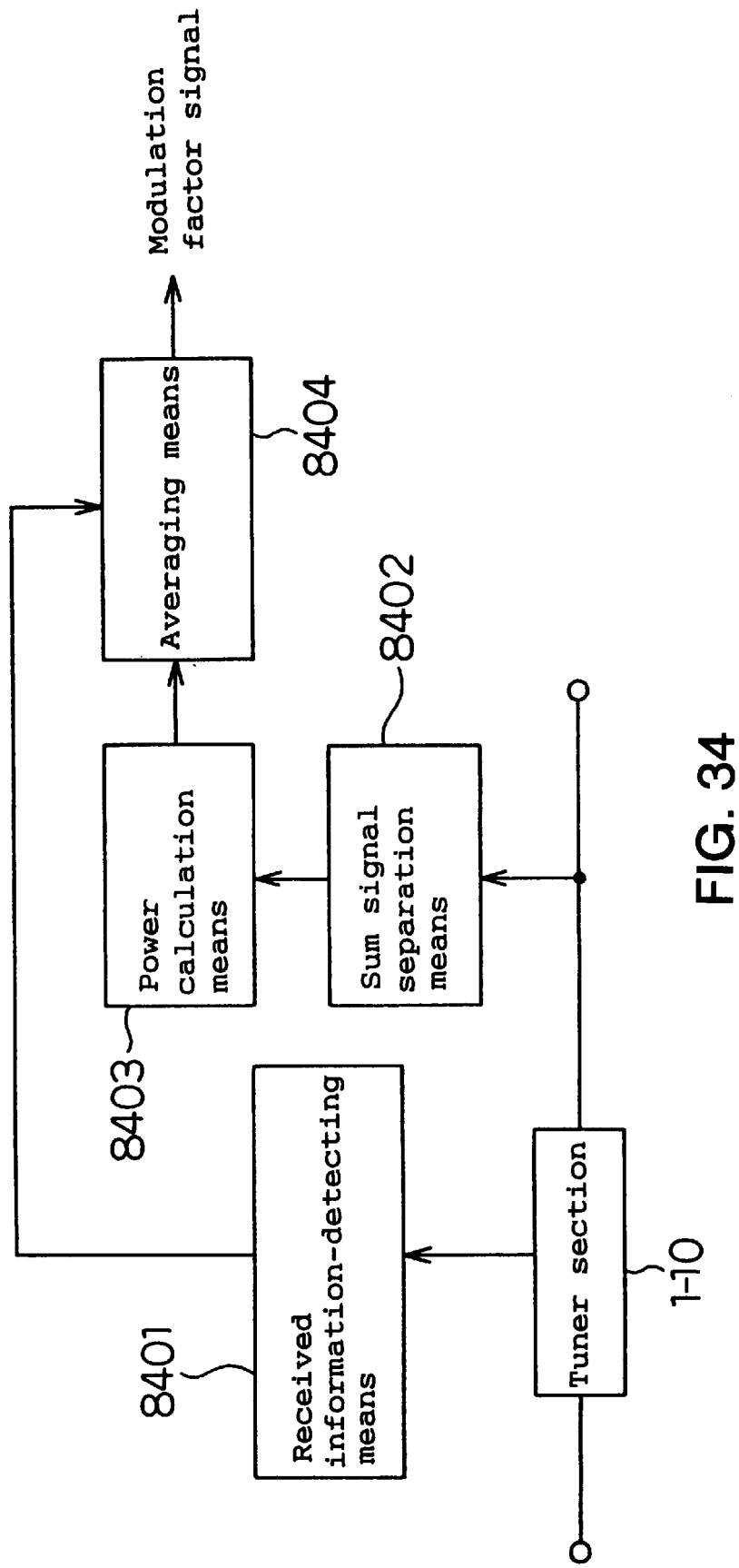
FIG. 34 is a structural view of the modulation degree-detecting device of other embodiment according to the present invention.

FIG. 34 is a view showing the structure of the modulation detecting device of other embodiment according to the present invention, and FIG. 33 is a block diagram showing the concept of the case where the modulation degree in the modulation degree-detecting device of the embodiment is determined by the power calculation, and the structure and the action of the present embodiment will be described with reference to these figures.

Referring to FIG. 34, 1-10 is a tuner section for detecting and outputting the given signal from the signal to be modulated, 8403 is a power calculating means for calculating the power of the (L+R) signal after said signal to be modulated has been detected, 8401 is a received information-detecting means for detecting the existence of the multipath signal, and 8404 is an averaging means which averages said power of the (L+R) signal only when said multipath signal does not exist, and outputs it as the modulation degree signal, reckoned as the modulation degree. In such structure, the audio signal power is calculated from the signal to be modulated. By the multipath informations obtained from the received information-detecting means 8401, the average of the power is determined only when the multipath does not exist (see FIG. 33, the time for averaging is determined by α in the figure), and reckoned as the modulation degree. Since the audio power value does not become the modulation degree as it is, a given converting means is provided after the power calculation or after averaging.

According to the present embodiment, it is so constituted that the modulation degree is determined by using the audio signal power after detection output and the multipath signal obtained by the received information-detecting means 8401, thereby such effect that the modulation degree can be calculated by a simple processing on the audio signal can be exerted.

Figure 35:
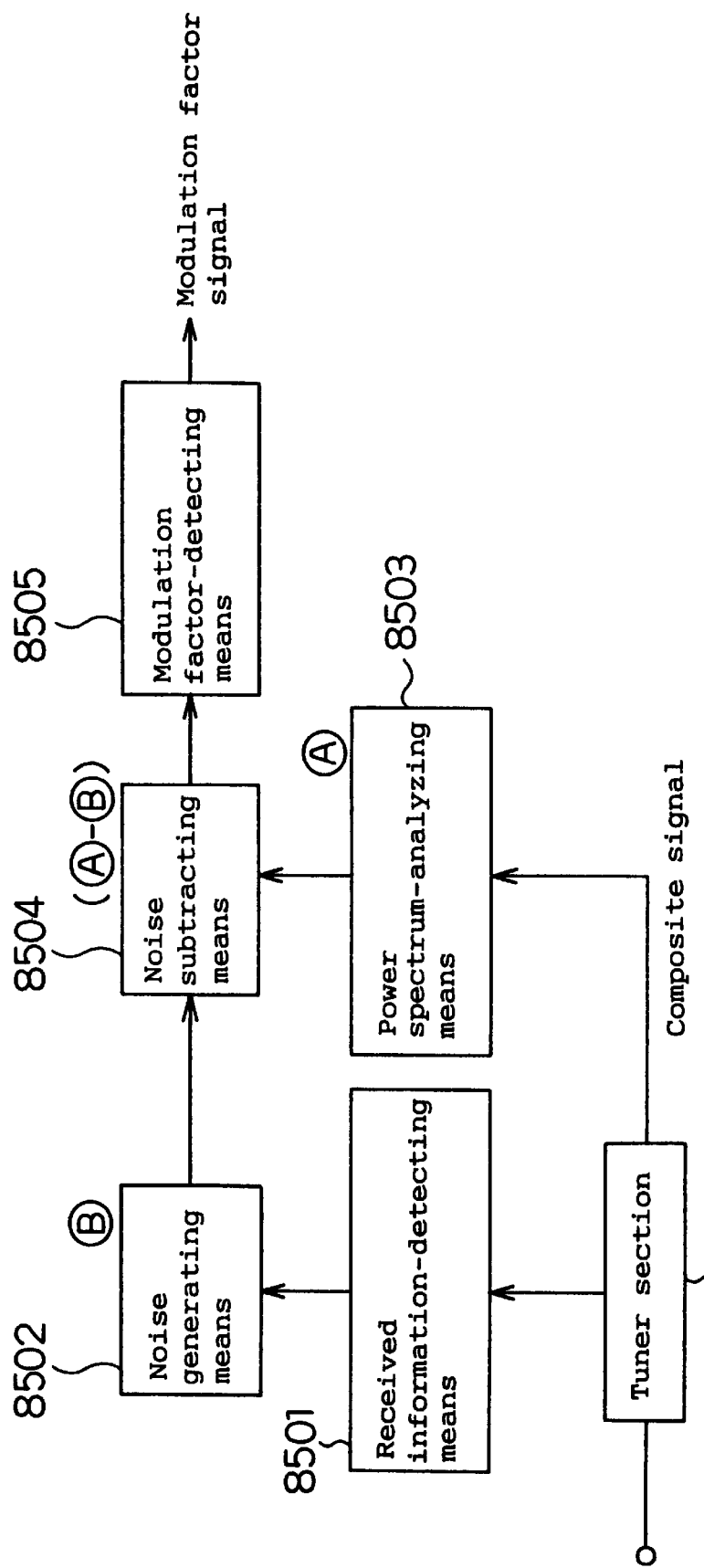
FIG. 35 is a structural view of the modulation degree-detecting device of other embodiment according to the present invention.

FIG. 35 is a view showing the structure of the modulation detecting device of other embodiment according to the present invention, and the structure and the action of the present embodiment will be described with reference to FIG. 35.

In FIG. 35, 8501 is a received information-detecting means for detecting the multipath signal and the field intensity from the tuner section 1-10, 8502 is a noise generating means as the noise generating means of the present invention, which generates the noise subtracted by the noise subtracting means described below. This noise is generated as the optimum noise according to the multipath informations and the field informations obtained by the received information-detecting means. As one example of this generation method, the noise may be read out from the memory, or the noise generating means described in said embodiment may be used. 8503 is a power spectrum-analyzing means for analyzing the power spectrum of the composite signal obtained from the tuner section 1-10. It converts the composite signal in the region of the time axis to the signal in the frequency region, and calculates the power spectrum of each frequency component. As the converting means to the frequency signal, there can be mentioned FFT (Fast Fourier Transform), FHT (Fast Hartley Transform) and the like. 8504 is a noise-subtracting means for subtracting the noise spectrum obtained by the noise generating means from the power spectrum of the composite signal obtained by the power spectrum-analyzing means 8503. As the noise-subtracting processing, there can be mentioned the spectrum subtraction and a method using a filter and the like. 8505 is a modulation degree-detecting means for detecting the modulation degree from the composite signal spectrum in which the noise has been removed obtained by the noise-subtracting means 8504, and outputting the modulation degree signal. As the method for detecting the modulation degree, there can be mentioned a method which uses full spectra of the composite signal, or if it the FM stereo, a method in which the modulation degree is obtained by only L+R signal described in the above embodiment.

By such structure, by determining the modulation degree from the noise-subtracted composite signal, such effect that the modulation degree can be determined accurately even in the case where there is the multipath signal or receiver's noise such as a weak field noise and the like.

Figure 36:
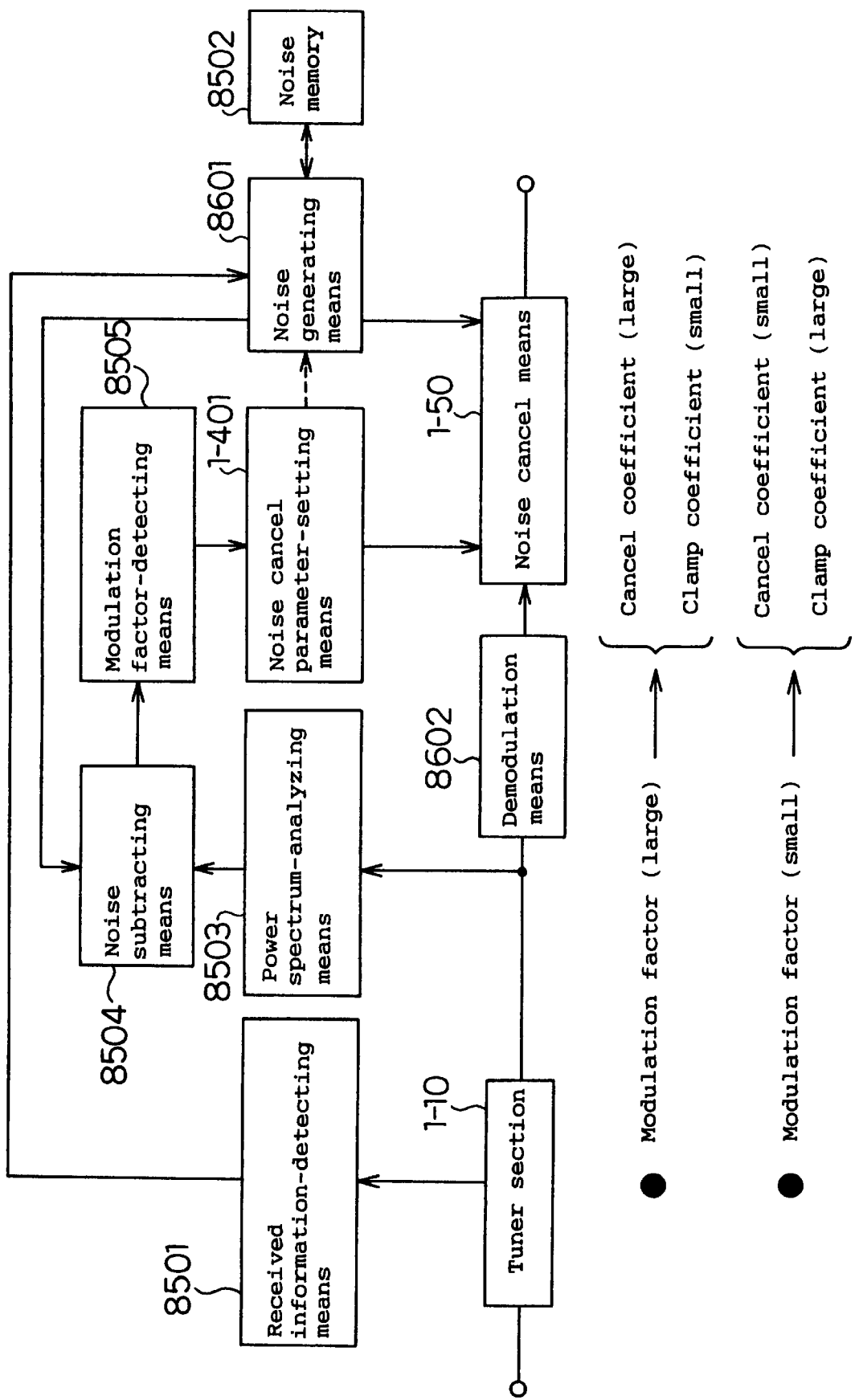
FIG. 36 is a structural view of the noise suppressing device of other embodiment according to the present invention.

FIG. 36 is a view showing the structure of the modulation detecting device of other embodiment according to the present invention, and the structure and the action of the present embodiment will be described with reference to FIG. 36.

The present embodiment is the one in which the noise generating means of the noise suppresing device of the above embodiment is shared, therefore substantially the same part is given the same reference numeral.

Referring to FIG. 36, 8601 is a noise generating means as the noise generating means of the present invention, which generates the noise spectrum based on the multipath informations and the field-intensity informations from the received information-detecting means 8501 and also generates the noise power spectrum for the composite singal. The demodulation means 8602 is provided to input the audio signal between the noise cancel means and the tuner section 1-10. Moreover, at the noise generating means 8601, L+R, L−R noise spectra are generated in the stereo FM. The frequency band is 15 kHz for both L+R and L−R. On the other hand, though the composite signal is in the band up to 57 kHz, since the band of L+R and L−R are determined, the noise spectrum may be determined by converting the band. The reverse is also possible.

The noise data held in the noise memory 8502 includes the noise in the composite signal, or the noise in L+R, L−R.

By such a structure, the accuracy of the modulation degree-detecting means 8505 is enhanced, thereby the noise cancel parameter can be set most suitably. As a result, large noise cancel effect can be obtained, as well as the incorrect action of the noise cancel can be reduced.

As is obvious from the above description, the present invention has the advantage that the function to suppress or remove the noise is more improved compared to the conventional devices.

The embodiments of the present invention will now be described with reference to the accompanied drawings.

Figure 37:
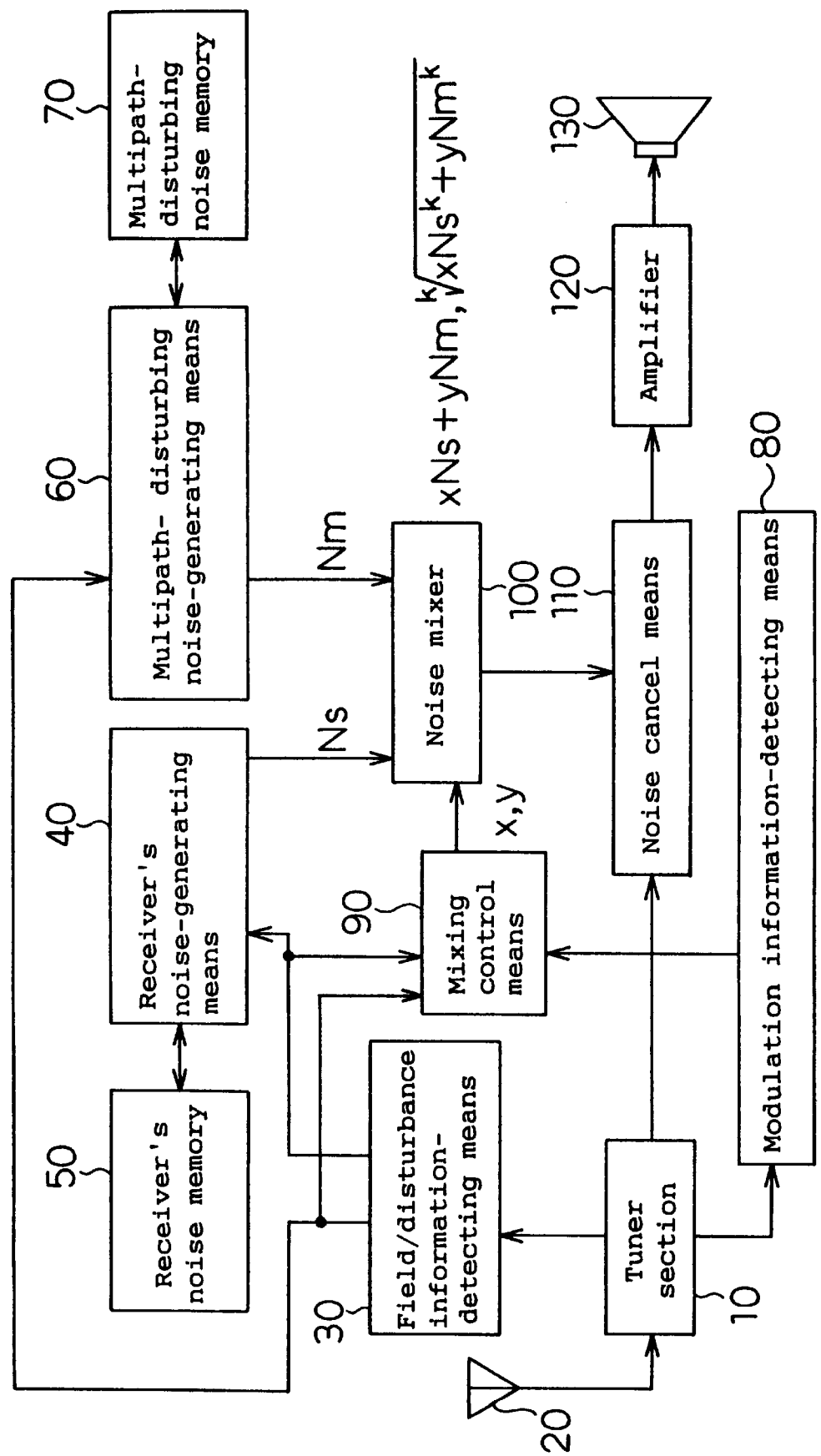
FIG. 37 is a structural view of the noise suppressing device of one embodiment according to the present invention.

FIG. 37 is a structural view of the noise suppressing means of one embodiment according to the present invention, and the structure and the action of the present embodiment will be described with reference to FIG. 37.

Namely, in FIG. 37, reference numeral 10 represents a tuner section which detects the radio wave and converts it to the electric signal, and 20 represents an antenna as the input means of the present invention connected to the tuner section 10.

30 represents a field/disturbance information-detecting means which detects the carrier level of the input signal and the disturbed degree of the input signal as the field/disturbance informations of the present invention, based on the signal from the inside of the tuner section 10. Namely, the field/disturbance information-detecting means 30 detects the signal of the intermediate frequency which is the output of the intermediate frequency amplifier (not shown) inside of the tuner section 10, and by analyzing the component of this signal, detects said field/disturbance informations, and sends the information corresponding to each means, to the receiver's noise-generating means 40 and the multipath-disturbing noise-generating means 60 described below. As the level of the carrier of the input signal, the field level is utilized, and as the disturbed degree of the input signal, the multipath disturbance and the ghost disturbance and the like are utilized.

40 is a receiver's noise-generating means for generating and outputting the receiver's residual noise data (being expressed as Ns in the drawing), while referring to the receiver's noise memory 50 based on the information relating to the field level, among the field/disturbance informations output from the field/disturbance information-detecting means 30.

60 is a multipath-disturbing noise-generating means for generating and outputting multipath-disturbing noise data (being expressed as Nm in the drawing), while referring to the multipath-disturbing noise memory 70 based on the information relating to the multipath disturbance, among said field/disturbance informations to be output.

80 is a modulation information-detecting means to detect the modulation informations relating to the modulation degree and the like based on the signal from the tuner section 10 and to output the modulation informations, and 90 is a mixing control means to utilize the field/disturbance informations output from the field/disturbance information-detecting means 30 and the modulation informations from the modulation information-detecting means 80 to control the way of adding processing of the noise mixer 100 described below.

100 is a noise mixer to utilize the receiver's residual noise data output from the receiver's noise-generating means 40 and the multipath-disturbing noise data output from the multipath-disturbing noise-generating means 60 to add these noise data based on the instruction of the mixing control means 90, and output the added noise data.

Here, the action in the mixing control means 90 and the noise mixer 100 will be explained more concretely.

The mixing control means 90 determines x and y which are the mixing coefficients as weighting to be given to respective data, receiver's residual noise data Ns and multipath-disturbing noise data Nm, based on the field/disturbance informations and the modulation informations as follows (see FIG. 38).

Figure 38A:
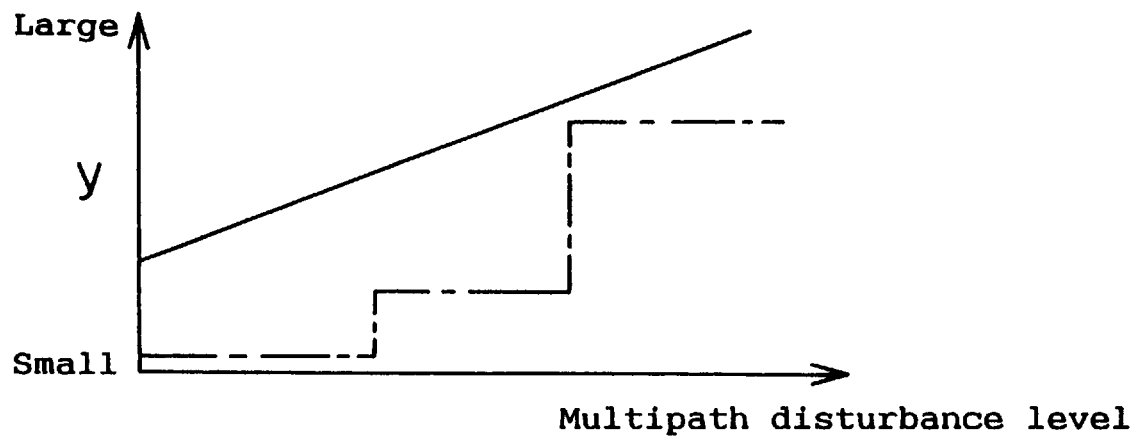
FIG. 38A is graphs showing the relation between the mixing coefficient and the field/disturbance informations in the noise suppressing device of one embodiment according to the present invention.
Figure 38B:
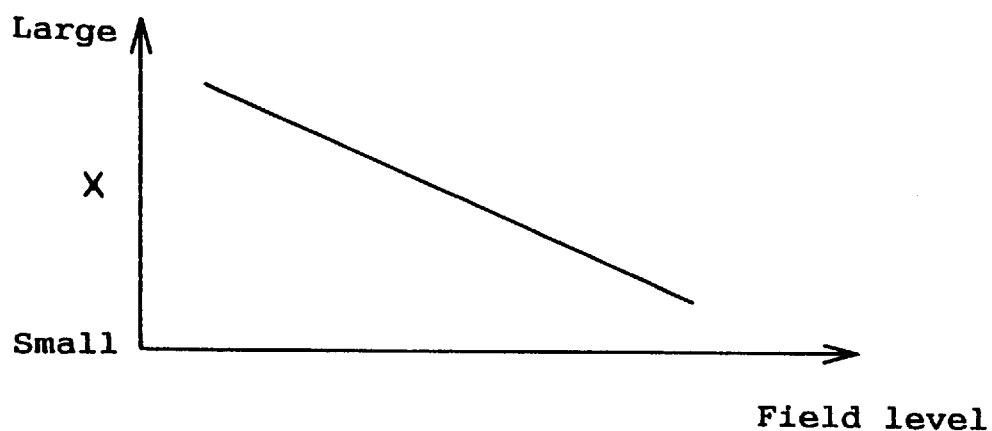
FIG. 38B is graphs showing the relation between the mixing coefficient and the field/disturbance informations in the noise suppressing device of one embodiment according to the present invention.

Namely, the mixing coefficient y is made larger as the multipath disturbance level becomes larger (may be determined by a function like a solid line, as shown in FIG. 38A, or may be determined by a function like a one-dot chain line). The field level is added further, and the mixing coefficient y is determined so that it becomes larger as the field level becomes larger (not shown in the drawing). In addition, in the present embodiment, the modulation information from the modulation information-detecting means 80 is further considered in addition to said field/disturbance informations. Therefore, said mixing coefficient y is determined to be larger, when the modulation degree which is the modulation information is small, and the multipath disturbance level is large.

Furthermore, the mixing coefficient x is made smaller, as the field level is larger (see FIG. 38B), and by adding the multipath disturbance level, the value of x is determined to become smaller, as the multipath disturbance level becomes larger (not shown in the drawing).

Thus determined mixing coefficients x and y are given so as to correspond to the receiver's residual noise data output from the receiver's noise-generating means 40 and the multipath-disturbing noise data output from the multipath-disturbing noise-generating means 60, added based on the instruction of the mixing control means 90 (expressed as xNs+yNm in FIG. 38), and the added noise data (xNs+yNm) is output from the noise mixer 100.

Thus prepared and output noise data is subtracted from the noise-containing signal output from the tuner section 10 by the noise cancel means 110, and as a result, a signal in which the noise has been removed is output to the amplifier 120, amplified and sent to the speaker 130.

Thus, according to the present embodiment, it is so constituted that the noise data is prepared by adding the receiver's residual noise data and the multipath-disturbing noise data to be sent to the noise cancel means 110, and only one noise cancel means will do, thereby the effect that the noise can be removed at quite low cost and more efficiently compared to the conventional device is exerted.

More concretely speaking, for example, in general when the multipath disturbance comes in, the receiver's residual noise is simultaneously generated because the input signal falls into the weak field. Even in this case, with the above structure, the noise can be removed all at once by the noise cancel means which manages the receiver's residual noise data and the multipath-disturbing noise data. Thus, the phenomenon that the receiver's residual noise is simultaneously generated is conspicuous in the FM radio, the portable telephone, the AM radio, the transceiver or the like, therefore the present invention is applicable to these instruments.

Figure 40:
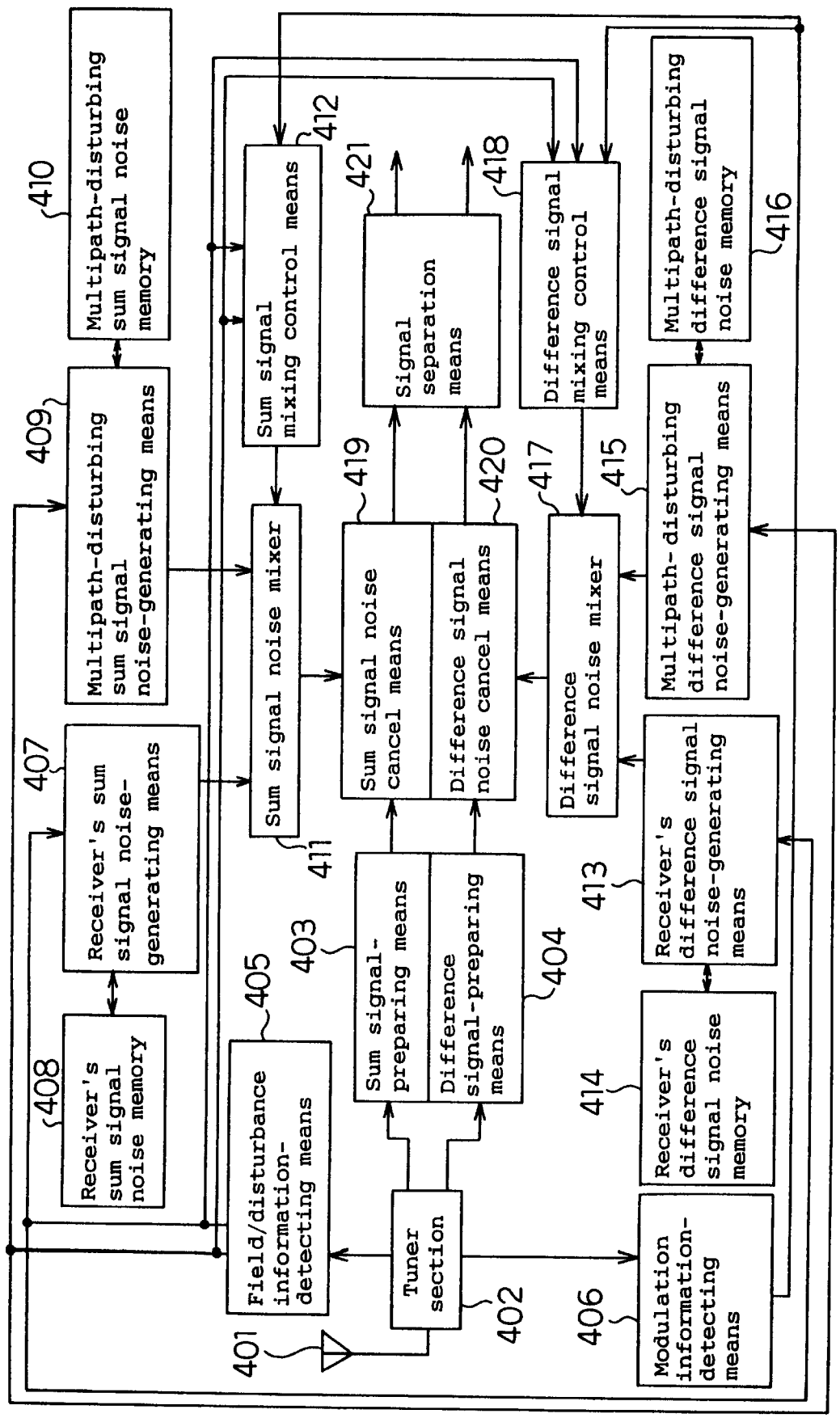
FIG. 40 is a structural view of the noise suppressing device of other embodiment according to the present invention.

FIG. 40 is a structural view of the noise suppressing device of other embodiment according to the present invention, and the structure and the action of the present embodiment will be described with reference to FIG. 40.

401 is an antenna as the input means of the signal to be modulated in the transfer system of the stereo signal, and 402 is a tuner section which obtains the signal from the antenna 401 and detects and outputs a plurality of given signals.

403 is a sum signal-preparing means for preparing the sum signal which is the sum of L-signal and R-signal output from the tuner section 402, and 404 is a difference signal-preparing means for preparing the difference of each signal output from the tuner section 402.

405 is a field/disturbance detecting means which detects and outputs the field/disturbance informations relating to the carrier level of the stereo signal and the disturbed degree of the stereo signal from the tuner section 402, and 406 is a modulation information-detecting means for detecting the modulation informations relating to the modulation degree of the stereo signal and the stereo pilot signal level from the tuner section 402 and outputs the modulation informations.

407 is a receiver's sum signal noise-generating means for generating and outputting the receiver's residual sum signal noise data, while referring to the contents of the receiver's sum signal noise memory 408. And 409 is a multipath-disturbing sum signal noise-generating means for generating and outputting the multipath-disturbing sum signal noise data, while referring to the multipath-disturbing sum signal noise memory 410, based on the information relating to the disturbed degree among the field/disturbance informations output from the field/disturbance information-detecting means 405.

411 is a sum signal noise mixer which utilizes said receiver's residual sum signal noise data to be output and said multipath-disturbing sum signal noise data to be output to add these noise data to which the mixing coefficients determined by the sum signal mixing control means described later are given, and outputs the added noise data. 412 is a sum signal mixing control means which determines said mixing coefficient used for the adding processing of said sum signal noise mixer based on said field/disturbance informations to be output and the modulation information output from the modulation information-detecting means 406.

Although the foregoing is the structure of the sum signal, the difference signal has the similar structure. Namely, 413 is a receiver's difference signal noise-generating means for generating and outputting the receiver's residual difference signal noise data, while referring to the contents of the receiver's difference signal noise memory 414. And 415 is a multipath-disturbing difference signal noise-generating means for generating and outputting the multipath-disturbing difference signal noise data, while referring to the contents of the multipath-disturbing difference signal noise memory 416.

417 is a difference signal noise mixer which utilizes said receiver's residual difference signal noise data to be output and said multipath-disturbing difference signal noise data to be output to add these noise data to which the mixing coefficients determined by the difference signal mixing control means 418 described later are given, and outputs the added noise data. 418 is a difference signal mixing control means which determines said mixing coefficient used for the adding processing of said difference signal noise mixer 417 based on said field/disturbance informations to be output and the modulation information output from the modulation information-detecting means 406.

419 is a sum signal noise cancel means which utilizes the noise data output from the sum signal noise mixer 411 to suppress or remove the noise contained in the sum signal with respect to said sum signal, and 420 is a difference signal noise cancel means which utilizes the noise data output from the difference signal noise mixer 417 to suppress or remove the noise contained in the difference signal with respect to said difference signal. 421 is a signal separation means to separate said plurality of given signals based on the sum signal and the difference signal in which the noise has been suppressed or removed.

Thus, according to the present embodiment, when the input signal is a stereo signal, it is so constituted that the noise data is prepared by adding the receiver's residual noise data and the multipath-disturbing noise data, and is sent to respective noise cancel means 419 and 420, and only one noise cancel means will do for the sum signal and for the difference signal, respectively, thereby the effect that the noise can be removed at quite low cost and efficiently is exerted.

Incidentally, in said embodiment, the case where the noise data is added as the noise mixer has been described, however, for example, instead of the adding processing, it may be so constituted to select the noise data having larger noise level among receiver's residual noise data (for example, xNs) to which the mixing coefficient is given and the multipath disturbing noise data (for example, yNm) to which said mixing coefficient is given. This is applied to the case where the input signal is a stereo signal.

Furthermore, in the above embodiment, it has been described for the case shown in FIG. 38 as the way to determine the mixing coefficient in the mixing control means 90, but, for example, it may be so constituted to determine said mixing coefficient by using the fuzzy function. This is applied to the case where the input signal is a stereo signal.

Furthermore, in said embodiment, the case where the noise mixer is a means to add the noise data has been described, however, for example, instead of the adding processing, it may be constituted as a noise selector which selects the noise data having larger noise level among receiver's residual noise data to which the mixing coefficient is given and the multipath disturbing noise data to which said mixing coefficient is given, and outputs the selected noise data to the noise cancel means. This is applied to the case where the input signal is a stereo signal.

Furthermore, said embodiment has been described with regard to the case where the modulation information from the modulation information-detecting means is also considered, when the mixing control means 90, 412 and 418 determine the mixing coefficients, but for example, the noise suppressing device may not include said modulation information-detecting means.

Figure 39:
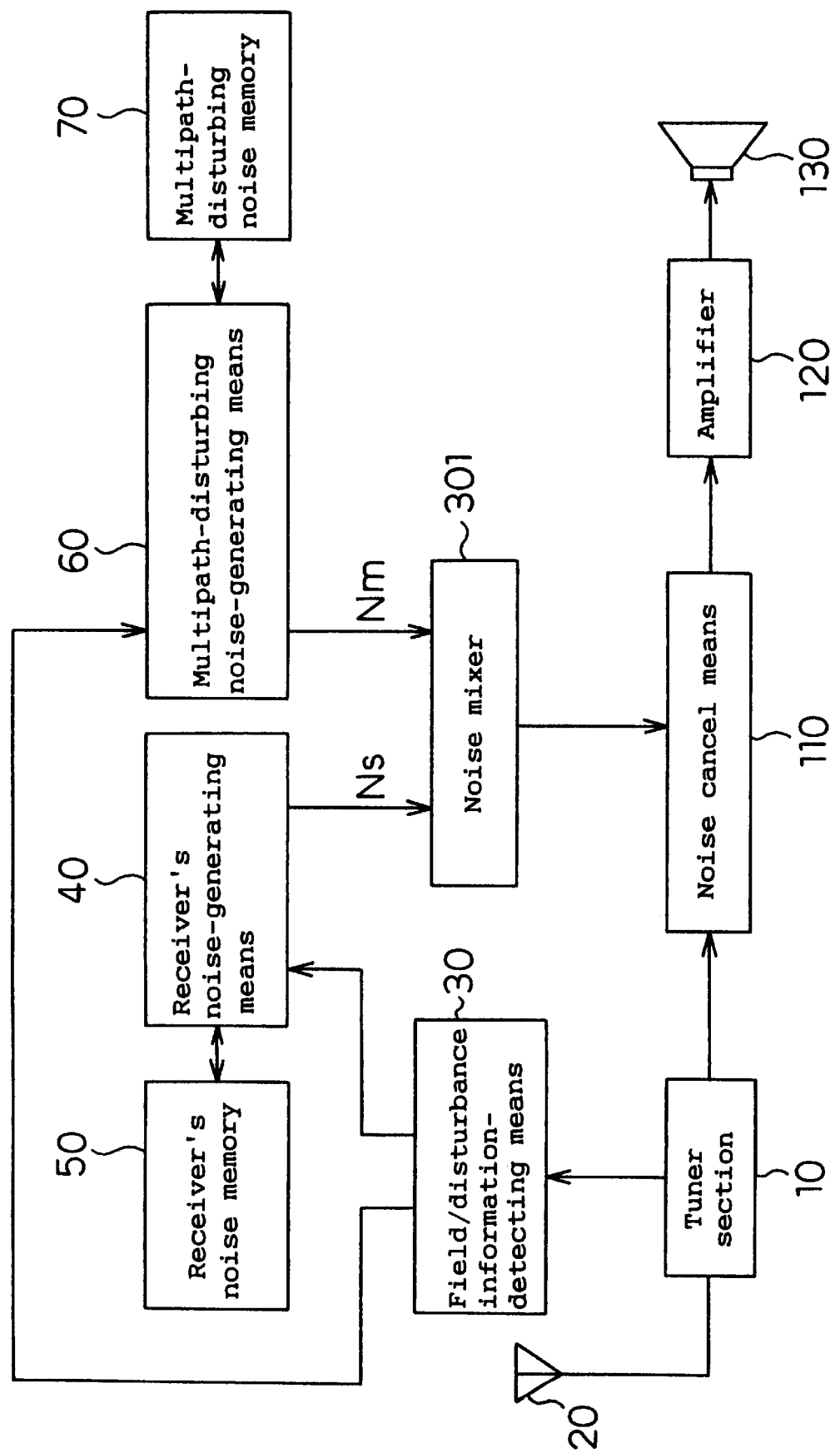
FIG. 39 is a structural view of the noise suppressing device of other embodiment according to the present invention.
Figure 41:
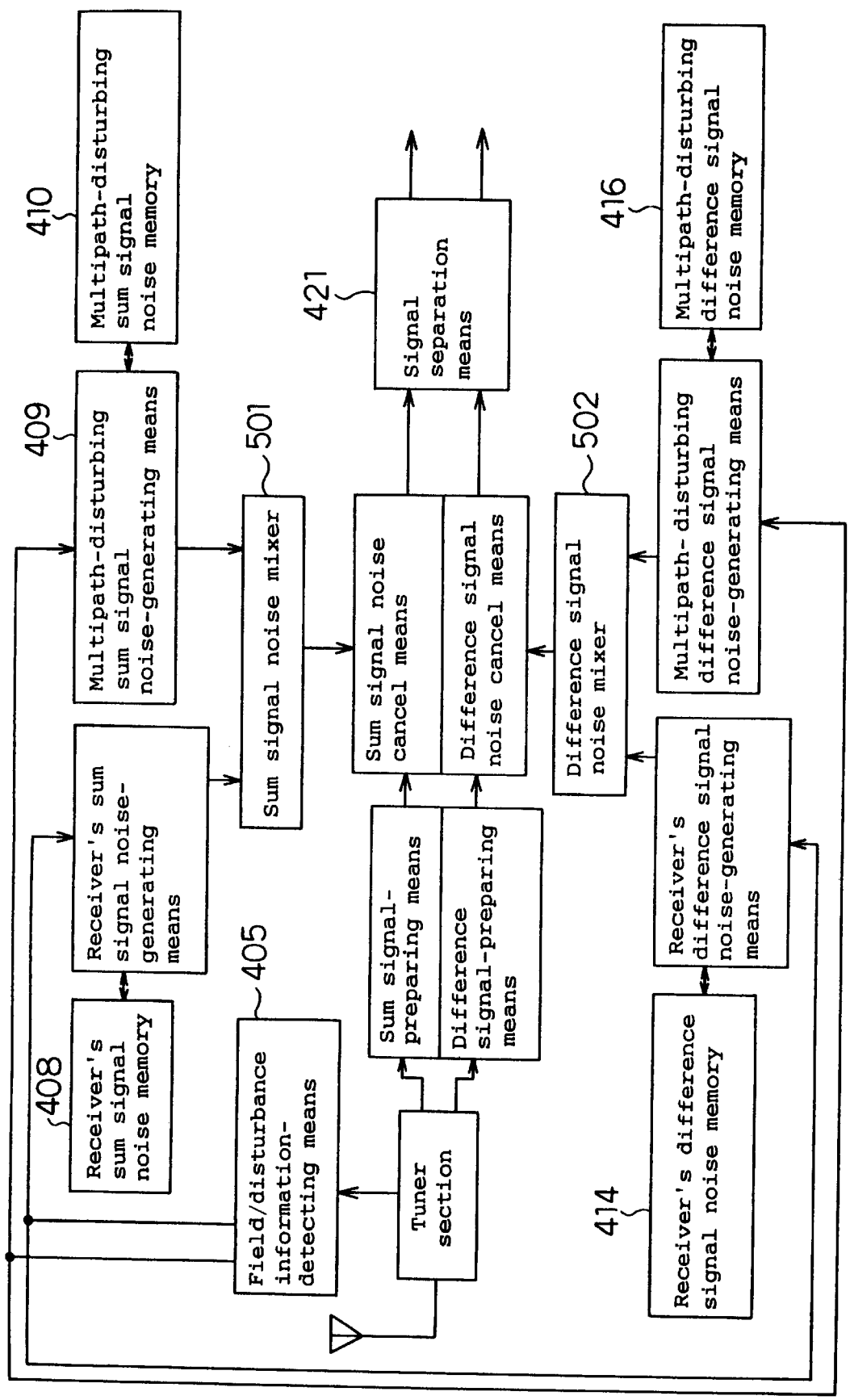
FIG. 41 is a structural view of the noise suppressing device of other embodiment according to the present invention.

Furthermore, the above embodiment has been described with regard to the case where the noise mixer 100 performs predetermined mixing processing based on the instruction from the mixing control means 90, but for example, the noise suppressing device may not include said mixing control means (see FIG. 39). In this case, as shown in FIG. 39, the noise mixer 301 is constituted to utilize the receiver's residual noise data and the multipath-disturbing noise data to mix these noise data and output the mixed noise data to the noise cancel means 110. Here, the noise mixer 301 may be the adding means to add the receiver's residual noise data and said multipath-disturbing noise data to be output, or may be the noise selector to select the noise data having larger noise level among the receiver's residual noise data and the multipath-disturbing noise data. This is applied to the case where the input signal is a stereo signal (see FIG. 41), and in this case, as shown in FIG. 41, it is so constituted that the respective noise mixers 501 and 502 utilize the respective receiver's residual noise data and the respective multipath-disturbing noise data to mix these noise data, and output the mixed noise data to the respective noise cancel means 419 and 420. Here, the noise mixer 501 and 502 may be the adding means to add the receiver's residual noise data and said multipath-disturbing noise data to be output, or may be the noise selector to select the noise data having larger noise level among the receiver's residual noise data and the multipath-disturbing noise data.

Figure 42:
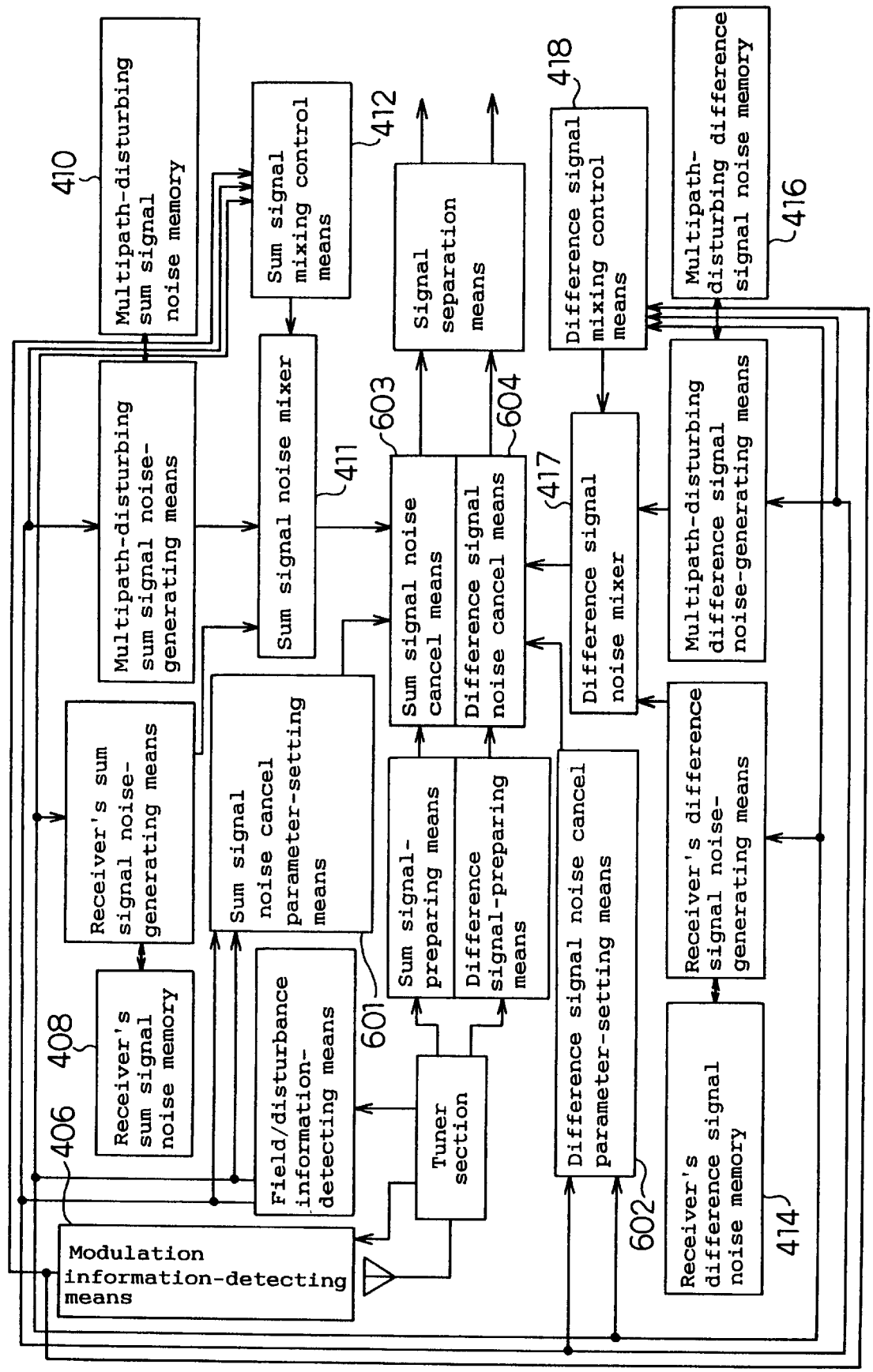
FIG. 42 is a structural view of the noise suppressing device of other embodiment according to the present invention.

FIG. 42 is a structural view of the noise suppressing device of the other embodiment according to the present invention, and the structure and the action of the present embodiment will be described with reference to FIG. 42.

The main structural difference between this embodiment and the above embodiment shown in FIG. 40 is that respective noise cancel parameter-setting means 601 and 602 are added, and the processing in the respective noise cancel means 603 and 604 differ accordingly. Incidentally, the same reference numeral is given to the substantially similar parts as in FIG. 40, and the description thereof will be omitted.

Namely, 601 is a sum signal noise cancel parameter-setting means to set the clamp coefficient and the cancel coefficient as the sum signal noise cancel parameter, based on said field/disturbance informations to be output, and 602 is a difference signal noise cancel parameter-setting means to set the clamp coefficient and the cancel coefficient as the difference signal noise cancel parameter, based on said field/disturbance informations to be output. 603 is a sum signal noise cancel means to utilize said set sum signal noise cancel parameter and the noise data output from said sum signal noise mixer 411 to suppress or remove the noise contained in the sum signal, with respect to said sum signal, and 604 is a difference signal noise cancel means to utilize said set difference signal noise cancel parameter and the noise data output from said difference signal noise mixer 417 to suppress or remove the noise contained in the difference signal, with respect to said difference signal.

Accordingly, in the present embodiment, since the noise is removed considering also the noise cancel parameter in respective noise cancel means 603 and 604, the noise can be removed more effectively.

Figure 43:
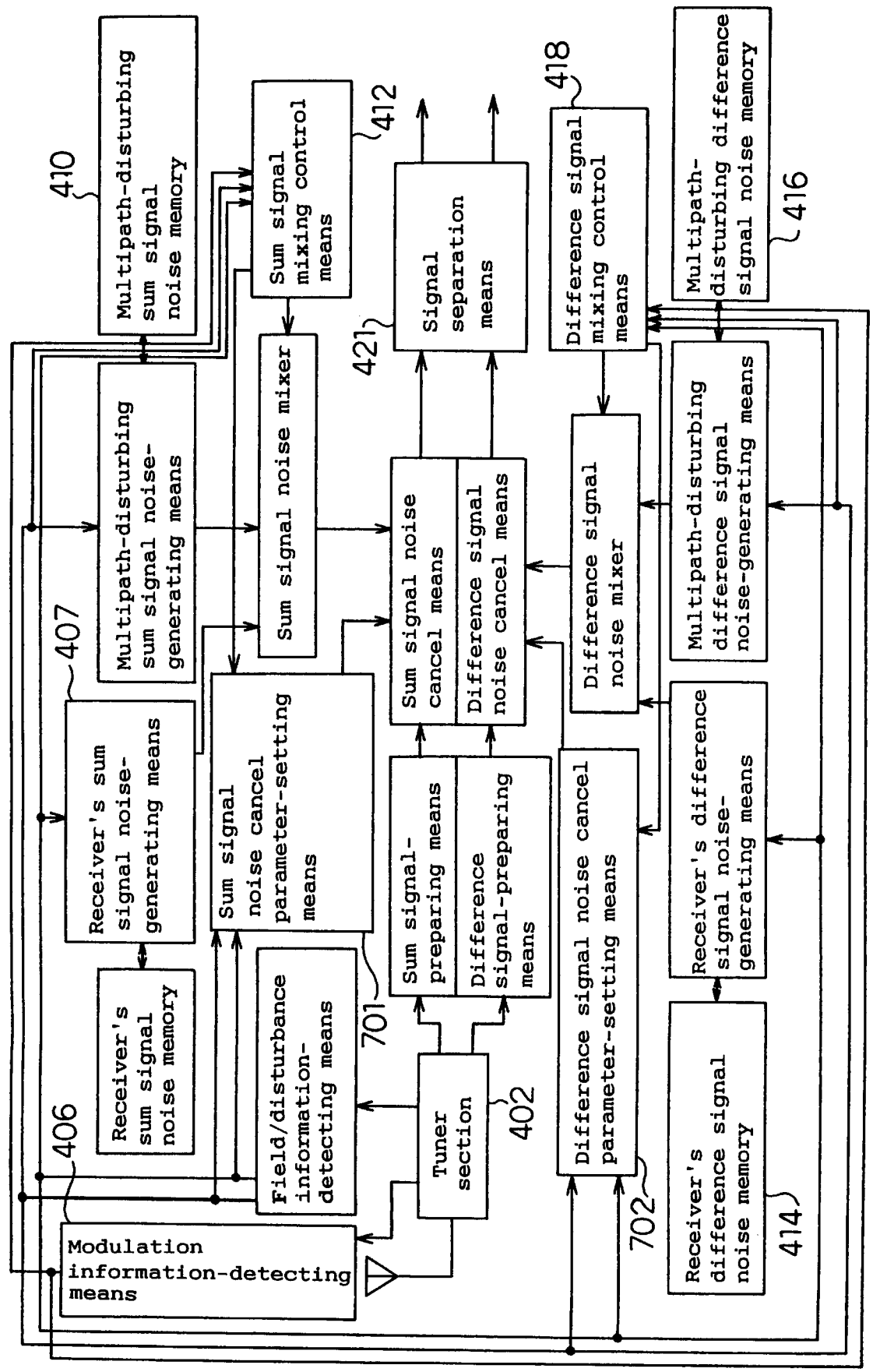
FIG. 43 is a structural view of the noise suppressing device of other embodiment according to the present invention.

In addition, as shown in FIG. 43, respective noise cancel parameter-setting means 701 and 702 may be so constituted to obtain the informations relating to the mixing coefficients x and y from said respective mixing control means 412 and 418, and to set respective cancel parameters. Concretely speaking, respective noise cancel parameter-setting means 701 and 702 compare said mixing coefficients, x and y, and when y is larger, that is, the multipath disturbance is largely mixed, the clamp coefficient is controlled to become smaller.

Furthermore, in the above embodiment, the case where the noise data is added as the noise mixer has been described, however, for example, instead of the adding processing, it may be so constituted to select the noise data having larger noise level among receiver's residual noise data (for example, xNs) to which the mixing coefficient is given and the multipath-disturbing noise data (for example, yNm) to which said mixing coefficient is given. Moreover, as the processing of the mixer, it may be any mixing processing such as multiplication processing of each noise data, or a processing in which the receiver's residual noise data and the multipath-disturbing noise data are multiplied by k, giving the mixing coefficient to them, and the respective data are added and the k root is taken away, so far as being a so-called mixing processing. This is regardless of whether the input signal is a monaural signal or a stereo signal.

Furthermore, in the above embodiment, for example, the case shown in FIG. 38 has been described as the way to determine the mixing coefficient in the mixing control means 90, but, for example, it may be so constituted to determine said mixing coefficient by using the fuzzy function. This is regardless of whether the input signal is a monaural signal or a stereo signal.

Furthermore, in said embodiment, the case where the noise mixer is a means to add the noise data has been described, however, for example, instead of the adding processing, it may be constituted as a noise selector which selects the noise data having larger noise level among receiver's residual noise data to which the mixing coefficient is given and the multipath-disturbing noise data to which said mixing coefficient is given, and outputs the selected noise data to the noise cancel means. This is regardless of whether the input signal is a monaural signal or a stereo signal.

Furthermore, the above embodiment has been described with regard to the case where the modulation information from the modulation information-detecting means is also considered, when the mixing control means 90, 412 or 418 determines the mixing coefficient, but for example, the noise suppressing device may not include said modulation information-detecting means. In this case, the mixing control means performs the control, such as to determine the mixing coefficient, with regard to the mixing processing of the noise mixer, based on the field/disturbance informations from the field/disturb and information-detecting means. This is regardless of whether the input signal is a monaural signal or a stereo signal.

Figure 44:
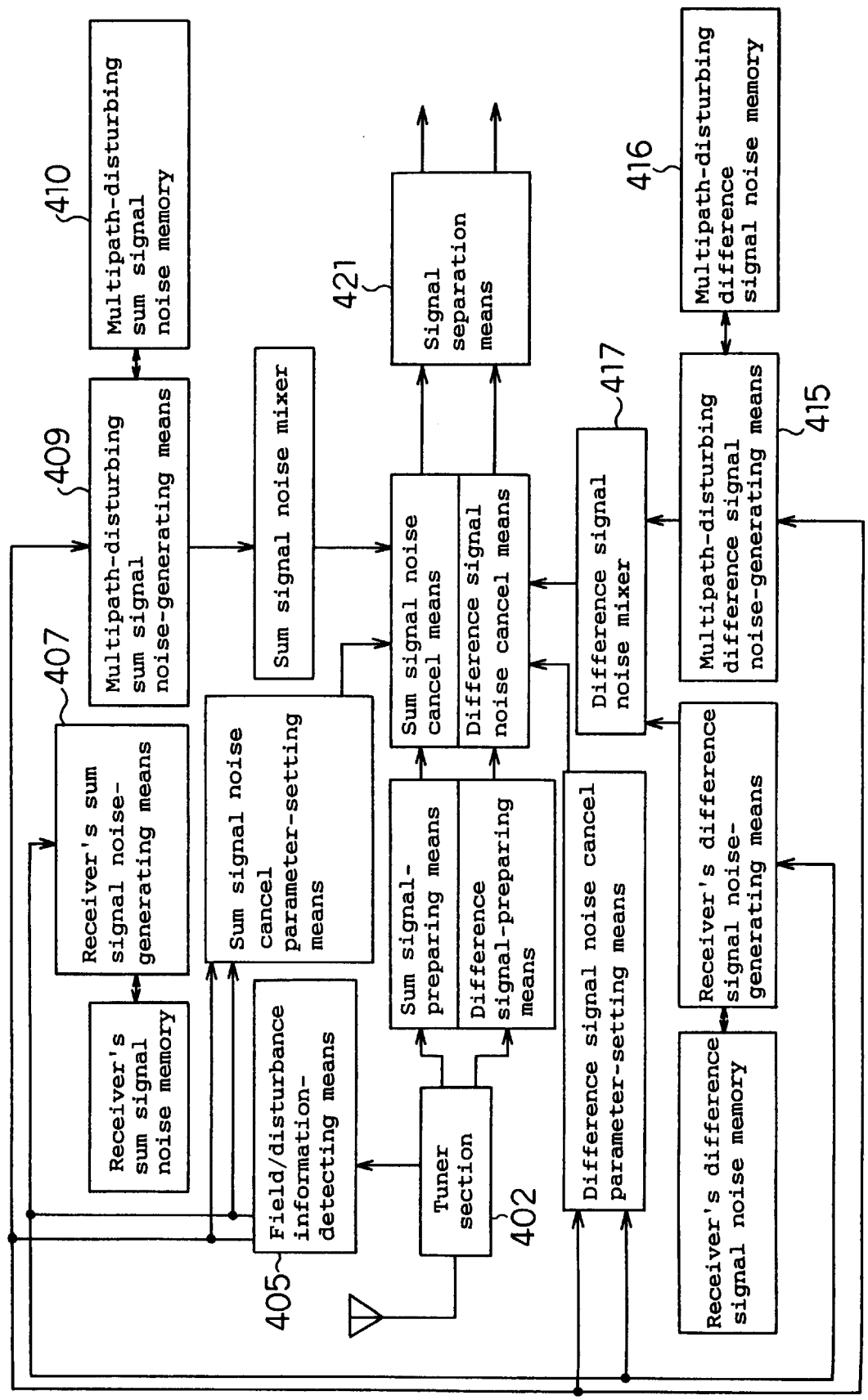
FIG. 44 is a structural view of the noise suppressing device of other embodiment according to the present invention.

Furthermore, the above embodiment has been described with regard to the case where the noise mixer 100, 411 or 417 performs predetermined mixing processing based on the instruction from the mixing control means 90, 412 or 418, but for example, the noise suppressing device may not include, for example, said mixing control means 90 (see FIG. 39). In this case, as shown in FIG. 39, the noise mixer 301 is so constituted to utilize the receiver's residual noise data and the multipath-disturbing noise data to mix these noise data and output the mixed noise data to the noise cancel means 110. Here, the noise mixer 301 may be the adding means to add the receiver's residual noise data and said multipath-disturbing noise data to be output, or may be the noise selector to select the noise data having larger noise level among the receiver's residual noise data and the multipath-disturbing noise data. This is applied to the case where the input signal is a stereo signal (see FIG. 41), and in this case, as shown in FIG. 41, it is so constituted that the respective noise mixers 501 and 502 utilize the respective receiver's residual noise data and the respective multipath-disturbing noise data to mix these noise data, and output the mixed noise data to the respective noise cancel means 419 and 420. Here, the noise mixer 501 and 502 may be the adding means to add the receiver's residual noise data and said multipath-disturbing noise data to be output, or may be the noise selector to select the noise data having larger noise level among the receiver's residual noise data and the multipath-disturbing noise data. Furthermore, as in the above case, it may have a structure shown in FIG. 43, without the mixing control means 412 and 418 (see FIG. 44). Even in such a structure, the effect described in the above embodiment can be exerted without being changed essentially.

Figure 45:
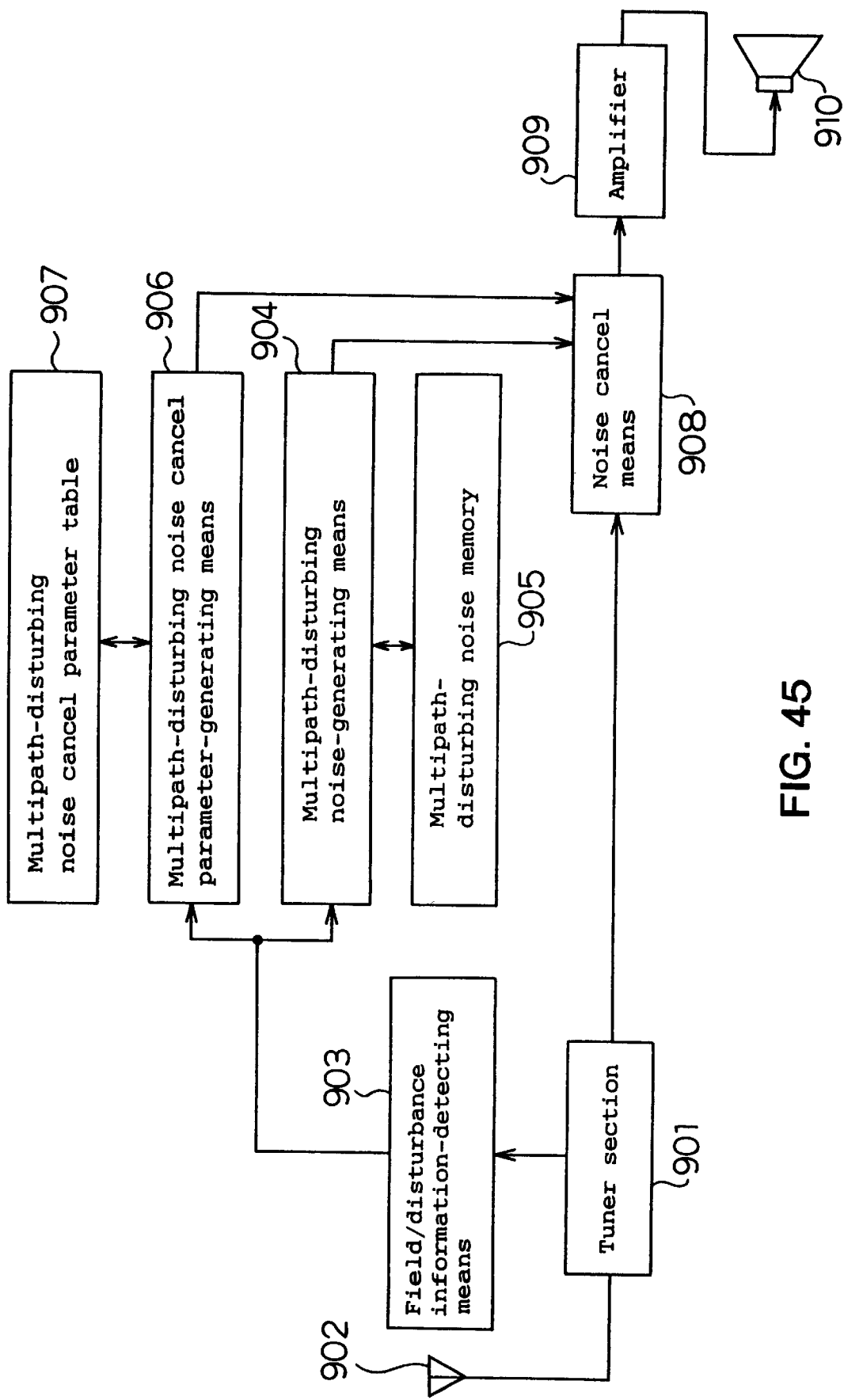
FIG. 45 is a structural view of the noise suppressing device of other embodiment according to the present invention.

FIG. 45 is a structural view of the noise suppressing device of the other embodiment according to the present invention, and the structure and the action of the present embodiment will be described with reference to FIG. 45.

901 is a tuner section to detect the radio wave and convert it to the electric signal, and 902 is an antenna as the input means of the present invention connected to the tuner section 901.

903 is a field/disturbance information-detecting means to detect the disturbed degree of the input signal as the field/disturbance informations, based on the signal from the inside of the tuner section 901.

904 is a multipath-disturbing noise-generating means to utilize the multipath-disturbing noise memory 905 which has preliminarily stored the multipath-disturbing noise data to generate and output the multipath-disturbing noise data, and 906 is a multipath-disturbing noise cancel parameter-generating means to utilize the multipath-disturbing noise cancel parameter table 907 which has preliminarily stored the multipath-disturbing noise cancel parameter to generate the multipath-disturbing noise cancel parameter.

908 is a noise cancel means to utilize said generated multipath-disturbing noise data and said generated multipath-disturbing noise cancel parameter to suppress or remove the noise contained in said given signal. The signal of which noise has been removed is output to the amplifier 909 to be amplified and sent to the speaker 910.

The main characteristics of the present embodiment is that at the time of the noise removal of the noise cancel means 908, by using both the multipath-disturbing noise data and the clamp coefficient as the multipath-disturbing noise cancel parameter according to the level of the multipath disturbance, double adjustments can be performed, thereby the noise removal can be performed more effectively, and that since it has the memory and tables, control and the like can be easily performed when the noise data and the noise cancel parameter are generated.

The above-mentioned double adjustments will be more concretely described with reference to FIG. 46.

Figure 46A:
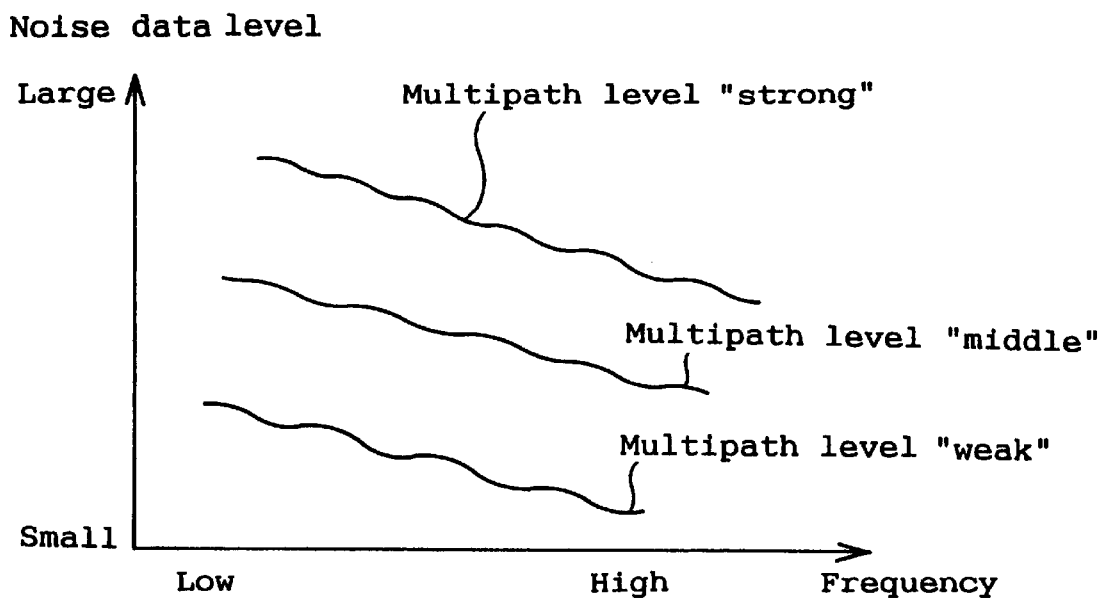
FIG. 46A is a graph showing the relation between the frequency by the multipath disturbance level and the noise data level, in the noise suppressing device of other embodiment according to the present invention.
Figure 46B:
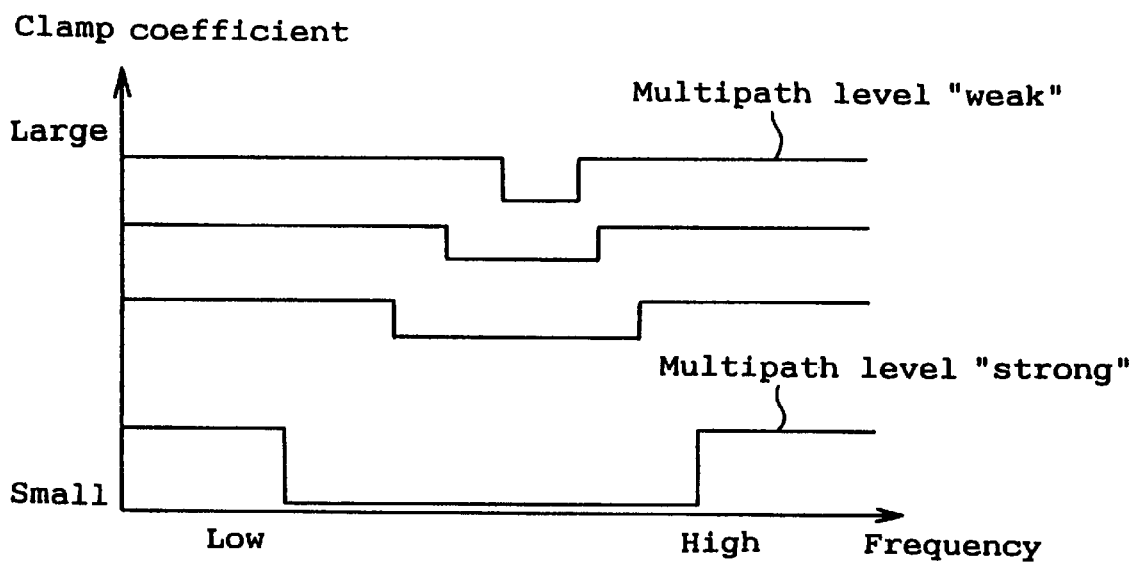
FIG. 46B is a graph showing the relation between the frequency by the multipath disturbance level and the clamp coefficient, in the noise suppressing device of other embodiment according to the present invention.

Here, FIG. 46A is a graph showing the relation between the frequency of the signal and the noise data level sampled from the multipath-disturbing noise memory 905 due to the difference of the multipath level. FIG. 46B is a graph showing the relation between the frequency of the signal and the clamp coefficient sampled from the multipath-disturbing noise cancel parameter table 907 due to the difference of the multipath level.

Namely, it is so adjusted that if they have the same frequency, the stronger the multipath level to be input, the larger the level of the noise data (see FIG. 46A), and smaller the clamp coefficient (see FIG. 46B).

According to the present embodiment, noise can be removed effectively, and since the noise suppressing device includes the memory and tables, it exerts the effect that the control and the like are easily performed when the noise data and the noise cancel parameter are generated.

Figure 47:
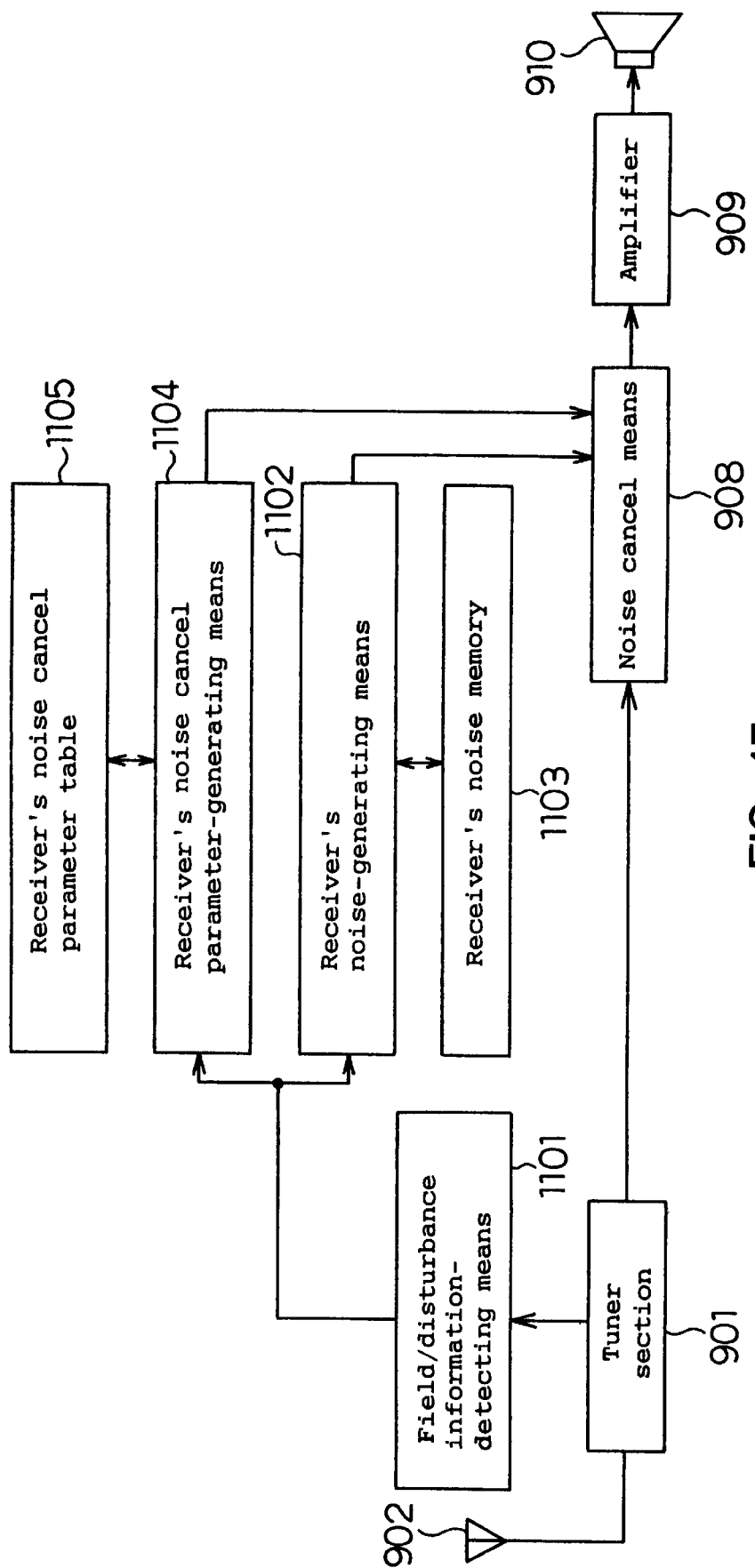
FIG. 47 is a structural view of the noise suppressing device of other embodiment according to the present invention.

FIG. 47 is a structural view of the noise suppressing device of the other embodiment according to the present invention, and the structure and the action of the present embodiment will be described with reference to FIG. 47.

Here, the main structural difference between this embodiment and the above-mentioned embodiment is that in the above embodiment, the field/disturbance information-detecting means 903 detects the field/disturbance informations relating to the disturbed degree of the signal to be modulated, on the contrary, in the present embodiment, the field/disturbance information-detecting means 1101 detects the field/disturbance informations relating to the disturbed degree of the carrier level of the signal to be modulated, and outputs the field/disturbance informations, as shown below. In addition, the same reference numerals are given to the substantially same parts as in FIG. 45, and the description thereof is omitted.

Namely, in FIG. 47, 1102 is a receiver's noise-generating means which utilizes the receiver's residual noise memory 1103 based on the information relating to the carrier level to generate and output the receiver's residual noise data, and 1104 is a receiver's noise cancel parameter-generating means which utilizes the receiver's noise cancel parameter table 1105 to generate the receiver's noise cancel parameter based on the information relating to the carrier level.

The main characteristics of the present embodiment is, as in the case of the above embodiment, that at the time of noise removal of the noise cancel means 908, by using both the receiver's residual noise data and the clamp coefficient as the receiver's noise cancel parameter, according to the carrier level, double adjustments can be performed, thereby the noise removal can be performed more effectively, and that since it has the memory and tables, control and the like can be easily performed when the noise data and the noise cancel parameter are generated.

The above-mentioned double adjustments will be more concretely described with reference to FIG. 48.

Figure 48A:
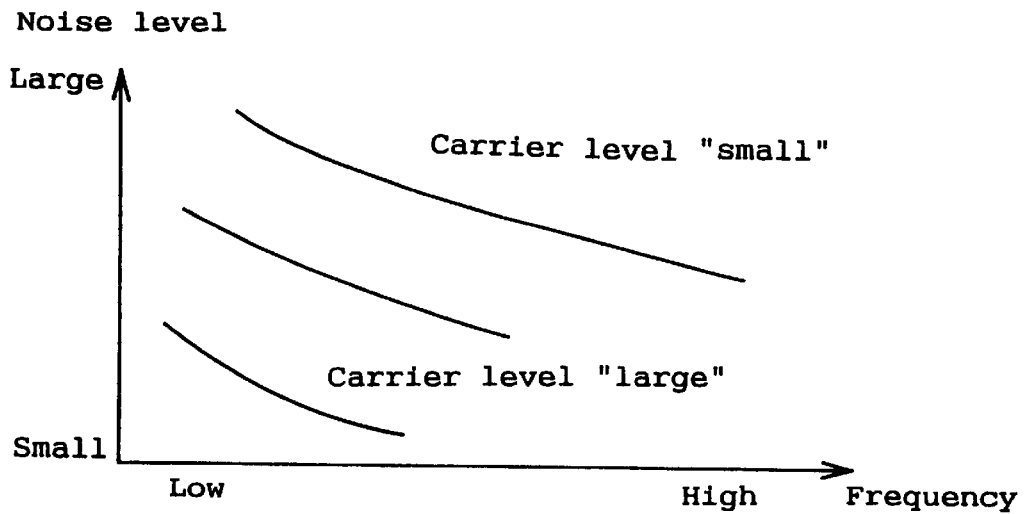
FIG. 48A is a graph showing the relation between the frequency by the carrier level and the noise data level, in the noise suppressing device of other embodiment according to the present invention.
Figure 48B:
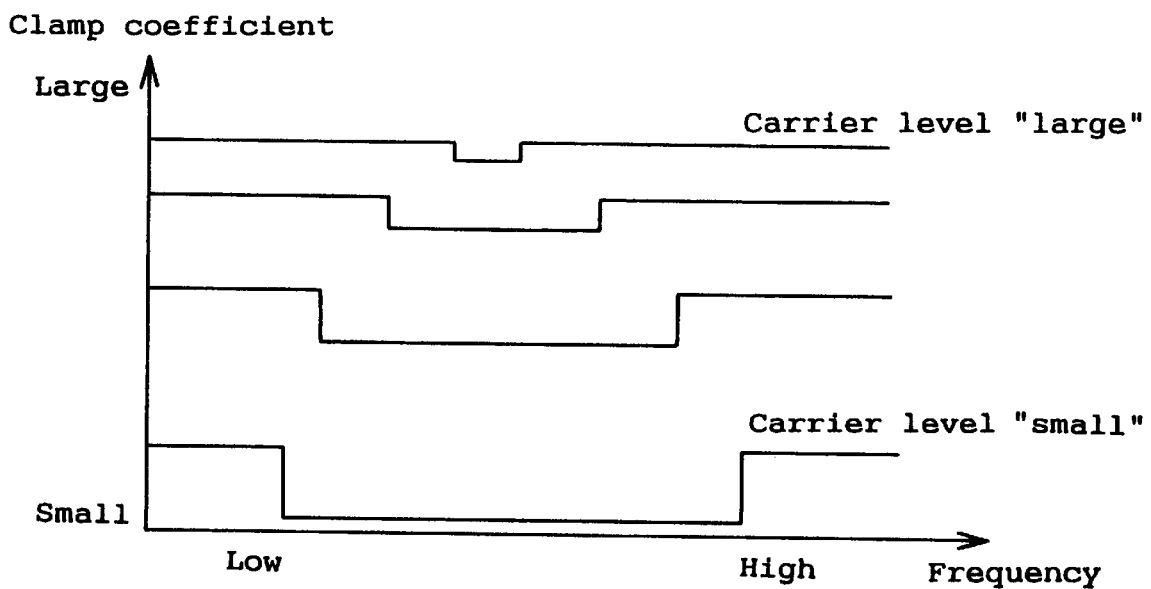
FIG. 48B is a graph showing the relation between the frequency by the carrier level and the clamp coefficient, in the noise suppressing device of other embodiment according to the present invention.

Here, FIG. 48A is a graph showing the relation between the frequency of the signal and the noise data level sampled from the receiver's noise memory 1103 due to the difference of the carrier level. FIG. 48B is a graph showing the relation between the frequency of the signal and the clamp coefficient sampled from the receiver's noise cancel parameter table 1105 due to the difference of the carrier level.

Namely, it is so adjusted that if they have the same frequency, the smaller the carrier level to be input, the larger the level of the noise data (see FIG. 48A), and smaller the clamp coefficient (see FIG. 48B).

In addition, the above embodiment has been described with regard to the case where the clamp coefficient is used as the cancel parameter, but, for example, it may be so constituted to use the cancel coefficient. In the case of the cancel coefficient, the inverse relation to the large/small relation in the clamp coefficient is realized.

Figure 49:
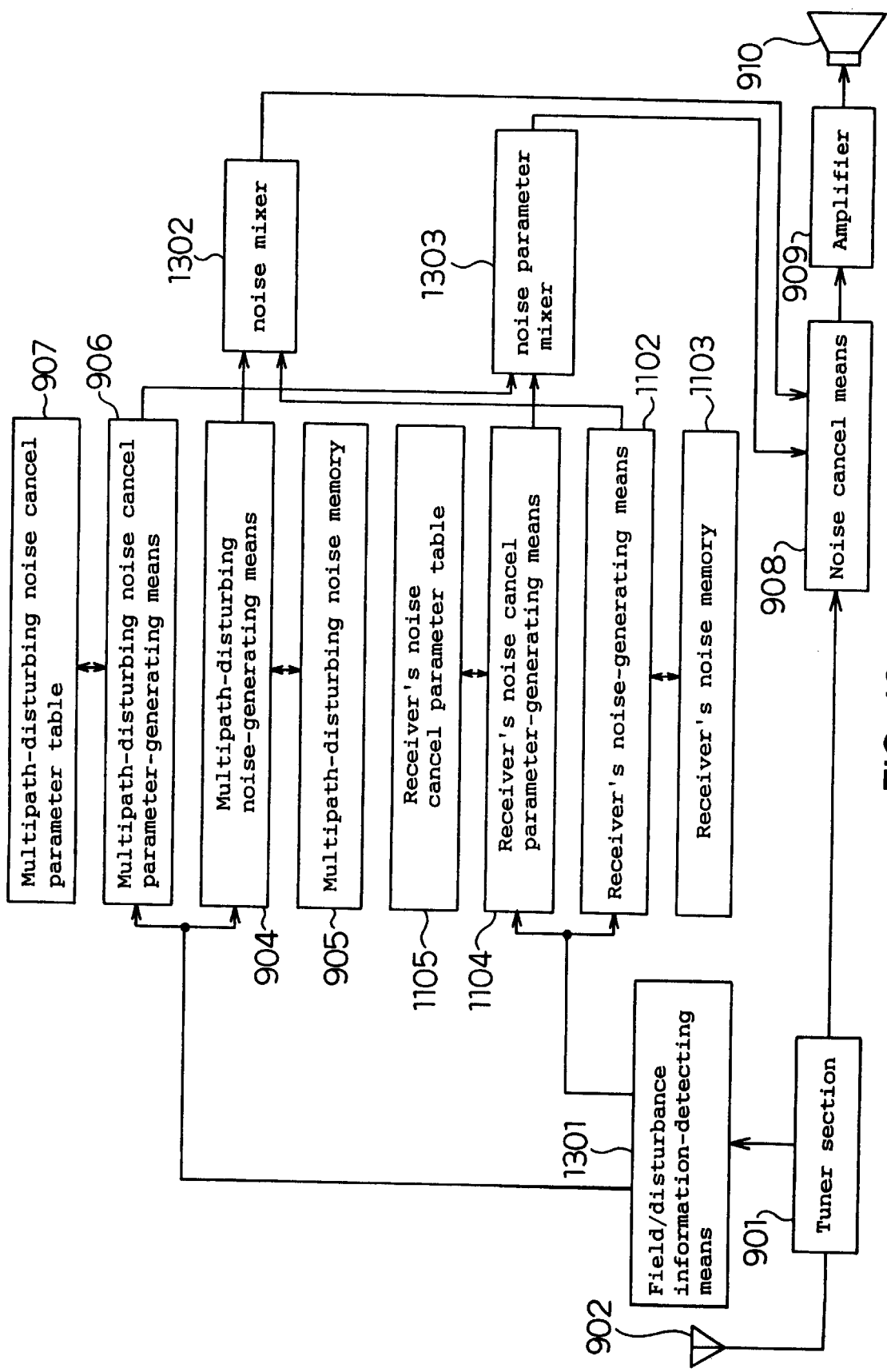
FIG. 49 is a structural view of the noise suppressing device of other embodiment according to the present invention.

FIG. 49 is a structural view of the noise suppressing device of the other embodiment according to the present invention, and the structure and the action of the present embodiment will be described with reference to FIG. 49. As shown in FIG. 49, the main structural characteristic of the present embodiment is that it has the primary component of the above embodiment shown in FIG. 47 and also has newly provided noise mixer and noise parameter mixer. Incidentally, the same reference numeral is given to the substantially same parts, and the description thereof will be omitted.

Here, 1301 is a field/disturbance information-detecting means for detecting the field information relating to the carrier level and the disturbance information relating to the disturbed degree of the signal to be modulated from the tuner section 901, and outputting these informations, and 1302 is a noise mixer which utilizes the multipath-disturbing noise data output from the multipath-disturbing noise-generating means 904 and the receiver's residual noise data output from the receiver's noise-generating means 1102 to mix these noise data, and outputs the mixed noise data.

1303 is a noise parameter mixer which utilizes the multipath-disturbing noise cancel parameter output from the multipath-disturbing noise cancel parameter-generating means 906 and the receiver's residual noise cancel parameter output from the receiver's noise cancel parameter-generating means 1102 to mix these cancel parameter, and outputs the mixed cancel parameter.

The noise cancel means 908 utilizes the above-mentioned mixed noise data and mixed cancel parameter obtained by respective mixers 1302 and 1303 to remove the noise contained in the above-mentioned given signal.

The way of mixing processing will be described concretely.

Namely, in the present embodiment, mixing of the noise data is to add said multipath-disturbing noise data to be output and said receiver's residual noise data to be output, and mixing of said cancel parameter is to add said multipath-disturbing noise cancel parameter to be output and said receiver's residual noise cancel parameter to be output.

Thus, according to the present embodiment, because of the structure that the adding processing of respective noise data and the adding processing of respective cancel parameters are performed by respective mixers 1302 and 1303, only one noise cancel means will do, thereby the noise suppressing device can be realized at quite low cost compared to the conventional devices. Furthermore, by only one cancel action, noise removal can be performed, thereby the effect to remove the noise more efficiently compared to the conventional devices can be exerted.

Incidentally, the above embodiment has been described with regard to the case where adding processing is performed with respect to mixing, but, for example, it may be so constituted to perform so-called select processing to select the noise data having larger noise level among said multipath-disturbing noise data to be output and said receiver's residual noise data to be output, and to select the smaller cancel parameter as for the clamp coefficient among said multipath-disturbing noise cancel parameter to be output and said receiver's residual noise cancel parameter to be output, and to select larger cancel parameter as for the cancel coefficient. Or as the processing of the mixer, it may be any mixing processing such as multiplication processing of each noise data, or a processing in which the receiver's residual noise data and the multipath-disturbing noise data are multiplied by k, giving the mixing coefficient to them, and the respective data are added and the k root is taken away (similar also for each cancel parameter), so far as being a so-called mixing processing. Moreover, it is not required that the contents of the mixing processing are the same in the noise mixer and the noise parameter mixer.

Figure 50:
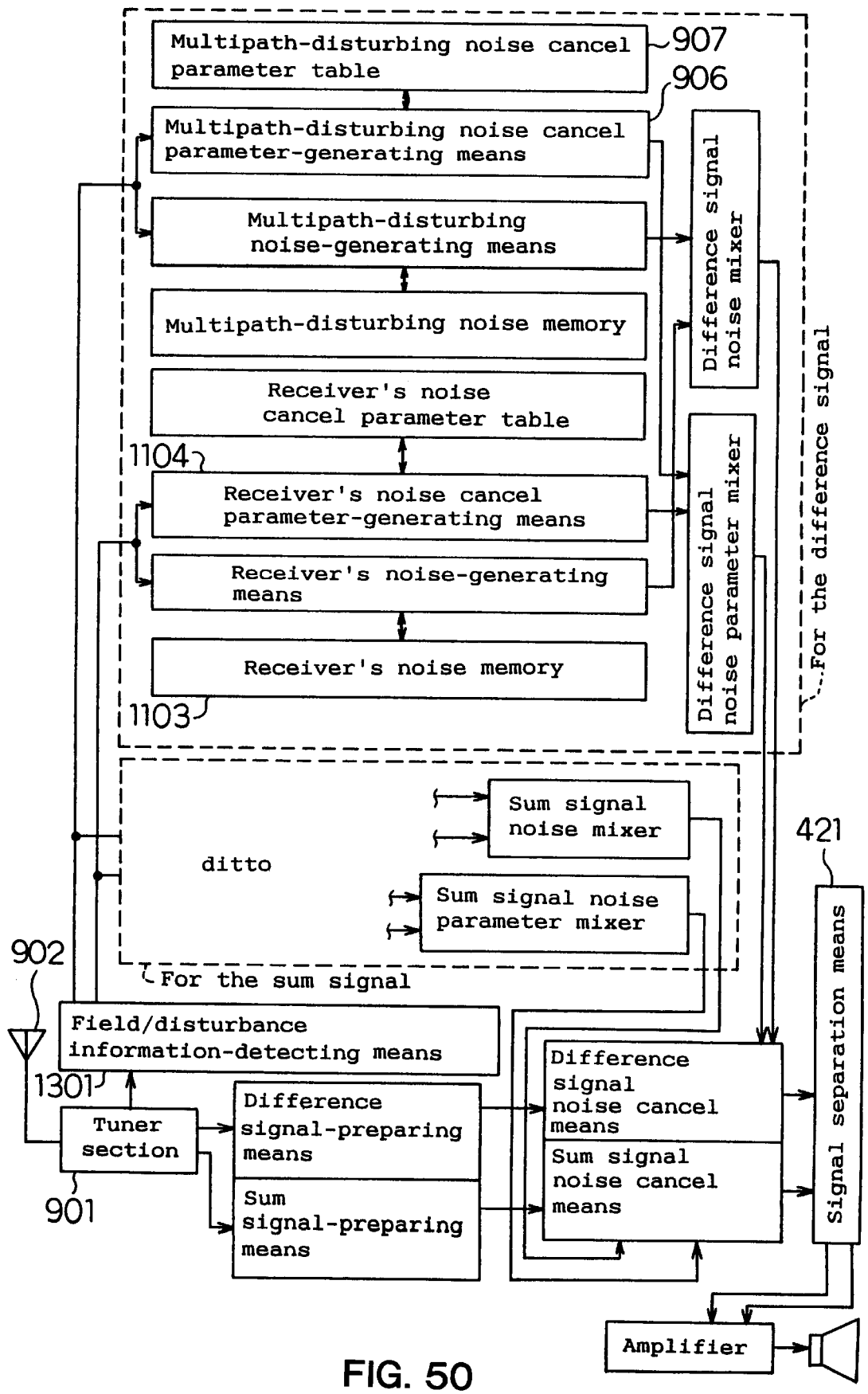
FIG. 50 is a structural view of the noise suppressing device of other embodiment according to the present invention.

Furthermore, in the above embodiment, it is regardless of whether the input signal is a monaural signal or a stereo signal. For example, when the input signal is the stereo signal, the component described in FIG. 49 are divided into each means for the difference signal (L–R) and for the sum signal (L+R), as shown in FIG. 50, and provided roughly symmetrically, and basically similar action with the above content are performed, therefore, they exert the similar effect.

The following embodiment shows one structural embodiment of the multipath-disturbing noise cancel parameter table or the receiver's noise cancel parameter table and the like, described in FIGS. 9, 11, 13 or 14.

Figures 51A, 51B:
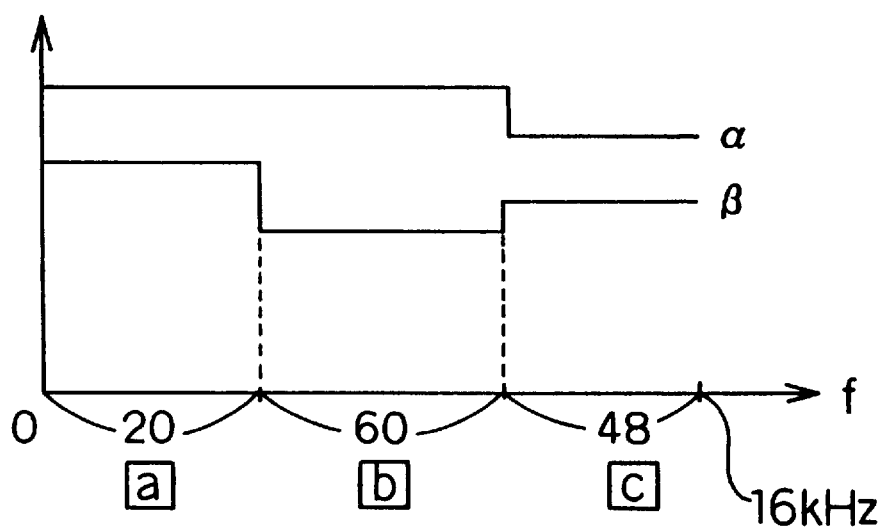
FIG. 51A is an example of the structure of the cancel parameter, in the noise suppressing device of other embodiment according to the present invention.
FIG. 51B is a graph expressing the relation shown in FIG. 51A.

FIG. 51A shows the clamp coefficient β and the cancel coefficient α preliminarily stored in the above table, and they are set for every band. FIG. 51B shows the example in which 16 kHz is divided into 128 bands.

For example, as shown in FIG. 45, the multipath-disturbing noise cancel parameter-generating means 906 has a multipath-disturbing noise cancel parameter table 907 which preliminarily stores the clamp coefficient β and the cancel coefficient α as the cancel parameter, and in the stored cancel parameter, the frequency band of the signal detected by the tuner section 901 is divided on the predetermined standard, and given value is set for every divided band (see FIG. 51A).

If the cancel parameter is held for every frequency, the number of memory becomes enormous, but if it is so constituted to hold the list composition data as in the present embodiment, such effect is exerted that the necessary number of memory can be reduced.

In addition, with regard to the multipath-disturbing noise cancel parameter table or the receiver's noise cancel parameter table described in FIG. 47, FIG. 49 or FIG. 50, the same thing can be said as in the above embodiment.

Figure 52:
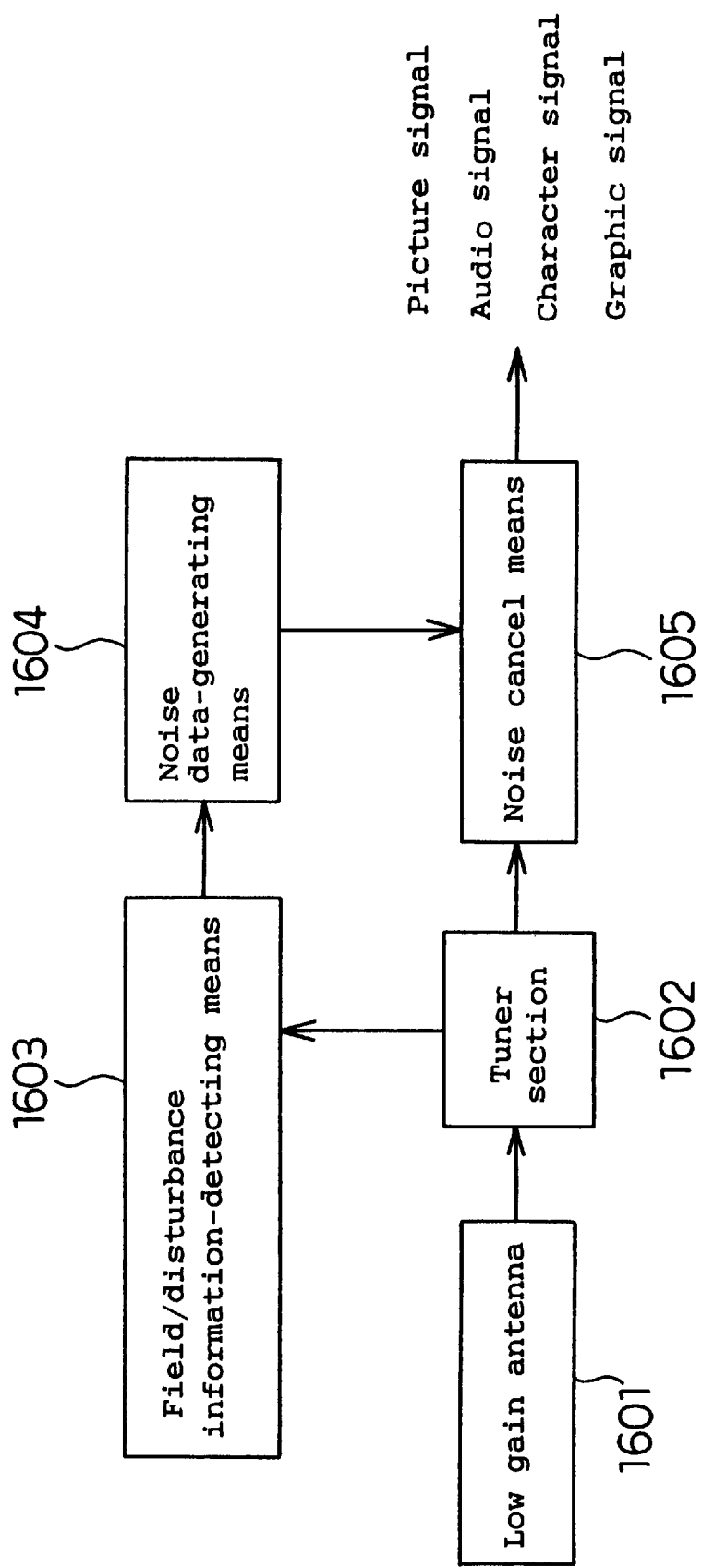
FIG. 52 is a structural view of the noise suppressing device of other embodiment according to the present invention.

FIG. 52 is a structural view of the noise suppressing device of the other embodiment according to the present invention, and the structure and the action of the present embodiment will be described with reference to FIG. 52.

In FIG. 52, 1602 is a tuner section which detects the radio wave and converts it to the electric signal, and 1601 is a low gain antenna as the input means connected to the tuner section 1602.

1603 is a field/disturbance information-detecting means to detect the field/disturbance informations relating to the carrier level or the disturbed degree of the signal to be modulated from the tuner section 1602 and output the field/disturbance informations, and 1604 is a noise data-generating means which inputs said field/disturbance informations to be output, generates the noise data based on the field/disturbance informations, and outputs the generated noise data.

1605 is a noise cancel means for unitizing said noise data with respect to the given signal to be output from the tuner section 1602 to suppress or remove the noise contained in said given signal, and is so constituted that the output means (not shown) obtains and outputs the output signal from the noise cancel means.

As the low gain antenna 1601, there can be used a micro miniature antenna, a print printing antenna, an antenna used also for the earphone code, a miniature antenna for portable telephone, a low gain antenna by the body effect, a glass print antenna mounted to a car, a glass sandwich antenna mounted to a car, a small-sized deformed antenna for vehicles, or the like.

Thus, when the low gain antenna and the noise suppressing device are combined, such effect can be exerted that the sensitivity is rapidly increased.

Figure 53:
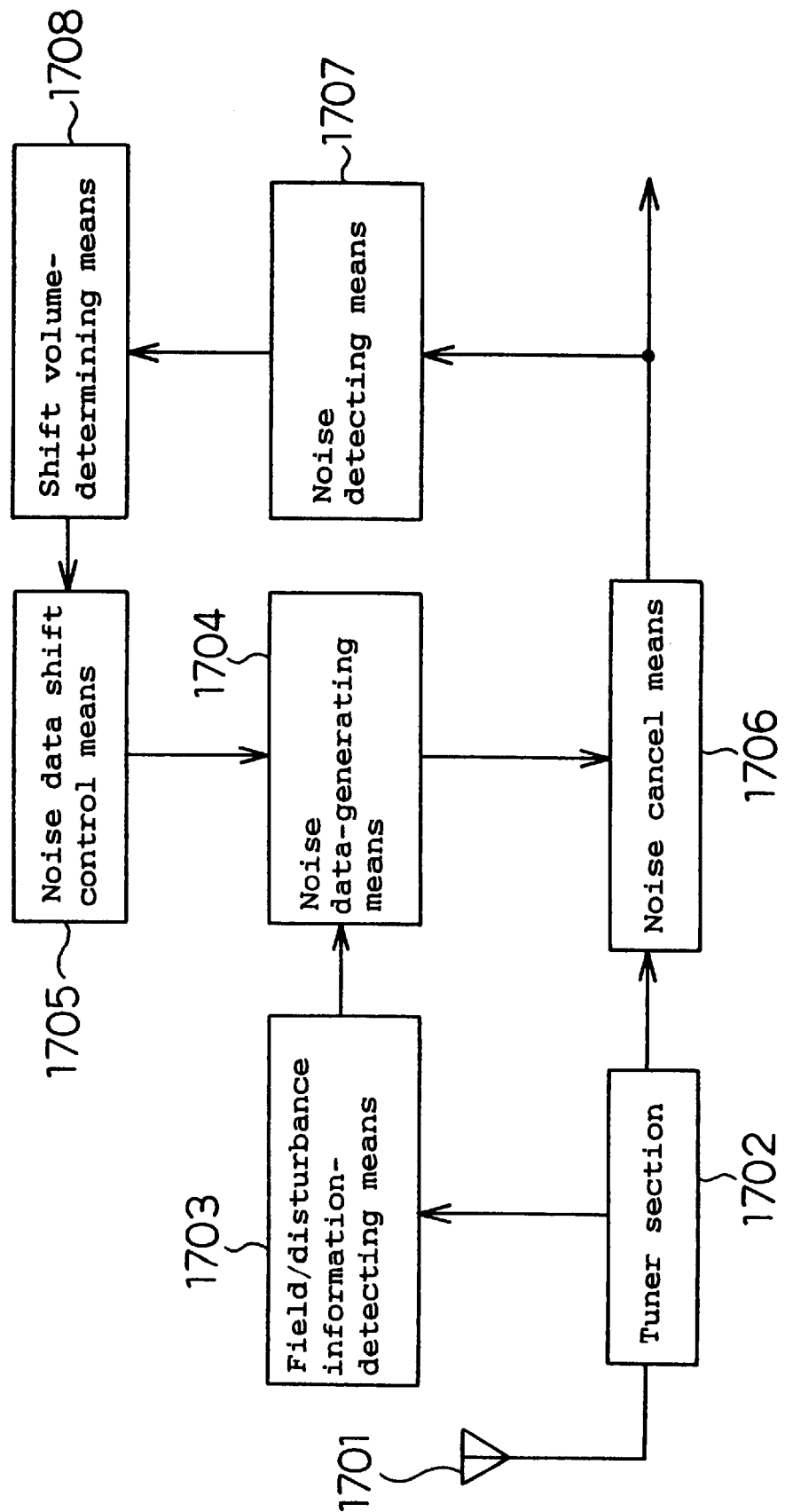
FIG. 53 is a structural view of the noise suppressing device of other embodiment according to the present invention.

FIG. 53 is a structural view of the noise suppressing device of the other embodiment according to the present invention, and the structure and the action of the present embodiment will be described with reference to FIG. 53. In FIG. 53, 1702 is a tuner section which detects the radio wave and converts it to the electric signal, and 1701 is an antenna as the input means connected to the tuner section 1702.

1703 is a field/disturbance information-detecting means to detect the field/disturbance informations relating to the carrier level or the disturbed degree of said signal to be modulated from the tuner section 1602 and output the field/disturbance informations, and 1704 is a noise data-generating means which inputs said field/disturbance informations to be output, generates the noise data based on the field/disturbance informations by utilizing the noise data stored in the given noise table (not shown), and outputs the generated noise data. And 1705 is a noise data shift control means to make the adjustment in the given volume with respect to the noise data, when the noise data-generating means 1704 utilizes the noise data in said noise table.

1706 is a noise cancel means to utilize the noise data output from the noise data-generating means 1704 with respect to the given signal output from the tuner section 1702 to suppress or remove the noise contained in said given signal. 1707 is a noise detecting means to detect the noise level of the noise existing in the output signal of the noise cancel means 1706, and 1708 is a shift volume-determining means for determining said given volume so that said detected noise level becomes smaller, and transmitting the determined given volume to the noise data shift control means 1705.

The noise detecting means 1707 is to detect the noise level for the output from the noise cancel means 1706 in the state that the signal is not input from the antenna 1701, thereby it is constituted to feed back the noise level of the signal after the noise is canceled.

By such a structure, the noise of the receiver itself is corrected, and the noise level can be minimized.

Figure 54:
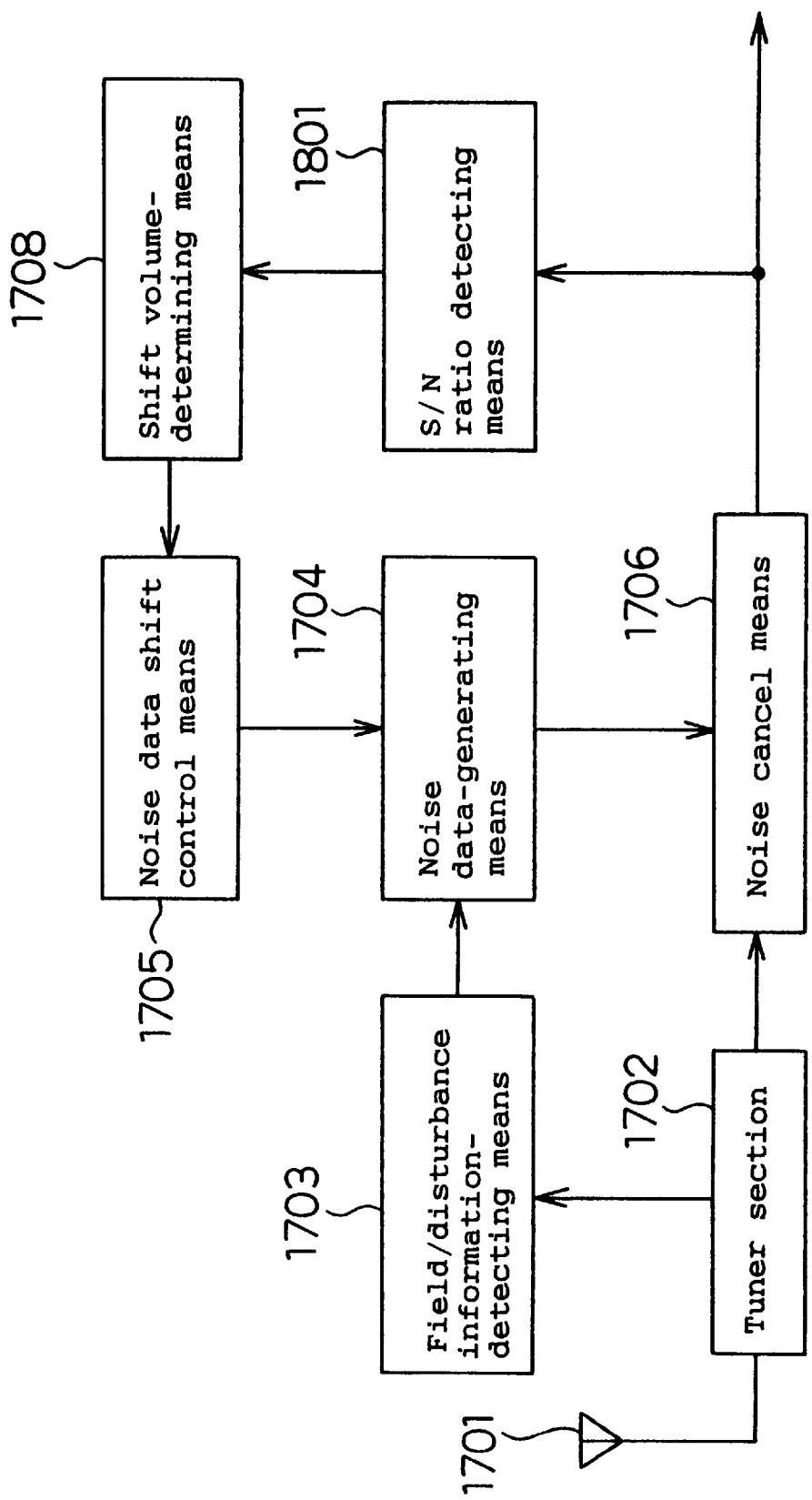
FIG. 54 is a structural view of the noise suppressing device of other embodiment according to the present invention.

In addition, even if a S/N detecting means 1801 which detects the S/N ratio from the output signal of the noise cancel means is included, instead of the noise detecting means 1707 in the above embodiment shown in FIG. 53, the same effect can be obtained (see FIG. 54). In this case, differing from the description of the above embodiment, the input signal may be included in the output signal of the noise cancel means.

Figure 55:
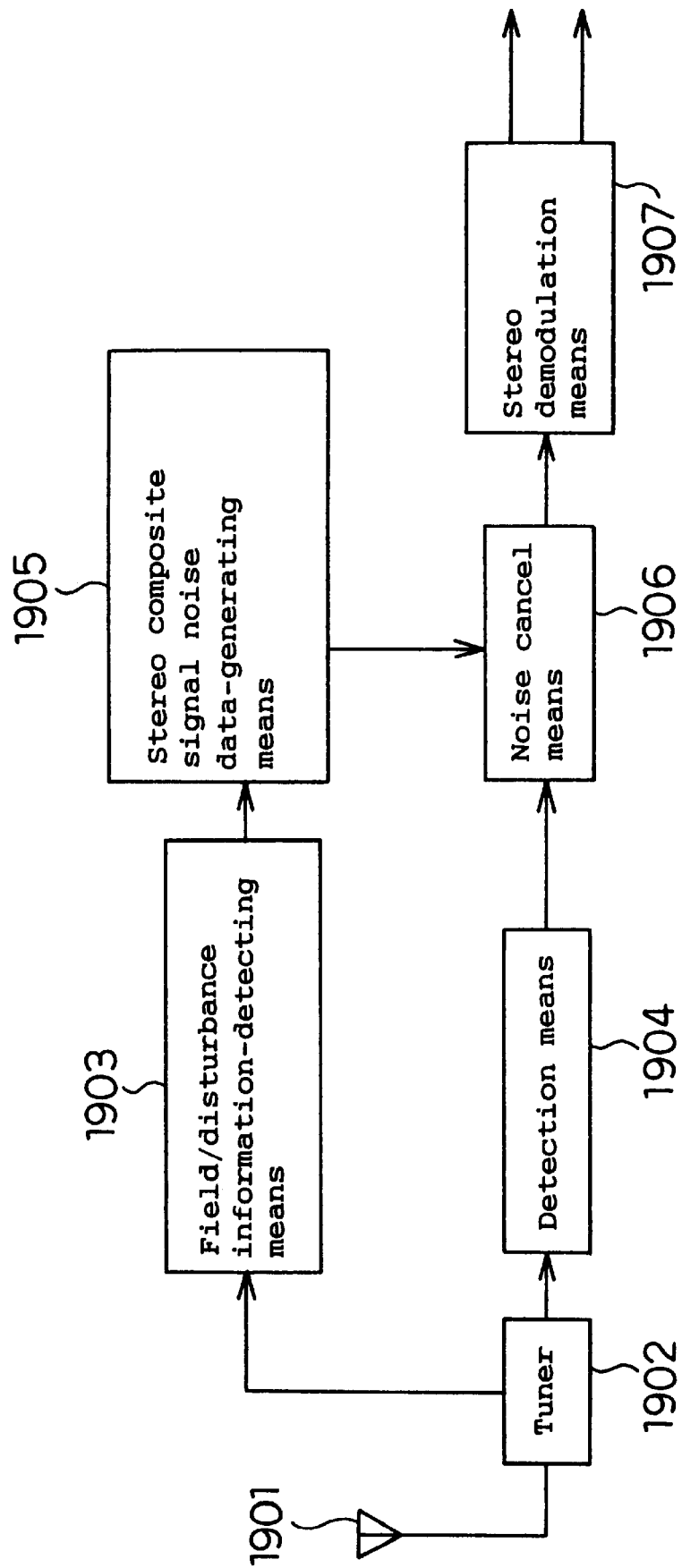
FIG. 55 is a structural view of the noise suppressing device of other embodiment according to the present invention.

FIG. 55 is a structural view of the noise suppressing device of the other embodiment according to the present invention, and the structure and the action of the present embodiment will be described with reference to FIG. 55.

In FIG. 55, 1902 is a tuner having a front end on the input side, and an intermediate frequency amplifier on the output side (either of them is not shown), and 1901 is an antenna as the input means of the present invention connected to the tuner 1902. Here, the input signal is a stereo signal.

1903 is a field-disturbing information-detecting means to detect the field/disturbance informations relating to the carrier level or the disturbed degree of said signal to be modulated from the tuner 1902 and output the field/disturbance informations. 1904 is a detection means which inputs the signal from the tuner 1902 and detects the given signal, and 1905 is a stereo composite signal noise data-generating means which generates and outputs the detection output noise data, based on the field/disturbance informations. 1906 is a noise cancel means which utilizes said stereo composite signal noise data to be output to suppress or remove the noise contained in said detected given signal, and outputs the signal in which the noise is suppressed or removed. 1907 is a stereo demodulation means for demodulating the signal output from said noise cancel means. The stereo composite signal is 0 to 53 kHz.

The stereo composite signal noise data-generating means 1905 has a table holding both the noise data depending upon the carrier level of the signal to be modulated, and the noise data depending upon the multipath disturbance.

As is obvious from such structure, the main characteristic of the present embodiment is to suppress or remove the noise at the first part of the modulation, thereby the noise suppressed degree becomes higher than suppressing or removing the noise at the latter part of the modulation.

Figure 56:
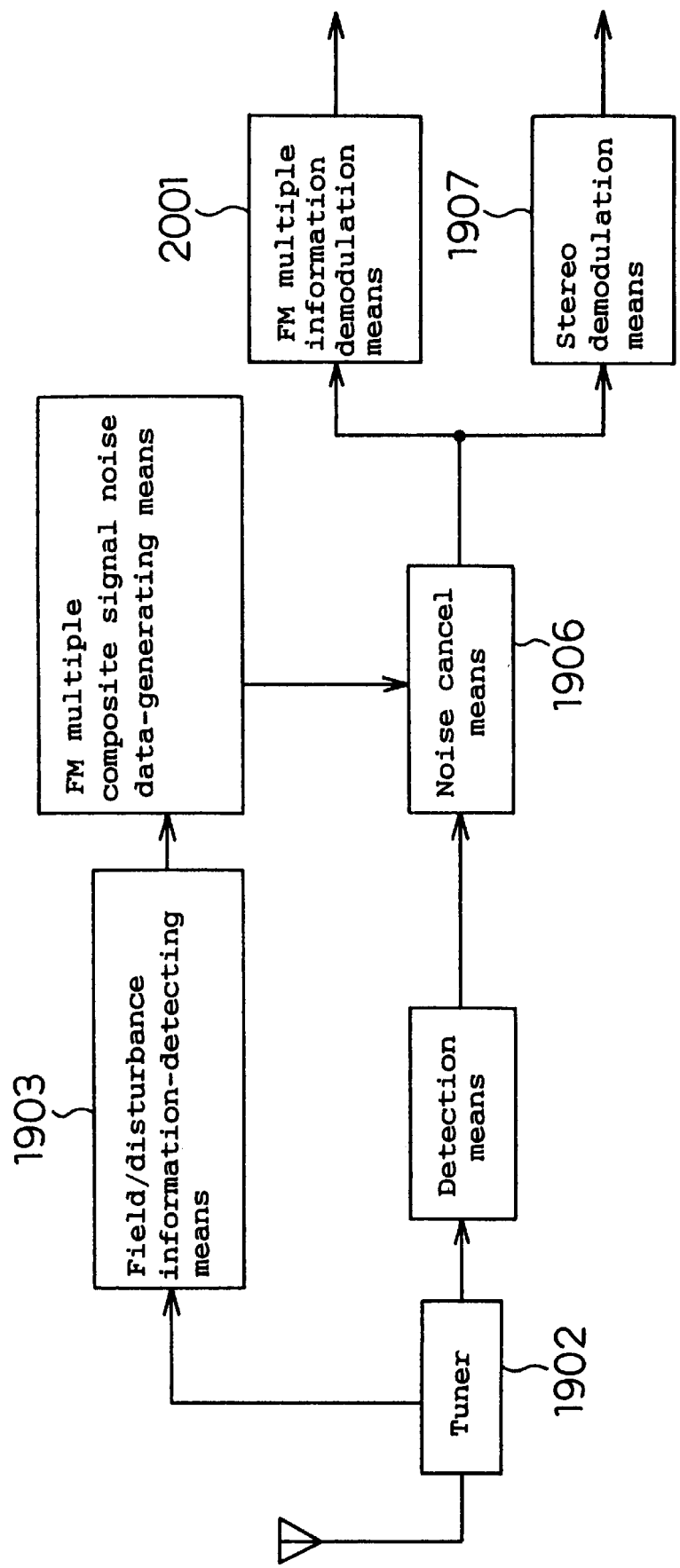
FIG. 56 is a structural view of the noise suppressing device of other embodiment according to the present invention.
Figure 57:
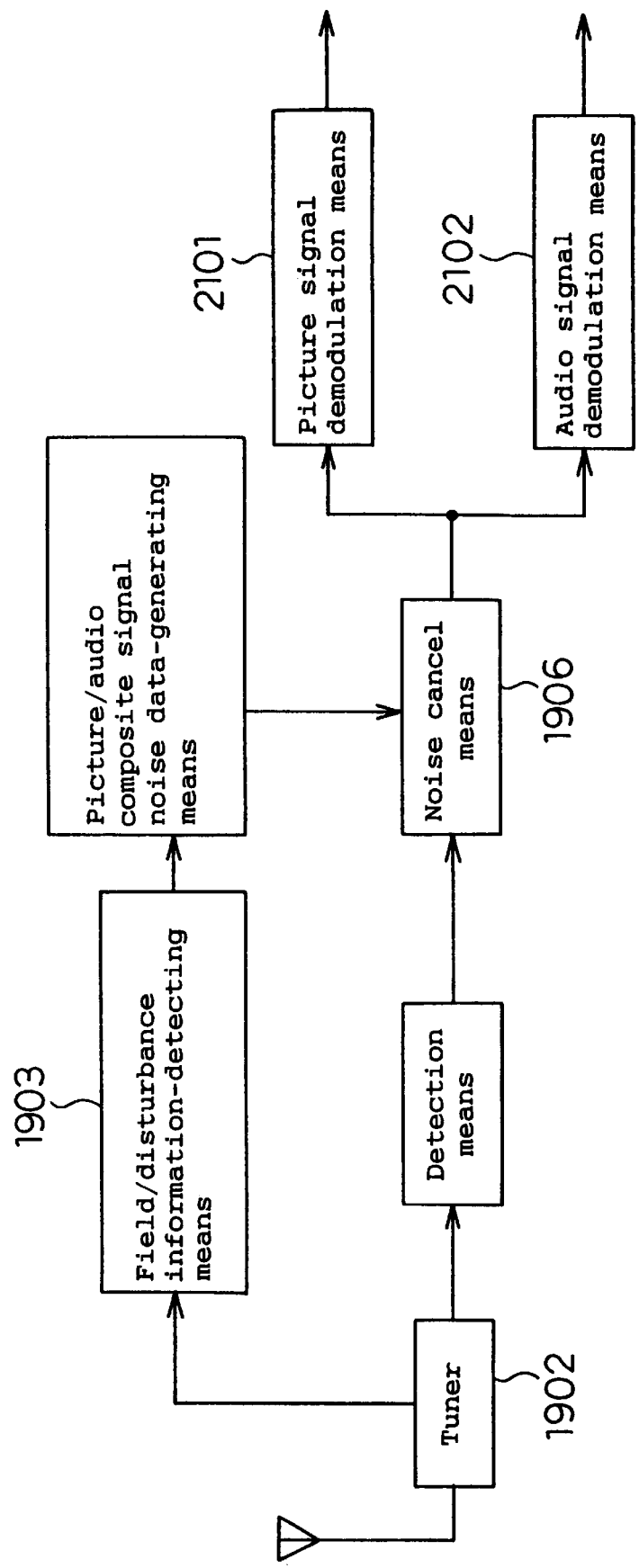
FIG. 57 is a structural view of the noise suppressing device of other embodiment according to the present invention.

Incidentally, the above embodiment has been described with regard to the case where the signal to be modulated of the present invention is a stereo signal, but the present invention is not limited to this case, for example, as shown in FIG. 56, if the signal is a stereo signal and FM multiple information signal, FM multiple composite signal noise data is used as the detection output noise data of the present invention, and it may be the structure having a stereo modulation means 1907 for modulating and outputting said stereo signal and a FM multiple modulation means 2001 for modulating and outputting said FM multiple information signal as the modulation means of the present invention. Here, the composite signal is 0 to 75 kHz, FM stereo signal is 0 to 53 kHz, and the FM multiple information is 59 kHz–75 kHz, and as an example of the FM multiple information, foreign RDS (radio data system) and the like are included. Furthermore, the signal to be modulated of the present invention may be a picture signal such as TV signal, radio signal and the like, and audio signal. In this case, as shown in FIG. 57, it may be so constituted that the picture/audio composite signal noise data is used as the detection output noise data of the present invention, and a picture signal modulation means 2101 for modulating and outputting said picture signal and an audio signal modulation means 2102 for modulating and outputting said audio signal are provided as the modulation means of the present invention. Here, the TV composite signal is 0 to 4.5 MHz.

Figure 58:
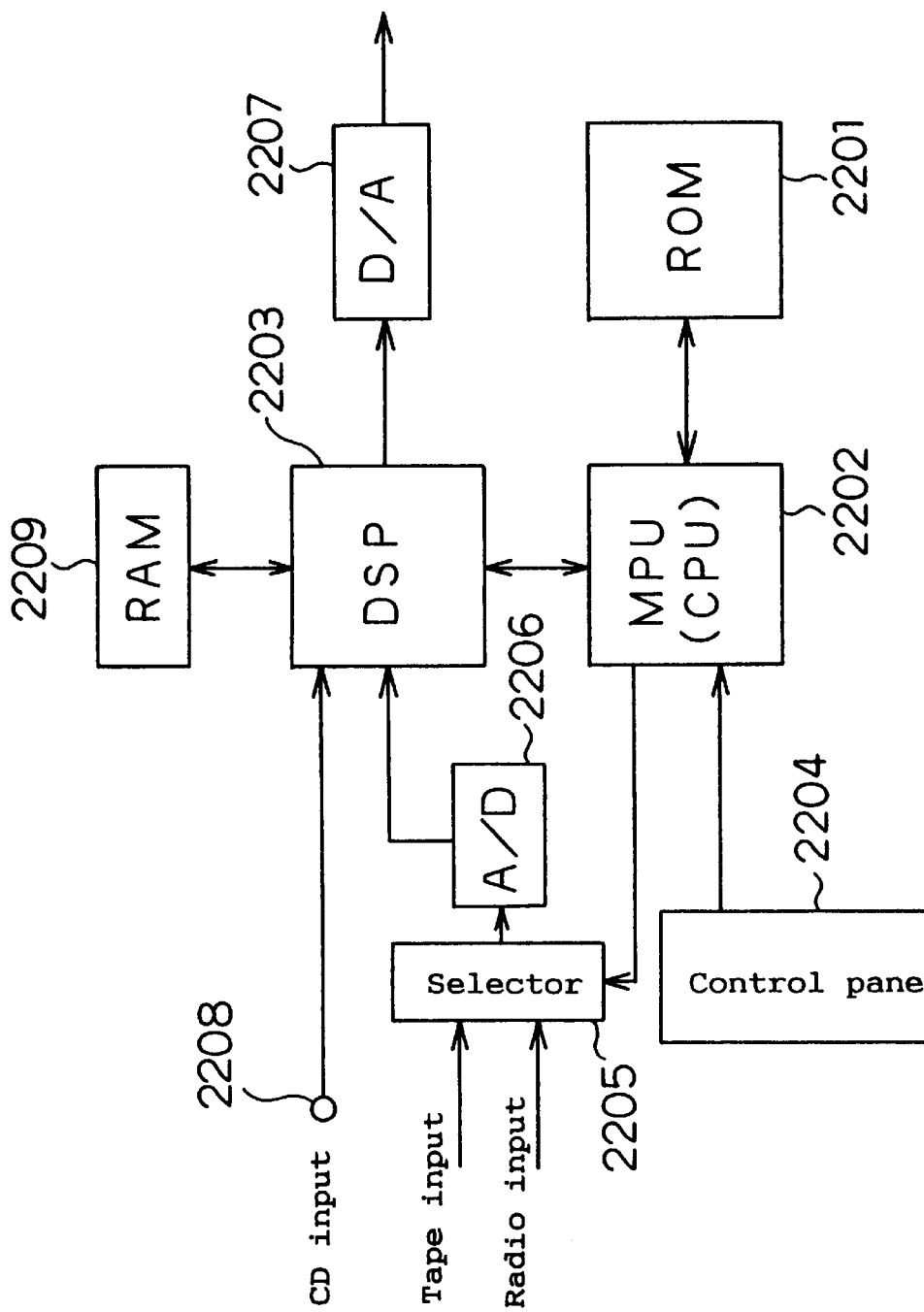
FIG. 58 is a structural view of the noise suppressing device of other embodiment according to the present invention.
Figure 59:
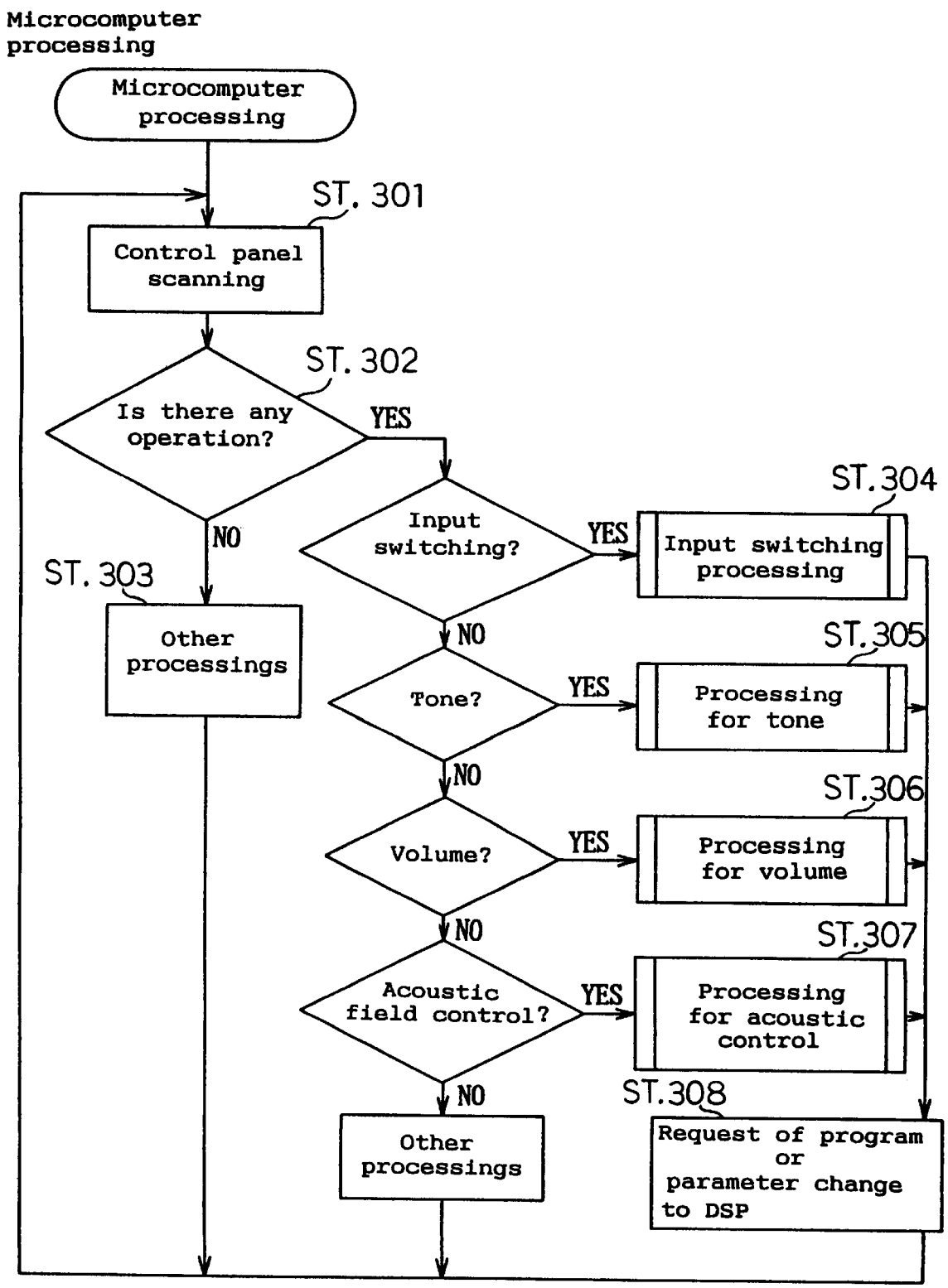
FIG. 59 is a flow chart relating to the microcomputer processing, in the noise suppressing device of other embodiment according to the present invention.
Figure 60:
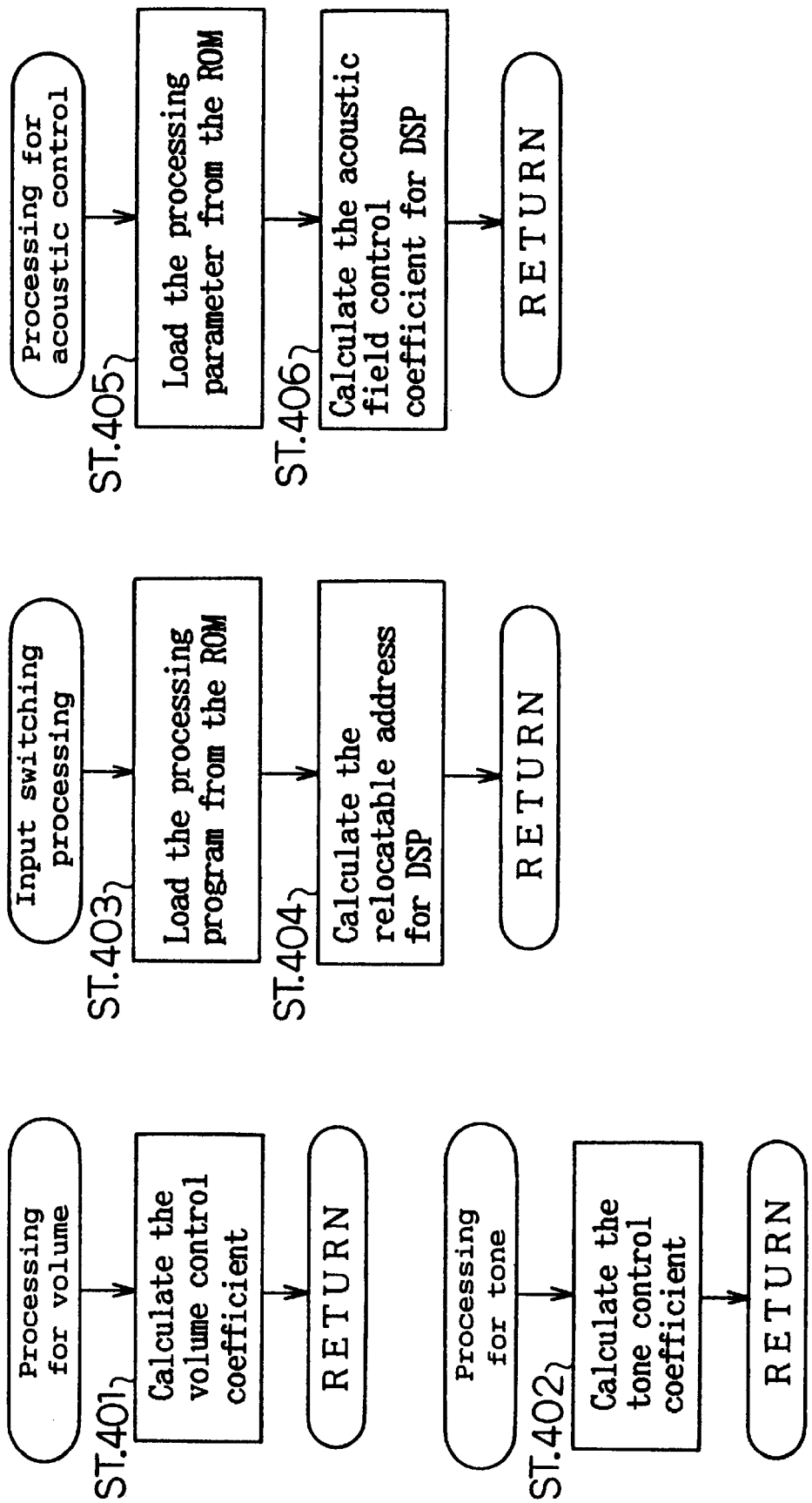
FIG. 60 is a flow chart relating to the microcomputer processing, in the noise suppressing device of other embodiment according to the present invention.
Figure 61:
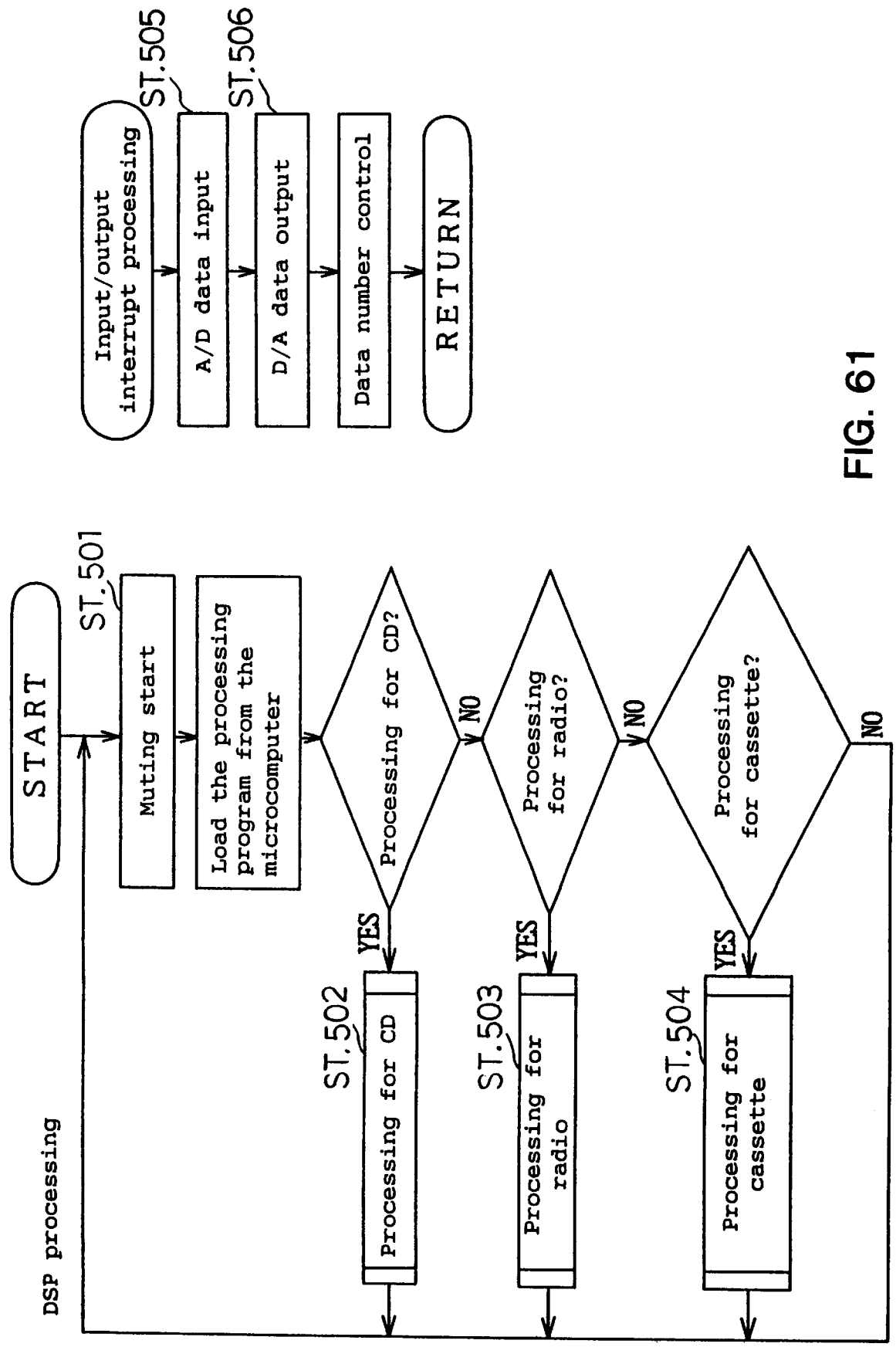
FIG. 61 is a flow chart relating to the DSP processing, in the noise suppressing device of other embodiment according to the present invention.
Figure 62:
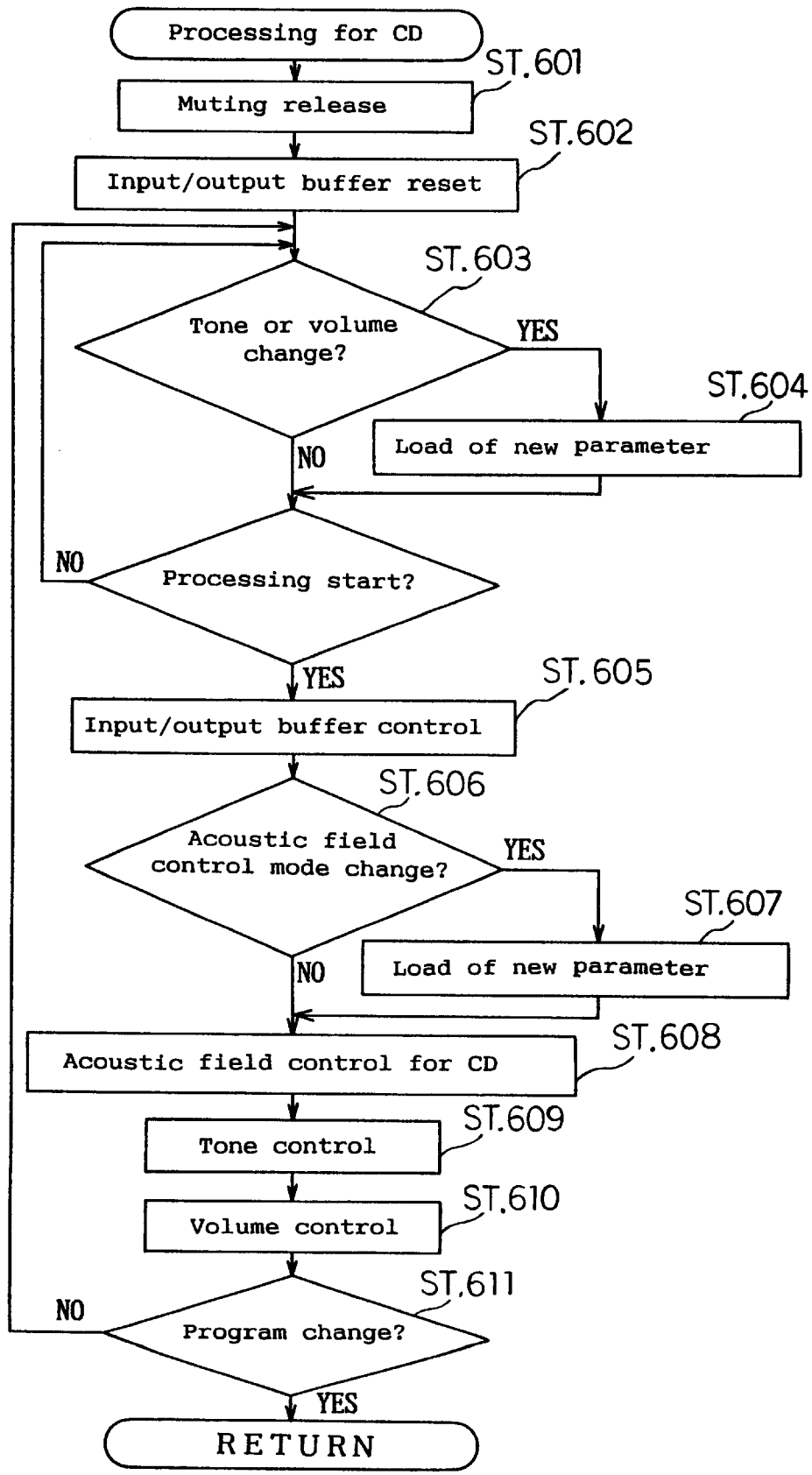
FIG. 62 is a flow chart relating to the DSP processing, in the noise suppressing device of other embodiment according to the present invention.
Figure 63:
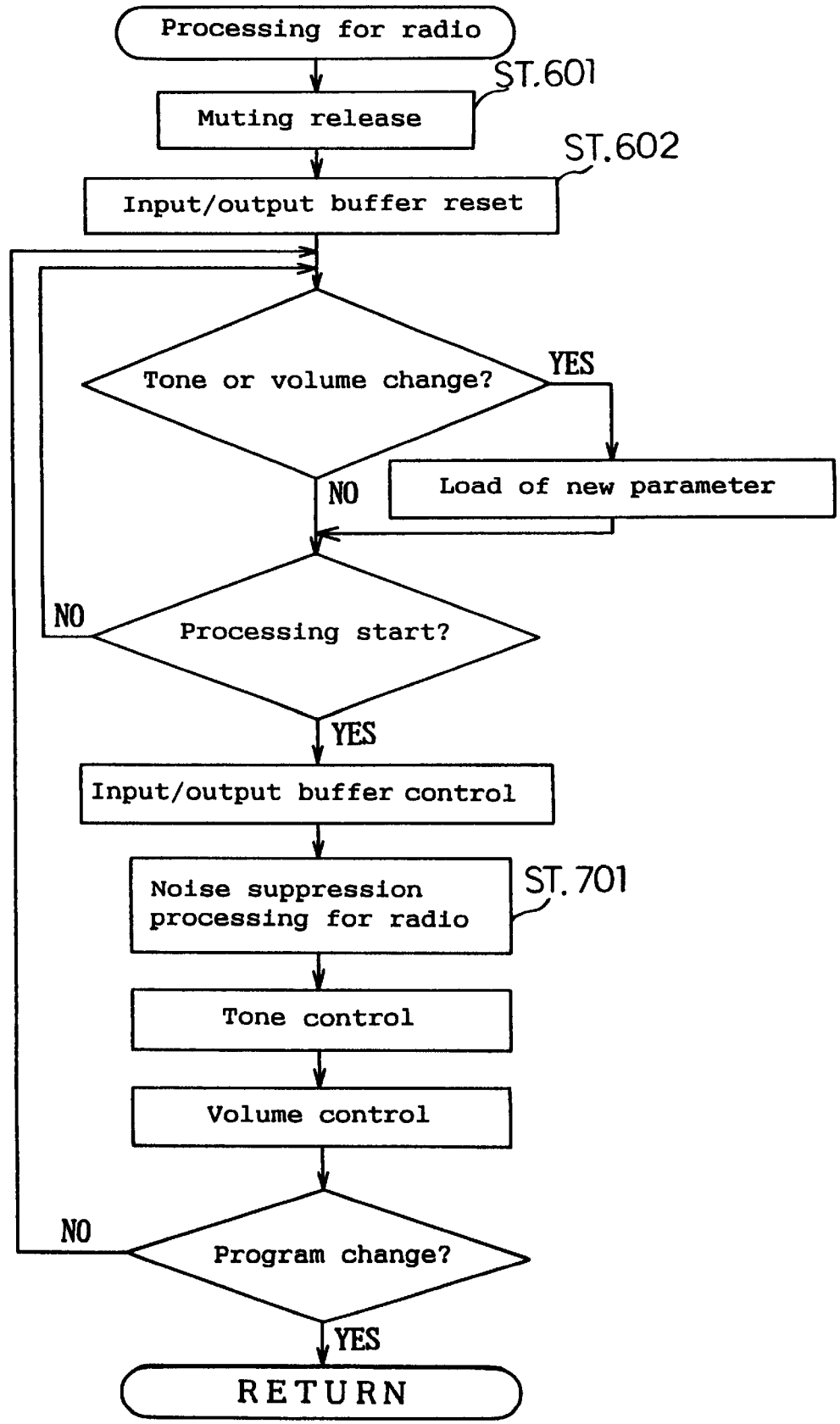
FIG. 63 is a flow chart relating to the DSP processing, in the noise suppressing device of other embodiment according to the present invention.
Figure 64:
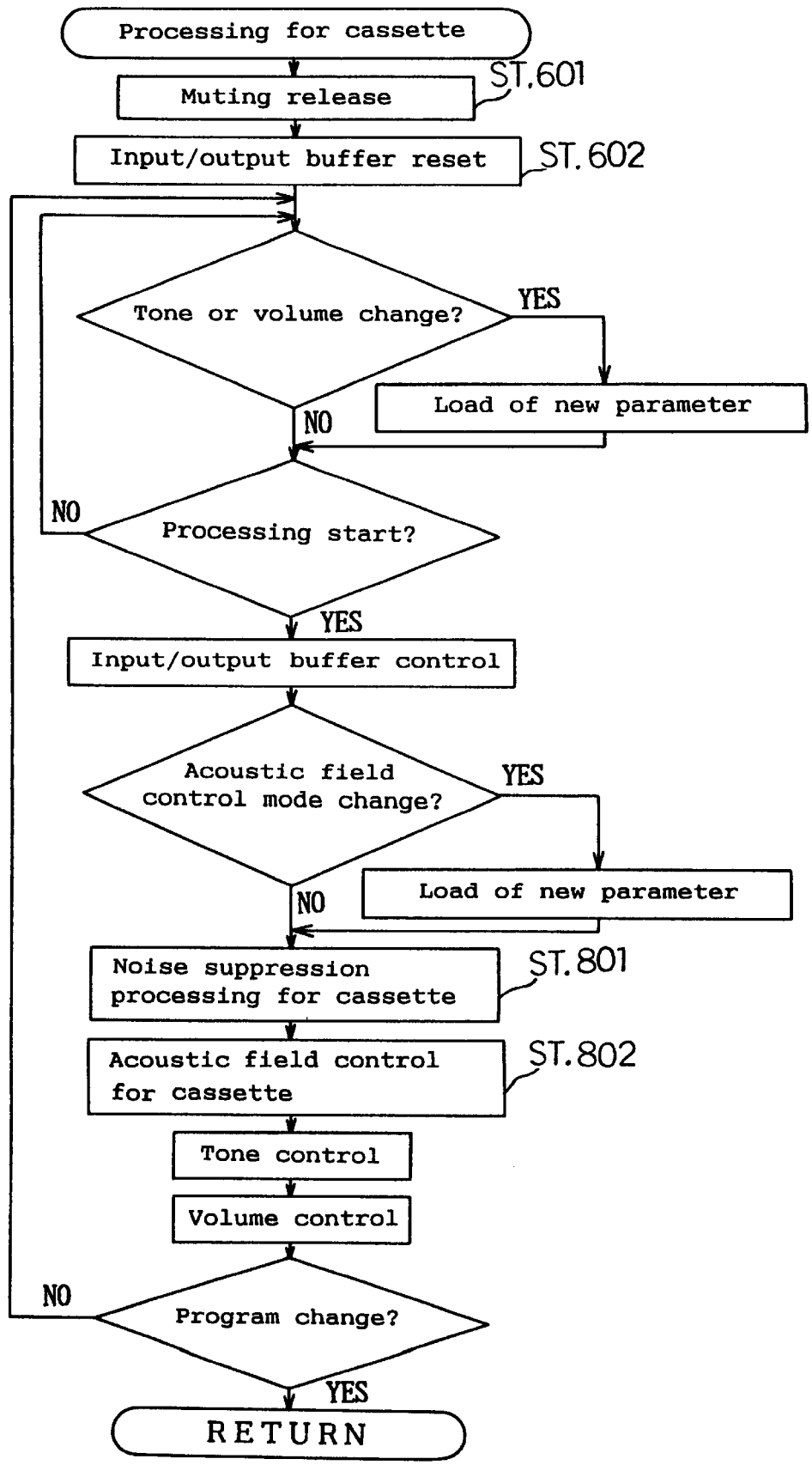
FIG. 64 is a flow chart relating to the DSP processing, in the noise suppressing device of other embodiment according to the present invention.

FIG. 58 is a structural view of the noise suppressing device of the other embodiment according to the present invention, and the structure and the action of the present embodiment will be described with reference to FIG. 58.

2201 is a memory to store a plurality of programs for executing the noise suppressing control or the acoustic field control, and 2202 is MPU as a processing means to sample and output the program in said memory 2201 according to the noise characteristic contained in the input signal, and 2203 is DSP (digital signal processor) for executing said noise suppressing control or the acoustic field control to said input signal, based on the input program.

2204 is a control panel for selecting and instructing the kind of the input signal, and 2205 is a selector for selecting the tape input or the radio input among the input signals by the command from MPU 2202, based on the instruction from the control panel 2204. 2208 is a terminal for CD input. 2206 is an A/D converter, and 2207 is a D/A converter. 2209 is RAM connected to DSP 2203. DSP 2203 has a muting means for muting in order to suppress or remove the shock noise generated inside by inputting of said program.

By such a structure, for example, when it is input from the control panel 2204 by the user that the radio signal will be input, an instruction to switch to the radio input is sent from MPU 2202 to the selector 2205. On the other hand, a program used for the noise suppression for the radio is read out from the ROM 2201 by the control of MPU 2202, and transferred to DSP 2203. At the time of program exchange, muting is conducted. Thus, the radio signal in which the noise is suppressed is output from DSP 2203.

The relation between kinds of the input signal and the program to be selected will be as follows:

That is, in the case of tape input, it is the program of the noise suppression and acoustic field control for the tape, and in the case of CD input, it becomes the program for CD acoustic field control.

Next, concrete description will be made regarding muting.
(1) Processing at the microcomputer (MPU) (see FIGS. 23 and 24)

Scan the control panel 2204 to determine whether it is operated or not (ST.301, ST.302). If it is not operated, execute other processing (ST.303). If there is any operation, analyze what is operated to proceed respective processing.

When there is any input switching, execute the input switching processing (ST.304), when there is operation of tone, execute the processing for the tone (ST.305), when there is any operation of volume, execute the processing for the volume (ST.306), and when there is any operation of the acoustic field control, execute the processing for the acoustic field control (ST.307). And the signal of program change is sent to DSP 2203, or in the case of switching of FF, REW and direction of the parameter, or selection of the radio, the signal is sent directly to the instrument (ST.308).
<Processing for volume>

Calculate the volume control coefficient used in DSP (ST.401).
<Processing for tone>

Calculate the tone control coefficient used in DSP (ST.402).
<Processing of input switching>

Program change is necessary in DSP. Load the necessary program from ROM 2201, calculate the absolute address in DSP, prepare the load module practicable in DSP, and prepare to transfer it to DSP (ST.403, ST.404). In addition, when the DSP program is stored in a practicable form of the absolute address, it is only required to prepare so as to be able to transfer the necessary program to DSP.

By storing the DSP program in ROM at the relocatable address, and converting it to the absolute address according to need, it is not necessary to repeatedly have common program for the acoustic field control for CD, noise suppression for the radio, and processing for the cassette to reduce the memory volume, as well as the program allocation adjusted for the internal memory of DSP can be flexibly done, thereby the memory resource of DSP can be effectively utilized.
<Processing for the acoustic field control>

Load the necessary parameter to ROM, and calculate the acoustic field control coefficient used in DSP (ST.405, ST.406).
(2) Processing in DSP (see FIGS. 25–28)

When there is any input switching in DSP, discontinue the processing up to now, and proceed the processing to load the program.

When there is any program change, execute the processing to initiate the muting of the audio signal to prevent the shock sound due to the input switching (ST.501).

Then, load the processing program from the microcomputer and execute the processing for CD (ST.502), the processing for radio (ST.503), and the processing for cassette (ST.504), respectively.
<Processing of input/output interrupt>

A/D and D/A processings are conducted by the interrupt processing for every certain time (ST.505, ST506). Store the A/D converted data (digital data from CD, in the case of CD input) to the predetermined input buffer, and to the predetermined output buffer, and transfer the data in the predetermined output buffer to the D/A converter.
<Processing for CD>

First, execute the processing to release the muting. In this case, control to rise smoothly so that any shock sound is not caused (ST.601). Then, reset the input/output buffer so as to input and output the given signal (ST.602).

DSP will wait until the data necessary for the processings are gathered, but during this period, processings when there is any change of tone or volume can be executed (ST.603). In this case, load a new parameter from the microcomputer (ST.604).

When necessary data are gathered and the processing is started, first perform the control of the input/output buffer, and set the address of the data to be processed, the next input address, the address of the data to be output subsequently, and the like (ST.605).

When there is any mode change of the acoustic field control, load the new parameter from the microcomputer (ST.606, ST.607). And perform the acoustic field control for CD, and processings of tone and volume (ST.608–ST.610). Lastly, examine if the program change request is sent from the microcomputer or not, and if there is no request, wait the start of the next processing (ST.611).

When there is a request of change, return there.
<Processing for radio>

Roughly the same with the processing for CD. In the processing for radio, noise suppression processing for radio is performed (ST.701).
<Processing for cassette>

In the processing for cassette, noise suppression processing and acoustic filed control processing for CD which suppresses the tape hiss is performed (ST.801, ST802).

Determination of the program change, and determination of the acoustic control and mode change in the above processings, may be performed while waiting the processing start.

Thus, by making the structure to change said program in DSP according to the input signal, large cost merit can be obtained, differing from the conventional structure in which DSP is individually provided according to the input signal.

In addition, the above embodiment has been described for the case where muting is conducted in the DSP processing, but, for example, it may be so constituted to conduct muting between DSP 2203 and D/A converter 2207, or at the poststage of D/A converter 2207.

Figure 65:
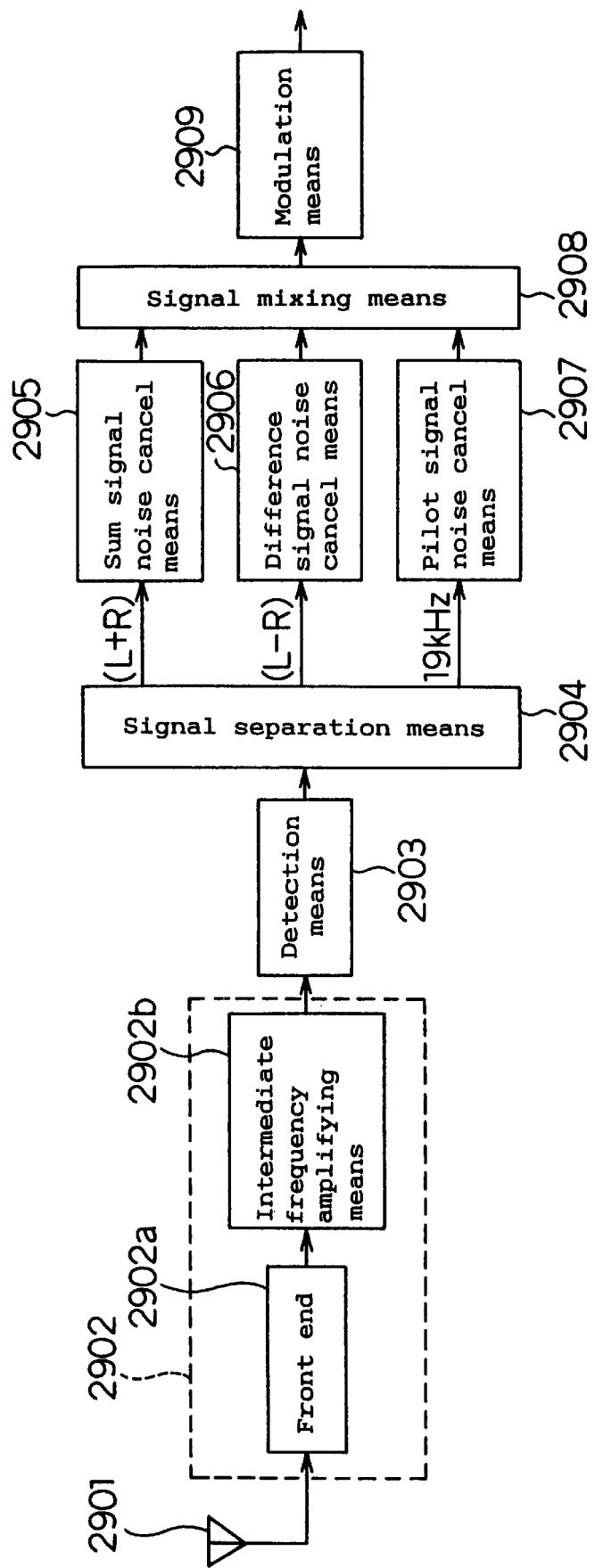
FIG. 65 is a structural view of the noise suppressing device of other embodiment according to the present invention.

FIG. 65 is a structural view of the noise suppressing device of the other embodiment according to the present invention, and the structure and the action of the present embodiment will be described with reference to FIG. 65. 2902 is a tuner having a front end 2902a on the input side, and an intermediate frequency amplifier 2902b on the output side, and 2901 is an antenna as the input means of the present invention connected to the tuner 2902. Here, the input signal is a stereo signal. 2903 is a detection means which inputs the signal from the intermediate amplifier 2902b, and 2904 is a signal separation means for separating and outputting said detected given signal into 3 kinds of signals: sum signal, difference signal and pilot signal.

As a plurality of noise cancel means which suppress or remove the noise contained in the signal, based on the respective separation signals separated by the signal separation means 2904, and output the signal in which the noise has been suppressed or removed, there are provided a sum signal noise cancel means 2905 for inputting said separated sum signal, a difference signal noise cancel means 2906 for inputting said separated difference signal, and a pilot signal noise cancel means 2907 for inputting said separated pilot signal.

Also, there are provided a signal mixing means 2908 for mixing respective signals output from respective noise cancel means 2905, 2906 and 2907, and a modulation means 2909 for inputting the mixed signal-output from the signal mixing means 2908 to perform modulation.

The present embodiment has a characteristic that by such a structure, noise is suppressed at the stage of the stereo composite signal. More detailed description will be made with regard to this point.

Figure 66:
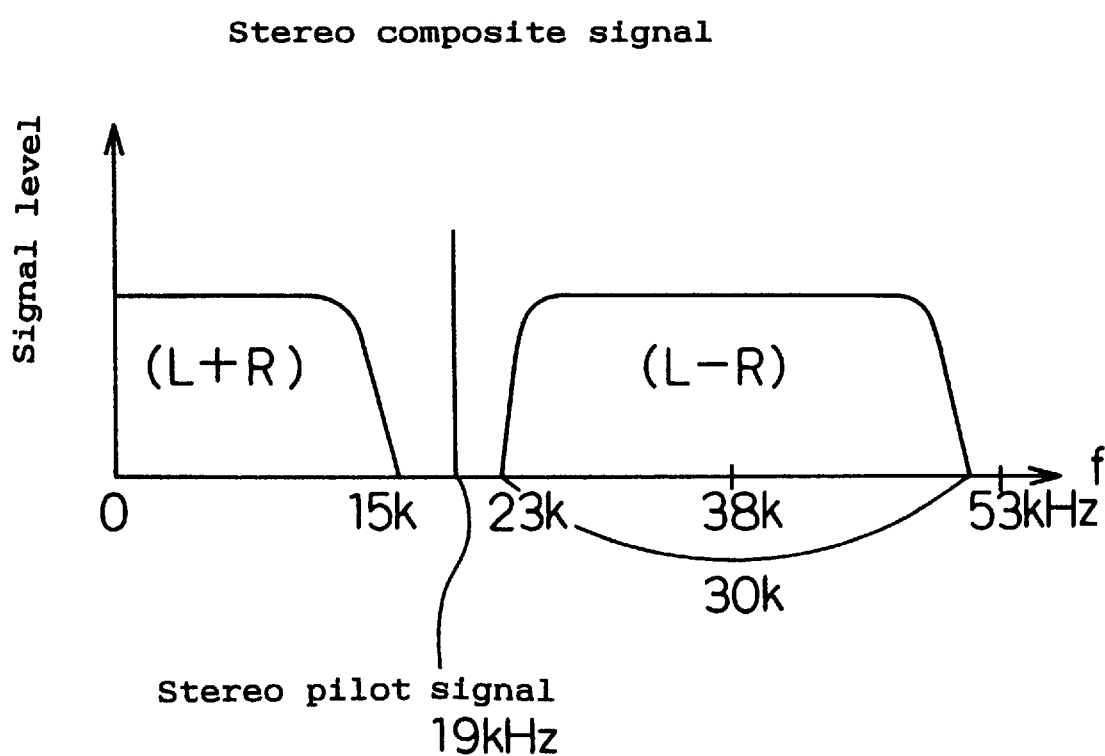
FIG. 66 is a graph showing the stereo composite signal, in the noise suppressing device of other embodiment according to the present invention.

In the present embodiment, as shown in FIG. 66, the stereo composite signal which is the output of the detection means 2903 is separated into the sum signal with the band width of 0 to 15 kHz, the difference signal with the band width of 30 kHz of from 23 kHz to 53 kHz, and the pilot signal of 19 kHz.

With respect to the stereo composite signal, it has a characteristic that the higher the frequency, the higher the noise level. By utilizing this characteristic, respective noise cancel means 2905 to 2907 suppress or remove the noise effectively.

Figure 67:
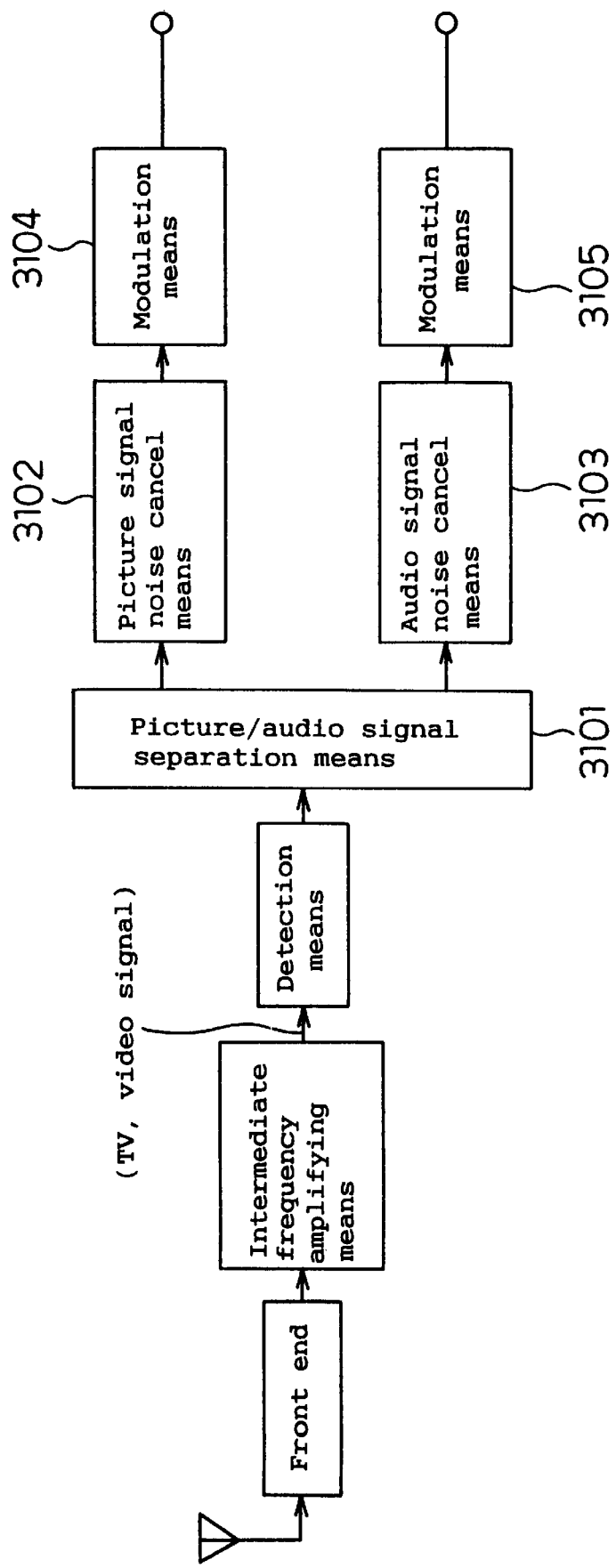
FIG. 67 is a structural view of the noise suppressing device of other embodiment according to the present invention.

Incidentally, in the above embodiment, the description has been made for the case where the stereo signal is used as the signal to be modulated, but, for example, as shown in FIG. 67, it may have a structure that the picture/audio signals such as TV signal, video signal and the like are used. In that case, the structure will be such that there are provided a picture/audio signal separation means which separates the picture signal and the audio signal from the picture/audio composite signal which is the output from the detection means, as the signal separation means of the present invention, and a picture signal noise cancel means 3102 and an audio signal noise cancel means 3103 as the noise cancel means of the present invention, and modulation means 3104 and 3105 provided respectively, and the signal mixing means 2908 described in FIG. 65 is not required. Furthermore, the structure may be such that instead of the above picture/audio signals, character/graphic signals are handled. In that case, a character/graphic signal separation means is used as the signal separation means of the present invention, and applicable to the instruments such as a facsimile and the like.

Figure 68:
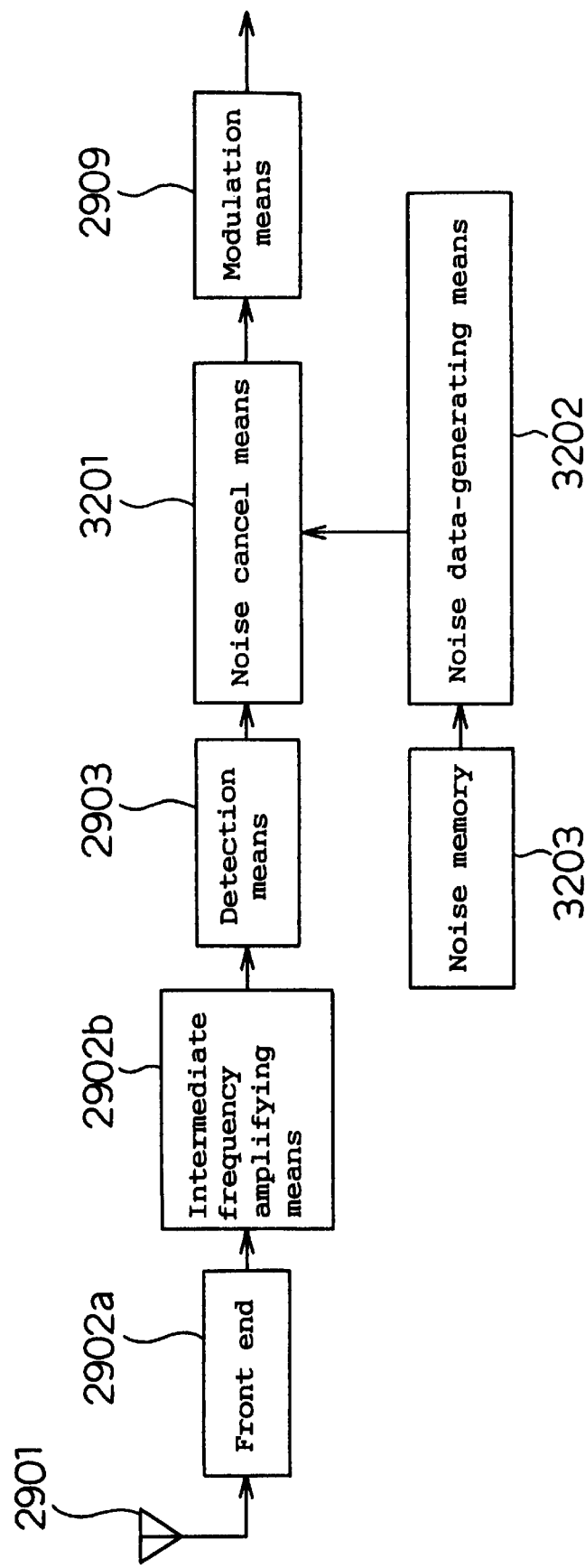
FIG. 68 is a structural view of the noise suppressing device of other embodiment according to the present invention.
Figure 69:
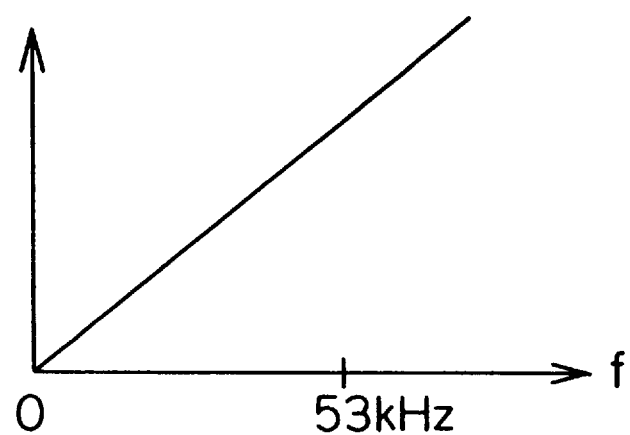
FIG. 69 is a graph showing the noise level, in the noise suppressing device of other embodiment according to the present invention.

Furthermore, the above embodiment has been described with regard to the case where a signal separation means is used, but it is not limited to that case, for example, as shown in FIG. 68, it may be so constituted that a signal separation means is not included, and the output of the detection means 2903 is directly input to the noise cancel means 3201, and turning the attention to the characteristic of the composite signal (see FIG. 69) that the higher the frequency, the higher the noise level, a noise generating means 3202 is provided which generates the noise data while utilizing the noise memory 3203, so that the noise level becomes high as the frequency of the input signal becomes high. The same reference numeral is given to the substantially same part as in FIG. 65.

In this case, for example, if the signal to be modulated is the stereo signal, the noise cancel means 3201 suppresses or removes the noise in the band width of 0 to 53 kHz collectively, with regard to the stereo composite signal which is not separated, using the noise data generated by utilizing the above-mentioned characteristic. Thereby, the noise cancel means 3201 suppresses or removes the noise effectively.

Figure 70:
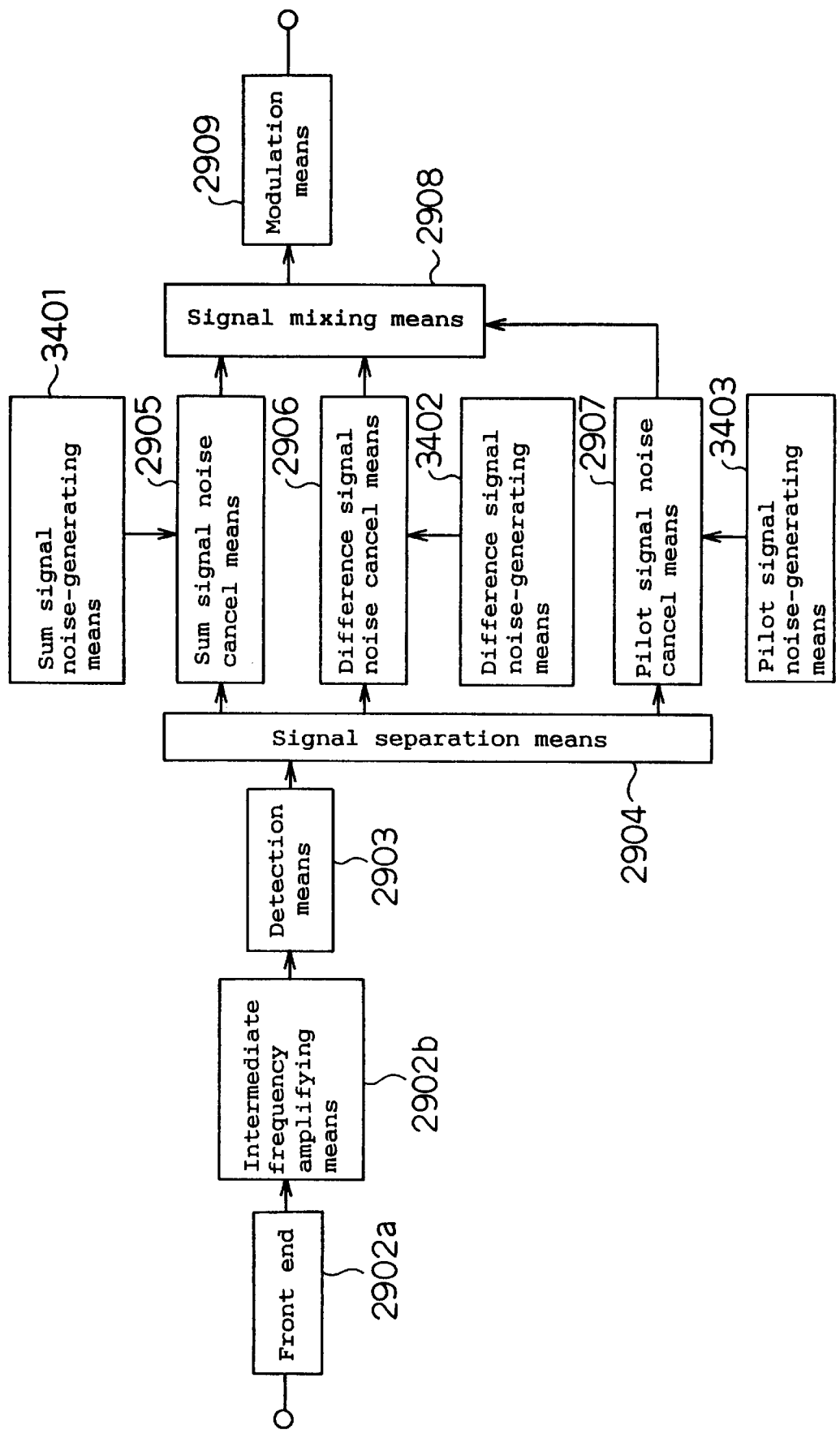
FIG. 70 is a structural view of the noise suppressing device of other embodiment according to the present invention.

Furthermore, with regard to the above embodiment described in FIG. 65, noise generating means 3401, 3402 and 3403 may be further provided for generating the noise data corresponding to the respective noise cancel means 2905 to 2907, respectively (see FIG. 70).

Figure 71:
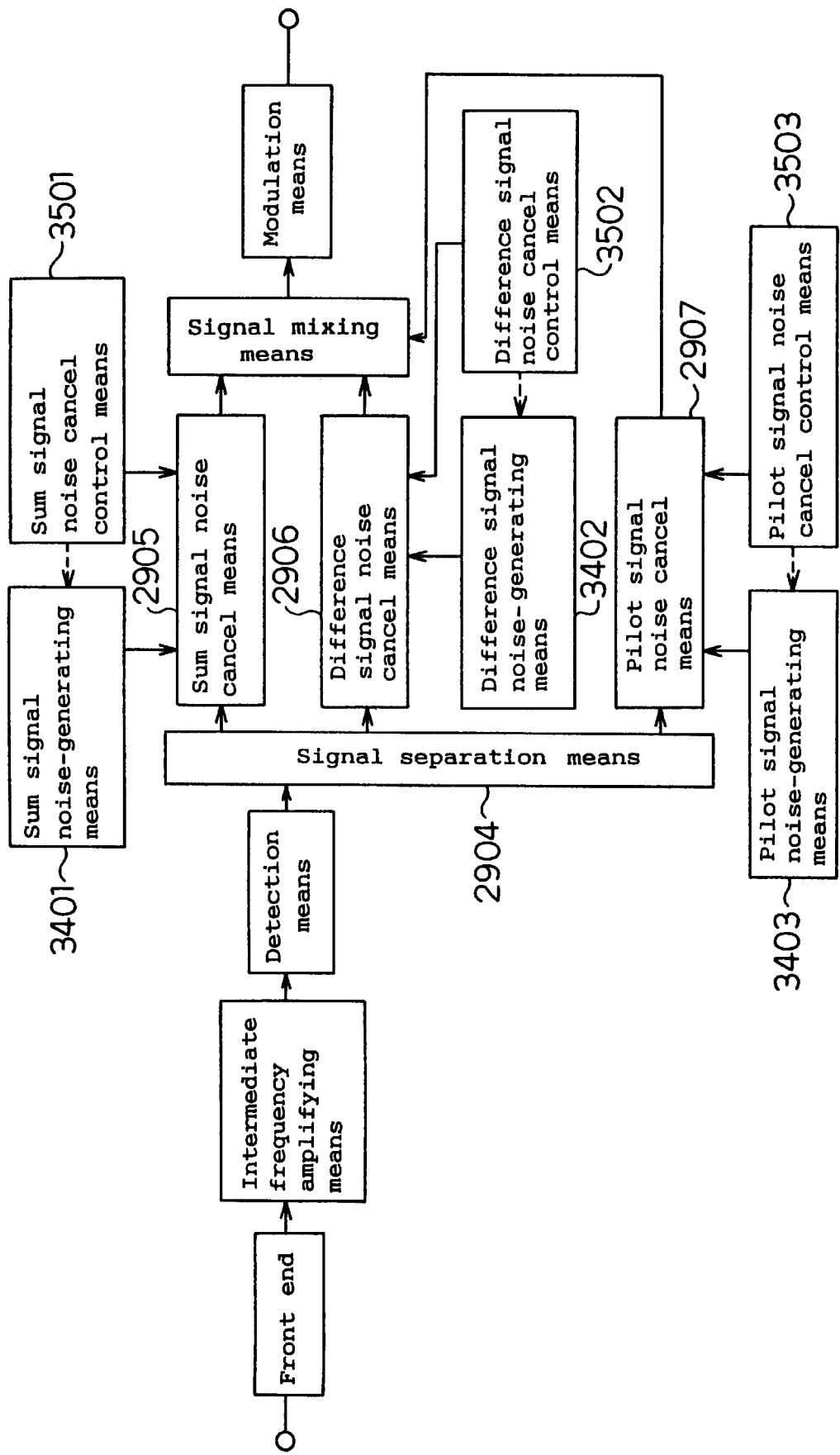
FIG. 71 is a structural view of the noise suppressing device of other embodiment according to the present invention.

Furthermore, with regard to the above embodiment described with reference to FIG. 70, noise cancel control means 3501, 3502, and 3503 for controlling the generation of the noise may be provided corresponding to respective noise cancel means 2905–2907 (see FIG. 71).

Figure 72:
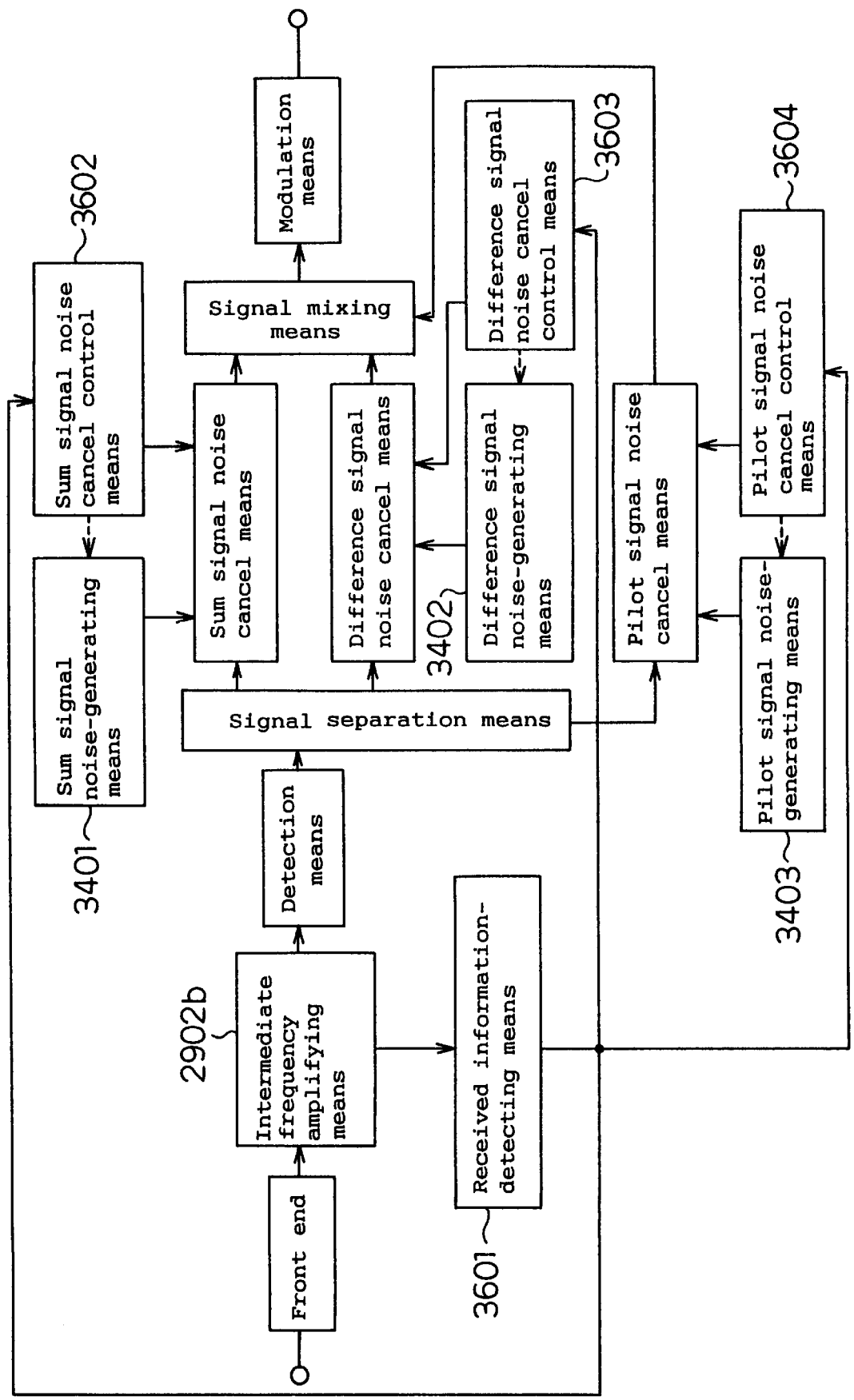
FIG. 72 is a structural view of the noise suppressing device of other embodiment according to the present invention.

With regard to the above embodiment described with reference to FIG. 71, its structure may be such that a received information-detecting means 3601 which detects the field/disturbance informations relating to the carrier level of said signal to be modulated and the disturbed degree of said signal to be modulated from the intermediate frequency amplifying means 2902 and outputs these informations is further included, and respective noise cancel control means 3602, 3603 and 3604 control said respective noise cancel means based on said informations output from the received information-detecting means 3601 (see FIG. 72).

Furthermore, with regard to the above embodiment described with reference to FIG. 72, its structure may be such that instead of respective noise cancel control means 3602 to 3604, there are provided noise mixers 3701 to 3703, noise generating means 3706 and 3707 which generates the receiver's residual noise data based on the information relating to the carrier level, noise memories 3704 and 3705 which are connected to the noise generating means 3706 and 3707 and store respective receiver's residual noise data, noise generating means 3708 and 3709 which generates the multipath-disturbing noise based on the informations output from the received information-detecting means 3601, and noise memories 3710 and 3711 which store respective multipath-disturbing noise data. In this case, noise mixers 3701 and 3702 utilize the receiver's residual noise data to be output and the multipath-disturbing noise data to be output with regard to the sum signal and the difference signal, respectively, to mix these noise data and output the mixed noise data. Furthermore, it is so constituted that the pilot signal noise mixer 3703 utilizes the output from the sum signal noise mixer 3701 and the output from the difference signal noise mixer 3702 to mix these noise data, and outputs the mixed noise data. The sum signal noise cancel means 2905 utilizes the output from the sum signal noise mixer 3701, and the difference signal noise cancel 2906 utilizes the output from the difference signal noise mixer 3702, and the pilot signal noise cancel means 2907 utilizes the output from the pilot signal noise mixer, to suppress or remove respective said noise (see FIG. 73).

Figure 73:
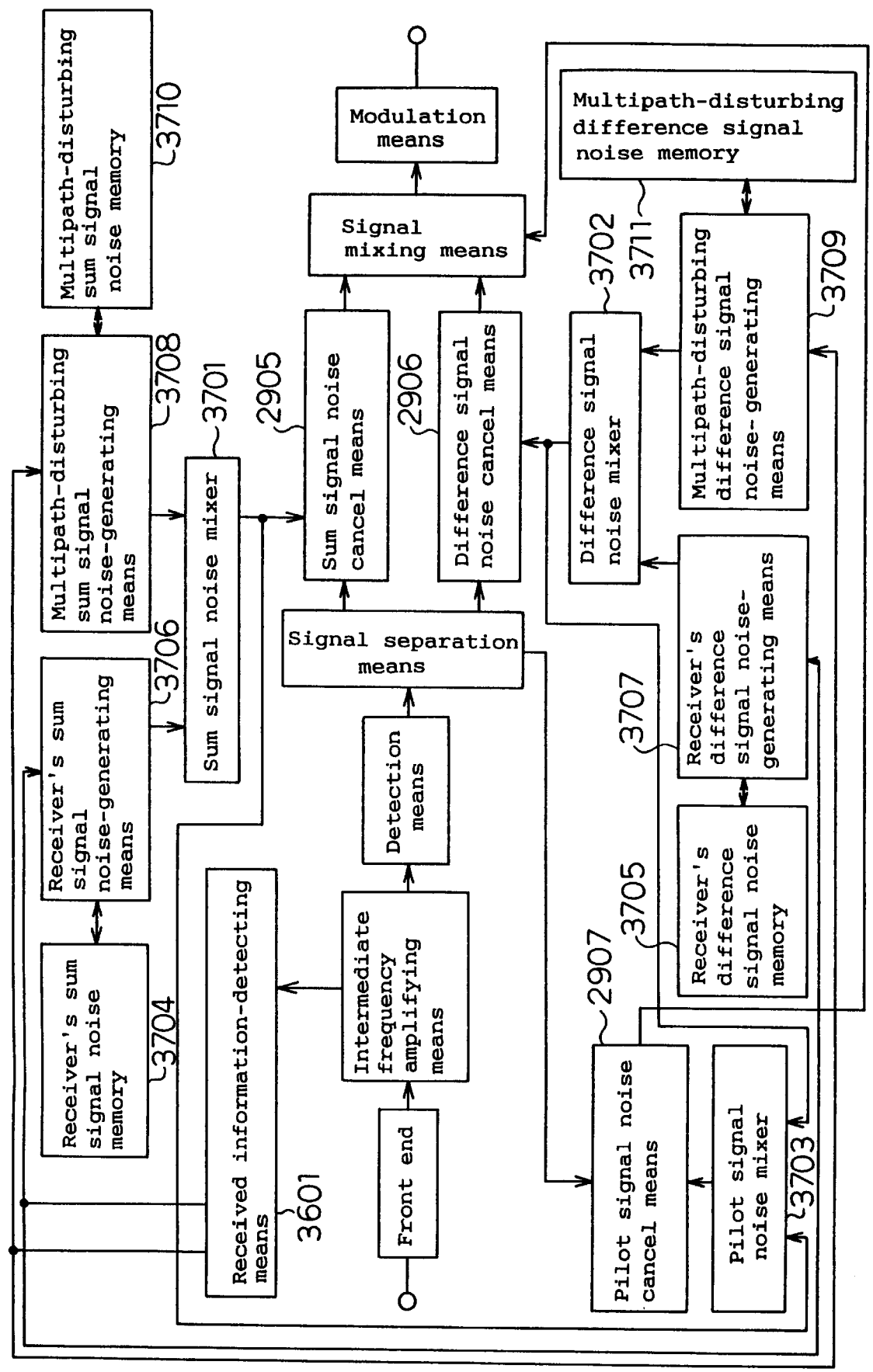
FIG. 73 is a structural view of the noise suppressing device of other embodiment according to the present invention.
Figure 74:
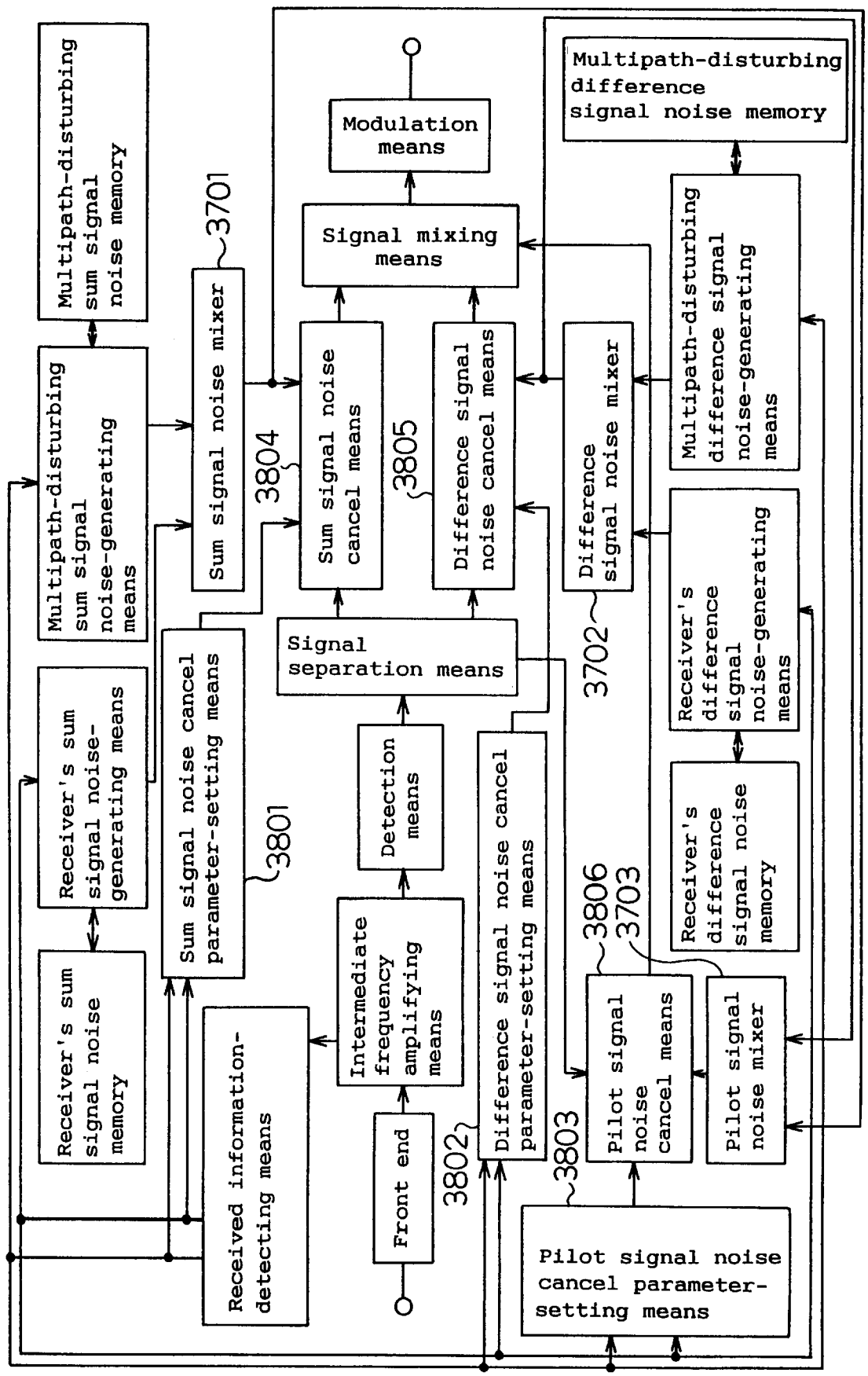
FIG. 74 is a structural view of the noise suppressing device of other embodiment according to the present invention.

Furthermore, with regard to the above embodiment described with reference to FIG. 73, there may be further provided a sum signal noise cancel parameter-setting means 3801 which sets the sum signal noise cancel parameter based on the informations output from said received information-detecting means, a difference signal noise cancel parameter-setting means 3802 which sets the difference signal noise cancel parameter based on the informations output from said received information-detecting means, and a pilot signal noise cancel parameter-setting means 3803 which sets the pilot signal noise cancel parameter based on the informations output from said received information-detecting means. In this case, the sum signal noise cancel means 3804 utilizes said set sum signal noise cancel parameter and the output from the sum signal noise mixer 3701, the difference signal noise cancel means 3805 utilizes said set difference signal noise cancel parameter and the output from the difference signal noise mixer 3702, and the pilot signal noise cancel means 3804 utilizes said set pilot signal noise cancel parameter and the output from the pilot signal noise mixer 3703, to suppress or remove said respective noise (see FIG. 74).

Furthermore, the contents of the mixing processing of the noise mixer of the embodiment shown by FIGS. 37 and 38 will be described more concretely. Namely, the mixing processing here means, with regard to the sum signal noise mixer 3701, to add said receiver's sum signal residual noise data to be output and said multipath-disturbing sum signal noise data to be output, with regard to the difference signal noise mixer 3702, to add said receiver's residual difference signal noise data to be output and said multipath-disturbing difference signal noise data to be output, and with regard to the pilot signal noise mixer 3703, to add the output from said sum signal noise mixer and the output from said difference signal noise mixer.

Moreover, in the above embodiments described with reference to FIGS. 37 and 38, the mixing processing is performed by adding processing, but, for example, it may be so constituted, with said sum signal noise mixer, to select the noise data having larger noise level among said receiver's residual sum signal noise data to be output and said multipath-disturbing sum signal noise data to be output; with said difference signal noise mixer, to select the noise data having larger noise level among said receiver's residual difference signal noise data to be output and said multipath-disturbing difference signal noise data to be output; and with said pilot signal noise mixer, to select the noise data having larger noise level among the noise data output from said sum signal noise mixer and the noise data output from said difference signal noise mixer. Or it may be any mixing processing such as multiplication processing of each noise data, or a processing in which the receiver's residual noise data and the multipath-disturbing noise data are multiplied by k, respectively, giving the mixing coefficient to them, and the respective data are added and the k root is taken away, so far as being a so-called mixing processing. Moreover, it is not required that the contents of the mixing processing are the same in the noise mixer and the noise parameter mixer.

Figure 75:
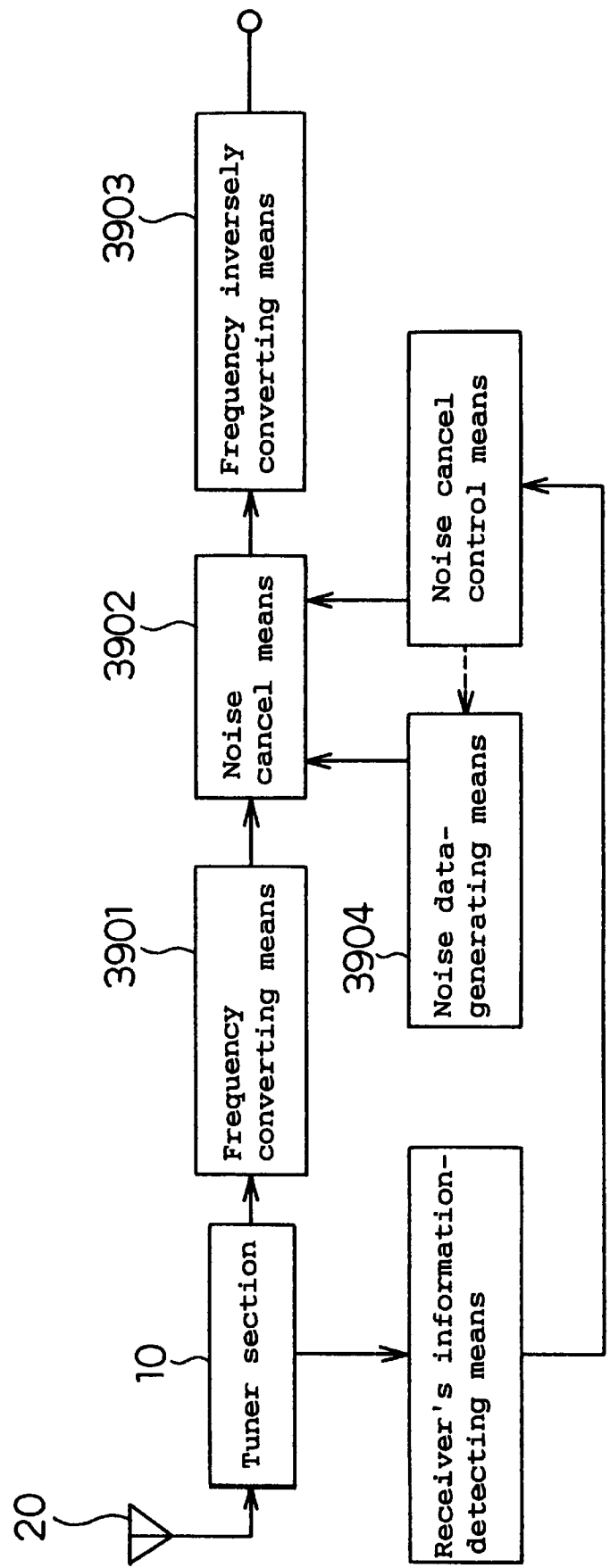
FIG. 75 is a structural view of the noise suppressing device of other embodiment according to the present invention.

FIG. 75 is a structural view of the noise suppressing device of the other embodiment according to the present invention, and the structure and the action of the present embodiment will be described with reference to FIG. 75.

Namely, in FIG. 75, 10 is a tuner section which detects the radio wave and converts it to the electric signal, and 20 is an antenna as the input means of the present invention connected to the tuner section 10. The tuner section 10 has a front end (not shown) on the input side, and the intermediate frequency amplifying means (not shown) which amplifies and outputs the signal of the intermediate frequency. Here, it is assumed that the input signal is the stereo pilot signal.

The main difference between the structure of the above embodiment and the structure of the present embodiment is that there are provided a frequency converting means 3901 and a frequency inversely converting means 3903 at the antestage and the poststage of the noise cancel means 3902, as shown in FIG. 75.

The frequency converting means 3901 is a means to input said output signal from said detection means and covert said signal so that the band width of the signal and the value of the absolute frequency become smaller, making the input signal as the standard, and generally a down-converter is used. As the converting method, there can be mentioned a beat down method, a frequency dividing method and the like. Furthermore, the frequency inversely converting means 3903 is a means to substantially return the signal output from the noise cancel means to the state before said conversion and output the signal, and generally an up-converter is used.

Figure 76:
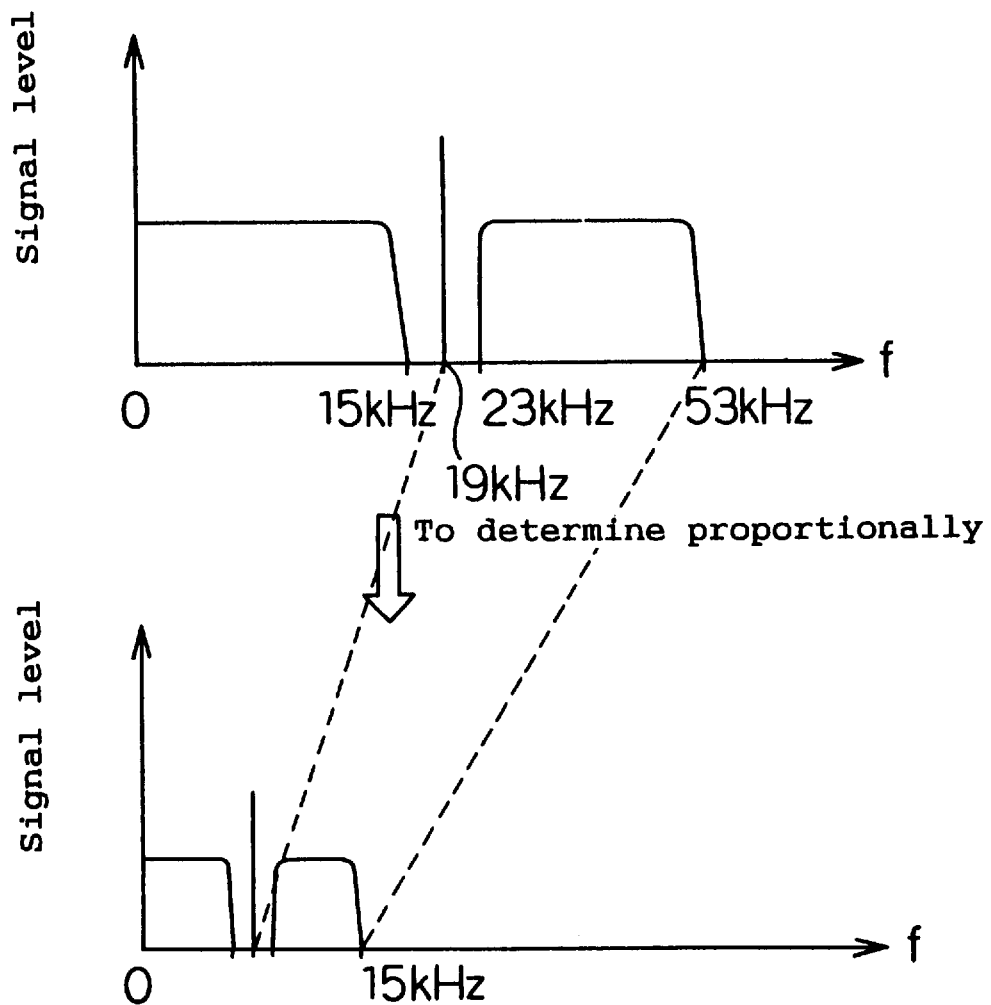
FIG. 76 is a graph showing the stereo composite signal before the frequency conversion, and the stereo composite signal after the frequency conversion, in the noise suppressing device of other embodiment according to the present invention.

Here, for example, the input signal is the stereo pilot signal, the frequency converting means 3901 reduces the signal in the frequency band in the range of 0 to 53 kHz proportionally to the band width of 0 to 15 kHz (see FIG. 76).

Furthermore, the noise data-generating means 3904 shown in FIG. 75 is a means to generate the noise data adjusted so that the higher is the frequency of the output signal from the frequency converting means 3901, the larger becomes the noise level of the noise data corresponding to the frequency, and output the generated noise data to the noise cancel means 3902.

By such structure, the noise cancel means 3902 suppresses or removes the noise with respect to the signal in which both the band width of the frequency of the input signal and the absolute value frequency have been reduced, thereby the circuit size of the noise cancel means can be made smaller.

In addition, the present embodiment has been explained with regard to the case where input of the signal to the frequency converting means 3901 is the output signal from said detection means, but it may be the output signal from said front end, or the output signal from said intermediate amplifying means.

Figure 77:
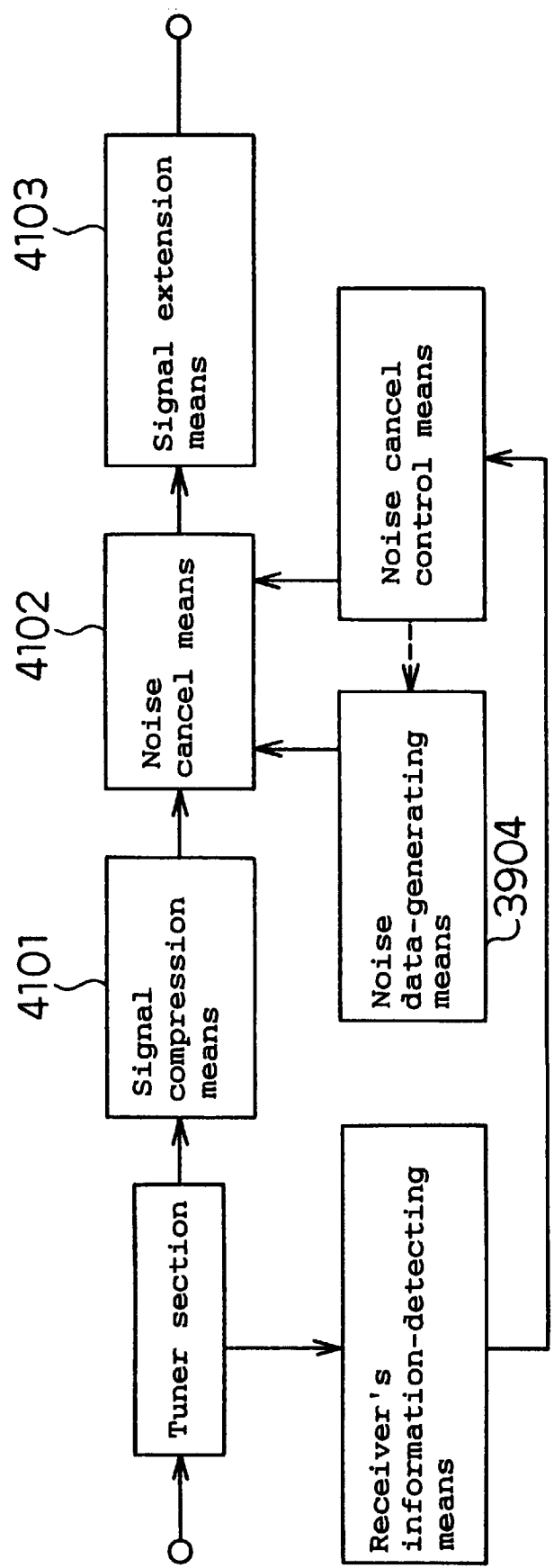
FIG. 77 is a structural view of the noise suppressing device of other embodiment according to the present invention.

FIG. 77 is a structural view of the noise suppressing device of the other embodiment according to the present invention, and the structure and the action of the present embodiment will be described with reference to FIG. 77.

The main difference between the present embodiment and the above embodiment described with reference to FIG. 75 is that a signal compression means 4101 is provided, instead of the frequency converting means 3901, to input said output signal from said detection means and to convert the signal so that the band width of the signal and the value of the absolute frequency become smaller, making the input signal as the standard. Moreover, another difference point is that a signal extension means 4103 is provided, instead of the frequency inversely converting means 3903, to substantially return the signal output from said noise cancel means to the state before said conversion and output the signal.

As the signal compression means 4101, there can be mentioned the one to compress the analog signal, and the one to compress the digital signal.

As the example of the former compression, there can be mentioned frequency band compression, such as a level compression seen in the DBX method, and a Dolby system. As the example of the latter compression, there can be mentioned a bit compression such as u-low compression and ADPCM compression, PASC (Precision Adaptive Sub-band Coding) encoding as the recording/reproducing method of a minidisk and a digital compact cassette, and MPEG (Moving Picture Experts Group) coding as the compression/extension method of the picture/audio signal, and the like.

By such structure, the processing of the noise cancel means becomes easier.

In addition, the present embodiment has been described with regard to the case where input of the signal to the signal compression means 4101 is the output signal from said detection means, but it may be the output signal from said front end, or the output from said intermediate frequency amplifying means.

In the above embodiments described with reference to FIGS. 39 and 41, it has been explained that the input signal is the stereo signal, but it is not limited to the stereo signal, and may be the picture/audio signal, or the character/graphic signal, irrespective of the kind of the signal and its content.

In the above embodiments described with reference to FIGS. 39 and 41, they include a received information-detecting means, but it is not limited to that case, and they may not necessarily have the received information-detecting means.

Figure 78A:
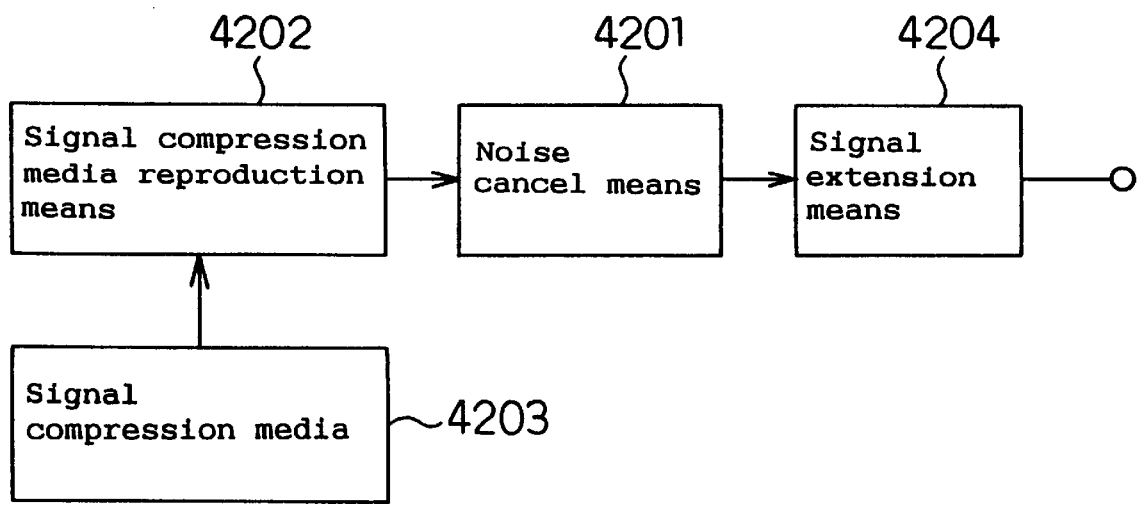
FIG. 78A is a structural view when the noise suppressing device of other embodiment according to the present invention is utilized for the reproduction device.

FIG. 78A,B are structural views in which the noise suppressing device of the other embodiment according to the present invention is applied to the signal reproducing device, and the structure and the action of the present embodiment will be described with reference to FIG. 78A,B.

The main difference between the present embodiment shown in FIG. 78A and the above embodiment described with reference to FIG. 77 is that, in the present embodiment, the noise cancel means 4201 is applied to the inside of the data reproduction device having a signal compression media reproduction means 4202 which reproduces the signal from the signal compression media 4203.

Furthermore, the main difference between the present embodiment shown in FIG. 78B and the above embodiment described with reference to FIG. 77 is that, in the present embodiment, the noise cancel means 4206 is applied to the inside of the data recording device having a signal compression media recording means 4207 which records the signal from the signal compression media 4208.

More concretely speaking, referring to FIG. 78A, the noise cancel means 4201 suppresses or removes the noise contained in the signal output from the signal compression media reproduction means 4202, and outputs the signal in which the noise is suppressed or removed. The signal extension means 4204 substantially returns the data of the output signal to the state before said compression and outputs the signal.

Figure 78B:
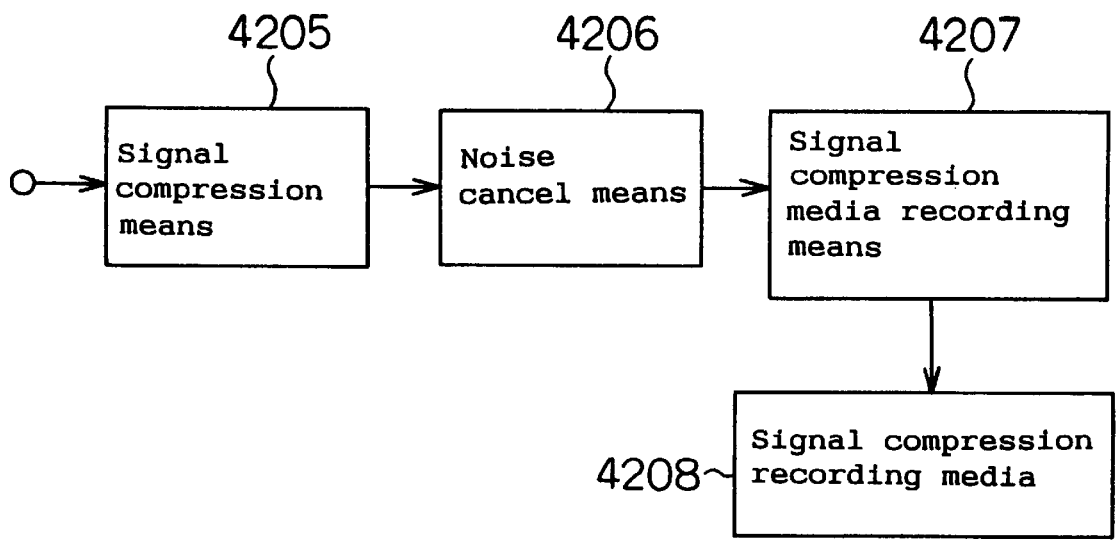
FIG. 78B is a structural view when the noise suppressing device of other embodiment according to the present invention is utilized for the recording device.

More concretely speaking, referring to FIG. 78B, the noise cancel means 4206 suppresses or removes the noise contained in the signal output from the signal compression means 4205, and outputs the signal in which the noise is suppressed or removed. The signal compression media recording means 4207 records this output signal with respect to the signal compression recording media 4208.

By such structure, even in the recording or reproduction device, the noise can be suppressed or removed more effectively.

Figure 79:
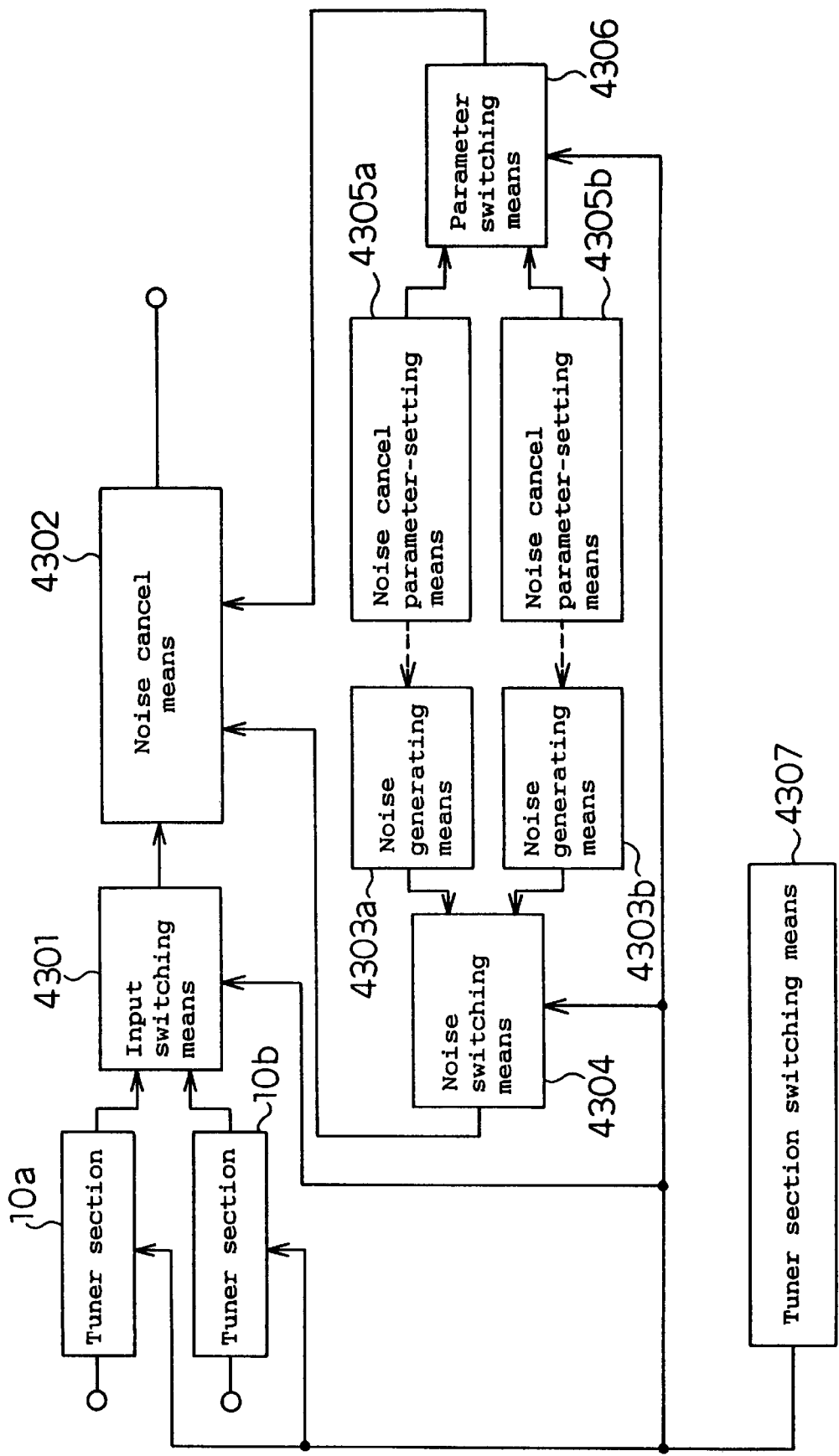
FIG. 79 is a structural view of the noise suppressing device of other embodiment according to the present invention.
Figure 80:
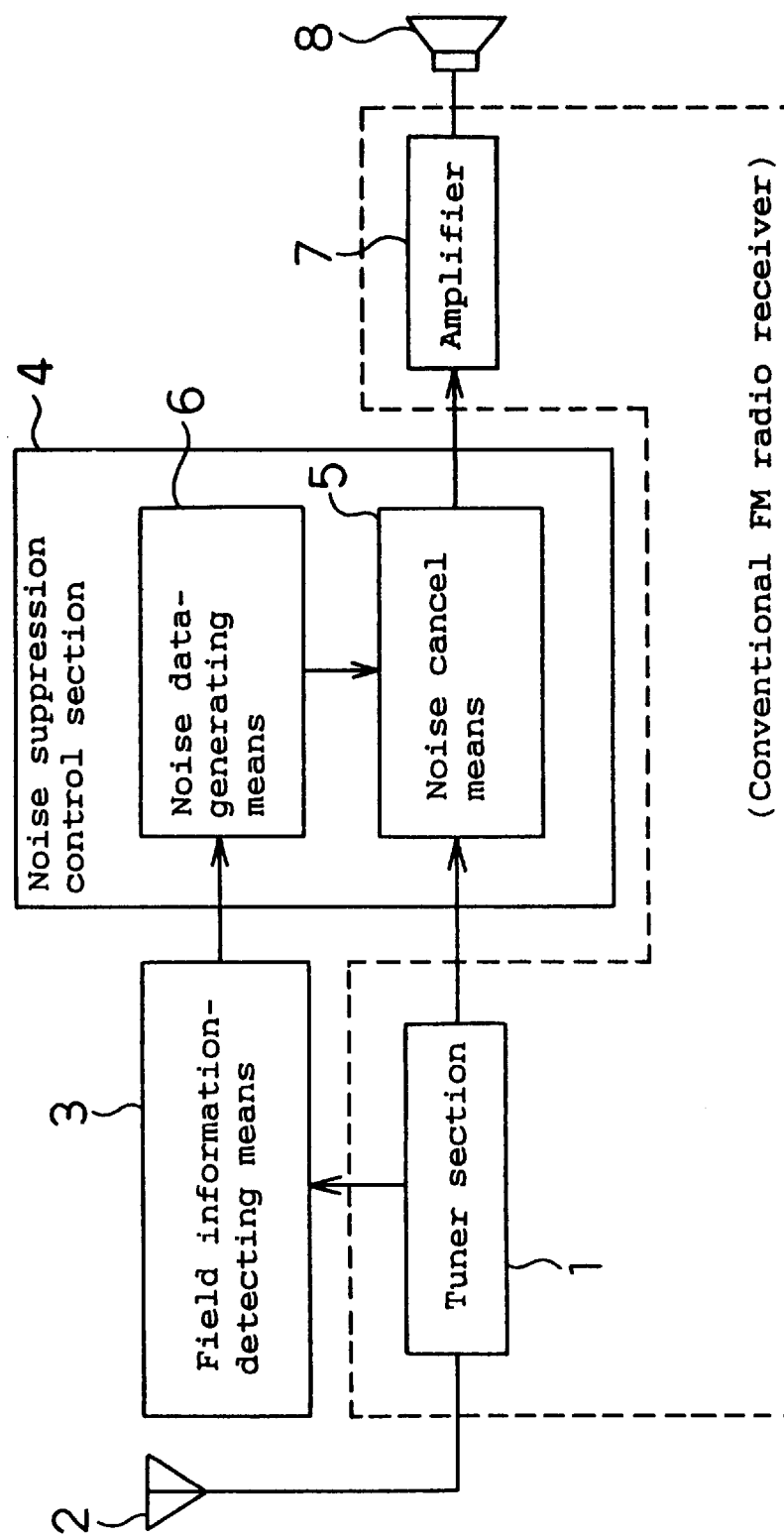
FIG. 80 is a structural view of the conventional noise suppressing device in the FM radio receiver.

FIG. 79 is a structural view of the noise suppressing device of the other embodiment according to the present invention, and the structure and the action of the present embodiment will be described with reference to FIG. 79.

10a and 10b are two tuner sections which obtain the signal from the input section (not shown), detect and output the given signal, and 4301 is an input switching means to obtain the instruction which signal should be selected from the switching means 4307 of the tuner section, among signals from said plurality of tuner sections 10a and 10b, and output said signal to be selected based on the instruction.

4302 is a noise cancel means to suppress or remove the noise contained in the signal output from the input switching means 4301, and 4303a and 4303b are noise generating means to generate and output the noise data corresponding to the tuner sections 10a and 10b. 4304 is a noise switching means to control switching so that the noise data to be selected is output among the noise data set by said plurality of noise generating means 4303a and 4303b, corresponding to said instruction.

4305a and 4305b are noise cancel parameter-setting means to set the noise cancel parameter corresponding to said respective tuner sections 10a and 10b, and 4306 is a parameter switching means to control switching so that the noise cancel parameter to be selected is output among the noise cancel parameter set by said plurality of noise cancel parameter-setting means 4305a and 4305b, corresponding to said instruction.

Thus constituted noise cancel means 4302 is to suppress or remove said noise based on said noise data to be output and said noise cancel parameter to be output.

Thereby, noise suppression or removal can be controlled delicately even to the different noise patterns generated in the tuner section.

In addition, in the above embodiment, the input signal may be the monaural signal, the stereo signal, the picture/audio signal used as the TV and video signals, or the character/graphic signal used in the facsimile and the like, irrespective of the kind of the signal and its content.

As is obvious from the above description, the present invention has the advantage that the noise can be suppressed or removed more effectively compared to the conventional devices.

What is claimed is:

1. A noise suppressing device comprising:
   a means for inputting a signal to be modulated in a transfer system of a stereo signal;
   a tuner section for obtaining the signal from said input means, detecting and outputting a plurality of certain signals;
   a sum signal-preparing means for summing up said certain signals output from said tuner section and preparing a sum signal;
   a difference signal-preparing means for taking the difference between said certain signals output from said tuner section and preparing a difference signal;
   a field/disturbance information-detecting means for detecting field/disturbance informations relating to the carrier level of said signal to be modulated or the disturbed degree of said signal to be modulated from said tuner section, and outputting the field/disturbance informations;
   a modulation information-detecting means for detecting modulation informations relating to the modulation degree of said signal to be modulated or the stereo pilot signal level of said signal to be modulated from said tuner section, and outputting said modulation informations;
   a sum signal noise cancel means for suppressing or removing noise with respect to said sum signal;

a difference signal noise cancel means for suppressing or removing noise with respect to said difference signal;

a noise cancel control means for controlling said sum signal noise cancel means and said difference signal noise cancel means, based on the output from said field/disturbance information-detecting means and the output from said modulation information-detecting means; and a signal separation means for separating said plurality of certain signals based on the sum signal and the difference signal in which the noise has been suppressed or removed.

2. A noise suppressing device comprising:

a means for inputting a signal to be modulated in a transfer system of a stereo signal;

a tuner section for obtaining the signal from said input means, detecting and outputting a plurality of certain signals;

a sum signal-preparing means for summing up said certain signals output from said tuner section and preparing a sum signal;

a difference signal-preparing means for taking the difference between said certain signals output from said tuner section and preparing a difference signal;

a field/disturbance information-detecting means for detecting field/disturbance informations relating to the carrier level of said signal to be modulated and the disturbed degree of said signal to be modulated from said tuner section, and outputting the field/disturbance informations;

a modulation information-detecting means for detecting modulation informations relating to the modulation degree of said signal to be modulated or the stereo pilot signal level of said signal to be modulated from said tuner section, and outputting said modulation informations;

a field/disturbance information-comparing means which compares said field/disturbance informations output from said field/disturbance information-detecting means with a predetermined value, or a modulation information-comparing means which compares said modulation informations output from said modulation information-detecting means with other predetermined value;

a sum signal noise cancel means for suppressing or removing noise with respect to said sum signal, with noise data and noise muting cancel parameter;

a difference signal noise cancel means for suppressing or removing noise with respect to said difference signal, with noise data and noise muting cancel parameter;

a noise muting cancel control means for (1) setting said noise cancel parameter based on the output from said field/disturbance information-detecting means and/or the output from said modulation information-detecting means, controlling said difference signal noise cancel means, and (2) setting clamp coefficient of said noise muting cancel parameter to any value between 0 and 0.7 based on the output from said field/disturbance information-comparing means and/or the output from said modulation information-comparing means, controlling said sum signal noise cancel means; and a signal separation means for separating said plurality of certain signals based on the sum signal and the difference signal in which noise has been suppressed or removed by said noise cancel means.

* * * * *